(12) United States Patent
Geum et al.

(10) Patent No.: US 12,120,948 B2
(45) Date of Patent: Oct. 15, 2024

(54) BORON-CONTAINING COMPOUND AND ORGANIC LIGHT-EMITTING ELEMENT COMPRISING SAME

(71) Applicant: LG CHEM, LTD., Seoul (KR)

(72) Inventors: Sujeong Geum, Daejeon (KR); Kyunghee Kim, Daejeon (KR); Wanpyo Hong, Daejeon (KR); Jaegoo Lee, Daejeon (KR); Sang Duk Suh, Daejeon (KR)

(73) Assignee: LG Chem, Ltd., Seoul (KR)

( * ) Notice: Subject to any disclaimer, the term of this patent is extended or adjusted under 35 U.S.C. 154(b) by 680 days.

(21) Appl. No.: 17/284,760

(22) PCT Filed: Feb. 13, 2020

(86) PCT No.: PCT/KR2020/002054
§ 371 (c)(1),
(2) Date: Apr. 12, 2021

(87) PCT Pub. No.: WO2020/167001
PCT Pub. Date: Aug. 20, 2020

(65) Prior Publication Data
US 2021/0391547 A1       Dec. 16, 2021

(30) Foreign Application Priority Data

Feb. 13, 2019   (KR) .................... 10-2019-0016634

(51) Int. Cl.
*H10K 85/40*       (2023.01)
*C07F 7/08*        (2006.01)
(Continued)

(52) U.S. Cl.
CPC ........... *H10K 85/40* (2023.02); *C07F 7/0812* (2013.01); *C09K 11/06* (2013.01);
(Continued)

(58) Field of Classification Search
None
See application file for complete search history.

(56) References Cited

U.S. PATENT DOCUMENTS

2015/0236274 A1    8/2015  Hatakeyama et al.
2018/0094000 A1    4/2018  Hatakeyama et al.
(Continued)

FOREIGN PATENT DOCUMENTS

JP      2016-219487 A        12/2016
KR   10-2017-0130434 A       11/2017
(Continued)

*Primary Examiner* — Jeffrey D Washville
(74) *Attorney, Agent, or Firm* — Bryan Cave Leighton Paisner LLP

(57) ABSTRACT

A compound represented by Chemical Formula 1, and an organic light emitting device comprising the same, the compound used in an organic material layer of the organic light emitting device, and providing low driving voltage and high efficiency properties of the organic light emitting device.

[Chemical Formula 1]

16 Claims, 3 Drawing Sheets

(51) Int. Cl.
  *C09K 11/06* (2006.01)
  *H10K 50/11* (2023.01)
  *H10K 50/15* (2023.01)
  *H10K 50/16* (2023.01)
  *H10K 50/17* (2023.01)
  *H10K 50/18* (2023.01)
  *H10K 101/10* (2023.01)

(52) U.S. Cl.
  CPC .. *C07B 2200/05* (2013.01); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(56) References Cited

U.S. PATENT DOCUMENTS

| | | |
|---|---|---|
| 2018/0301629 A1 | 10/2018 | Hatakeyama et al. |
| 2018/0366653 A1 | 12/2018 | He et al. |
| 2020/0058885 A1* | 2/2020 | Hong .................. H10K 85/322 |
| 2020/0176679 A1 | 6/2020 | Jeong et al. |
| 2020/0185626 A1* | 6/2020 | Yuuki .................. C07F 7/0814 |

FOREIGN PATENT DOCUMENTS

| | | |
|---|---|---|
| KR | 10-2018-0122298 A | 11/2018 |
| KR | 10-2018-0127918 A | 11/2018 |
| WO | 2015-102118 A1 | 7/2015 |
| WO | 2016-152418 A1 | 9/2016 |

\* cited by examiner

[FIG. 1]
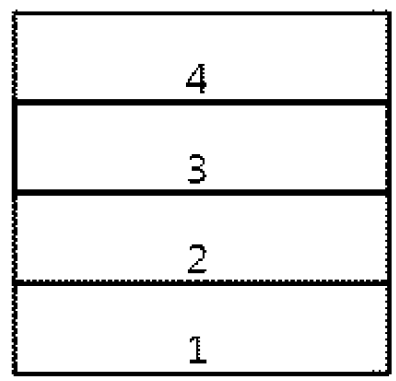
[FIG. 2]
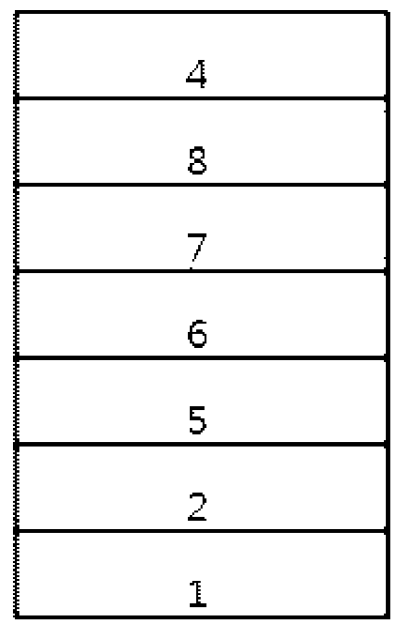

[FIG. 3]
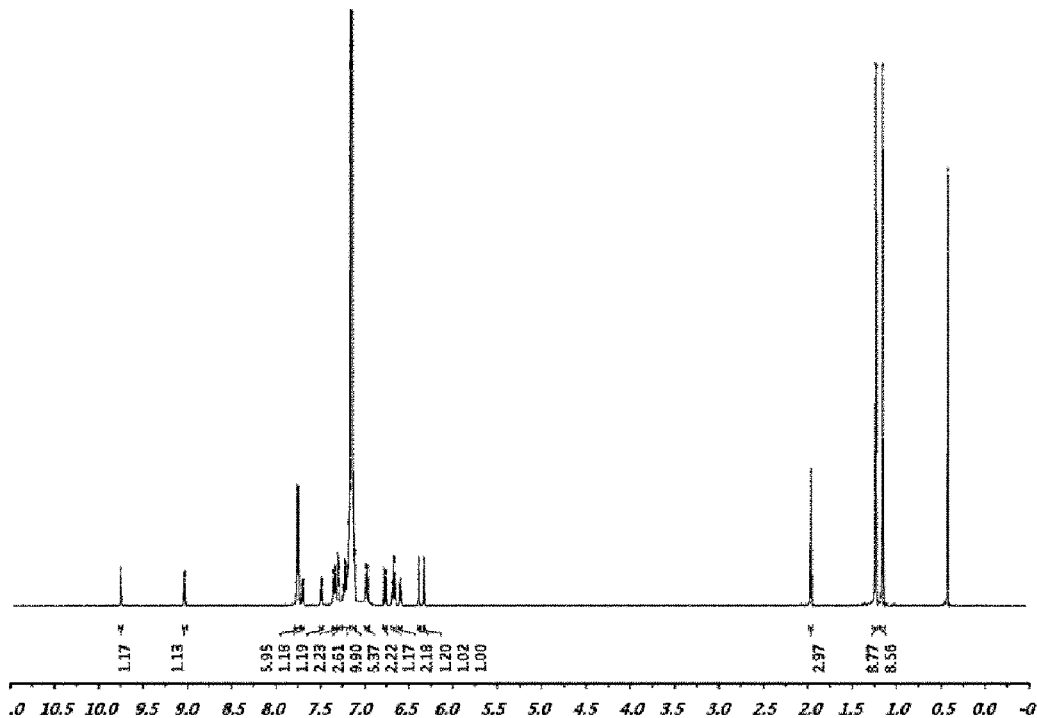
[FIG. 4]
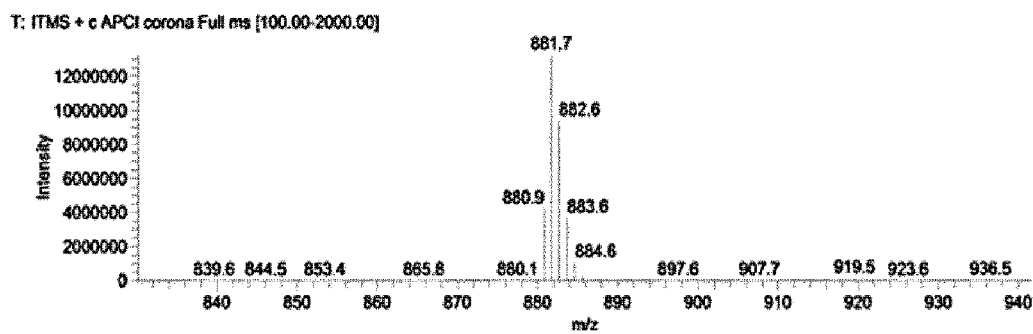

[FIG. 5]
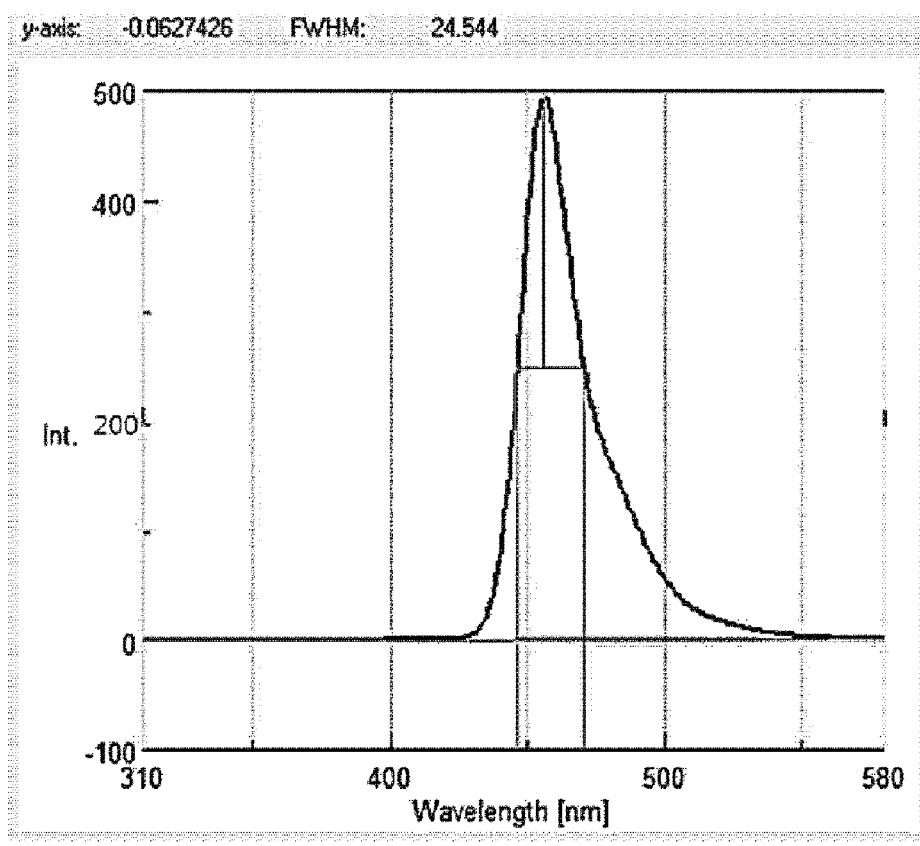

BORON-CONTAINING COMPOUND AND ORGANIC LIGHT-EMITTING ELEMENT COMPRISING SAME

CROSS-REFERENCE TO RELATED APPLICATION(S)

This application is a National Stage Application of International Application No. PCT/KR2020/002054 filed on Feb. 13, 2020, which claims priority to Korean Patent Application No. 10-2019-0016634 filed on Feb. 13, 2019, the disclosures of which are incorporated herein by reference in their entireties.

FIELD OF DISCLOSURE

The present specification relates to a compound, and an organic light emitting device comprising the same.

BACKGROUND

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

Materials used in an organic light emitting device are mostly pure organic materials or complex compounds in which organic materials and metals form complexes, and may be divided into hole injection materials, hole transfer materials, light emitting materials, electron transfer materials, electron injection materials and the like depending on the application. Herein, as the hole injection material or the hole transfer material, organic materials having a p-type property, that is, organic materials readily oxidized and having an electrochemically stable state when oxidized, are generally used. Meanwhile, as the electron injection material or the electron transfer material, organic materials having an n-type property, that is, organic materials readily reduced and having an electrochemically stable state when reduced, are generally used. As the light emitting layer material, materials having both a p-type property and an n-type property, that is, materials having a stable form in both oxidized and reduced states, are preferred, and materials having high light emission efficiency converting, when excitons produced by holes and electrons recombining in a light emitting layer are formed, the excitons to light are preferred.

Development of an organic thin film material has been continuously required for enhancing performance, lifetime or efficiency of an organic light emitting device.

RELATED ARTS

Korean Patent Application Laid-Open Publication No. 10-2017-0122298

SUMMARY

The present specification describes a compound, and an organic light emitting device comprising the same.

One embodiment of the present specification provides a compound represented by the following Chemical Formula 1. Silyl group-substituted boron-based compounds have been developed in order to enhance performance of an organic light emitting device, however, the present disclosure provides a compound exhibiting superior effects compared to existing silyl group-substituted boron-based compounds when used in a device by limiting a bonding position of the silyl group, and bonding positions and types of additional substituents.

[Chemical Formula 1]

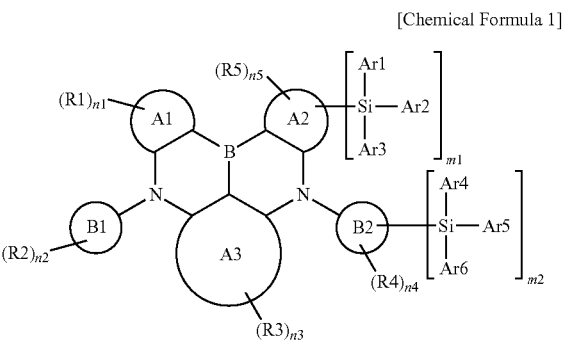

In Chemical Formula 1,

A1, A2, A3, B1 and B2 are the same as or different from each other, and each independently a hydrocarbon ring, Ar1, Ar2, Ar4 and Ar5 are the same as or different from each other, and each independently a substituted or unsubstituted aryl group, Ar3 and Ar6 are the same as or different from each other, and each independently a substituted or unsubstituted alkyl group; or a substituted or unsubstituted aryl group, R1 to R3 and R5 are the same as or different from each other, and each independently hydrogen; deuterium; a halogen group; a cyano group; a substituted or unsubstituted alkyl group; a substituted or unsubstituted alkenyl group; a substituted or unsubstituted alkynyl group; a substituted or unsubstituted alkoxy group; a substituted or unsubstituted cycloalkyl group; a substituted or unsubstituted amine group; a substituted or unsubstituted aryl group; a substituted or unsubstituted aryloxy group; or a substituted or unsubstituted heterocyclic group, R4 is deuterium; a halogen group; a cyano group; a substituted or unsubstituted alkyl group; a substituted or unsubstituted alkenyl group; a substituted or unsubstituted alkynyl group; a substituted or unsubstituted alkoxy group; a substituted or unsubstituted cycloalkyl group; a substituted or unsubstituted amine group; a substituted or unsubstituted aryl group; a substituted or unsubstituted aryloxy group; or a substituted or unsubstituted heterocyclic group, n1 to n3 and n5 are each an integer of 0 to 10, n4 is an integer of 1 to 10, and the two or more substituents in the parentheses are the same as or different from each other when n1 to n5 are each 2 or greater, and m1 and m2 are each 0 or 1, and m1+m2 is 1.

Another embodiment of the present specification provides an organic light emitting device comprising a first electrode; a second electrode; and one or more organic material layers provided between the first electrode and the second electrode, wherein one or more layers of the organic material layers comprise the compound described above.

Advantageous Effects

A compound described in the present specification can be included in an organic material layer in an organic light emitting device, and by comprising the compound in an organic material layer of an organic light emitting device, an organic light emitting device having a low driving voltage and high efficiency properties can be obtained.

DESCRIPTION OF DRAWINGS

FIG. 1 illustrates an example of an organic light emitting device formed with a substrate (1), an anode (2), a light emitting layer (3) and a cathode (4).

FIG. 2 illustrates an example of an organic light emitting device formed with a substrate (1), an anode (2), a hole injection layer (5), a hole transfer layer (6), a light emitting layer (7), an electron transfer layer (8) and a cathode (4).

FIG. 3 shows a H-NMR spectrum of Compound A-2.

FIG. 4 shows a Mass spectrum of Compound A-2.

FIG. 5 shows a graph measuring a maximum emission wavelength and a full width at half maximum of Compound A-2.

DESCRIPTION OF REFERENCE NUMERALS

1: Substrate
2: Anode
3: Light Emitting Layer
4: Cathode
5: Hole Injection Layer
6: Hole Transfer Layer
7: Light Emitting Layer
8: Electron Transfer Layer

DETAILED DESCRIPTIONS

Hereinafter, the present specification will be described in more detail.

One embodiment of the present specification provides a compound represented by Chemical Formula 1. In the compound represented by Chemical Formula 1, a silyl group is bonded to the ring of A2 or B2, and a substituent (R4) which is not hydrogen and not a silyl group is bonded to B2, thereby a device having excellent efficiency and properties may be obtained when the compound is used in the device.

Specifically, a device having excellent efficiency and lifetime may be obtained when introducing a silyl group to a specific position as in the compound represented by Chemical Formula 1 of the present application. However, it is identified in experimental examples to describe later that further improvements in the efficiency and the lifetime are insignificant even when two or more silyl groups are introduced into the compound. In addition, by the silyl group being substituted with two or more aryl groups, the compound is, as well as having increased electrical and chemical stability, capable of minimizing intermolecular interactions by increasing a steric structure of the molecule. Accordingly, when using the compound of Chemical Formula 1 in a light emitting layer of a device, further improvements in the efficiency may be accomplished by increasing a distance between a host and a dopant, and a device having superior efficiency may be obtained.

In the present specification, a certain part "including" certain constituents means capable of further including other constituents, and does not exclude other constituents unless particularly stated on the contrary.

In the present specification, one member being placed "on" another member comprises not only a case of the one member being in contact with the another member but a case of still another member being present between the two members.

Examples of substituents in the present specification are described below, however, the substituents are not limited thereto.

The term "substitution" means a hydrogen atom bonding to a carbon atom of a compound being changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one, two or more substituents selected from the group consisting of deuterium; a halogen group; a cyano group (—CN); a nitro group; a hydroxyl group; an alkyl group; an alkenyl group; an alkynyl group; an alkoxy group; an aryloxy group; a cycloalkyl group; an aryl group; an amine group; and a heterocyclic group, or being substituted with a substituent linking two or more substituents among the substituents illustrated above, or having no substituents.

According to one embodiment, the term "substituted or unsubstituted" in the present specification means being substituted with one, two or more substituents selected from the group consisting of deuterium; a halogen group; a cyano group; an alkyl group; an aryl group; an amine group; and a heterocyclic group comprising one or more heteroatoms selected from the group consisting of O, S, N and Si, or being substituted with a substituent linking two or more substituents among the substituents illustrated above, or having no substituents.

Examples of the substituents are described below, however, the substituents are not limited thereto.

In the present specification, examples of the halogen group may comprise fluorine (—F), chlorine (—Cl), bromine (—Br) or iodine (—I).

In the present specification, the alkyl group comprises linear or branched, and although not particularly limited thereto, the number of carbon atoms is from 1 to 60, 1 to 30, or 1 to 20. Specific examples of the alkyl group may comprise a methyl group, an ethyl group, a propyl group, a butyl group, a pentyl group, a hexyl group, a heptyl group, an octyl group, a nonyl group and the like, and the alkyl group may be linear or branched, and according to one example, the propyl group comprises an n-propyl group and an isopropyl group, and the butyl group comprises an n-butyl group, an isobutyl group and a tert-butyl group.

In the present specification, the number of carbon atoms of the cycloalkyl group is not particularly limited, but is preferably from 3 to 60, 3 to 30, or 3 to 20. Specific examples thereof may comprise a cyclopropyl group, a cyclobutyl group, a cyclopentyl group, a cyclohexyl group, a cycloheptyl group, a cyclooctyl group and the like, but are not limited thereto.

In the present specification, the descriptions on the alkyl group provided above may be applied to the alkyl group of the alkoxy group.

In the present specification, the aryl group may be a monocyclic aryl group or a polycyclic aryl group, and although not particularly limited thereto, the number of carbon atoms is preferably from 6 to 60, 6 to 30, or 6 to 20. Examples of the monocyclic aryl group may comprise a phenyl group, a biphenyl group, a terphenyl group, a quaterphenyl group and the like, but are not limited thereto.

Examples of the polycyclic aryl group may comprise a naphthyl group, an anthracenyl group, a phenanthrenyl group, a pyrenyl group, a perylenyl group, a triphenyl group, a chrysenyl group, a fluorenyl group, a fluoranthenyl group, a triphenylenyl group and the like, but are not limited thereto.

In the present specification, the No. 9 carbon atom (C) of the fluorenyl group may be substituted with an alkyl group, an aryl group or the like, and two substituents may bond to each other to form cyclopentane, or a spiro structure such as fluorene.

In the present specification, the descriptions on the aryl group provided above may be applied to the aryl group of the aryloxy group.

In the present specification, the amine group may be represented by —NRaRb, and Ra and Rb may each be hydrogen; a substituted or unsubstituted alkyl group; a substituted or unsubstituted aryl group; or a substituted or unsubstituted heteroaryl group, but are not limited thereto. The amine group may be, depending on the types of substituents (Ra, Rb) bonding thereto, selected from the group consisting of an alkylamine group, an alkylarylamine group, an arylamine group, a heteroarylamine group, an alkylheteroarylamine group and an arylheteroarylamine group.

In the present specification, the alkylamine group means an amine group substituted with an alkyl group, and although not particularly limited thereto, the number of carbon atoms may be from 1 to 40, or 1 to 20. Specific examples of the alkylamine group may comprise a methylamine group, a dimethylamine group, an ethylamine group, a diethylamine group and the like, but are not limited thereto.

In the present specification, examples of the arylamine group may comprise a substituted or unsubstituted monoarylamine group, and a substituted or unsubstituted diarylamine group. The aryl group in the arylamine group may be a monocyclic or polycyclic aryl group. Specific examples of the arylamine group may comprise a phenylamine group, a naphthylamine group, a biphenylamine group, an anthracenylamine group, a diphenylamine group, a phenylnaphthylamine group and the like, but are not limited thereto.

In the present specification, examples of the heteroarylamine group may comprise a substituted or unsubstituted monoheteroarylamine group, a substituted or unsubstituted diheteroarylamine group.

In the present specification, the heterocyclic group is a cyclic group comprising one or more heteroatom selected from the group consisting of N, O, S and Si, and although not particularly limited thereto, the number of carbon atoms is from 2 to 60, or 2 to 30. Examples of the heterocyclic group may comprise a pyridyl group; a quinoline group; a thiophene group; a dibenzothiophene group; a furan group; a dibenzofuran group; a naphthobenzofuran group; a carbazole group; a benzocarbazole group; a naphthobenzothiophene group and the like, but are not limited thereto.

In the present specification, the descriptions on the heterocyclic group provided above may be applied to the heteroaryl group except for being aromatic.

In the present specification, the hydrocarbon ring may be aromatic, aliphatic, or a fused ring of aromatic and aliphatic, and the descriptions on the aryl group provided above may be applied to the aromatic a hydrocarbon ring except for those that are not monovalent, and the descriptions on the cycloalkyl group provided above may be applied to the aliphatic hydrocarbon ring except for those that are not monovalent.

According to one embodiment of the present specification, m1 and m2 are each 0 or 1, and m1+m2 is 1.

According to another embodiment, m1 is 1, and m2 is 0.

According to another embodiment, m1 is 0, and m2 is 1.

According to one embodiment of the present specification, the compound of Chemical Formula 1 is represented by the following Chemical Formula 2 or 3.

[Chemical Formula 2]

[Chemical Formula 3]

In Chemical Formulae 2 and 3,

A1, A2, A3, B1, B2, R1 to R5, n1 to n5 and Ar1 to Ar6 are the same as defined in Chemical Formula 1.

According to one embodiment of the present specification, A1, A2, A3, B1 and B2 are the same as or different from each other, and each independently a hydrocarbon ring having 6 to 30 carbon atoms.

In another embodiment, A1, A2, A3, B1 and B2 are the same as or different from each other, and each independently an aromatic hydrocarbon ring having 6 to 30 carbon atoms.

In another embodiment, A1, A2, A3, B1 and B2 are the same as or different from each other, and each independently a benzene ring or a naphthalene ring.

According to one embodiment of the present specification, the compound of Chemical Formula 1 is represented by the following Chemical Formula 4.

[Chemical Formula 4]

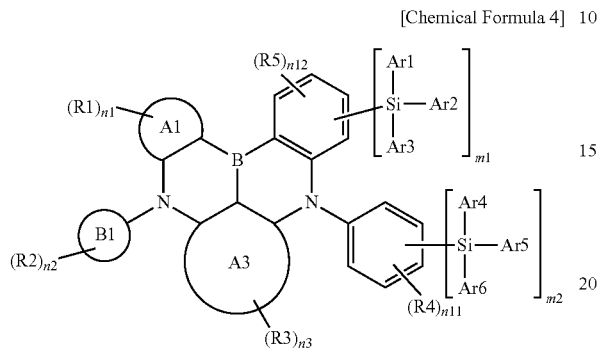

In Chemical Formula 4,

A1, A3, B1, R1 to R5, n1 to n3, Ar1 to Ar6, m1 and m2 are the same as defined in Chemical Formula 1, and n11 is an integer of 1 to 5, n12 is an integer of 0 to 4, and the two or more substituents in the parentheses are the same as or different from each other when n11 and n12 are each 2 or greater.

In one embodiment of the present specification, the compound of Chemical Formula 1 is represented by the following Chemical Formula 5.

[Chemical Formula 5]

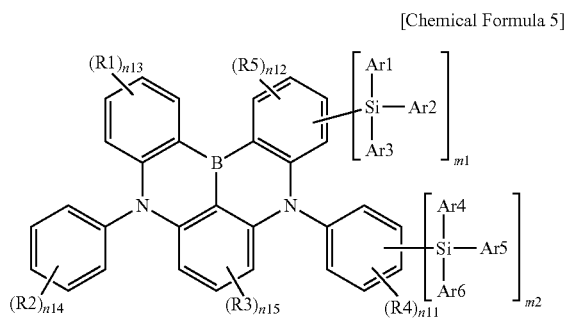

In Chemical Formula 5,

R1 to R5, Ar1 to Ar6, m1 and m2 are the same as defined in Chemical Formula 1, and n11 is an integer of 1 to 5, n14 is an integer of 0 to 5, n12 and n13 are each an integer of 0 to 4, n15 is an integer of 0 to 3, and the two or more substituents in the parentheses are the same as or different from each other when n11 to n15 are each 2 or greater.

According to one embodiment of the present specification, the compound of Chemical Formula 1 is represented by the following Chemical Formula 5-1.

[Chemical Formula 5-1]

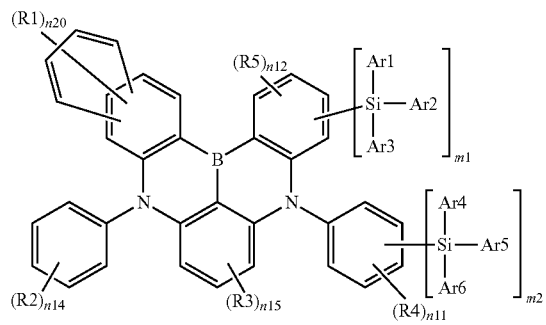

In Chemical Formula 5-1,

R1 to R5, Ar1 to Ar6, m1 and m2 are the same as defined in Chemical Formula 1, and n11 is an integer of 1 to 5, n14 is an integer of 0 to 5, n12 is an integer of 0 to 4, n15 is an integer of 0 to 3, n20 is an integer of 0 to 6, and the two or more substituents in the parentheses are the same as or different from each other when n11, n12, n14, n15 and n20 are each 2 or greater.

According to one embodiment of the present specification, the compound of Chemical Formula 1 is represented by the following Chemical Formula 6 or 7.

[Chemical Formula 6]

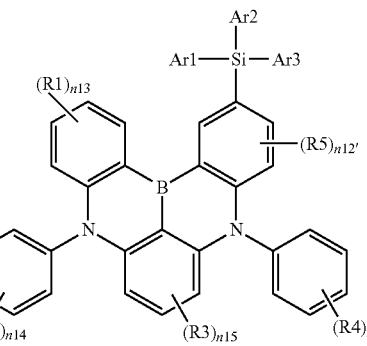

[Chemical Formula 7]

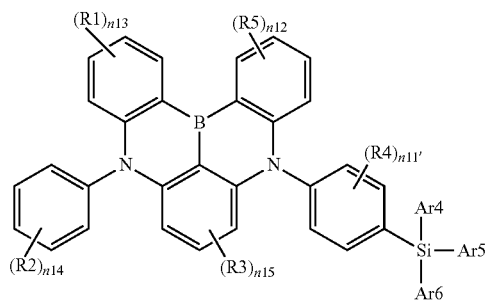

In Chemical Formulae 6 and 7,

R1 to R5 and Ar1 to Ar6 are the same as defined in Chemical Formula 1, and n11 is an integer of 1 to 5, n14 is an integer of 0 to 5, n12 and n13 are each an integer of 0 to 4, n15 and n12' are each an integer of 0 to 3, n11' is an integer of 1 to 4, and the two or more substituents in the parentheses are the same as or different from each other when n11 to n15, n11' and n12' are each 2 or greater.

According to one embodiment of the present specification, R1 to R3 and R5 are the same as or different from each other, and each independently hydrogen; deuterium; a halogen group; a cyano group; a substituted or unsubstituted linear or branched alkyl group having 1 to 40 carbon atoms; a substituted or unsubstituted arylamine group having 6 to 60 carbon atoms; a substituted or unsubstituted aryl group having 6 to 60 carbon atoms; or a substituted or unsubstituted heterocyclic group having 2 to 60 carbon atoms and comprising one or more heteroatoms selected from the group consisting of O, S, N and Si.

According to another embodiment, R1 to R3 and R5 are the same as or different from each other, and each independently hydrogen; deuterium; a halogen group; a cyano group; a substituted or unsubstituted linear or branched alkyl group having 1 to 20 carbon atoms; a substituted or unsubstituted arylamine group having 6 to 30 carbon atoms; a substituted or unsubstituted aryl group having 6 to 30 carbon atoms; or a substituted or unsubstituted heterocyclic group having 2 to 30 carbon atoms and comprising one or more heteroatoms selected from the group consisting of O, S, N and Si.

According to one embodiment of the present specification, R1 is hydrogen; a halogen group; a substituted or unsubstituted linear or branched alkyl group having 1 to 20 carbon atoms; a substituted or unsubstituted arylamine group having 6 to 30 carbon atoms; or a substituted or unsubstituted aryl group having 6 to 30 carbon atoms.

According to another embodiment, R1 is hydrogen; a halogen group; a linear or branched alkyl group having 1 to 20 carbon atoms unsubstituted or substituted with deuterium; an arylamine group having 6 to 30 carbon atoms; or an aryl group having 6 to 30 carbon atoms unsubstituted or substituted with a linear or branched alkyl group having 1 to 20 carbon atoms.

In another embodiment, R1 is hydrogen; a halogen group; a substituted or unsubstituted methyl group; a substituted or unsubstituted propyl group; a substituted or unsubstituted butyl group; a substituted or unsubstituted diphenylamine group; or a substituted or unsubstituted phenyl group.

According to another embodiment, R1 is hydrogen; a halogen group; a methyl group unsubstituted or substituted with deuterium; a propyl group; a butyl group; a diphenylamine group; or a phenyl group unsubstituted or substituted with a methyl group.

According to one embodiment of the present specification, R2 is hydrogen; a halogen group; a substituted or unsubstituted linear or branched alkyl group having 1 to 20 carbon atoms; or a substituted or unsubstituted aryl group having 6 to 30 carbon atoms.

According to another embodiment, R2 is hydrogen; a halogen group; a linear or branched alkyl group having 1 to 20 carbon atoms unsubstituted or substituted with deuterium; or an aryl group having 6 to 30 carbon atoms unsubstituted or substituted with a linear or branched alkyl group having 1 to 20 carbon atoms.

In another embodiment, R2 is hydrogen; a halogen group; a substituted or unsubstituted methyl group; a substituted or unsubstituted propyl group; a substituted or unsubstituted butyl group; or a substituted or unsubstituted phenyl group.

According to another embodiment, R2 is hydrogen; a halogen group; a methyl group unsubstituted or substituted with deuterium; a propyl group; a butyl group; or a phenyl group unsubstituted or substituted with a methyl group.

According to one embodiment of the present specification, R3 is hydrogen; a substituted or unsubstituted linear or branched alkyl group having 1 to 20 carbon atoms; a substituted or unsubstituted arylamine group having 6 to 30 carbon atoms; a substituted or unsubstituted aryl group having 6 to 30 carbon atoms; or a substituted or unsubstituted heteroaryl group having 2 to 30 carbon atoms.

According to another embodiment, R3 is hydrogen; a linear or branched alkyl group having 1 to 20 carbon atoms unsubstituted or substituted with deuterium; an arylamine group having 6 to 30 carbon atoms unsubstituted or substituted with a linear or branched alkyl group having 1 to 20 carbon atoms; an aryl group having 6 to 30 carbon atoms unsubstituted or substituted with deuterium or a halogen group; or a heteroaryl group having 2 to 30 carbon atoms.

In another embodiment, R3 is hydrogen; a substituted or unsubstituted methyl group; a substituted or unsubstituted butyl group; a substituted or unsubstituted diphenylamine group; a substituted or unsubstituted phenyl group; a substituted or unsubstituted naphthyl group; or a substituted or unsubstituted carbazole group.

According to another embodiment, R3 is hydrogen; a methyl group unsubstituted or substituted with deuterium; a tert-butyl group; a diphenylamine group unsubstituted or substituted with a propyl group; a phenyl group unsubstituted or substituted with deuterium or a halogen group; a naphthyl group; or a carbazole group.

According to one embodiment of the present specification, R5 is hydrogen; a substituted or unsubstituted linear or branched alkyl group having 1 to 20 carbon atoms; or a substituted or unsubstituted aryl group having 6 to 30 carbon atoms.

In another embodiment, R5 is hydrogen; a linear or branched alkyl group having 1 to 20 carbon atoms unsubstituted or substituted with deuterium; or an aryl group having 6 to 30 carbon atoms.

According to another embodiment, R5 is hydrogen; a substituted or unsubstituted methyl group; a substituted or unsubstituted butyl group; or a substituted or unsubstituted phenyl group.

In another embodiment, R5 is hydrogen; a methyl group unsubstituted or substituted with deuterium; a substituted or unsubstituted butyl group; or a substituted or unsubstituted phenyl group.

According to another embodiment, R5 is hydrogen; a methyl group unsubstituted or substituted with deuterium; a tert-butyl group; or a phenyl group.

In one embodiment of the present specification, R4 is deuterium; a halogen group; a cyano group; a substituted or unsubstituted linear or branched alkyl group having 1 to 40 carbon atoms; a substituted or unsubstituted alkenyl group having 2 to 40 carbon atoms; a substituted or unsubstituted alkynyl group having 2 to 40 carbon atoms; a substituted or unsubstituted alkoxy group having 1 to 40 carbon atoms; a substituted or unsubstituted cycloalkyl group having 3 to 60 carbon atoms; a substituted or unsubstituted amine group having 6 to 60 carbon atoms; a substituted or unsubstituted aryl group having 6 to 60 carbon atoms; a substituted or unsubstituted aryloxy group having 6 to 60 carbon atoms; or a substituted or unsubstituted heterocyclic group having 2 to 60 carbon atoms and comprising one or more heteroatoms selected from the group consisting of O, S, N and Si.

In another embodiment, R4 is deuterium; a halogen group; a cyano group; a substituted or unsubstituted linear or branched alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted cycloalkyl group having 3 to 30 carbon atoms; a substituted or unsubstituted amine group having 6 to 30 carbon atoms; a substituted or unsubstituted aryl group having 6 to 30 carbon atoms; a substituted or unsubstituted aryloxy group having 6 to 30 carbon atoms; or a substituted or unsubstituted heterocyclic group having 2 to 30 carbon atoms and comprising one or more heteroatoms selected from the group consisting of O, S, N and Si.

According to another embodiment, R4 is deuterium; a halogen group; a substituted or unsubstituted linear or branched alkyl group having 1 to 20 carbon atoms; a substituted or unsubstituted aryl group having 6 to 30 carbon atoms; or a substituted or unsubstituted heterocyclic group having 2 to 30 carbon atoms and comprising one or more heteroatoms selected from the group consisting of O, S, N and Si.

In another embodiment, R4 is a halogen group; a linear or branched alkyl group having 1 to 20 carbon atoms unsubstituted or substituted with deuterium; an aryl group having 6 to 30 carbon atoms unsubstituted or substituted with deuterium, a halogen group, a cyano group, or an alkyl group having 1 to 20 carbon atoms unsubstituted or substituted with deuterium; or a heterocyclic group having 2 to 30 carbon atoms and comprising one or more heteroatoms selected from the group consisting of O, S, N and Si.

According to another embodiment, R4 is a halogen group; a substituted or unsubstituted methyl group; a substituted or unsubstituted ethyl group; a substituted or unsubstituted butyl group; a substituted or unsubstituted phenyl group; a substituted or unsubstituted naphthyl group; or a substituted or unsubstituted pyridyl group.

In another embodiment, R4 is a halogen group; a methyl group unsubstituted or substituted with deuterium; an ethyl group; a tert-butyl group; a phenyl group unsubstituted or substituted with deuterium, a halogen group, a cyano group, or a methyl group unsubstituted or substituted with deuterium; a naphthyl group; or a pyridyl group.

In another embodiment, n1 is an integer of 0 to 2, and when n1 is 2, the two R1s are the same as or different from each other.

According to another embodiment, n1 is 0 or 1.

In another embodiment, n2 is an integer of 0 to 2, and when n2 is 2, the two R2s are the same as or different from each other.

In another embodiment, n3 is an integer of 0 to 2, and when n3 is 2, the two R3s are the same as or different from each other.

According to another embodiment, n3 is 0 or 1.

According to another embodiment, n4 is an integer of 1 to 3, and when n4 is 2 or greater, the two or more R4s are the same as or different from each other.

In another embodiment, n5 is an integer of 0 to 2, and when n5 is 2, the two R5s are the same as or different from each other.

According to another embodiment, n5 is 0 or 1.

According to one embodiment of the present specification, the compound of Chemical Formula 6 is represented by any one of the following Chemical Formulae 6-1 to 6-5.

[Chemical Formula 6-1]

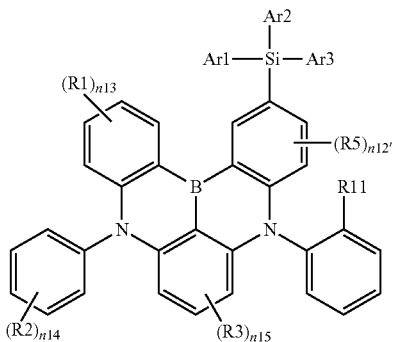

[Chemical Formula 6-2]

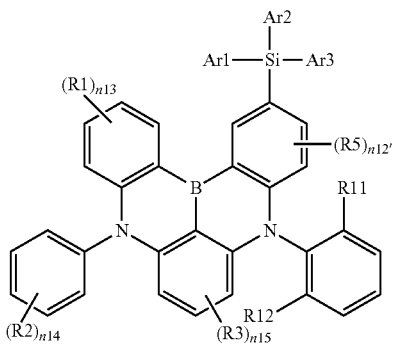

[Chemical Formula 6-3]

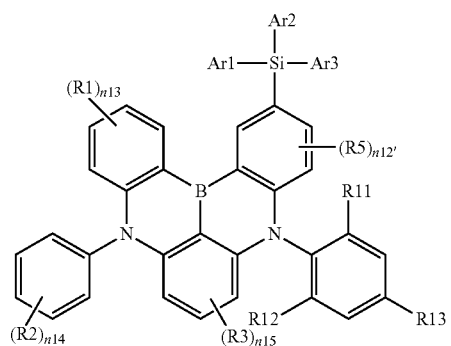

[Chemical Formula 6-4]

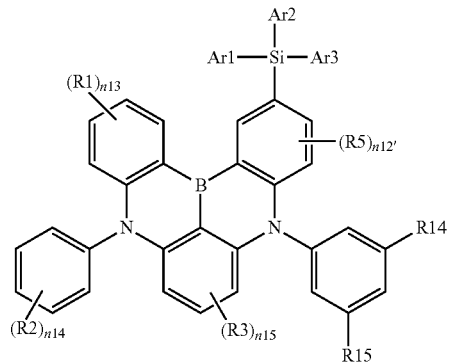

[Chemical Formula 6-5]

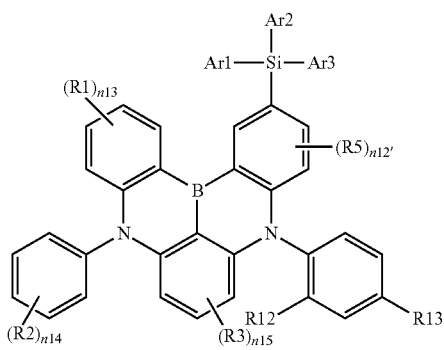

In Chemical Formulae 6-1 to 6-5, R1 to R3, R5, n13 to n15, n12' and Ar1 to Ar3 are the same as defined in Chemical Formula 6, and R11 to R15 are the same as or different from each other, and each independently deuterium; a halogen group; a cyano group; a substituted or unsubstituted alkyl group; a substituted or unsubstituted alkenyl group; a substituted or unsubstituted alkynyl group; a substituted or unsubstituted alkoxy group; a substituted or unsubstituted cycloalkyl group; a substituted or unsubstituted amine group; a substituted or unsubstituted aryl group; a substituted or unsubstituted aryloxy group; or a substituted or unsubstituted heterocyclic group.

According to one embodiment of the present specification, the descriptions on R4 provided above are applied to specific descriptions on R11 to R15.

According to one embodiment of the present specification, in Chemical Formulae 4 to 6, n11 is an integer of 1 to 3, and when n11 is 2 or greater, the two or more R4s are the same as or different from each other.

In one embodiment of the present specification, in Chemical Formula 6, n12' is an integer of 0 to 2, and when n12' is 2 or greater, the two or more R5s are the same as or different from each other.

According to one embodiment of the present specification, the compound of Chemical Formula 7 is represented by the following Chemical Formula 7-1 or 7-2.

[Chemical Formula 7-1]

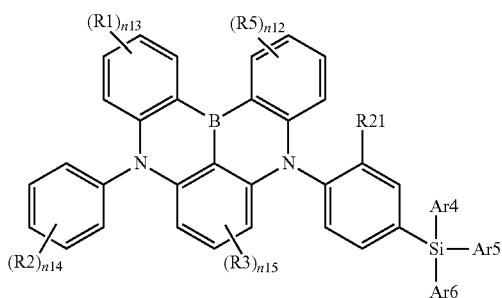

[Chemical Formula 7-2]

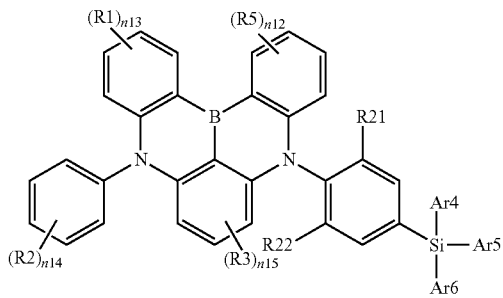

In Chemical Formulae 7-1 and 7-2,
R1 to R3, R5, n12 to n15, and Ar4 to Ar6 are the same as defined in Chemical Formula 7, and
R21 and R22 are the same as or different from each other, and each independently deuterium; a halogen group; a cyano group; a substituted or unsubstituted alkyl group; a substituted or unsubstituted alkenyl group; a substituted or unsubstituted alkynyl group; a substituted or unsubstituted alkoxy group; a substituted or unsubstituted cycloalkyl group; a substituted or unsubstituted amine group; a substituted or unsubstituted aryl group; a substituted or unsubstituted aryloxy group; or a substituted or unsubstituted heterocyclic group.

According to one embodiment of the present specification, the descriptions on R4 provided above are applied to specific descriptions on R21 and R22.

According to one embodiment of the present specification, in Chemical Formulae 4, 5 and 7, n12 is an integer of 0 to 2, and when n12 is 2, the two R5s are the same as or different from each other.

In one embodiment of the present specification, in Chemical Formula 7, n11' is an integer of 0 to 2, and when n11' is 2, the two R4s are the same as or different from each other.

According to one embodiment of the present specification, Ar1, Ar2, Ar4 and Ar5 are the same as or different from each other, and each independently a substituted or unsubstituted aryl group having 6 to 60 carbon atoms.

According to another embodiment, Ar1, Ar2, Ar4 and Ar5 are the same as or different from each other, and each independently an aryl group having 6 to 60 carbon atoms unsubstituted or substituted with an alkyl group having 1 to 20 carbon atoms.

In another embodiment, Ar1, Ar2, Ar4 and Ar5 are the same as or different from each other, and each independently a substituted or unsubstituted phenyl group.

According to another embodiment, Ar1, Ar2, Ar4 and Ar5 are the same as or different from each other, and each independently a phenyl group unsubstituted or substituted with an alkyl group having 1 to 20 carbon atoms.

In another embodiment, Ar1, Ar2, Ar4 and Ar5 are the same as or different from each other, and each independently a phenyl group unsubstituted or substituted with a methyl group.

According to one embodiment of the present specification, Ar3 and Ar6 are the same as or different from each other, and each independently a substituted or unsubstituted alkyl group having 1 to 40 carbon atoms; or a substituted or unsubstituted aryl group having 6 to 60 carbon atoms.

In another embodiment, Ar3 and Ar6 are the same as or different from each other, and each independently an alkyl group having 1 to 40 carbon atoms; or an aryl group having 6 to carbon atoms unsubstituted or substituted with an alkyl group having 1 to 20 carbon atoms.

According to another embodiment, Ar3 and Ar6 are the same as or different from each other, and each independently a substituted or unsubstituted butyl group; or a substituted or unsubstituted phenyl group.

In another embodiment, Ar3 and Ar6 are the same as or different from each other, and each independently a tert-butyl group; or a phenyl group unsubstituted or substituted with an alkyl group having 1 to 20 carbon atoms.

According to another embodiment, Ar3 and Ar6 are the same as or different from each other, and each independently a tert-butyl group; or a phenyl group unsubstituted or substituted with a methyl group.

According to one embodiment of the present specification, at least one of Ar1 to Ar3 is a substituted or unsubstituted alkyl group having 1 to 40 carbon atoms, and the rest are a substituted or unsubstituted aryl group having 6 to 60 carbon atoms.

According to another embodiment, at least one of Ar1 to Ar3 is a substituted or unsubstituted alkyl group having 1 to 20 carbon atoms, and the rest are a substituted or unsubstituted aryl group having 6 to 30 carbon atoms.

In another embodiment, at least one of Ar1 to Ar3 is an alkyl group having 1 to 20 carbon atoms, and the rest are an aryl group having 6 to 30 carbon atoms unsubstituted or substituted with an alkyl group having 1 to 20 carbon atoms.

According to another embodiment, at least one of Ar1 to Ar3 is a substituted or unsubstituted butyl group, and the rest are a phenyl group unsubstituted or substituted with an alkyl group having 1 to 20 carbon atoms.

According to one embodiment of the present specification, at least one of Ar4 to Ar6 is a substituted or unsubstituted alkyl group having 1 to 40 carbon atoms, and the rest are a substituted or unsubstituted aryl group having 6 to 60 carbon atoms.

According to another embodiment, at least one of Ar4 to Ar6 is a substituted or unsubstituted alkyl group having 1 to carbon atoms, and the rest are a substituted or unsubstituted aryl group having 6 to 30 carbon atoms.

In another embodiment, at least one of Ar4 to Ar6 is an alkyl group having 1 to 20 carbon atoms, and the rest are an aryl group having 6 to 30 carbon atoms unsubstituted or substituted with an alkyl group having 1 to 20 carbon atoms.

According to another embodiment, at least one of Ar4 to Ar6 is a substituted or unsubstituted butyl group, and the rest are a phenyl group unsubstituted or substituted with an alkyl group having 1 to 20 carbon atoms.

According to one embodiment of the present specification, the compound represented by Chemical Formula 1 is represented by any one of the following compounds.

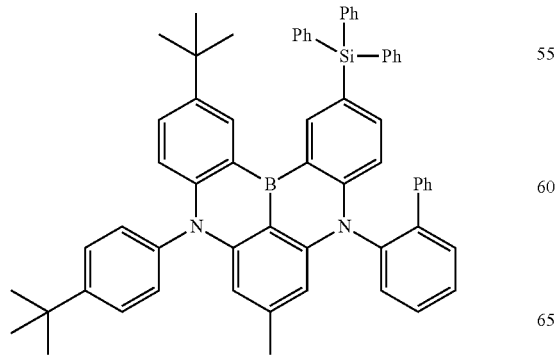

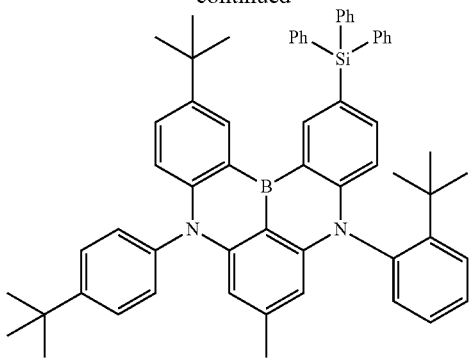

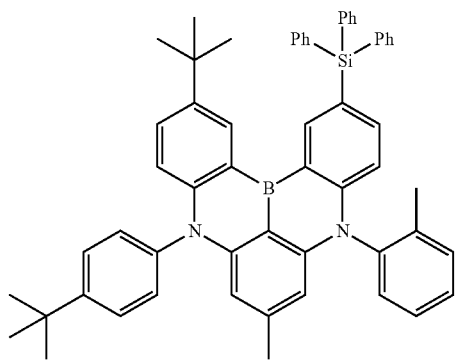

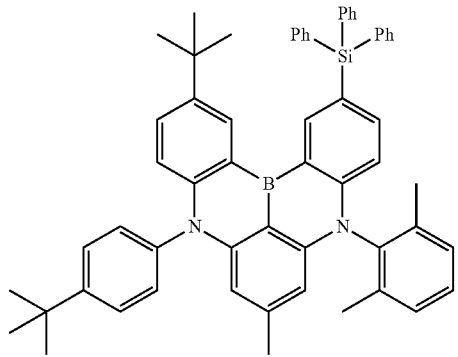

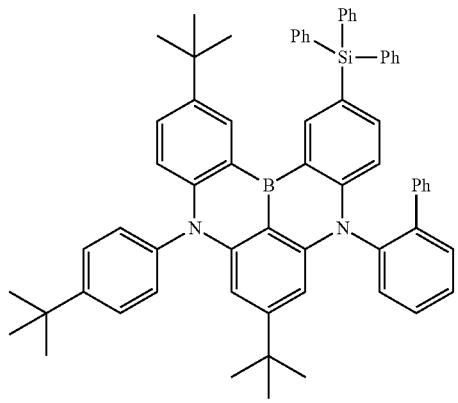

17
-continued
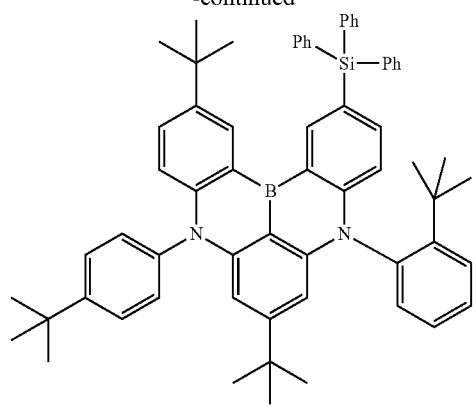
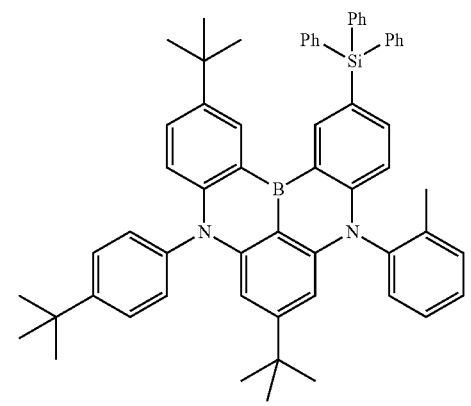
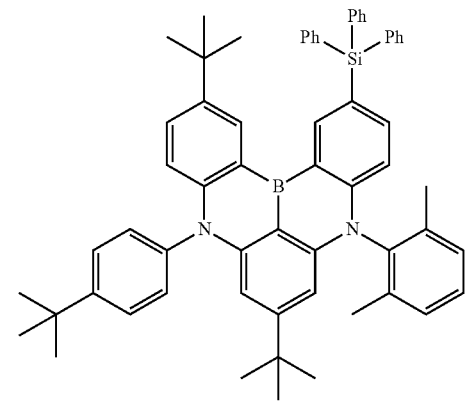
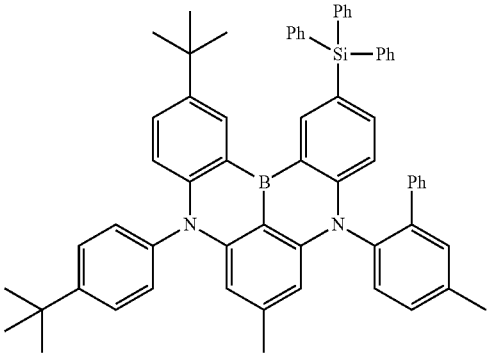
18
-continued
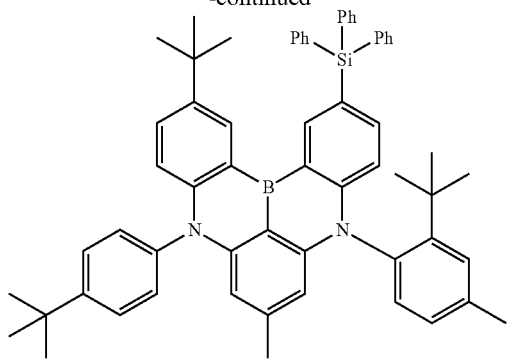
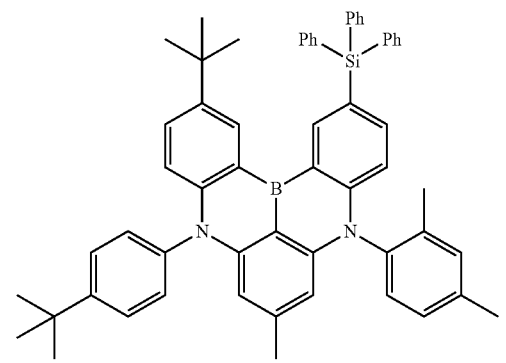
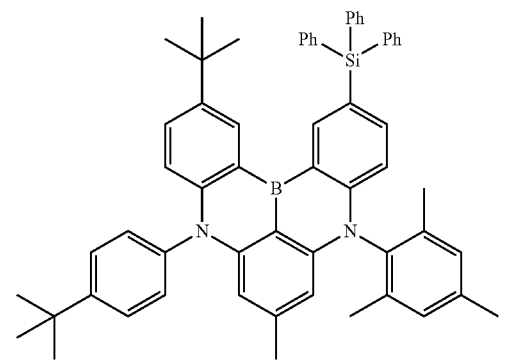
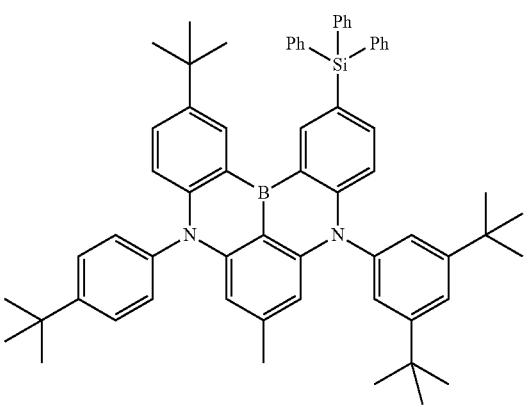

-continued
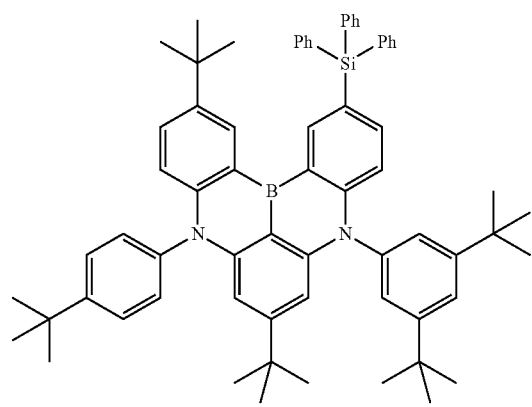
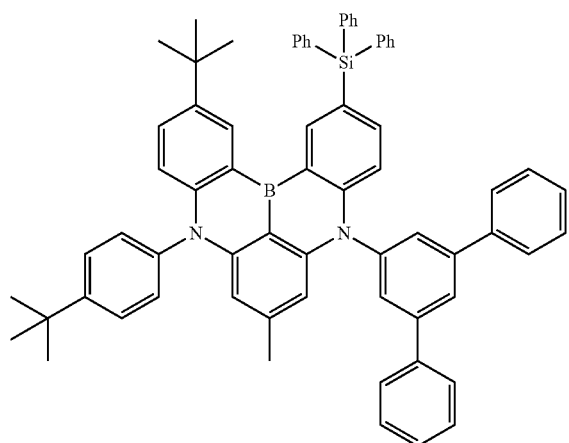
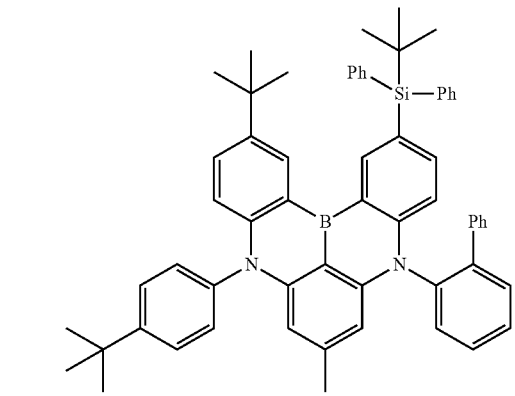
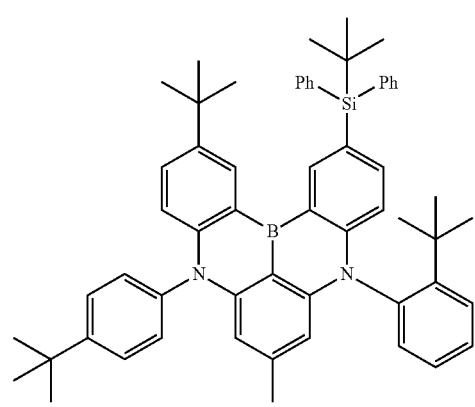
-continued
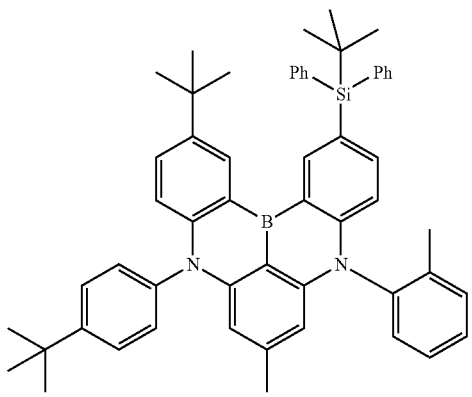
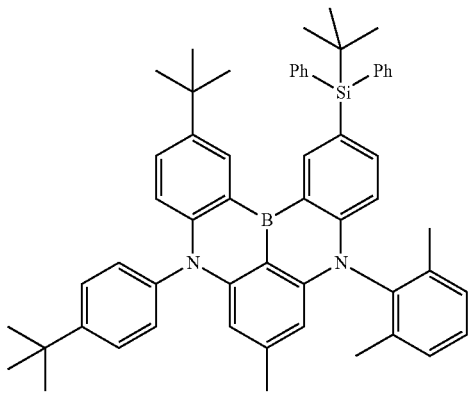
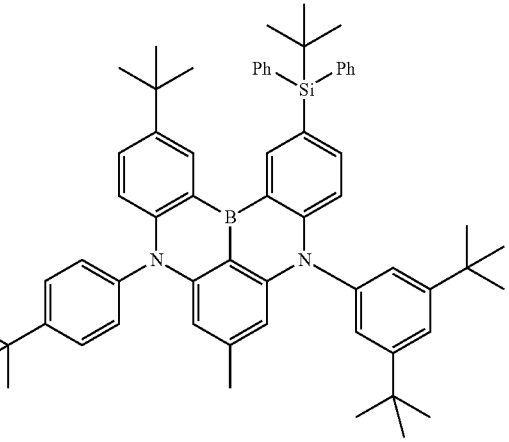
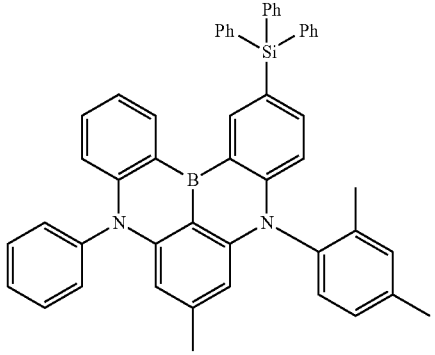

-continued
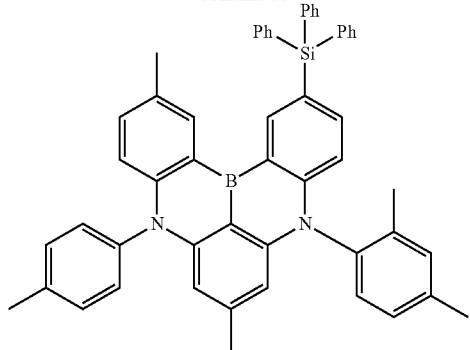
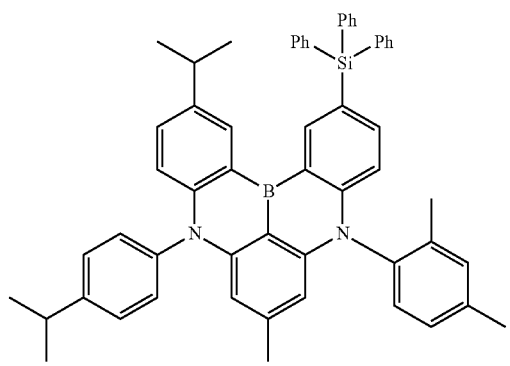
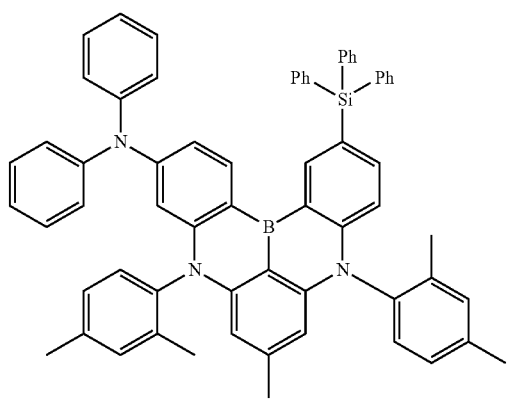
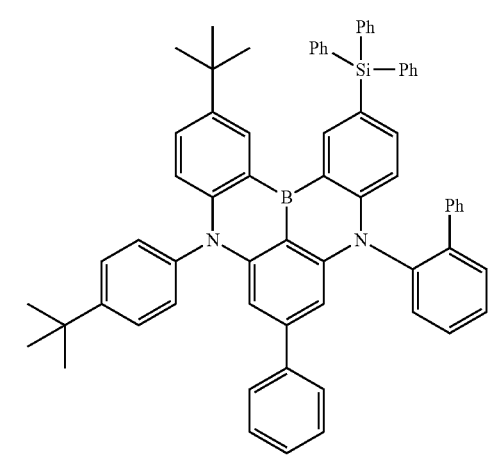
-continued
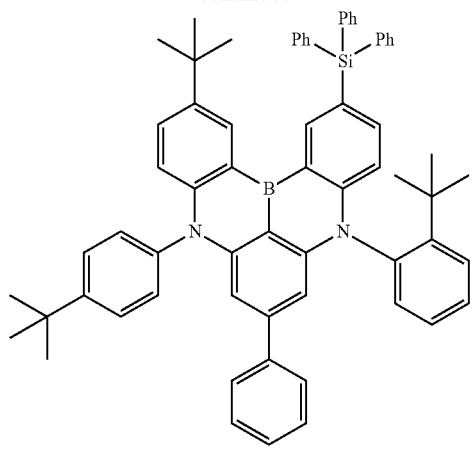
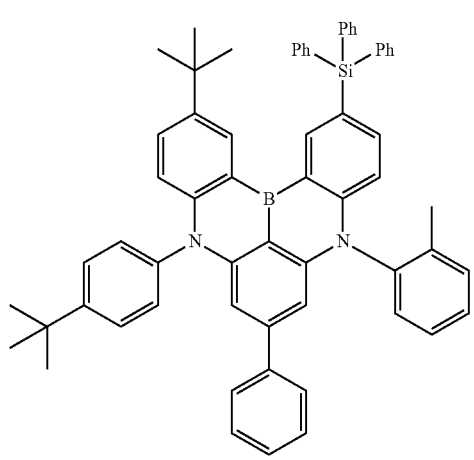
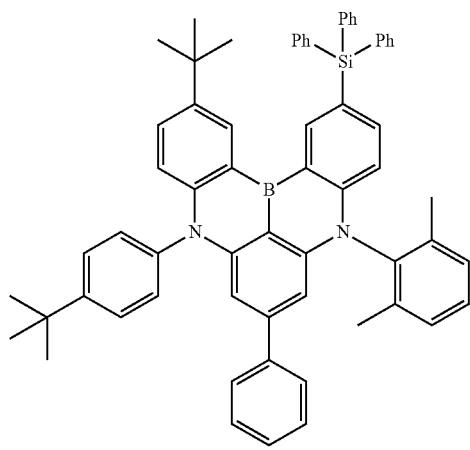

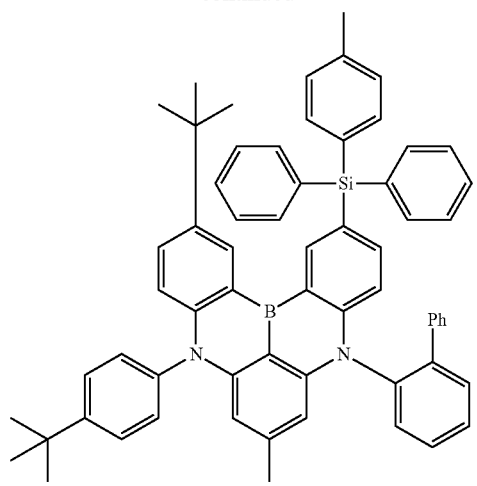
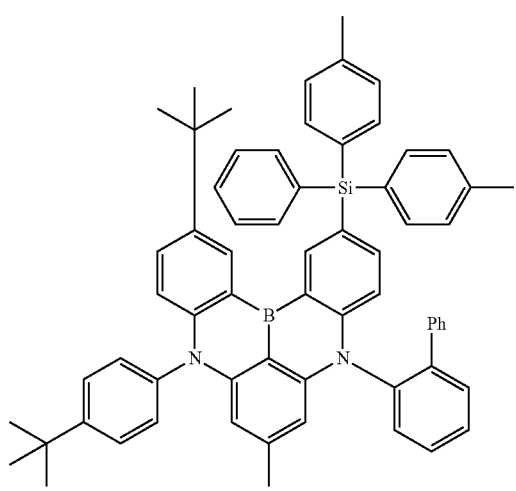
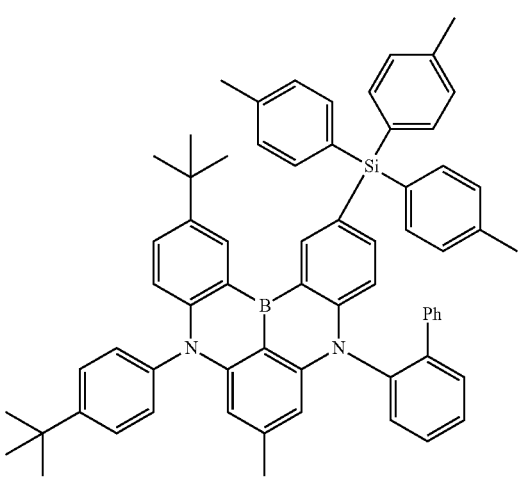
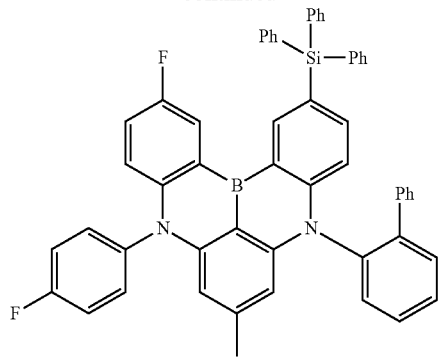
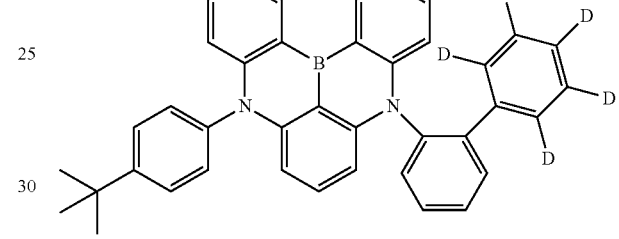
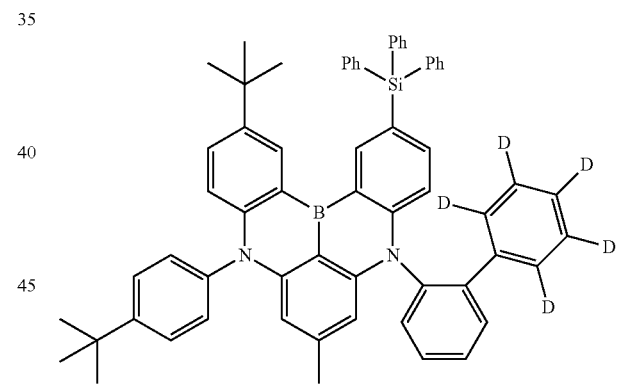
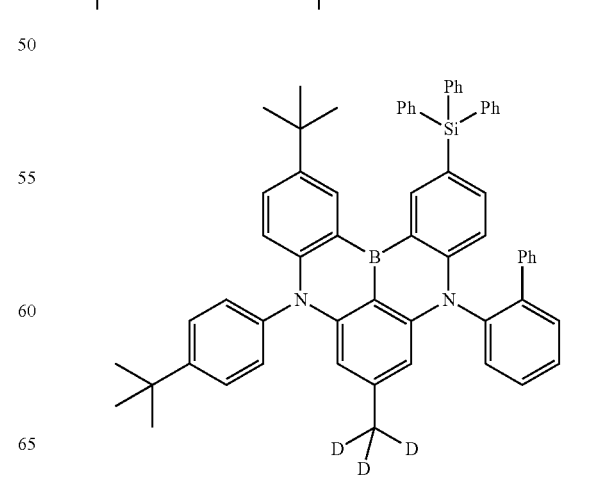

25
-continued
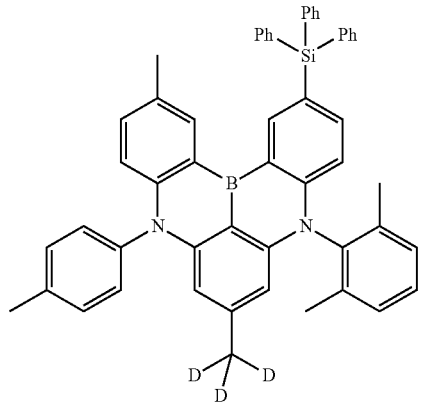
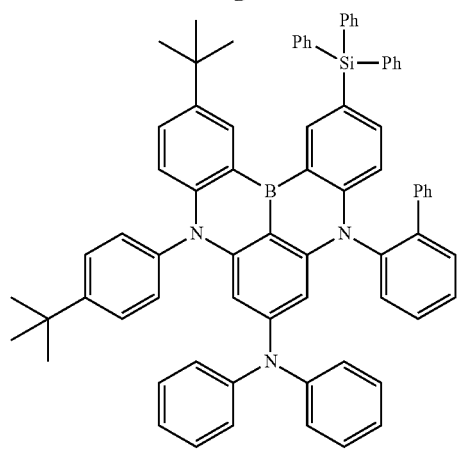
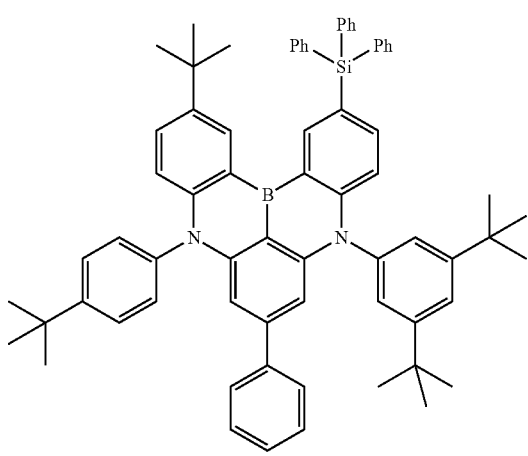
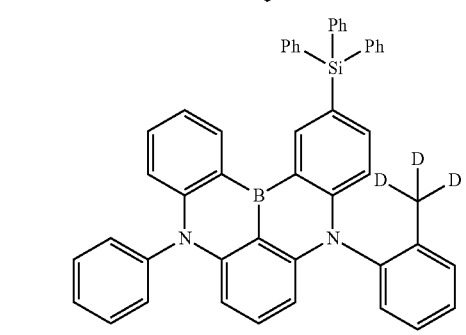
26
-continued
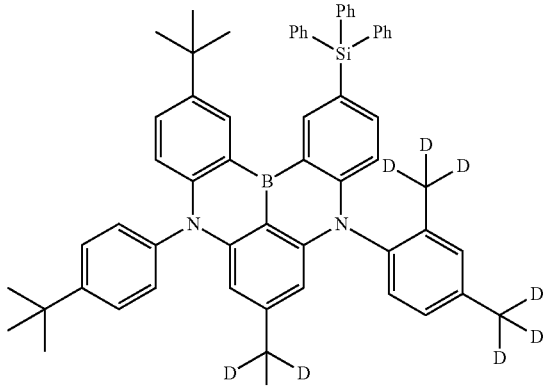
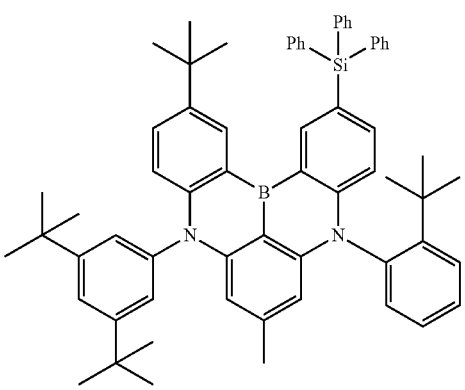
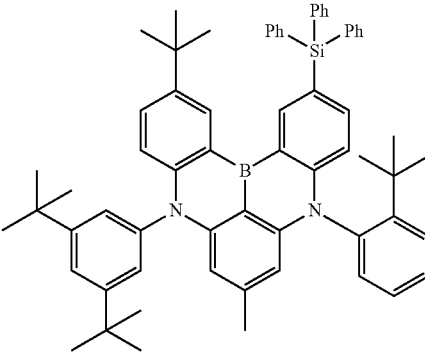
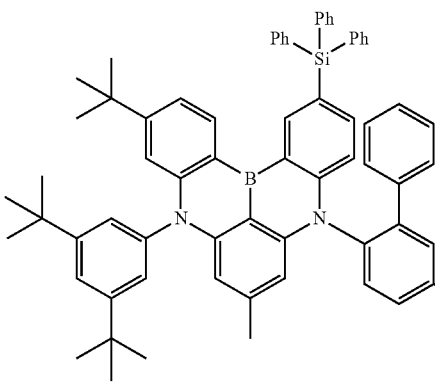

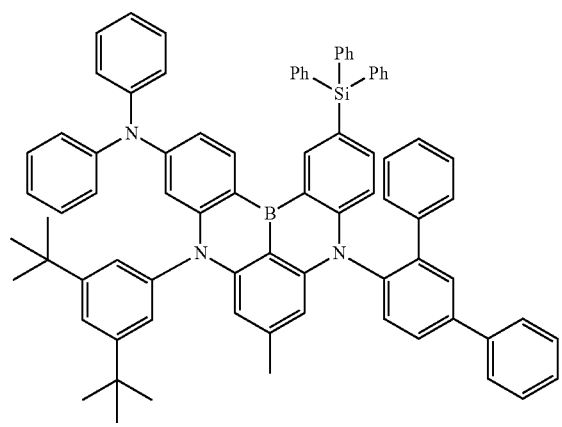
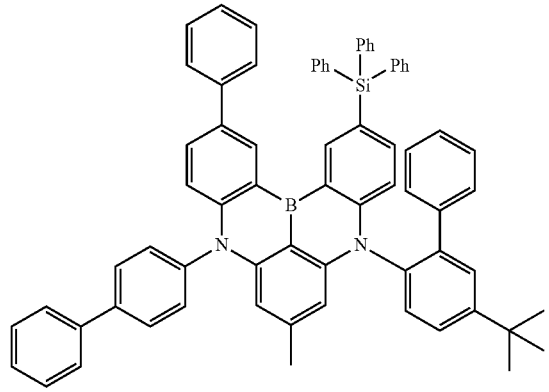
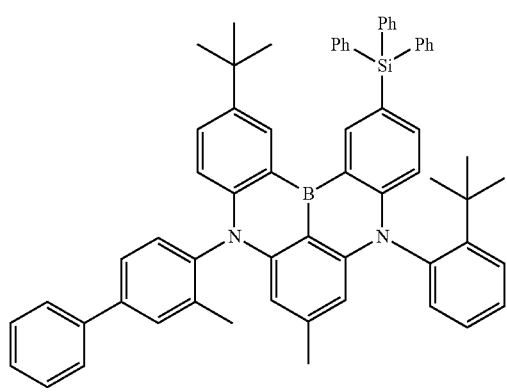
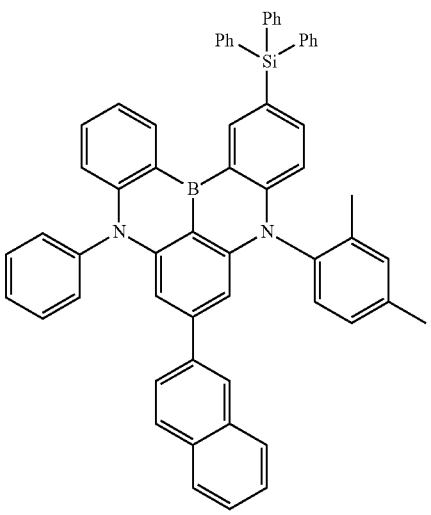
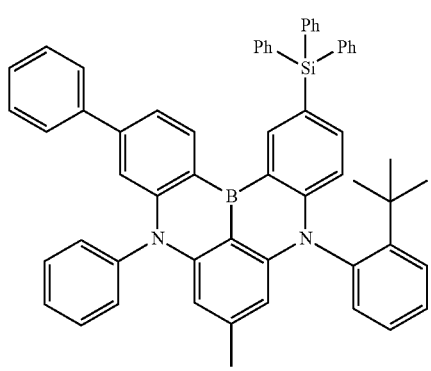
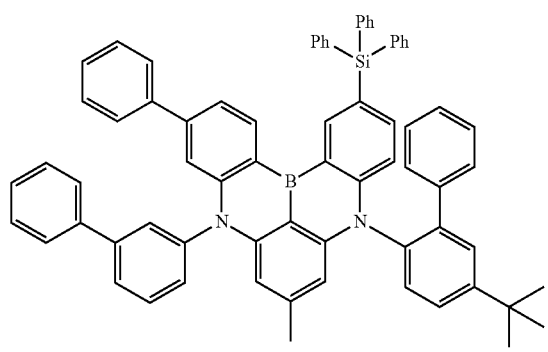
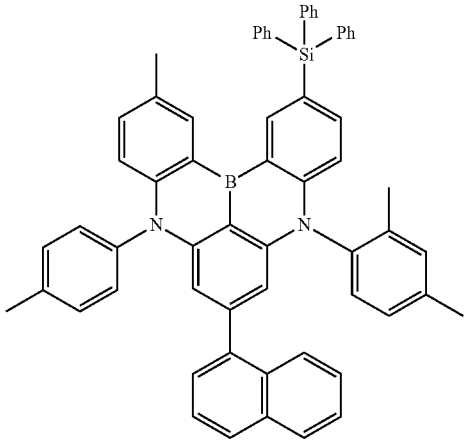

29
-continued
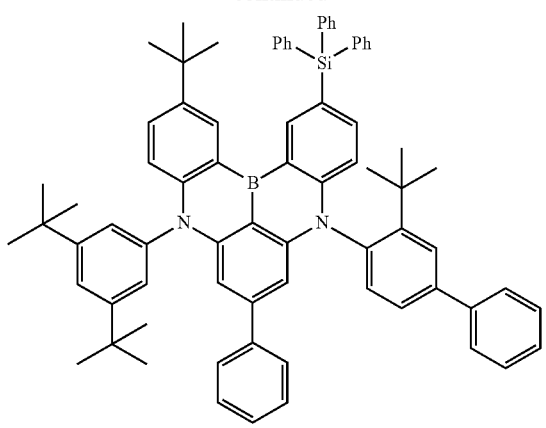
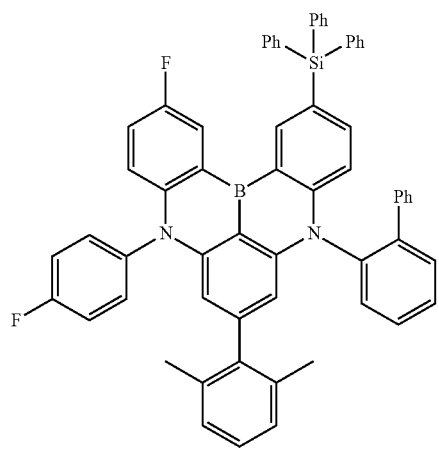
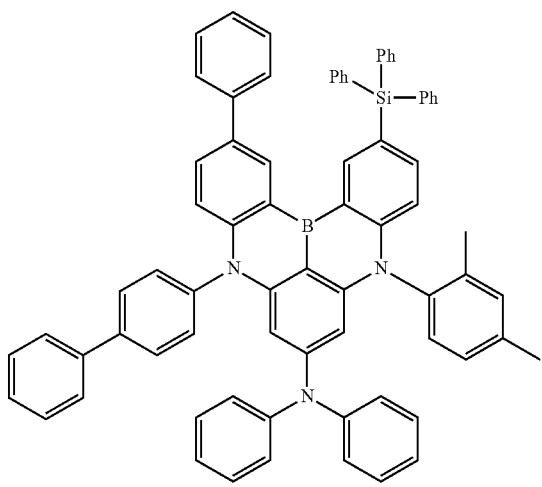
30
-continued
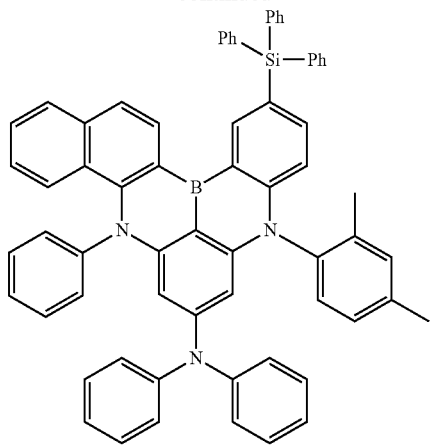
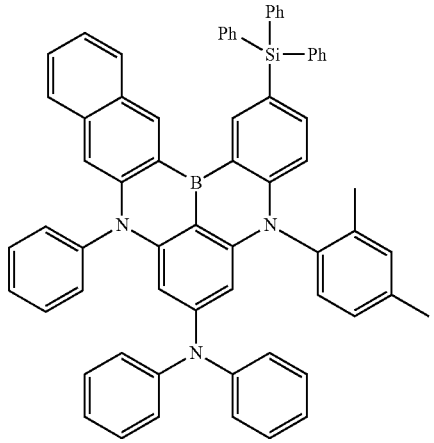
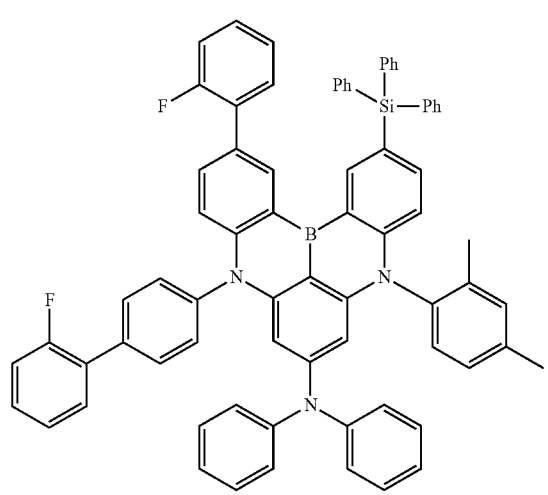

31
-continued
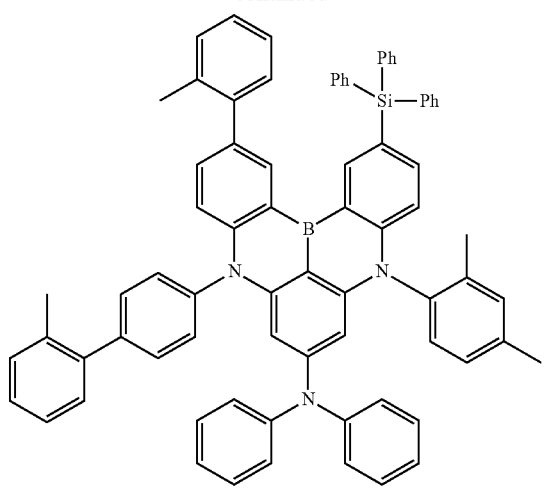
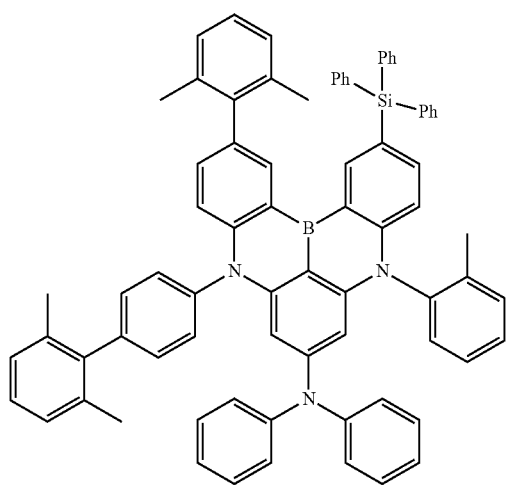
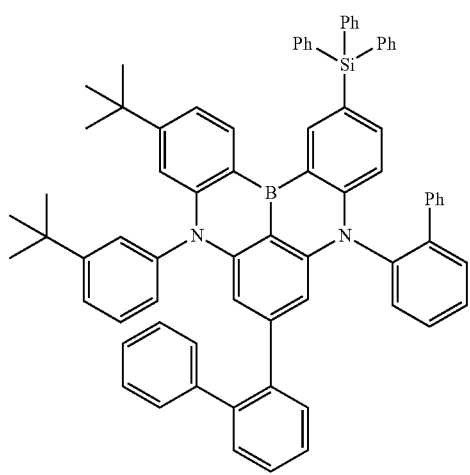
32
-continued
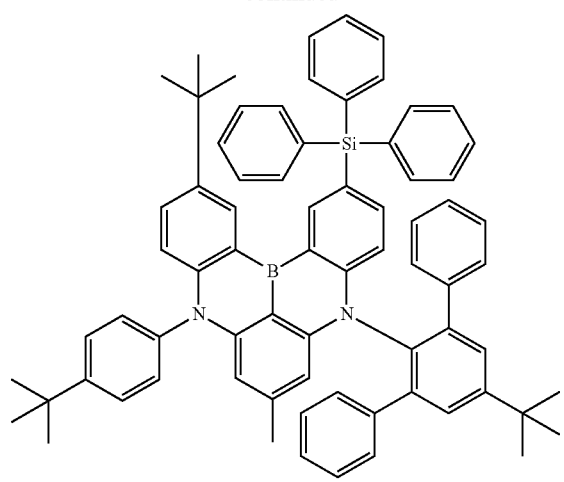
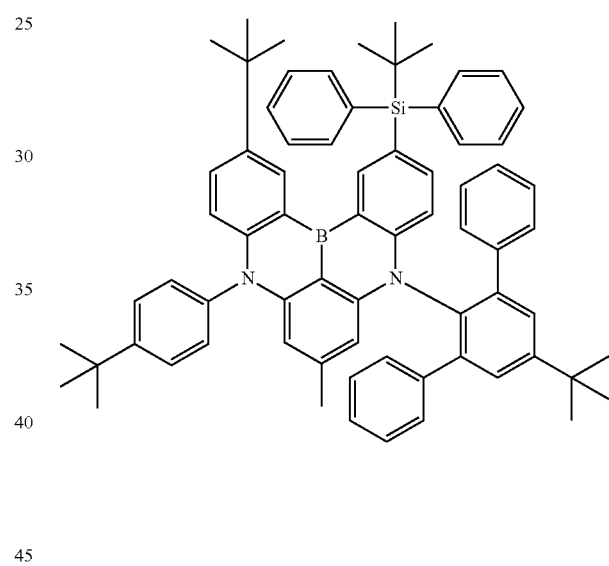
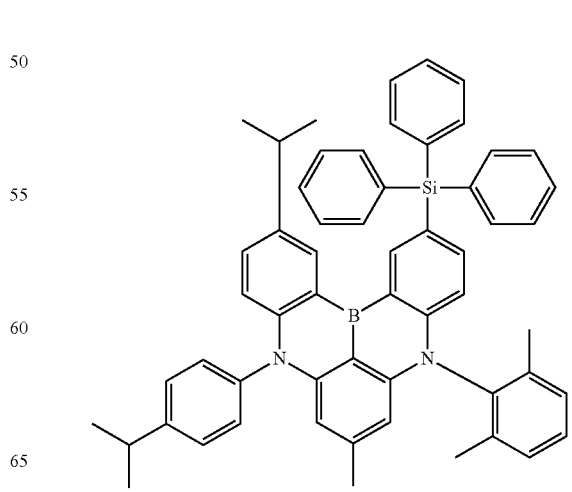

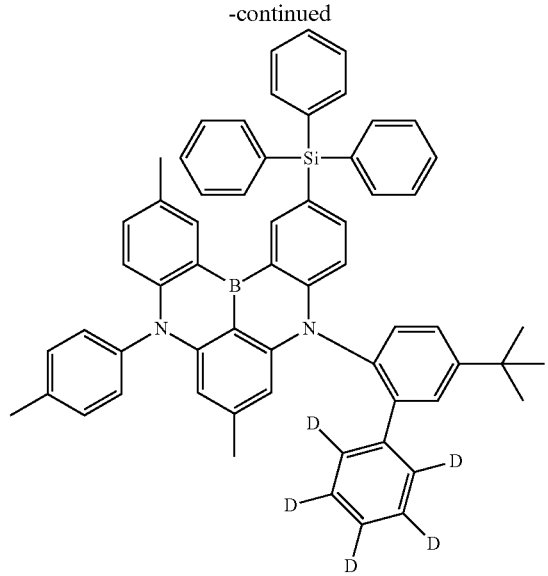
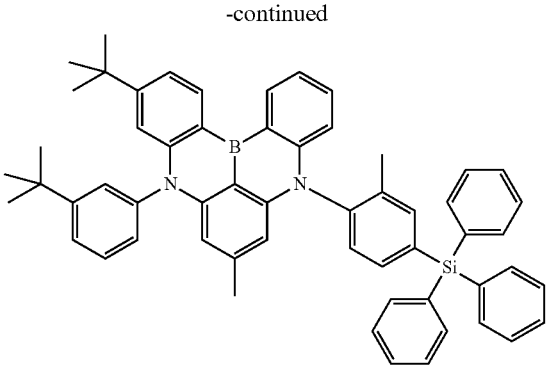
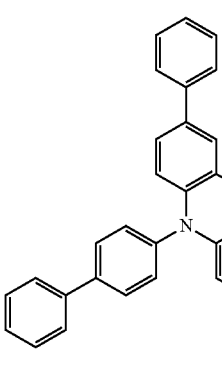
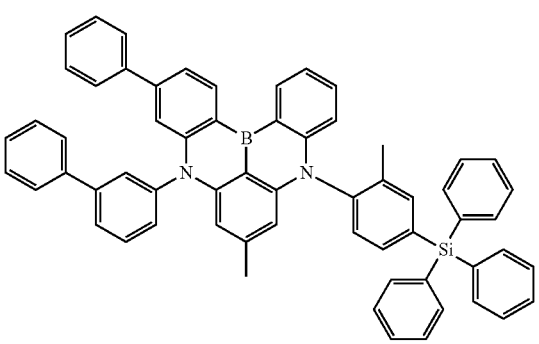
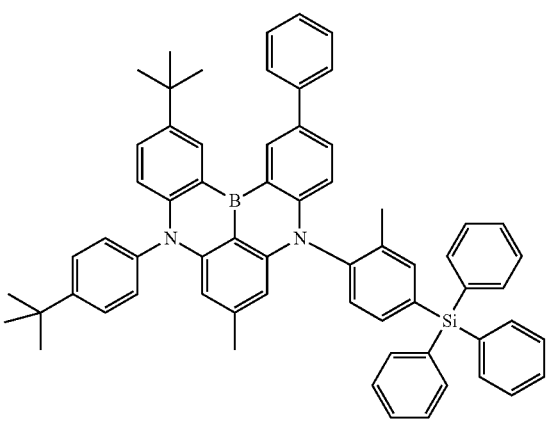

-continued
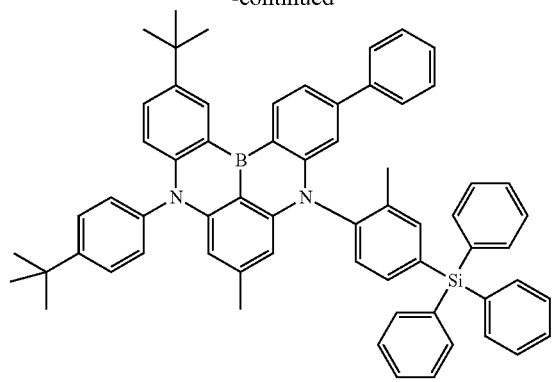
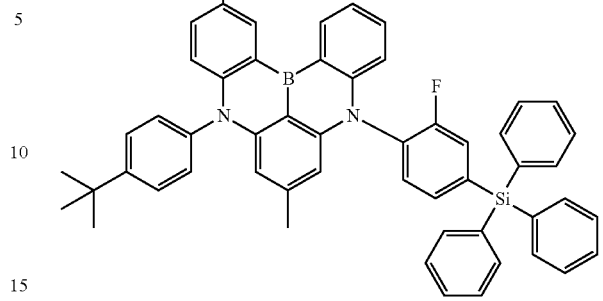
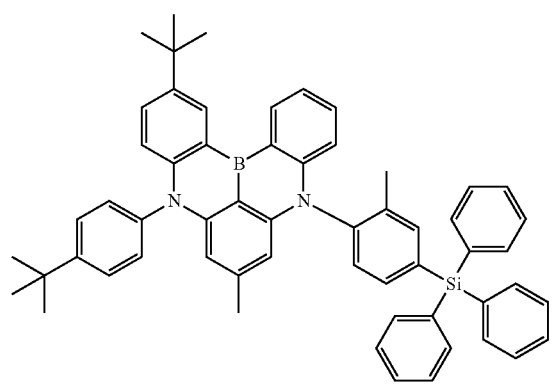
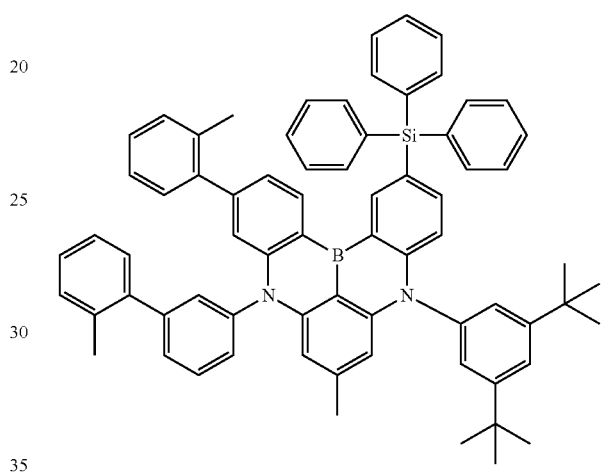
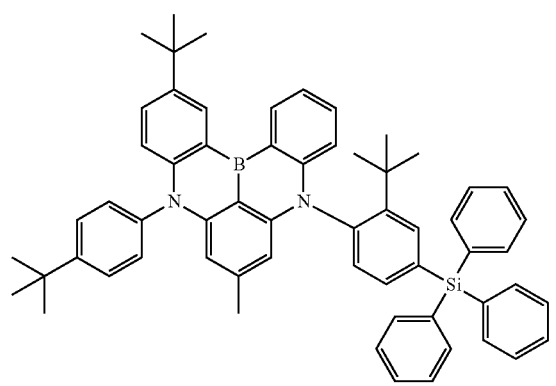
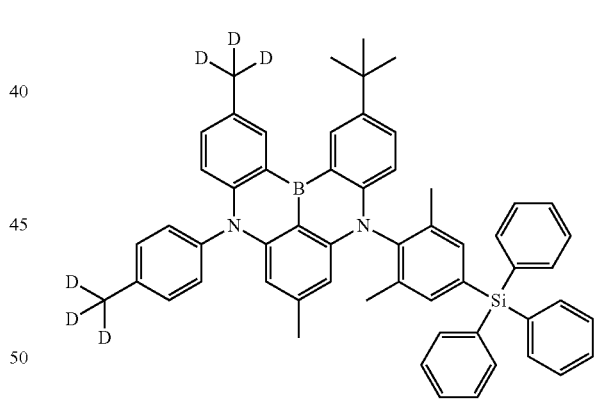
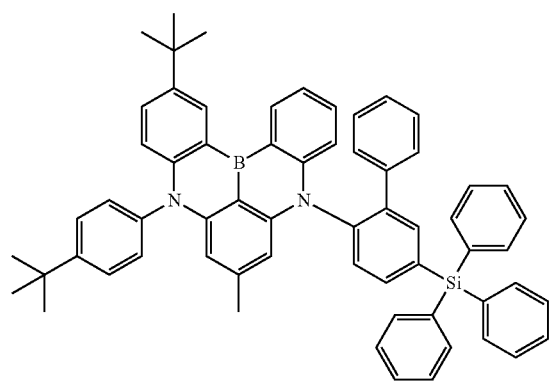
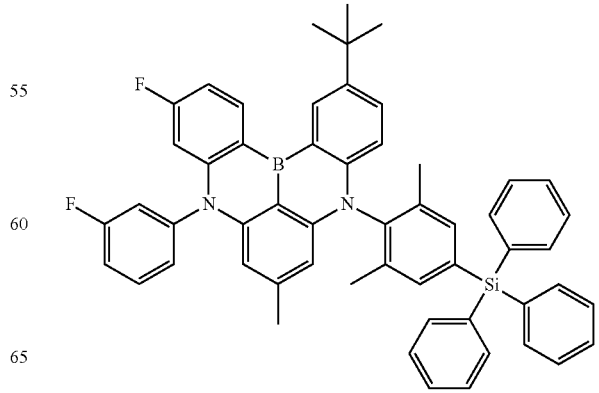

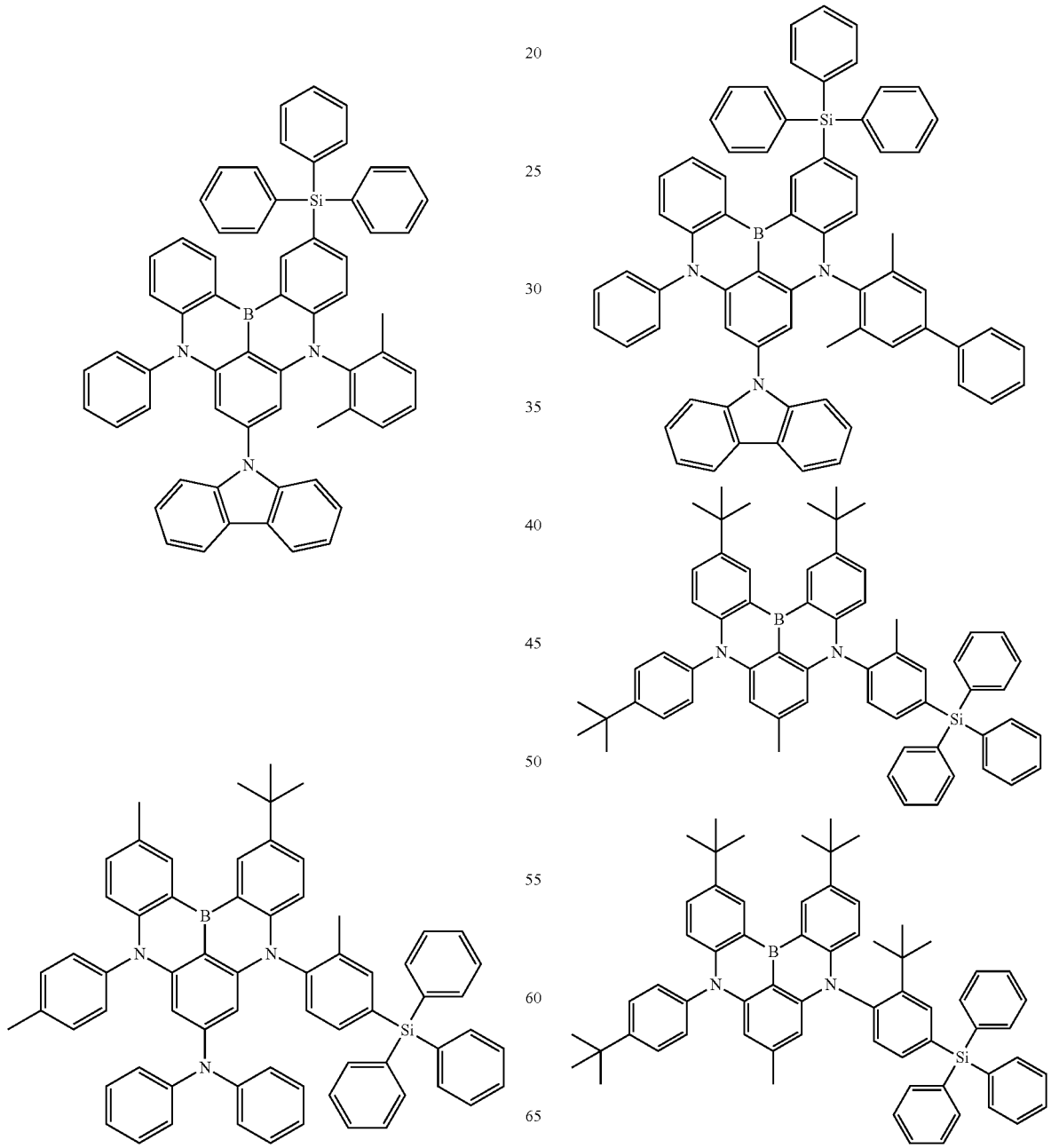

39
-continued
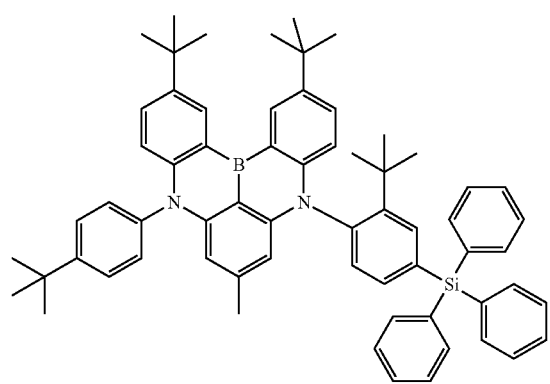
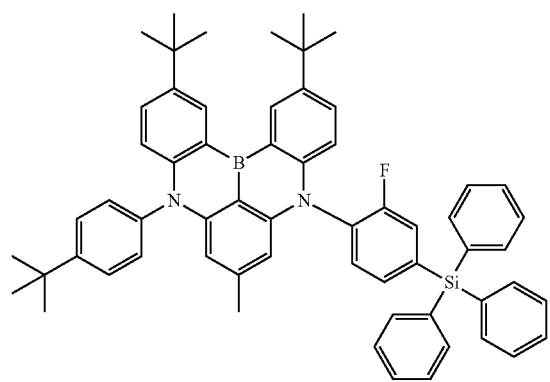
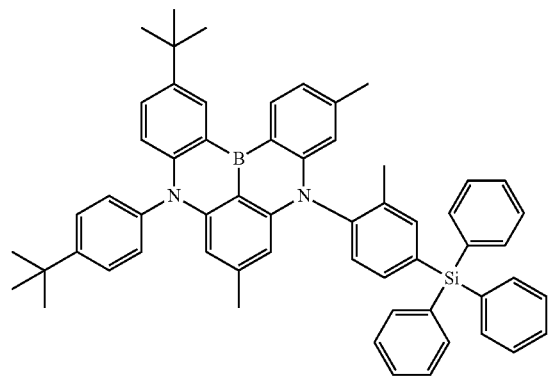
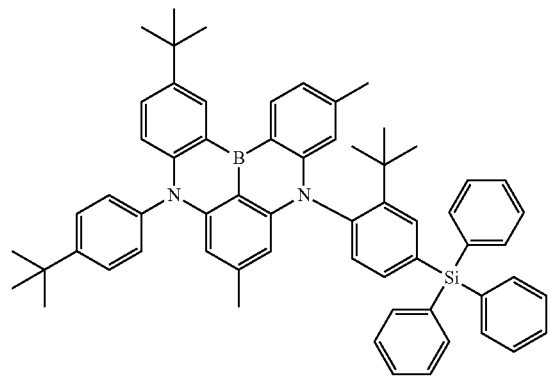
40
-continued
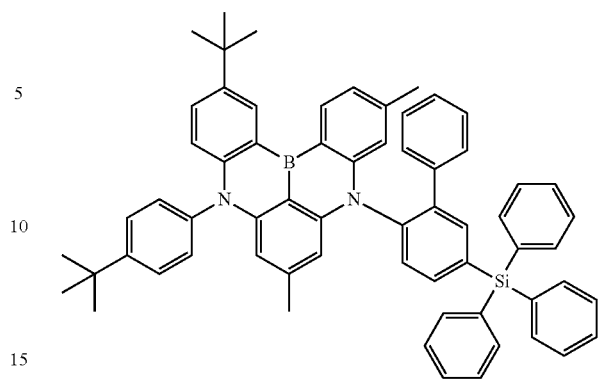
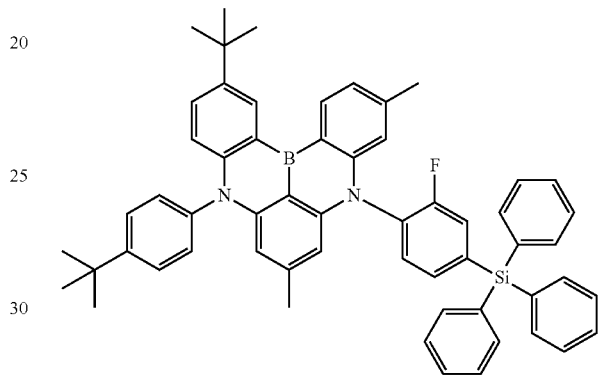
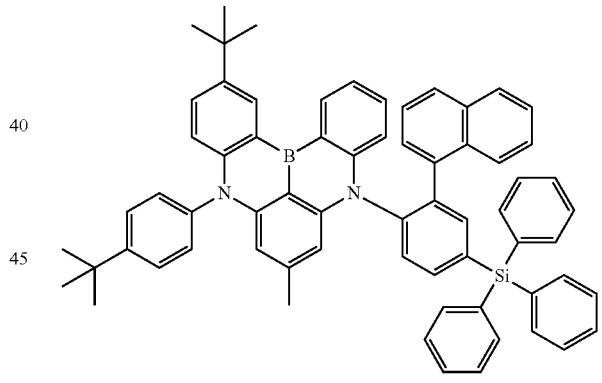
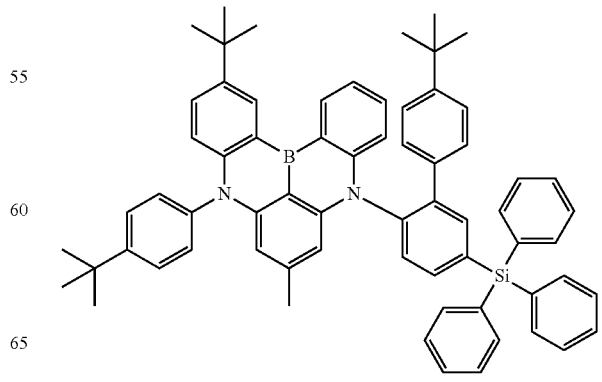

41
-continued
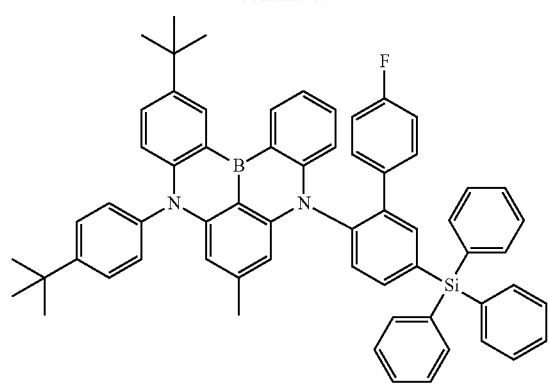
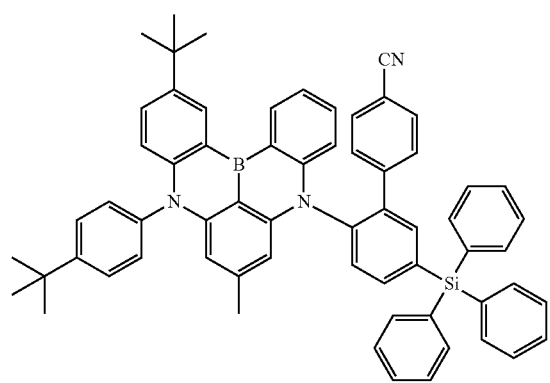
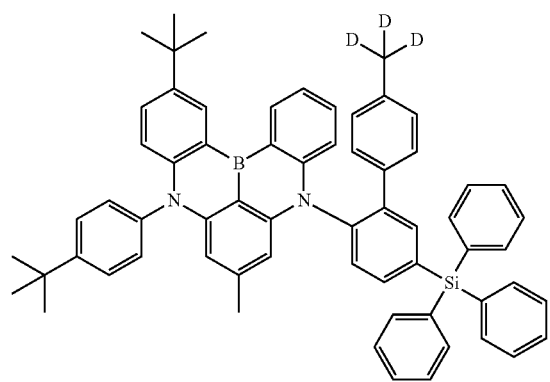
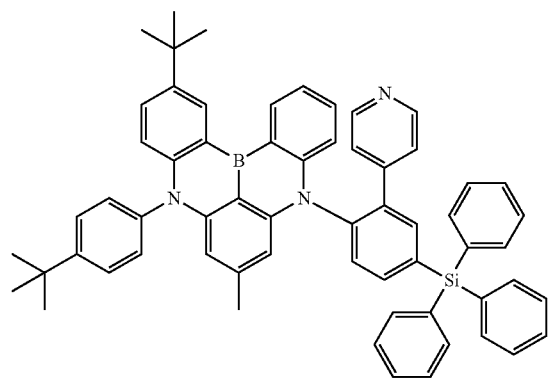
42
-continued
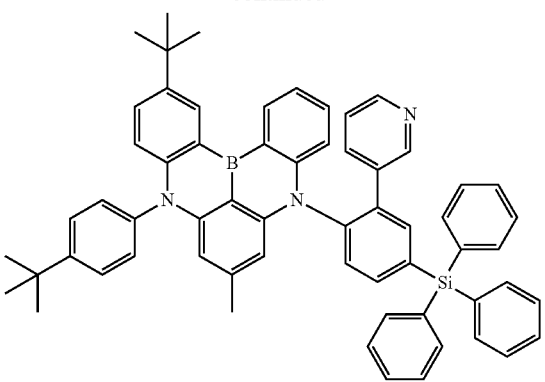
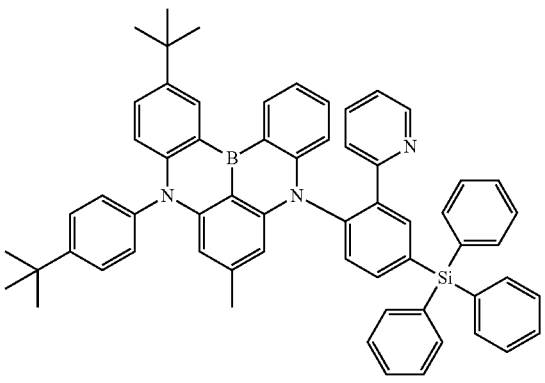
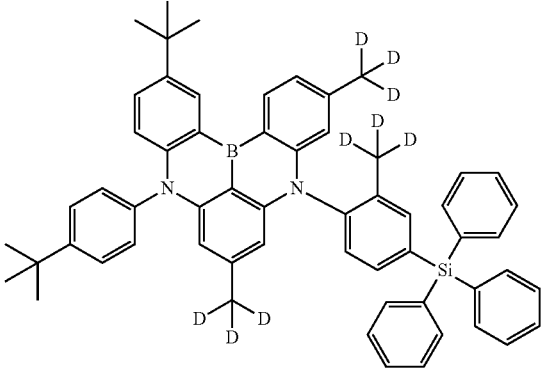
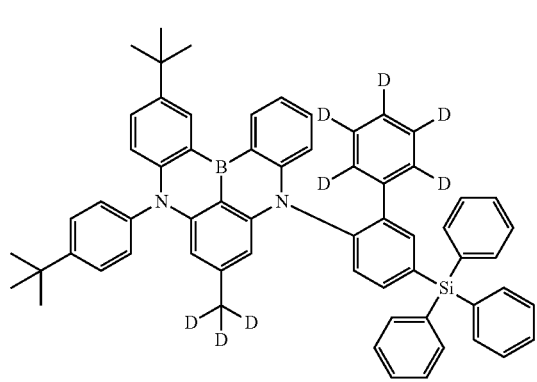

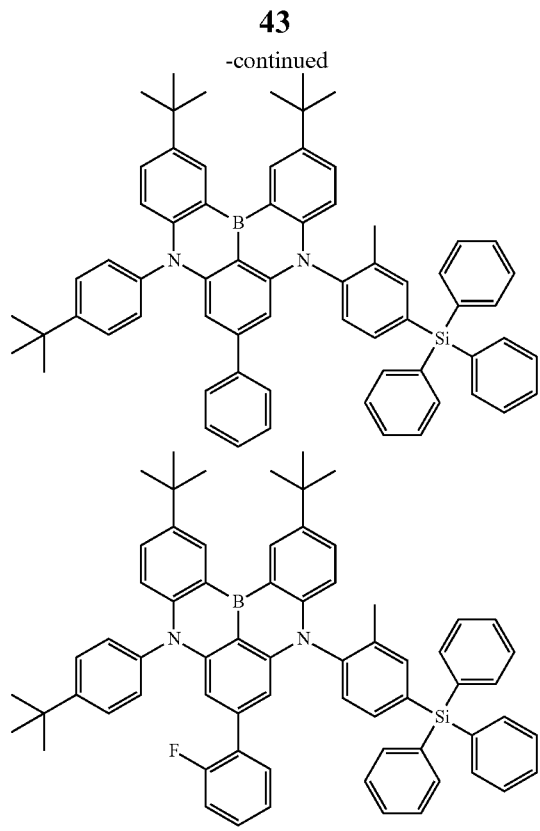

In the above listed compounds,

Ph is a phenyl group, and D is deuterium.

According to one embodiment of the present specification, the compound represented by Chemical Formula 1 may be used as a fluorescence dopant for a thermally activated delayed fluorescence (TADF) device.

The compound represented by Chemical Formula 1 of the present specification may have its core structure prepared as in the following Reaction Formula 1, and various types of substituents may bond thereto. The substituents may bond using methods known in the art, and types, positions and the number of the substituents may vary depending on technologies known in the art.

<Reaction Formula 1>

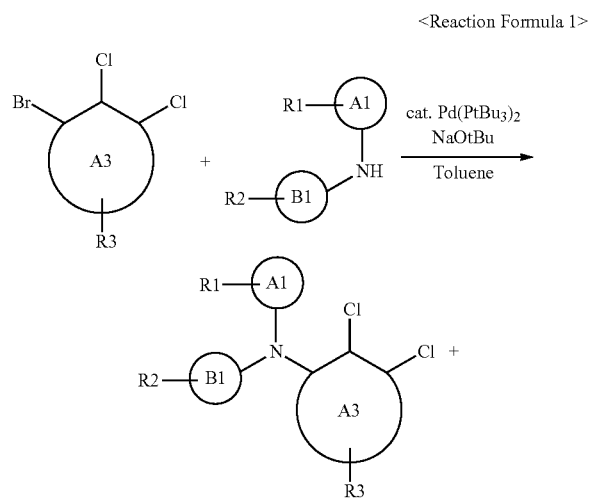

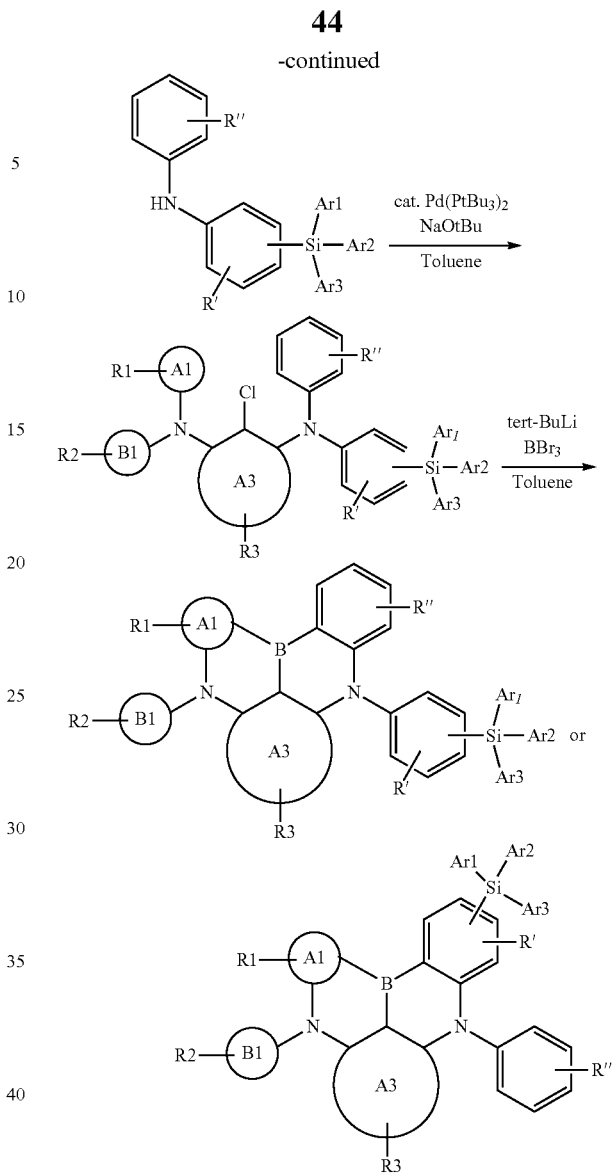

Diaminoaryl chloride may be obtained using a Buchwald amination reaction between an aminoaryl dichloride compound obtained by an amination reaction of aryl bromide and diarylamine using a palladium (Pd) catalyst and an arylamine compound having various substituents comprising an arylsilyl group. Various compounds having the structure of Chemical Formula 1 may be synthesized by adding boron tribromide thereto after a Li—Cl exchange reaction using an alkyl lithium.

In Reaction Formula 1, R1 to R3, R' and R" have the same definitions as R1 to R5 of Chemical Formula 1, and A1, A3, B1 and Ar1 to Ar3 have the same definition as in Chemical Formula 1.

Compounds having various energy band gaps may be synthesized by introducing various substituents to the compound represented by Chemical Formula 1. In addition, HOMO and LUMO energy levels of the compound may also be adjusted in the present specification by introducing various substituents to the core structure having a structure as above.

An organic light emitting device according to the present specification comprises a first electrode; a second electrode;

and one or more organic material layers provided between the first electrode and the second electrode, wherein one or more layers of the organic material layers comprise the compound represented by Chemical Formula 1 described above.

The organic light emitting device of the present specification may be manufactured using common organic light emitting device manufacturing methods and materials except that one or more organic material layers are formed using the compound represented by Chemical Formula 1 described above.

The organic material layer comprising the compound represented by Chemical Formula 1 may be formed by using a solution coating method as well as a vacuum deposition method when manufacturing the organic light emitting device. Herein, the solution coating method includes spin coating, dip coating, inkjet printing, screen printing, a spray method, roll coating and the like, but is not limited thereto.

The organic material layer of the organic light emitting device of the present specification may be formed in a single layer structure, but may be formed in a multilayer structure in which two or more organic material layers are stacked. For example, the organic light emitting device of the present specification may have a structure comprising a hole injection layer, a hole transfer layer, a layer carrying out hole transfer and hole injection at the same time, an electron blocking layer, a light emitting layer, an electron transfer layer, an electron injection layer, a layer carrying out electron transfer and electron injection at the same time, and the like as the organic material layer. However, the structure of the organic light emitting device is not limited thereto, and may comprise a smaller number or a larger number of organic material layers.

In the organic light emitting device of the present specification, the organic material layer may comprise an electron transfer layer or an electron injection layer, and the electron transfer layer or the electron injection layer may comprise the compound represented by Chemical Formula 1 described above.

In the organic light emitting device of the present specification, the organic material layer may comprise a hole injection layer or a hole transfer layer, and the hole injection layer or the hole transfer layer may comprise the compound represented by Chemical Formula 1 described above.

In the organic light emitting device of the present specification, the organic material layer comprises a light emitting layer, and the light emitting layer comprises the compound represented by Chemical Formula 1 described above.

According to another embodiment, the organic material layer comprises a light emitting layer, and the light emitting layer comprises the compound represented by Chemical Formula 1 described above as a dopant of the light emitting layer.

In one embodiment of the present specification, the light emitting layer comprises the compound represented by Chemical Formula 1 described above as a thermally activated delayed fluorescence (TADF) dopant. Herein, the compound emits thermally activated delayed fluorescence light in the light emitting layer. The thermally activated delayed fluorescence emission means reverse intersystem crossing being induced from a triplet excited state to a singlet excited state, and excitons in the singlet excited state moving to a ground state to produce fluorescence emission, an organic light emitting device with high efficiency may be obtained.

According to another embodiment, the light emitting layer comprises the compound represented by Chemical Formula 1 described above as a hyperfluorescence dopant of the light emitting layer, and the compound may be used together with a thermally activated delayed fluorescence dopant. Herein, the compound absorbs primary emission of the thermally activated delayed fluorescence dopant to be transferred to a singlet excited state, and excitons in the singlet excited state moves to a ground state to produce final fluorescence emission. An emission peak having a narrow full width at half maximum may be obtained when using the compound described above as a hyperfluorescence dopant compared to an emission peak of a general thermally activated delayed fluorescence dopant, and therefore an organic light emitting device with higher efficiency may be obtained.

In another embodiment, the organic material layer comprises a light emitting layer, the light emitting layer comprises the compound represented by Chemical Formula 1 described above as a dopant of the light emitting layer, and comprises a fluorescence host or a phosphorescence host, and may comprise other organic compounds, metals or metal compounds as a dopant.

According to one embodiment of the present specification, the organic material layer comprises a light emitting layer, the light emitting layer comprises the compound represented by Chemical Formula 1 described above as a dopant of the light emitting layer, and may further comprise a compound represented by the following Chemical Formula 1-A. Herein, the compound represented by the following Chemical Formula 1-A may be included as a host of the light emitting layer.

[Chemical Formula 1-A]

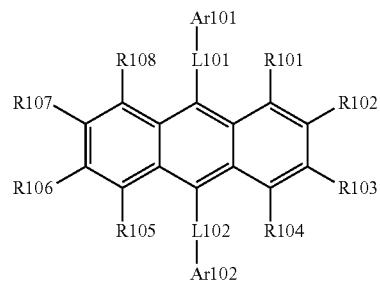

In Chemical Formula 1-A,

L101 and L102 are the same as or different from each other, and each independently a single bond; a substituted or unsubstituted arylene group; or a substituted or unsubstituted heteroarylene group, Ar101 and Ar102 are the same as or different from each other, and each independently a substituted or unsubstituted aryl group; or a substituted or unsubstituted heteroaryl group, and R101 to R108 are the same as or different from each other, and each independently hydrogen; deuterium; a halogen group; a cyano group; a nitro group; a substituted or unsubstituted silyl group; a substituted or unsubstituted amine group; a substituted or unsubstituted alkyl group; a substituted or unsubstituted alkoxy group; a substituted or unsubstituted cycloalkyl group; a substituted or unsubstituted alkenyl group; a substituted or unsubstituted aryl group; a substituted or unsubstituted aryloxy group; or a substituted or unsubstituted heterocyclic group.

In another embodiment, the compound of Chemical Formula 1-A is represented by the following Chemical Formula 1-A-1 or 1-A-2.

[Chemical Formula 1-A-1]

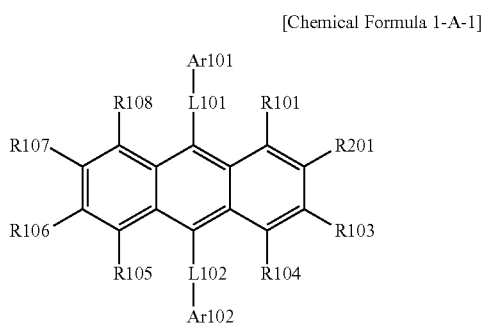

[Chemical Formula 1-A-2]

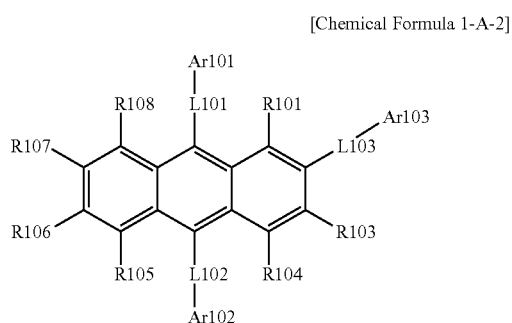

In Chemical Formulae 1-A-1 and 1-A-2,

R101, R103 to R108, L101, L102, Ar101 and Ar102 are the same as defined in Chemical Formula 1-A, R201 is hydrogen or deuterium, L103 is a single bond; a substituted or unsubstituted arylene group; or a substituted or unsubstituted heteroarylene group, and Ar103 is a substituted or unsubstituted aryl group; or a substituted or unsubstituted heteroaryl group.

According to one embodiment of the present specification, L101 and L102 are the same as or different from each other, and each independently a single bond; a substituted or unsubstituted arylene group having 6 to 60 carbon atoms; or a substituted or unsubstituted heteroarylene group having 2 to 60 carbon atoms and comprising O or S as a heteroatom.

According to one embodiment of the present specification, L101 and L102 are the same as or different from each other, and each independently a single bond; a substituted or unsubstituted arylene group having 6 to 30 carbon atoms; or a substituted or unsubstituted heteroarylene group having 2 to 30 carbon atoms and comprising O or S as a heteroatom.

According to another embodiment, L101 and L102 are the same as or different from each other, and each independently a single bond; a substituted or unsubstituted phenylene group; a substituted or unsubstituted naphthylene group; or a substituted or unsubstituted dibenzofuranylene group.

In another embodiment, L101 and L102 are the same as or different from each other, and each independently a single bond; a phenylene group; a naphthylene group; or a dibenzofuranylene group.

According to one embodiment of the present specification, L103 is a single bond; a substituted or unsubstituted arylene group having 6 to 60 carbon atoms; or a substituted or unsubstituted heteroarylene group having 2 to 60 carbon atoms and comprising O or S as a heteroatom.

According to one embodiment of the present specification, L103 is a single bond; a substituted or unsubstituted arylene group having 6 to 30 carbon atoms; or a substituted or unsubstituted heteroarylene group having 2 to 30 carbon atoms and comprising O or S as a heteroatom.

In another embodiment, L103 is a single bond; a substituted or unsubstituted phenylene group; or a substituted or unsubstituted naphthylene group.

According to another embodiment, L103 is a single bond; a phenylene group; or a naphthylene group.

In one embodiment of the present specification, Ar103 is a substituted or unsubstituted aryl group having 6 to 60 carbon atoms; or a substituted or unsubstituted heteroaryl group having 2 to 60 carbon atoms and comprising O or S as a heteroatom.

In one embodiment of the present specification, Ar103 is a substituted or unsubstituted aryl group having 6 to 30 carbon atoms; or a substituted or unsubstituted heteroaryl group having 2 to 30 carbon atoms and comprising O or S as a heteroatom.

According to another embodiment, Ar103 is a substituted or unsubstituted phenyl group; a substituted or unsubstituted biphenyl group; a substituted or unsubstituted naphthyl group; a substituted or unsubstituted dibenzofuran group; or a substituted or unsubstituted dibenzothiophene group.

According to another embodiment, Ar103 is a phenyl group; a biphenyl group; a naphthyl group; a dibenzofuran group; or a dibenzothiophene group.

According to one embodiment of the present specification, Ar101 and Ar102 are the same as or different from each other, and each independently a substituted or unsubstituted aryl group having 6 to 60 carbon atoms; or a substituted or unsubstituted heteroaryl group having 2 to 60 carbon atoms and comprising O or S as a heteroatom.

According to one embodiment of the present specification,

Ar101 and Ar102 are the same as or different from each other, and each independently a substituted or unsubstituted aryl group having 6 to 30 carbon atoms; or a substituted or unsubstituted heteroaryl group having 2 to 30 carbon atoms and comprising O or S as a heteroatom.

In another embodiment, Ar101 and Ar102 are the same as or different from each other, and each independently a substituted or unsubstituted phenyl group; a substituted or unsubstituted biphenyl group; a substituted or unsubstituted naphthyl group; a substituted or unsubstituted phenanthrene group; a substituted or unsubstituted dibenzofuran group; a substituted or unsubstituted naphthobenzofuran group; a substituted or unsubstituted thiophene group; or a substituted or unsubstituted naphthobenzothiophene group.

In another embodiment, Ar101 and Ar102 are the same as or different from each other, and each independently a phenyl group; a biphenyl group; a naphthyl group; a phenanthrene group; a dibenzofuran group; a naphthobenzofuran group; a thiophene group; or a naphthobenzothiophene group.

According to one embodiment of the present specification, the compound of Chemical Formula 1-A is any one selected from the group consisting of the following compounds.

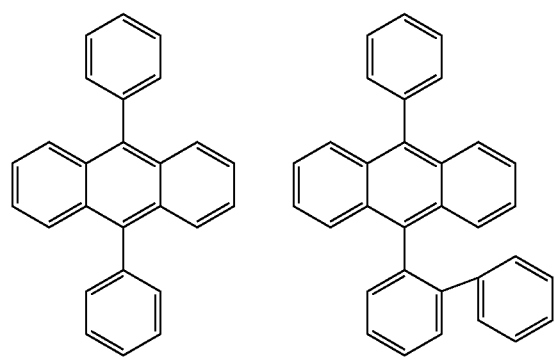
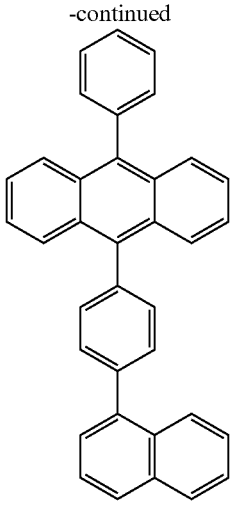
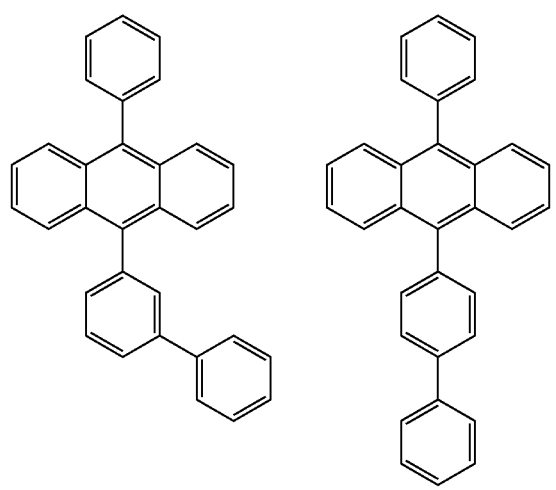
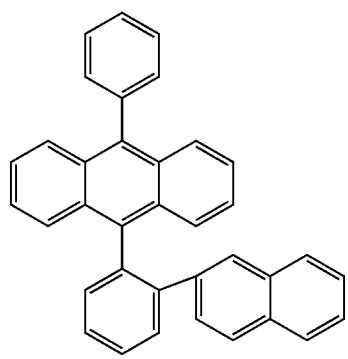
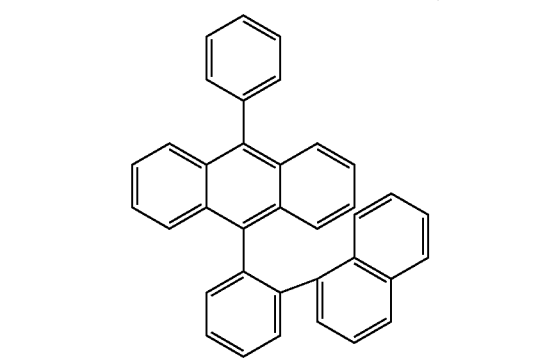
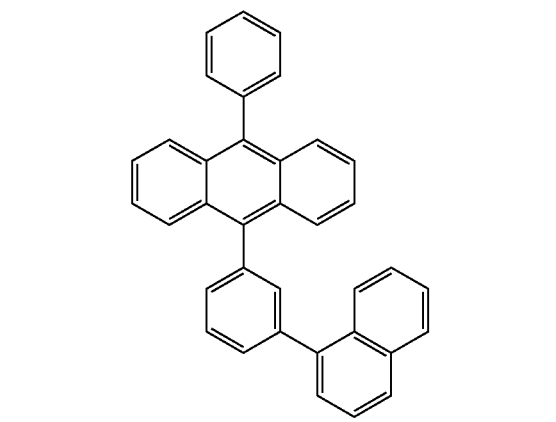
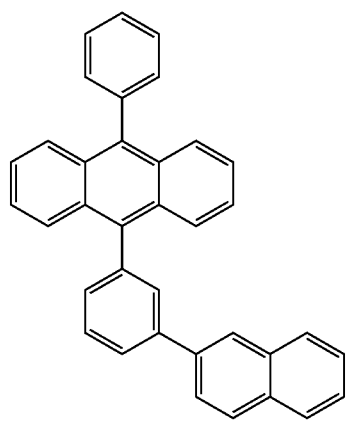

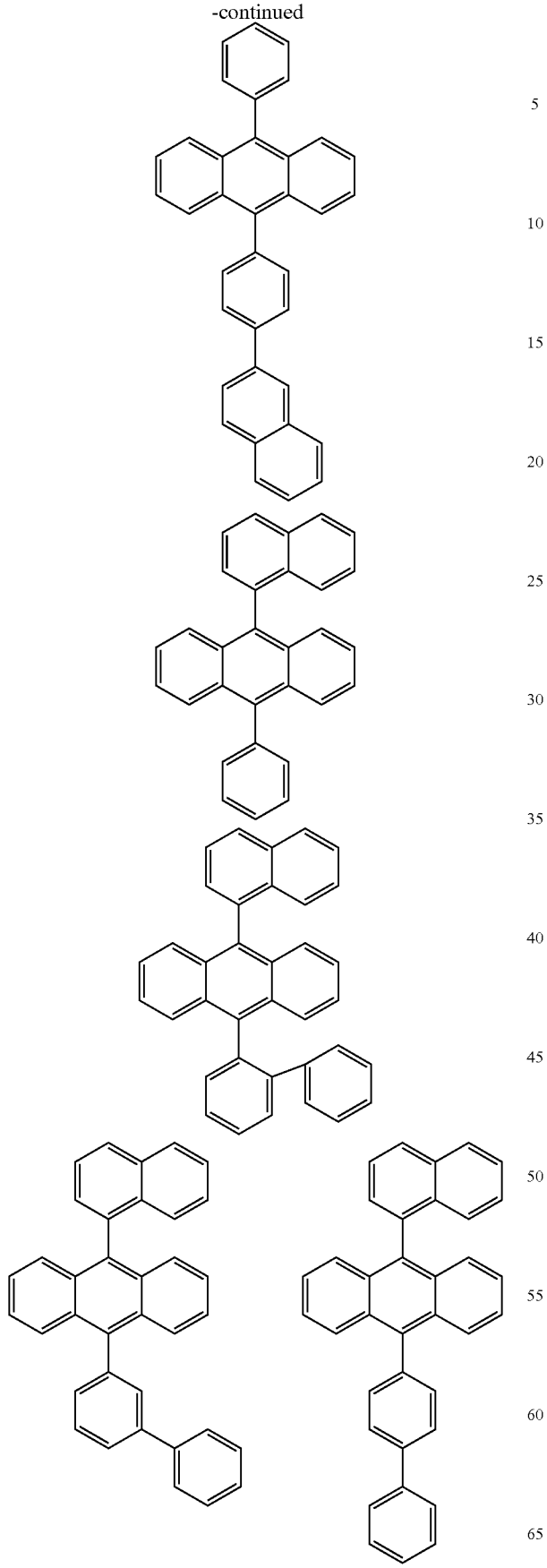

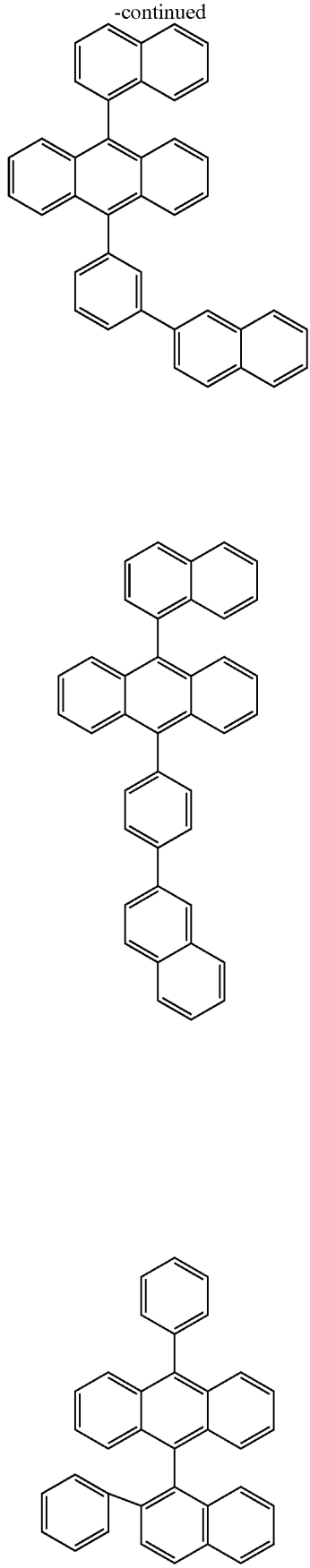

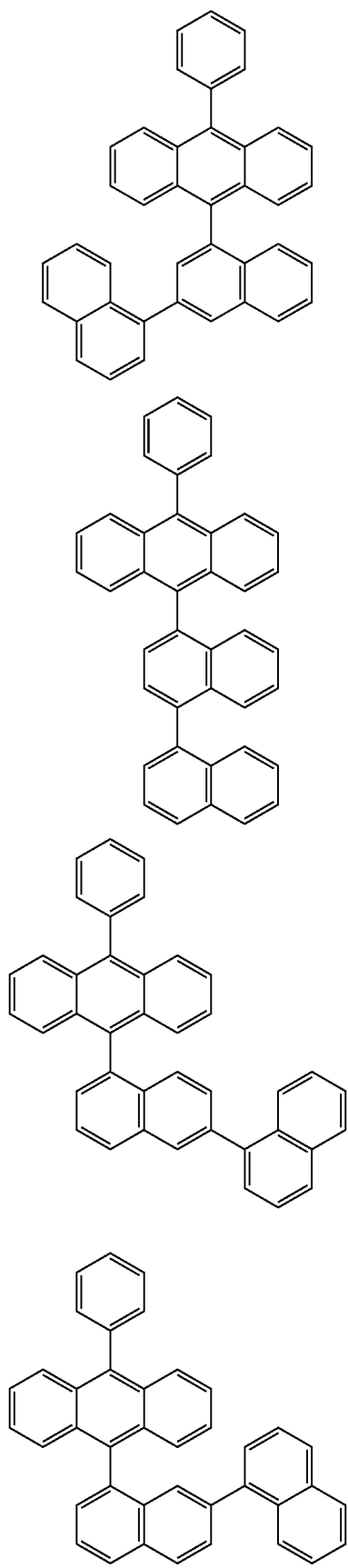
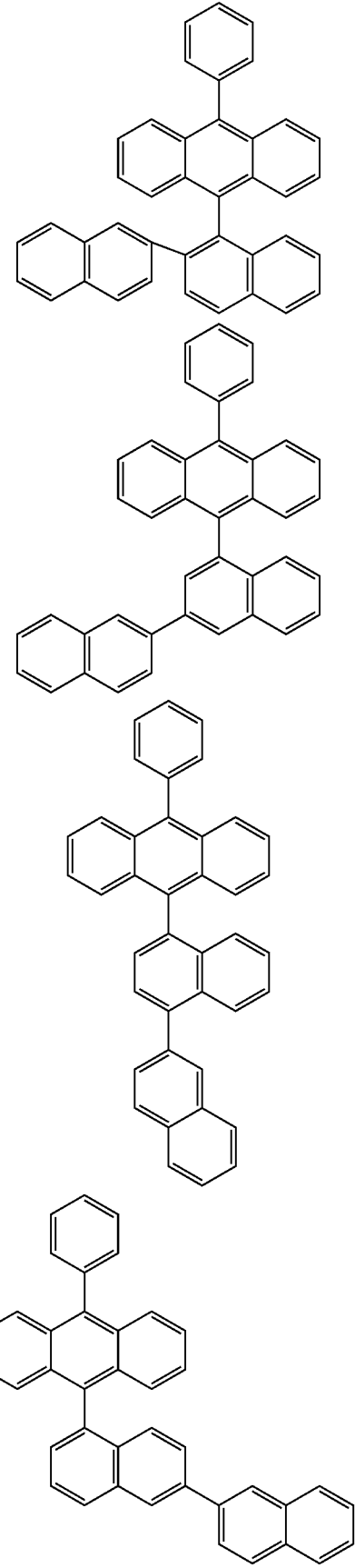

57
-continued
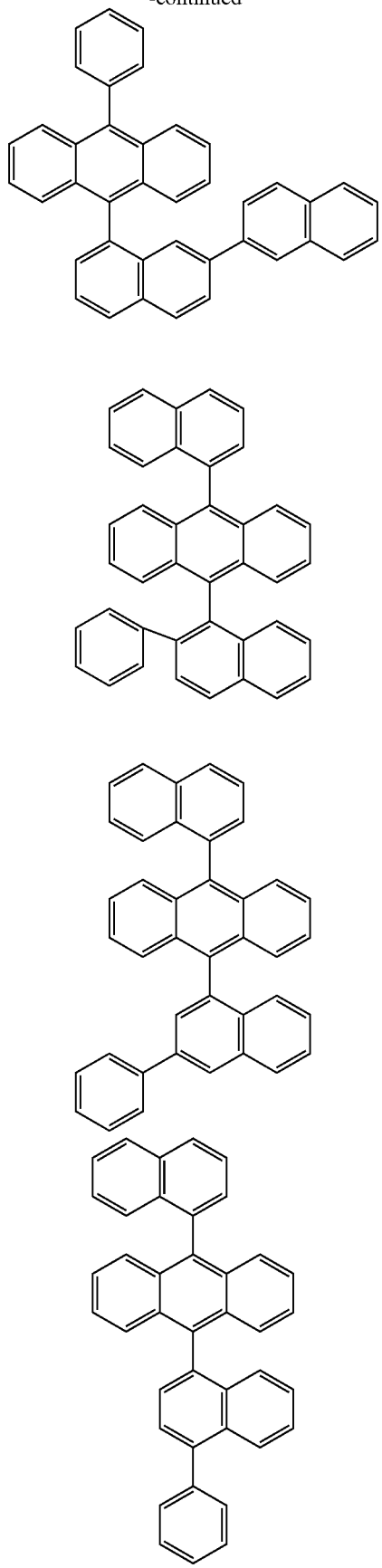
58
-continued
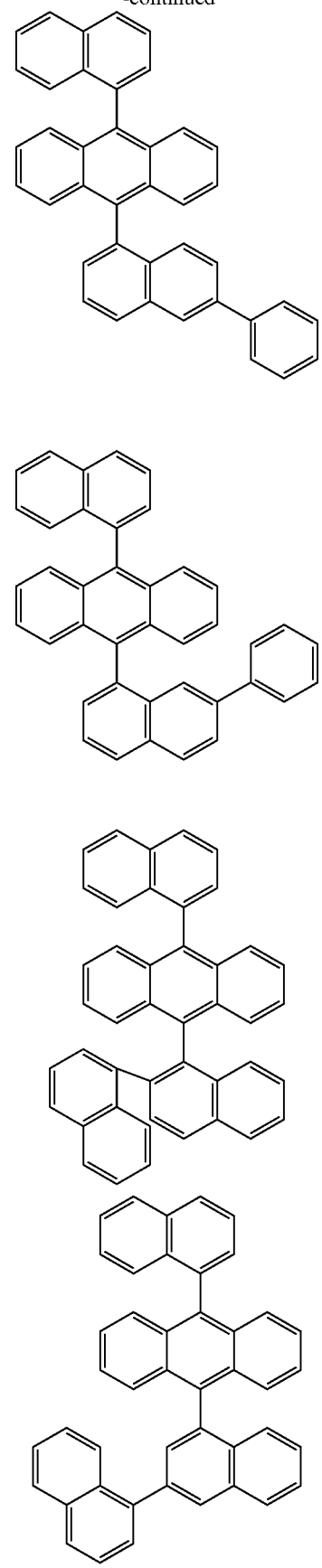

59
-continued
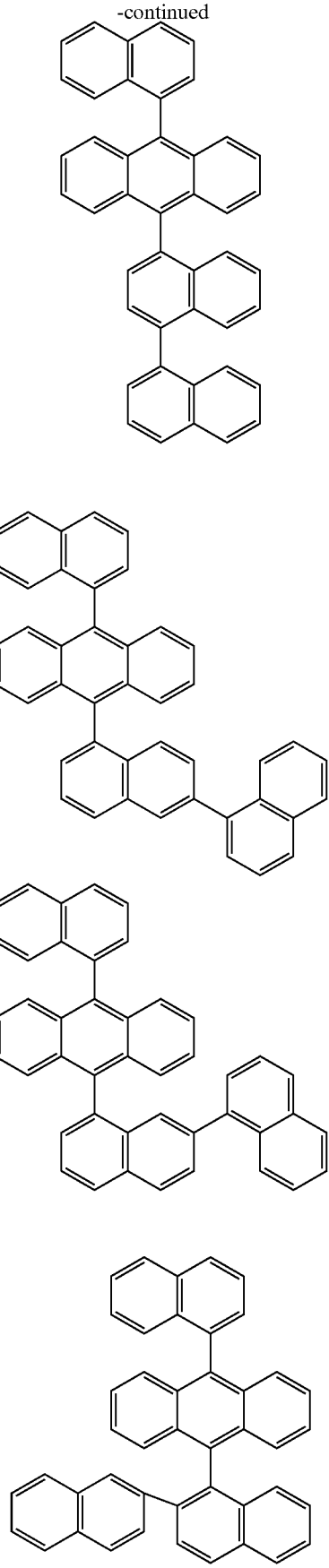
60
-continued
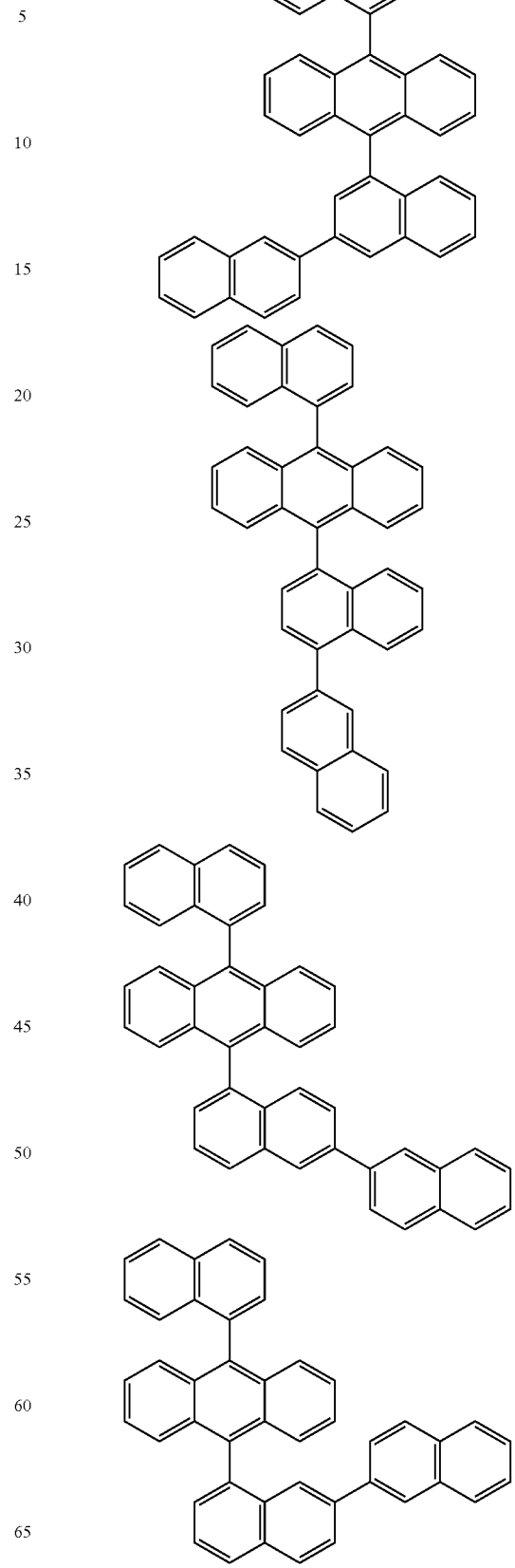

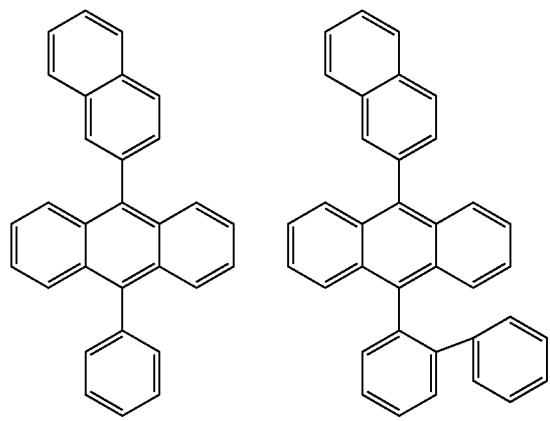
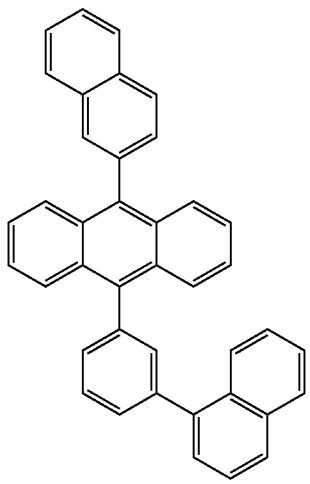
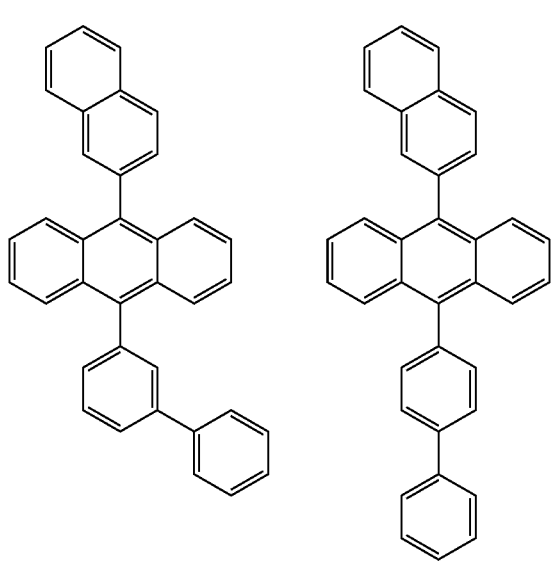
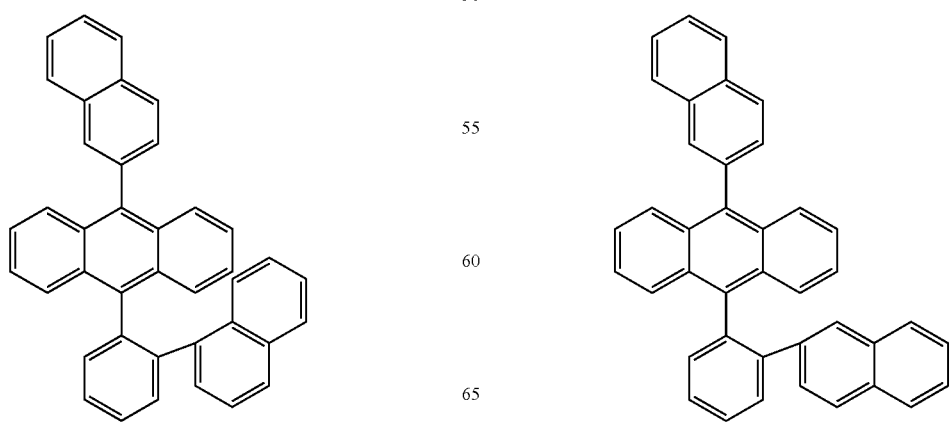

63
-continued
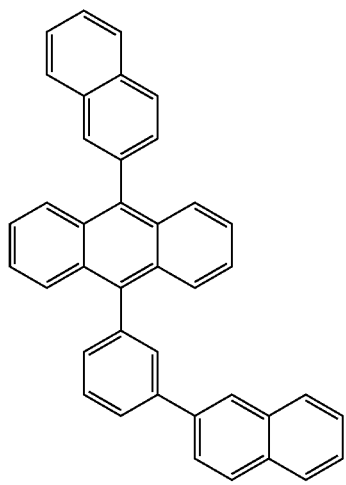
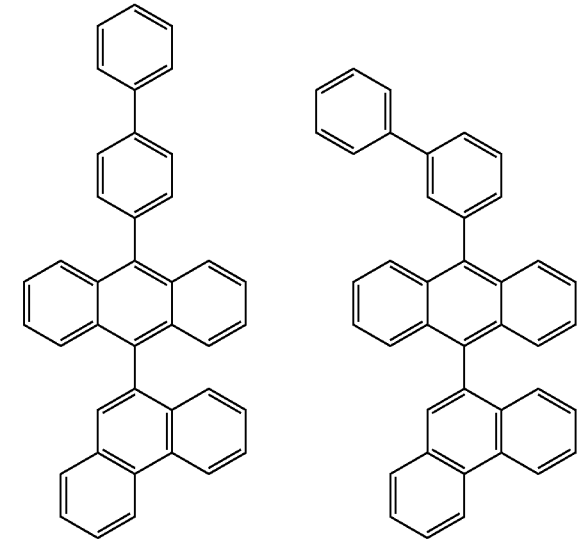
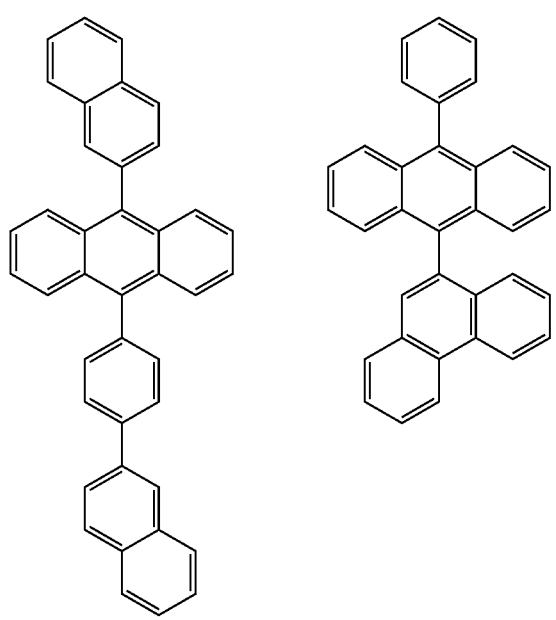
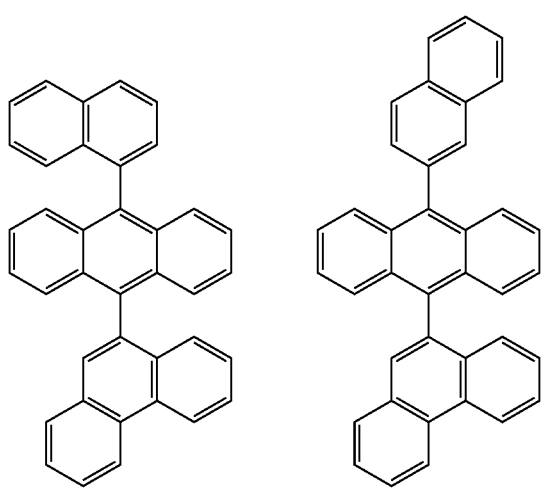
64
-continued
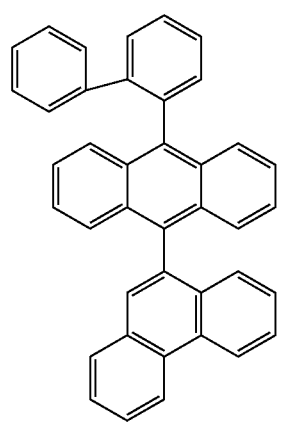
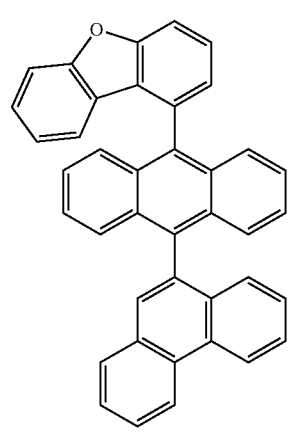

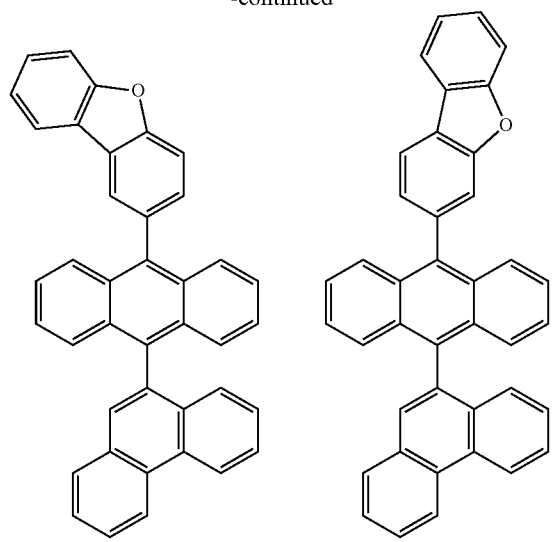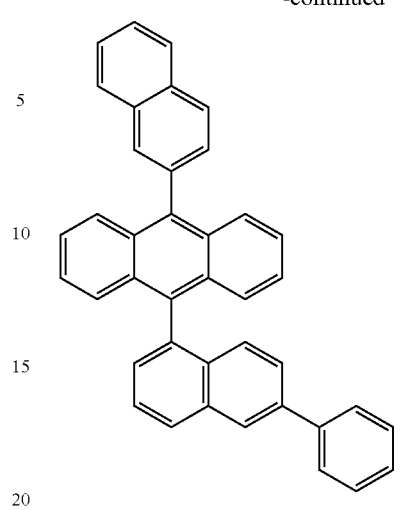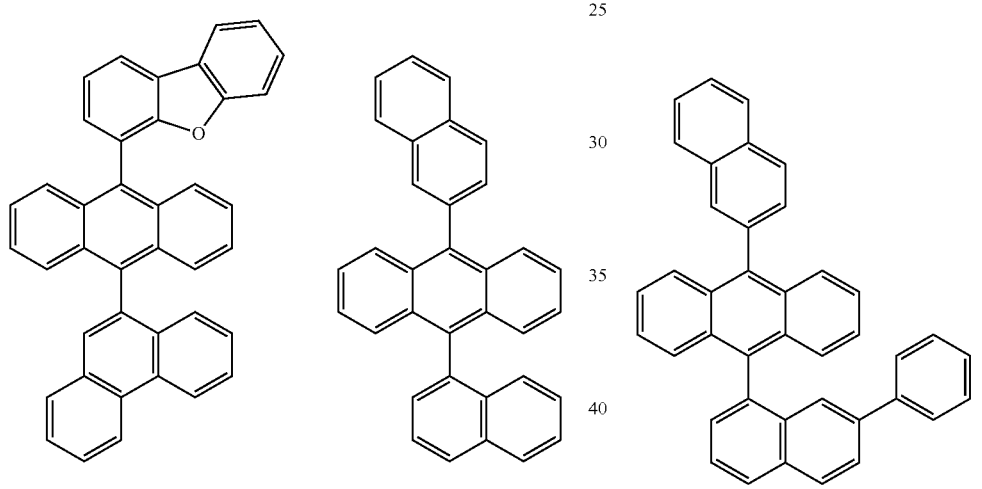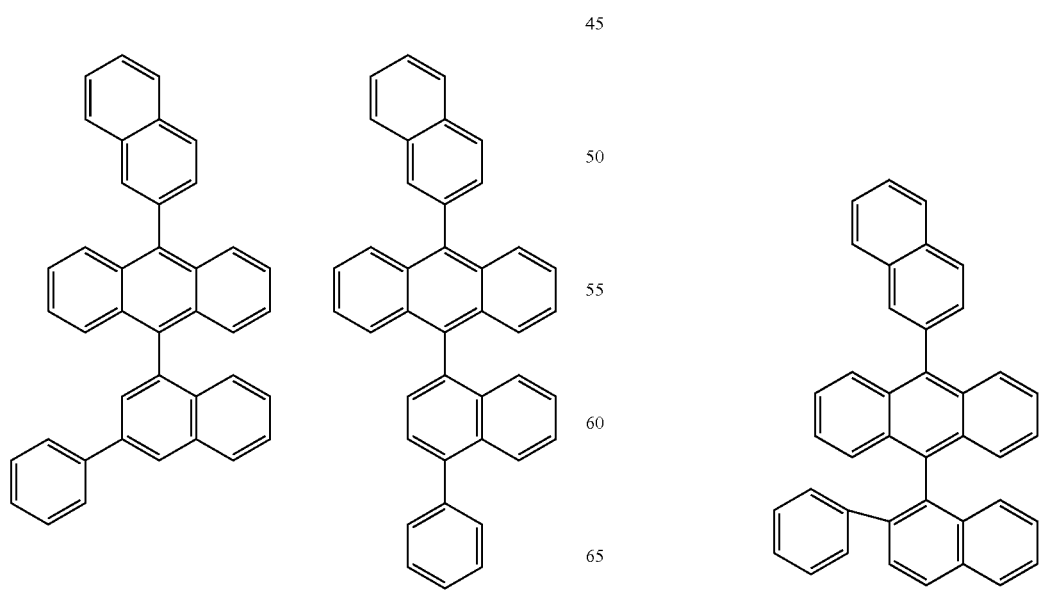

67
-continued
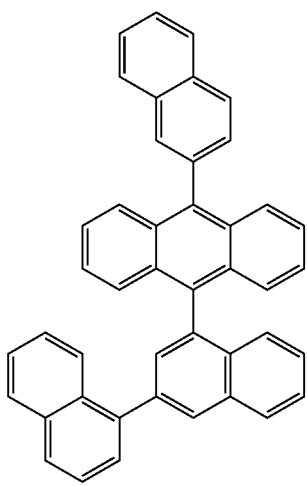
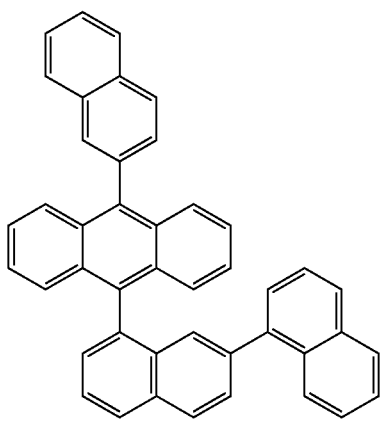
68
-continued
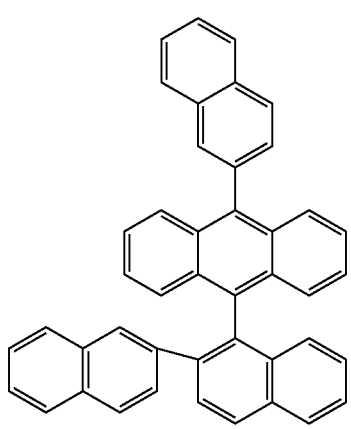
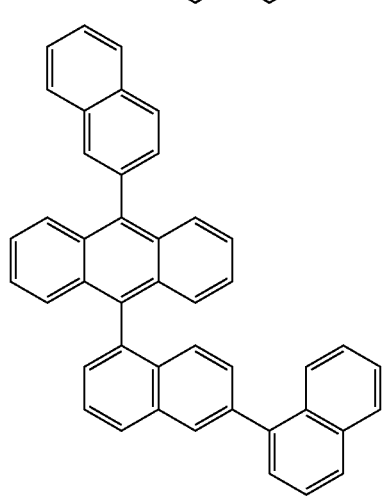
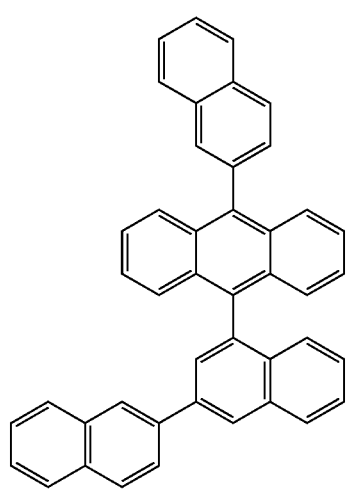

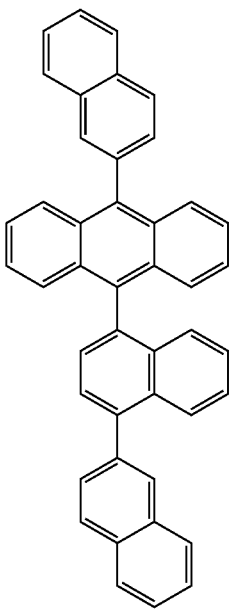
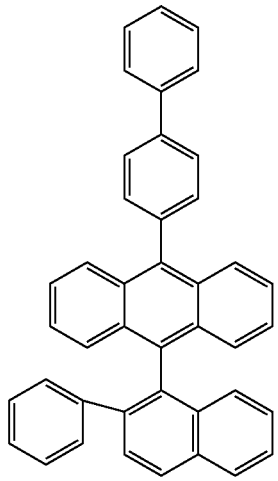
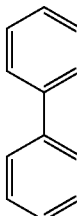
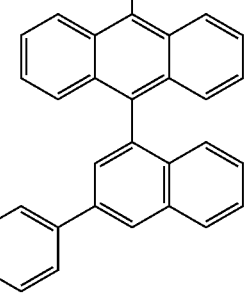
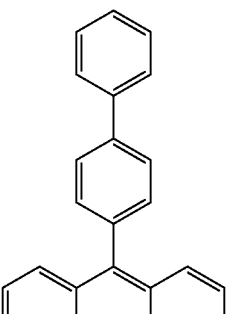
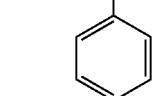

71
-continued
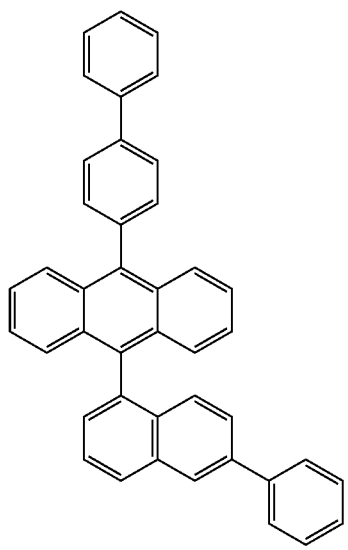
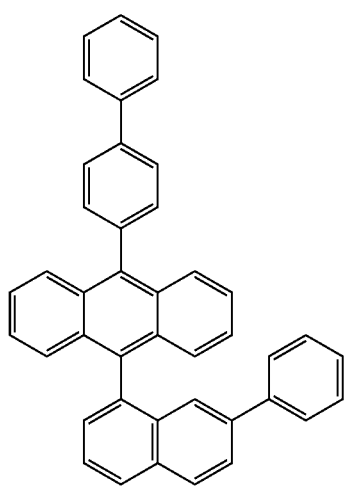
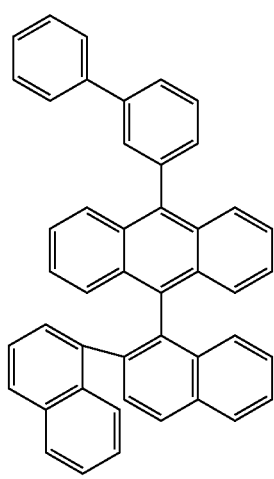
72
-continued
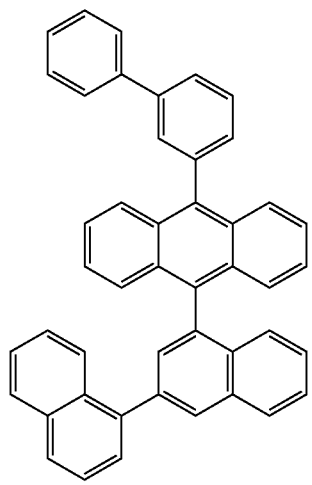
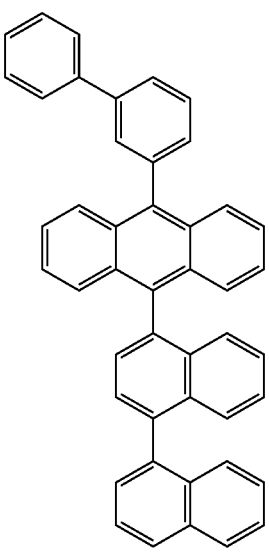
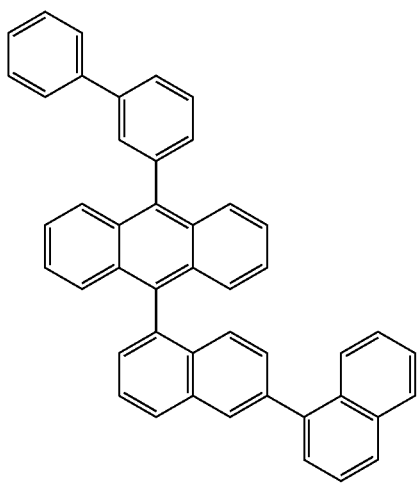

73
-continued
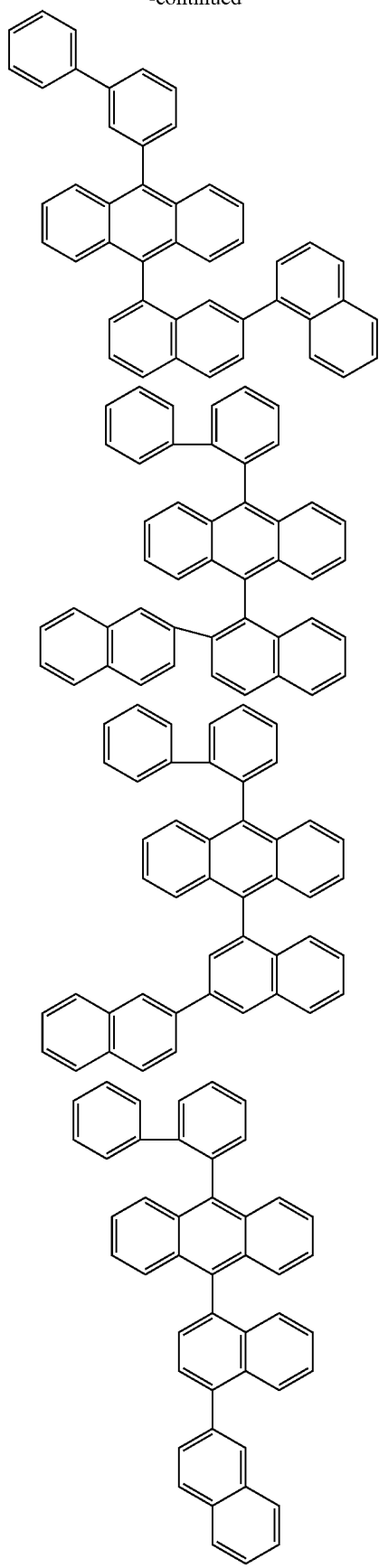
74
-continued
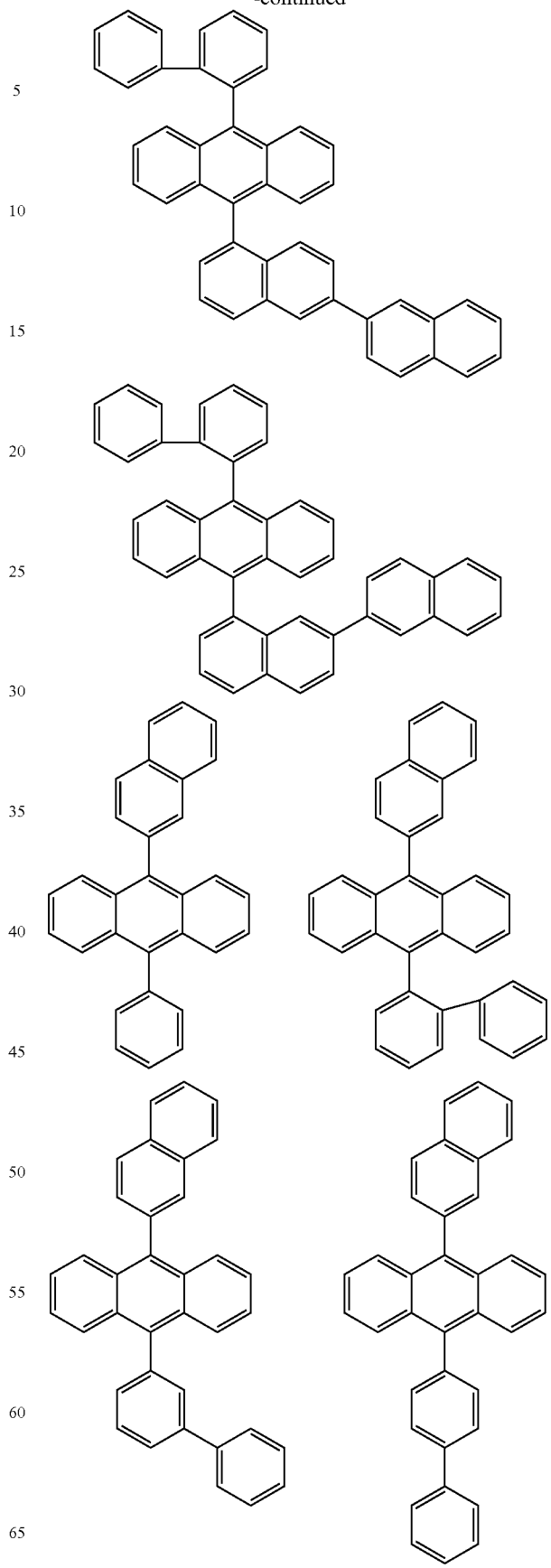

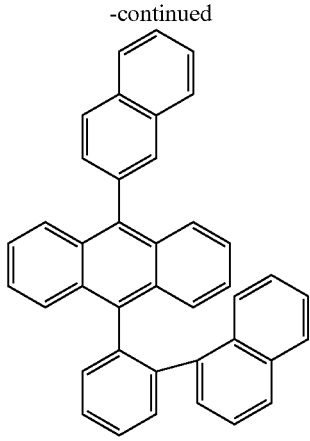
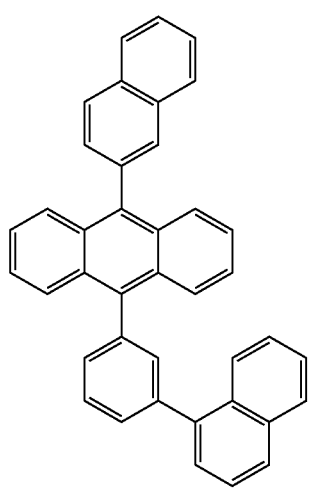
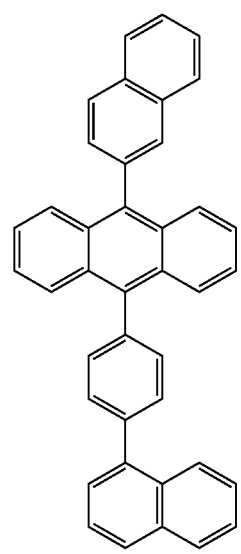
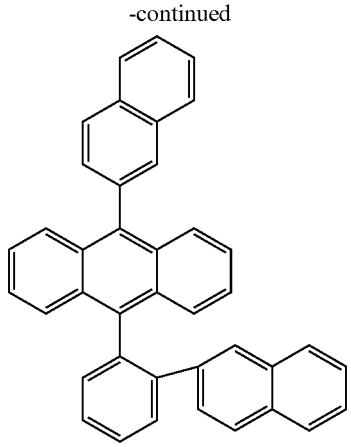
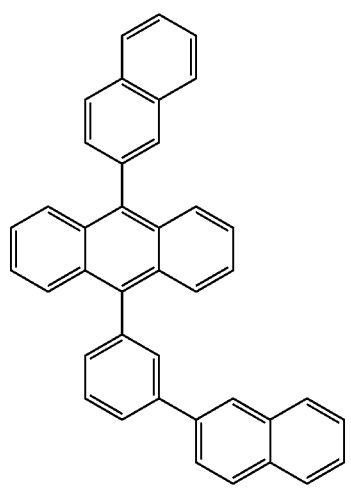
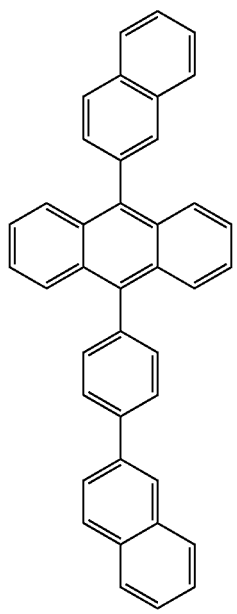 [SMILES: c1ccc2cc(-c3ccc(-c4c5ccccc5c(-c5ccc6ccccc6c5)c5ccccc45)cc3)ccc2c1]

-continued
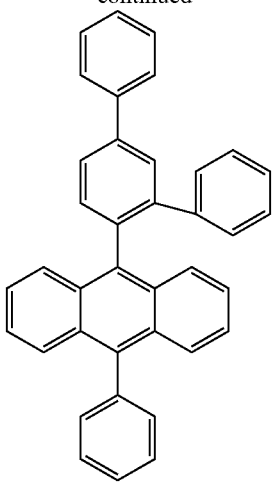
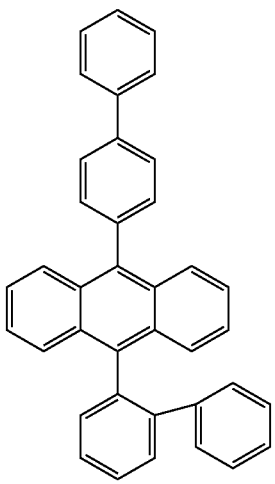
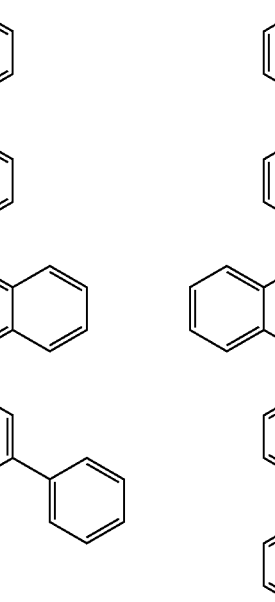 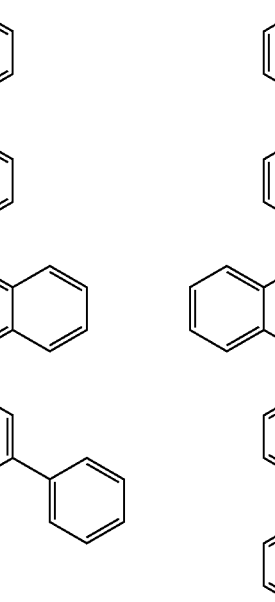
-continued
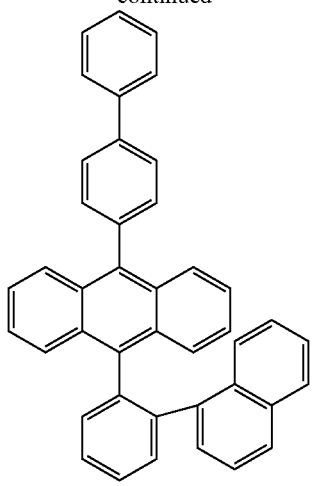
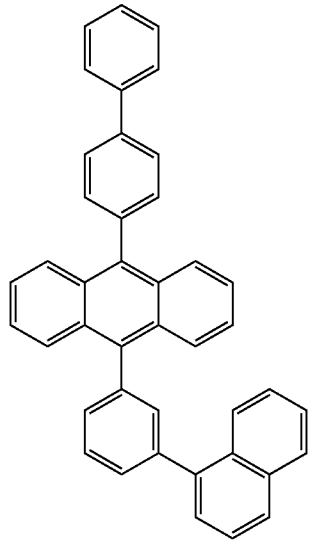
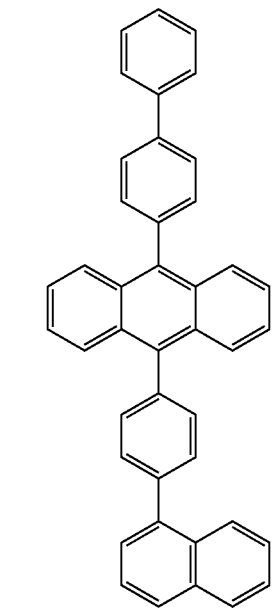

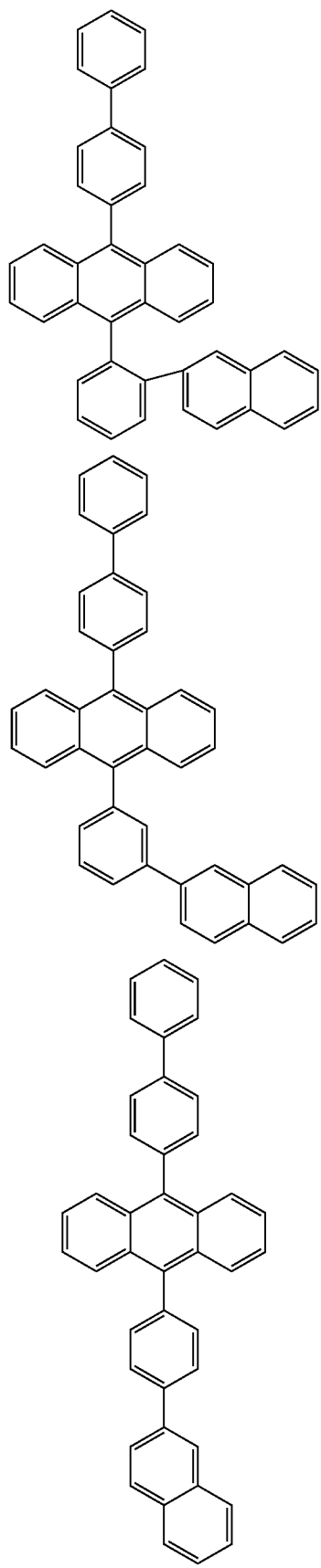
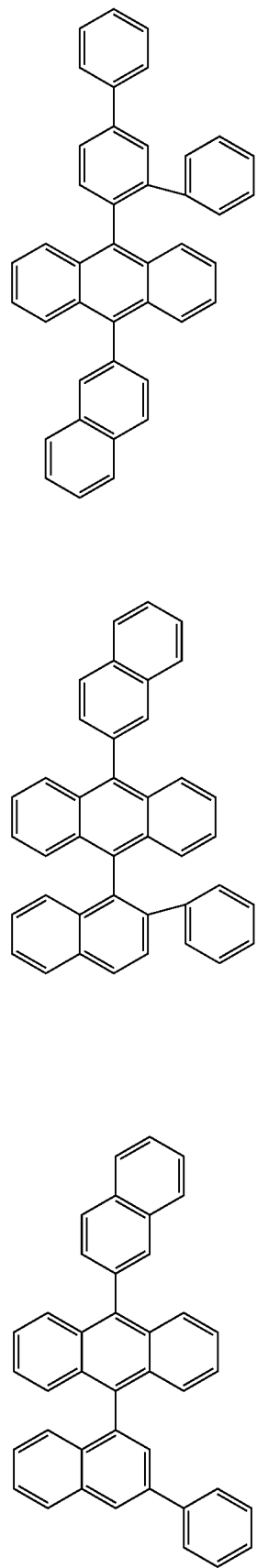

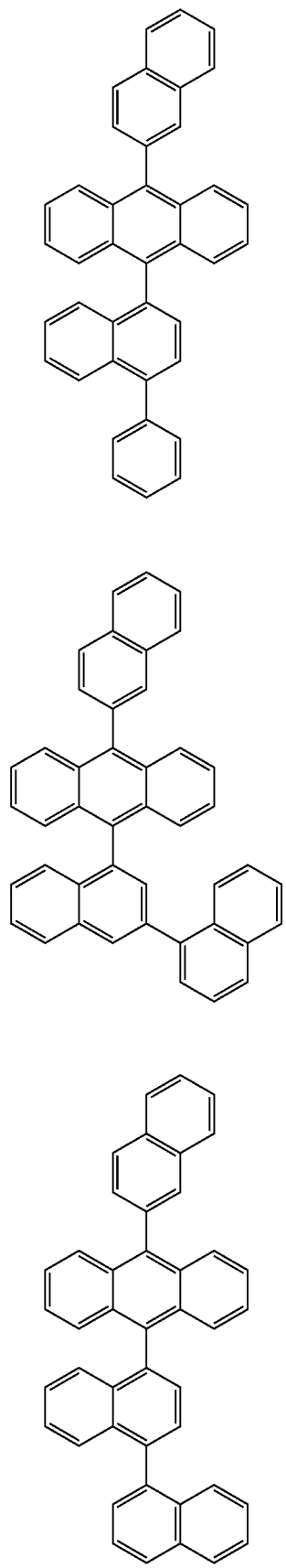
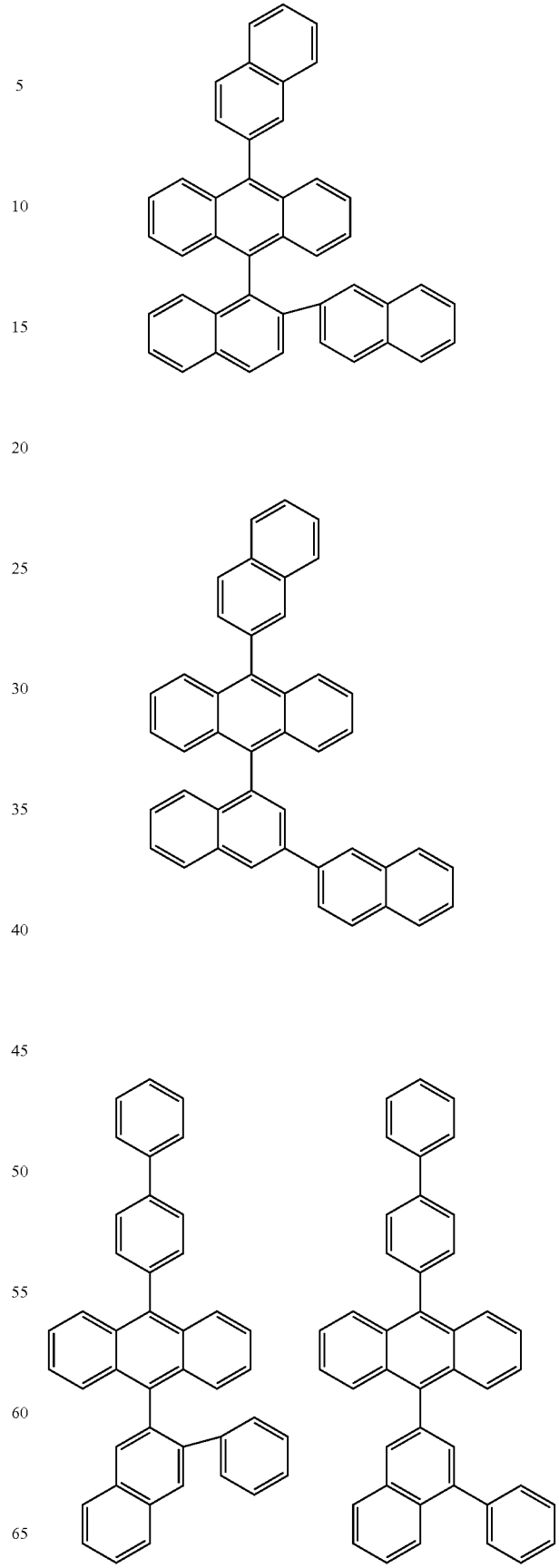

83
-continued
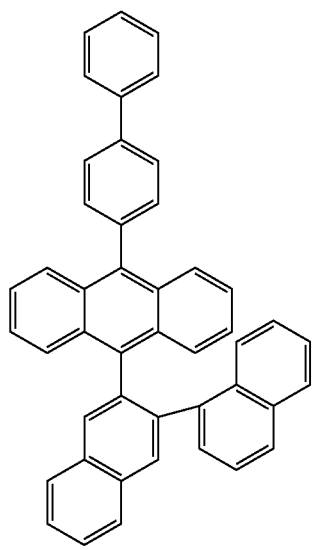
84
-continued
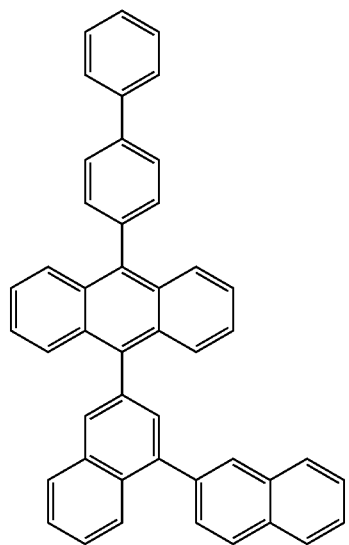
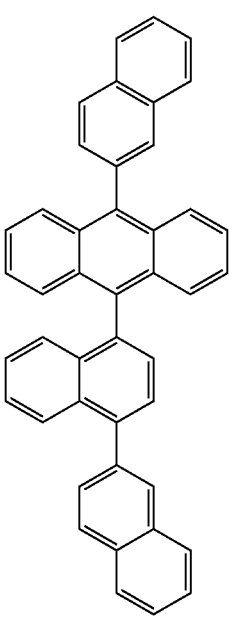
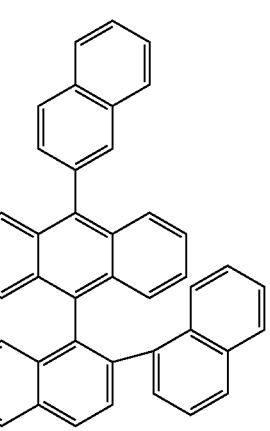

85
-continued
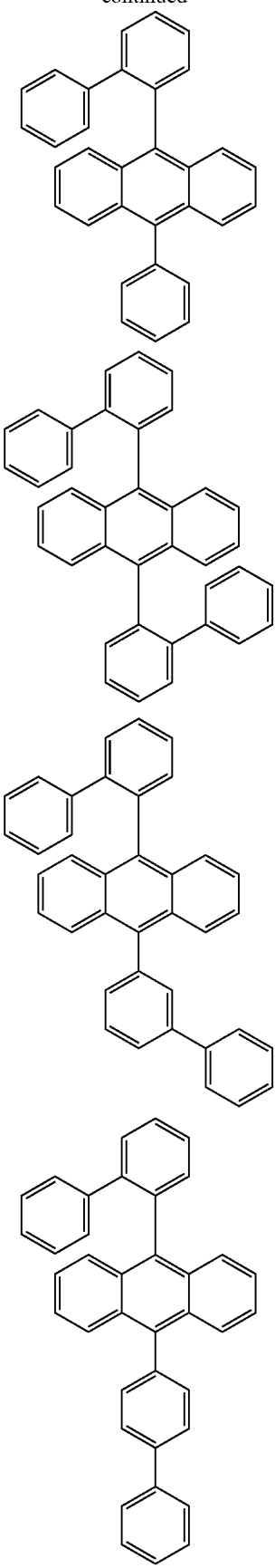
86
-continued
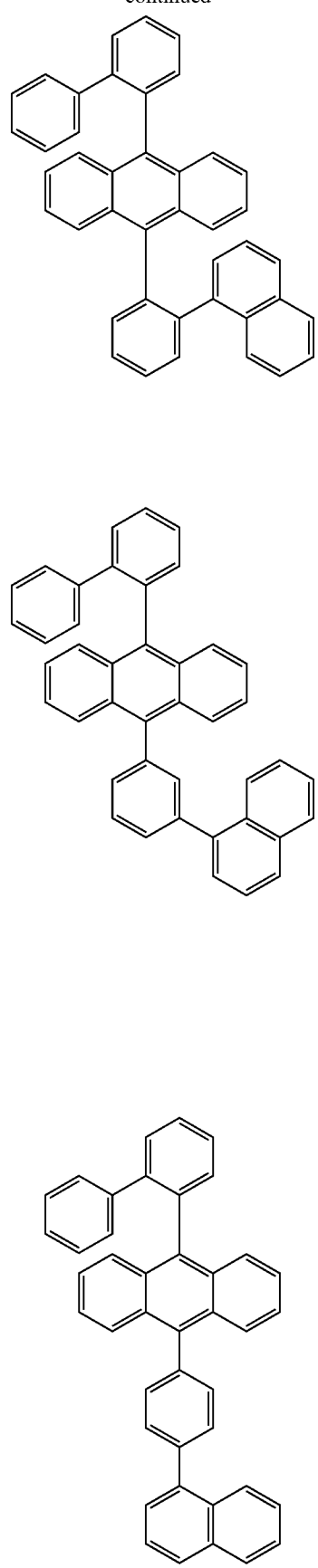

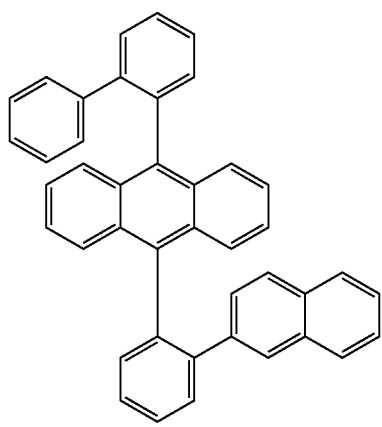
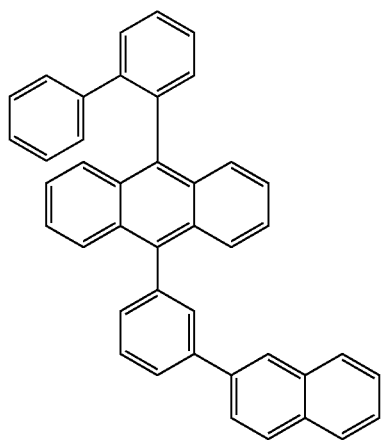
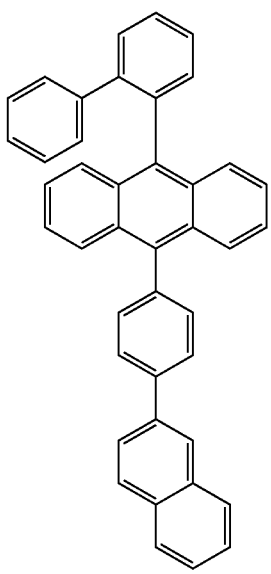
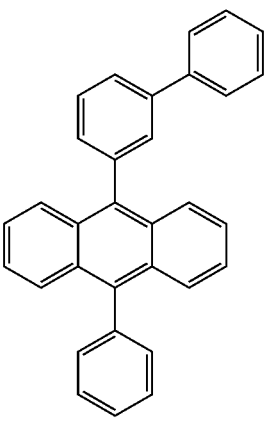
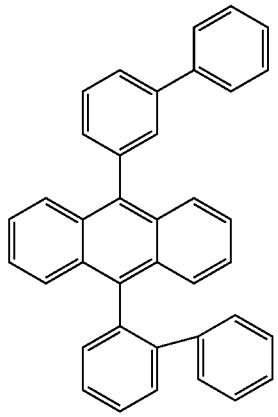
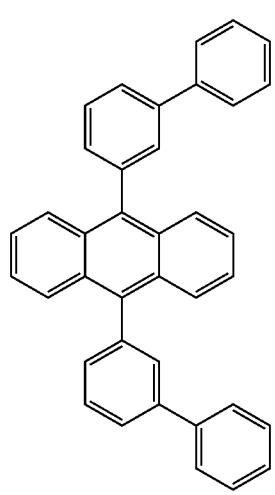

89
-continued
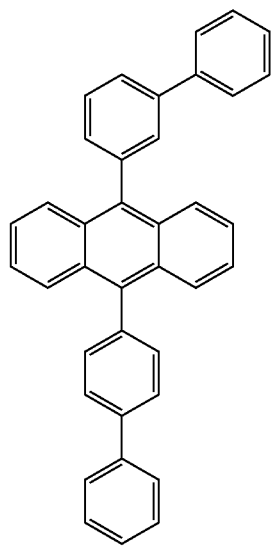
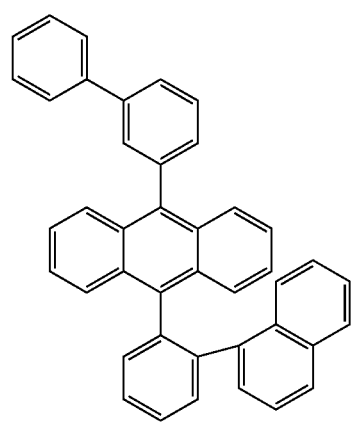
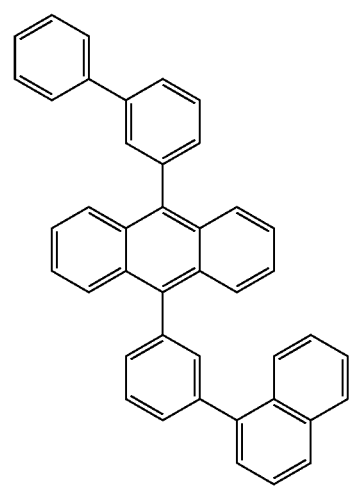
90
-continued
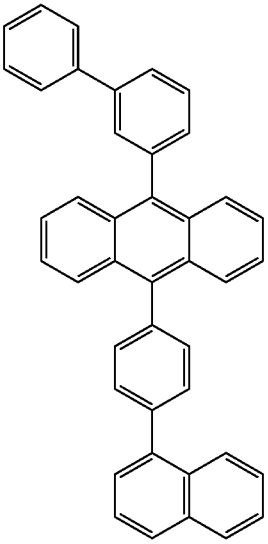
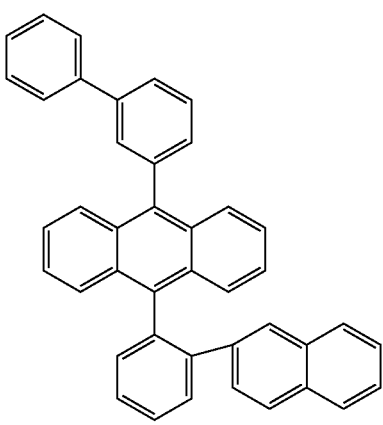
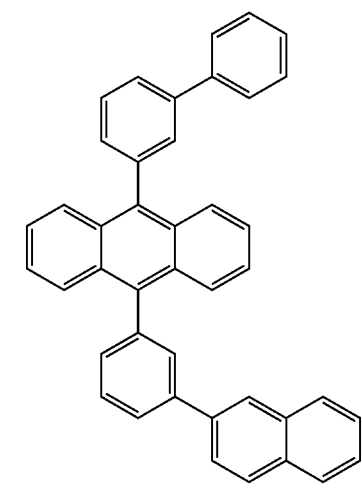

91
-continued
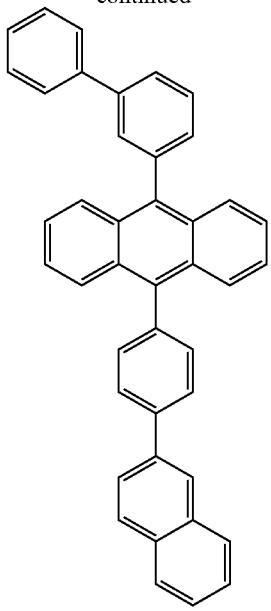
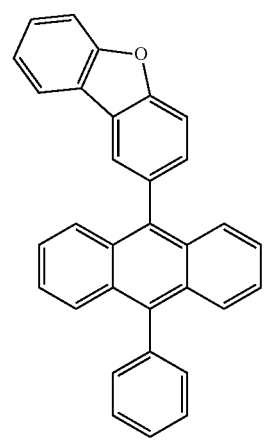
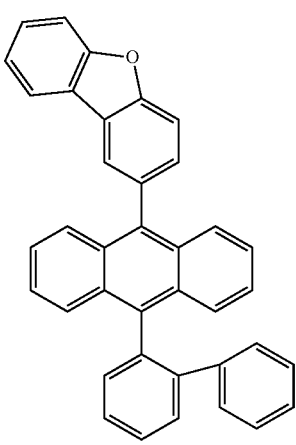
92
-continued
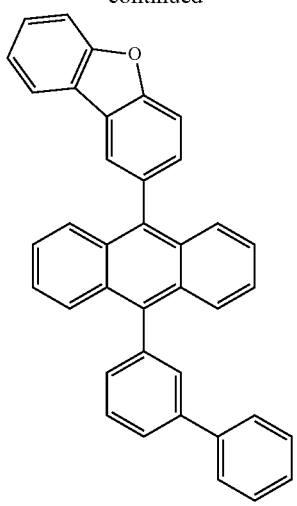
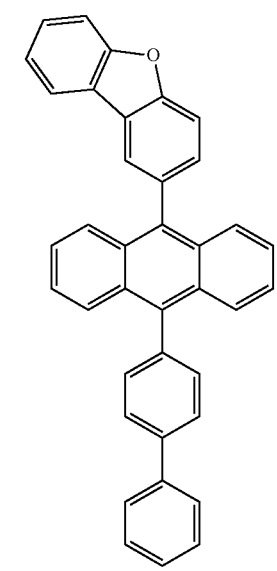
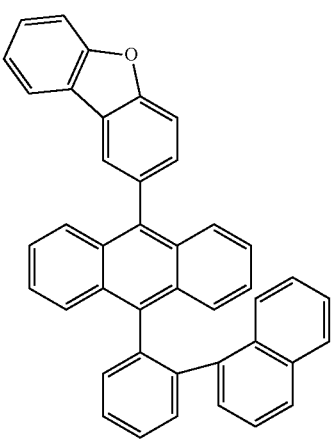

93
-continued
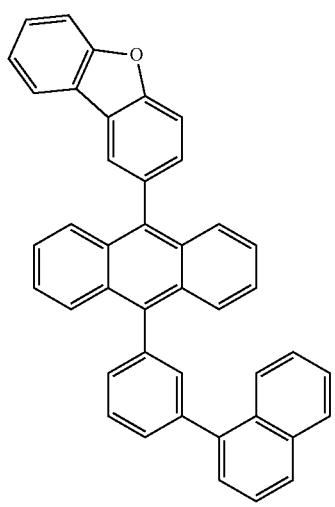
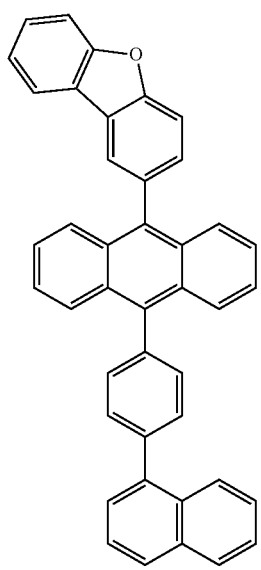
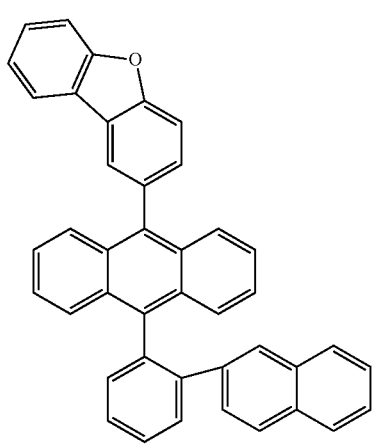
94
-continued
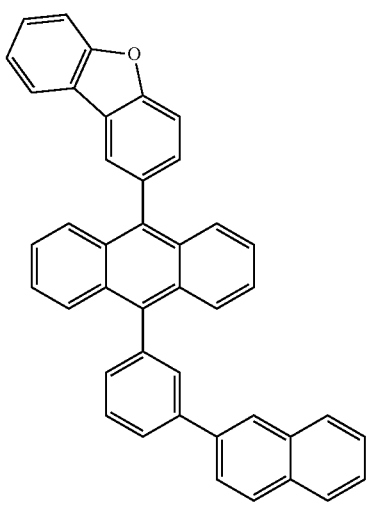
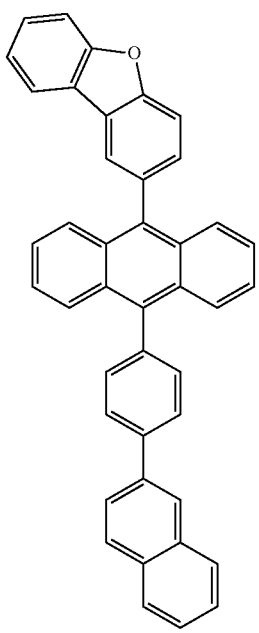
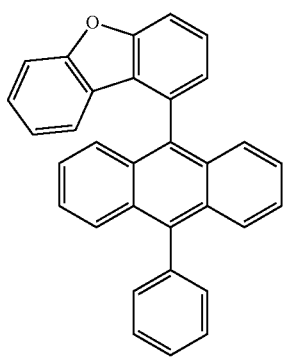

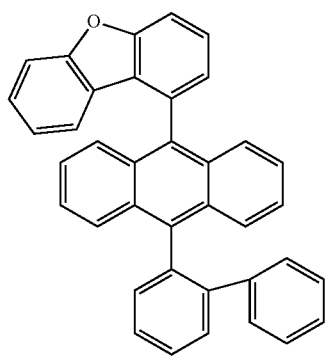
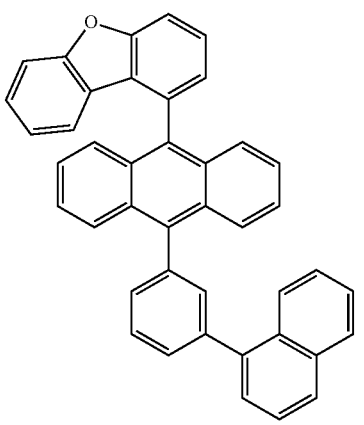

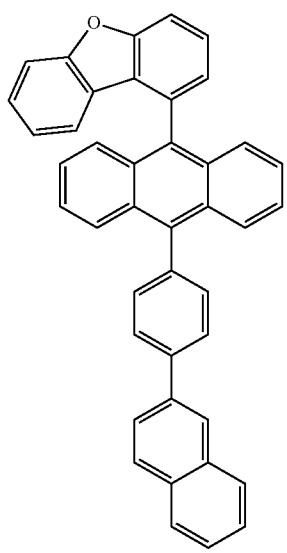
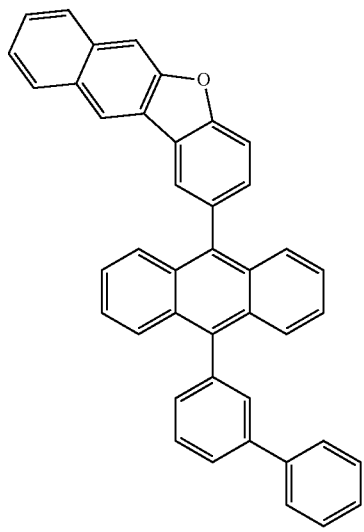
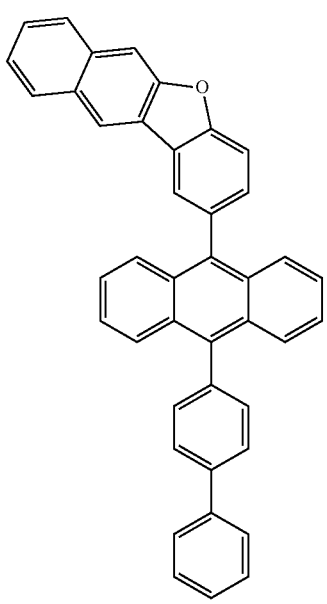
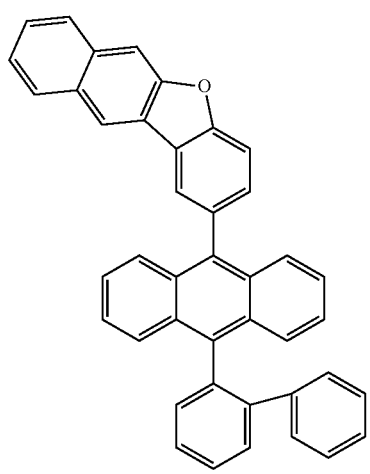
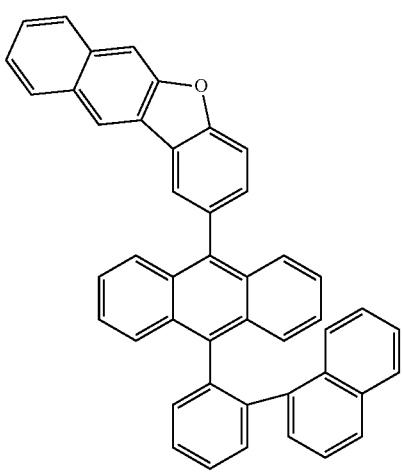

99
-continued
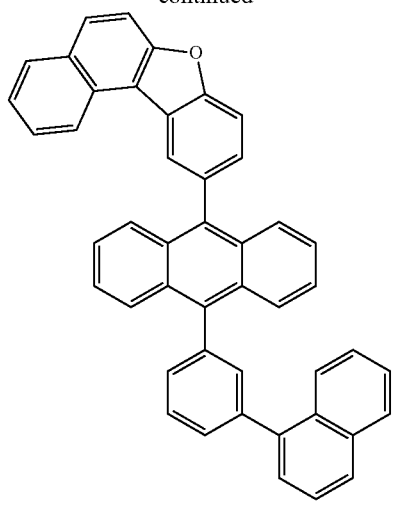
100
-continued
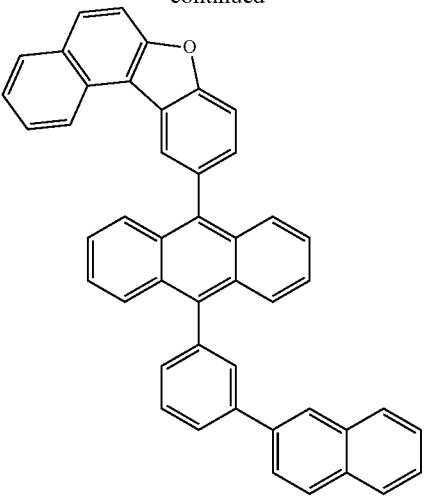
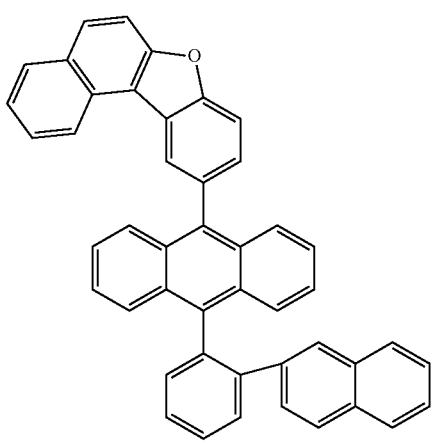
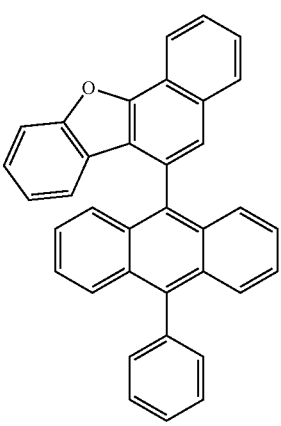

-continued
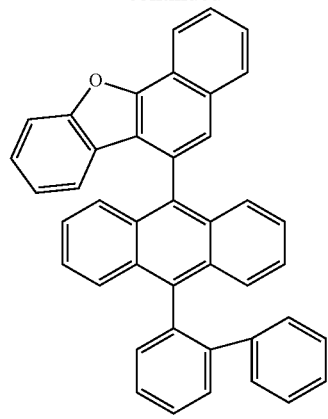
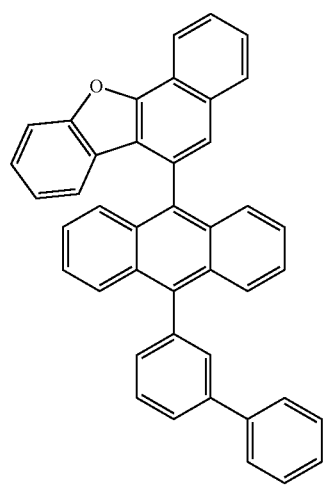
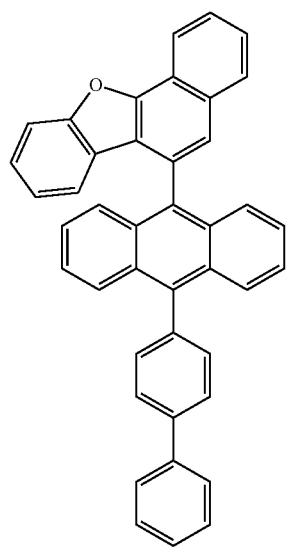
-continued
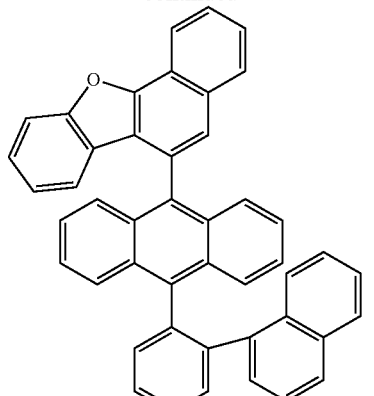
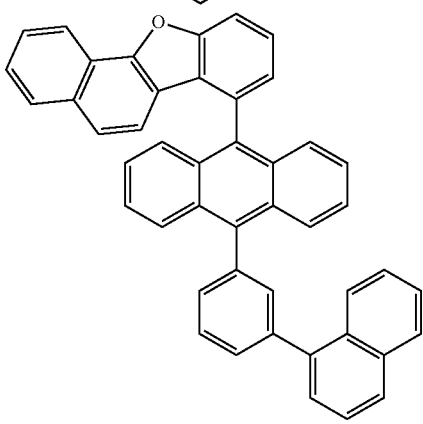
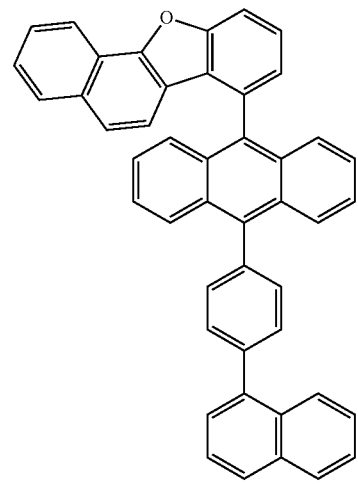
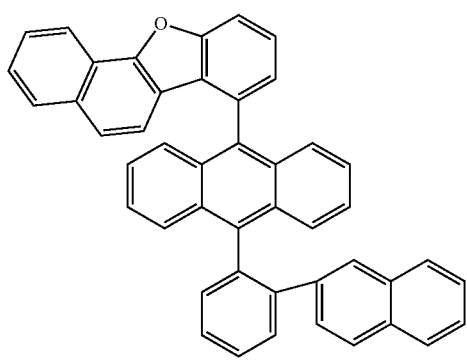

103
-continued
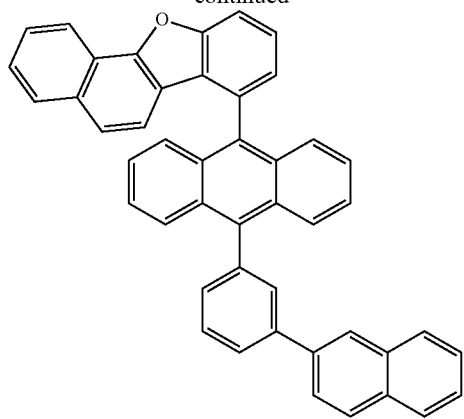
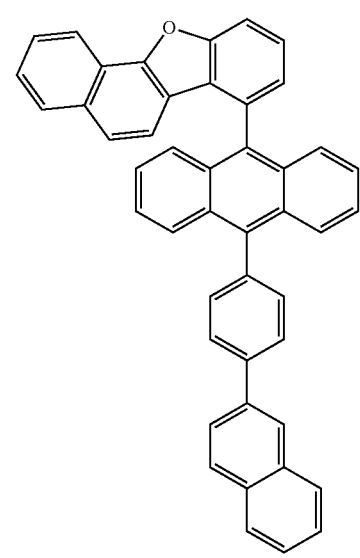
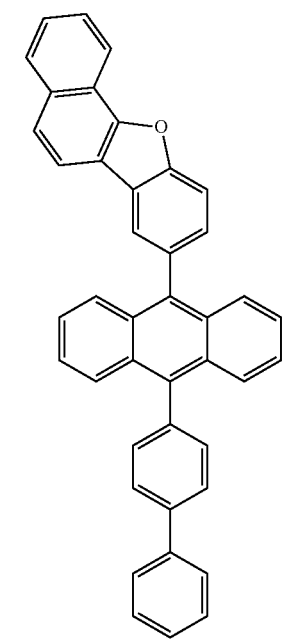
104
-continued
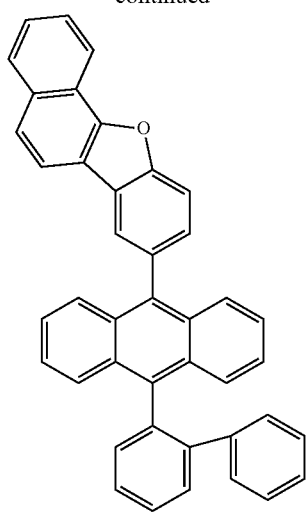
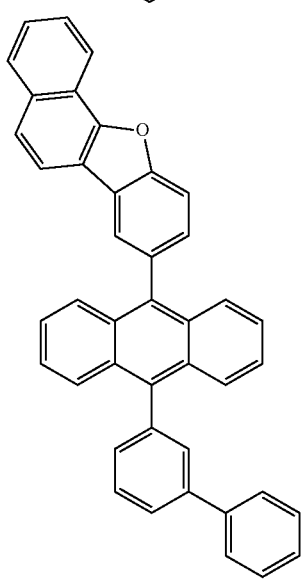

105
-continued
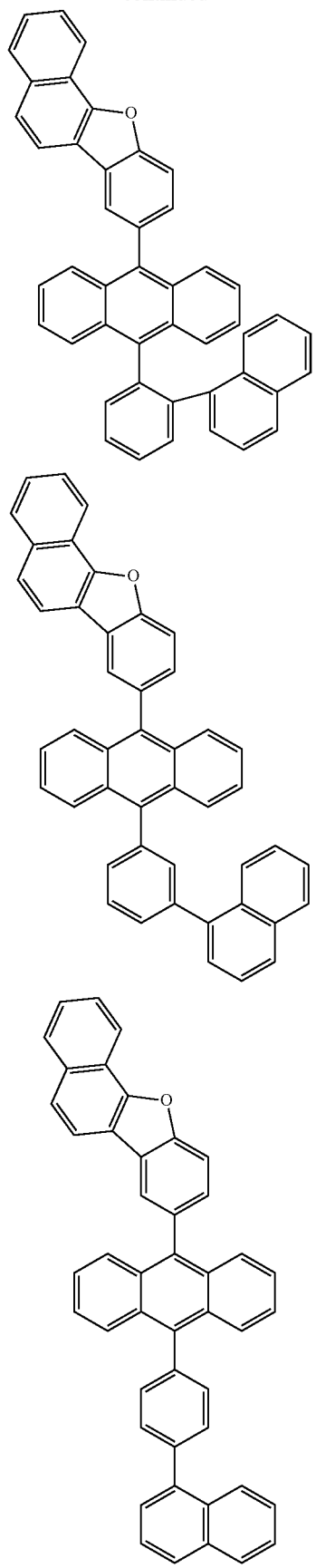
106
-continued
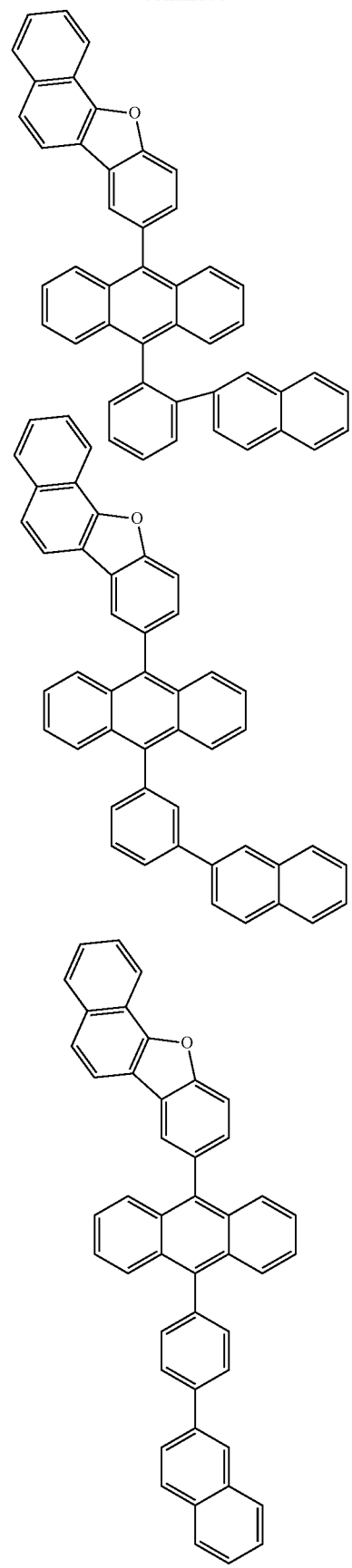

107
-continued
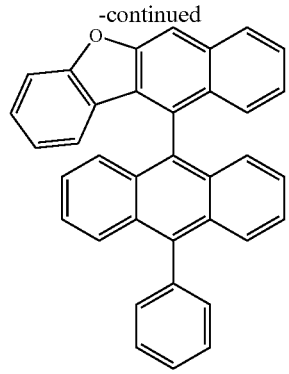
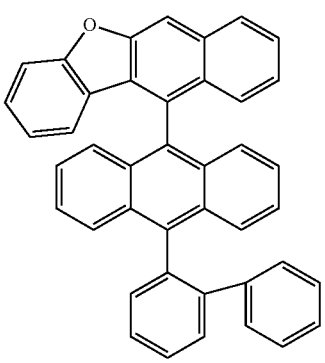
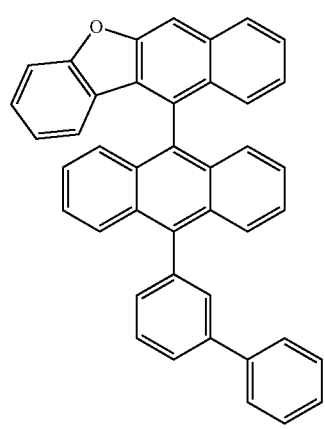
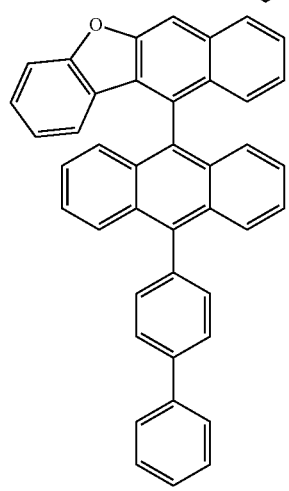
108
-continued
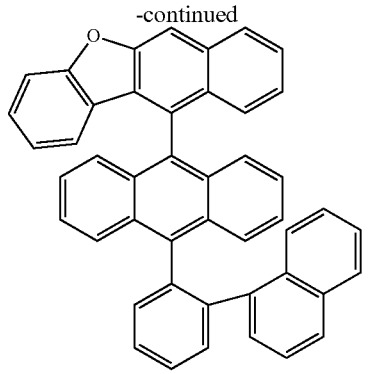
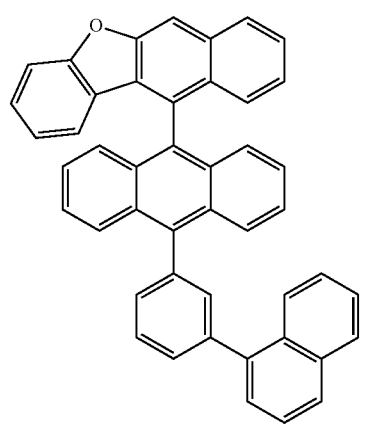
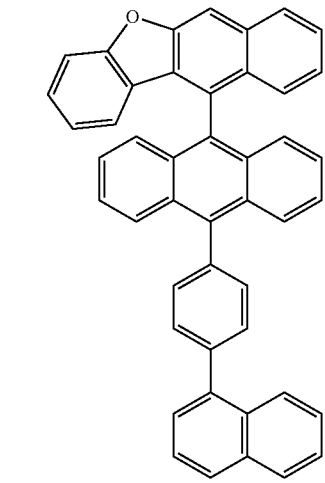
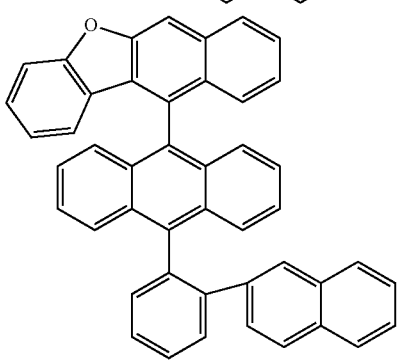

| 109 | 110 |
|---|---|
| -continued | -continued |
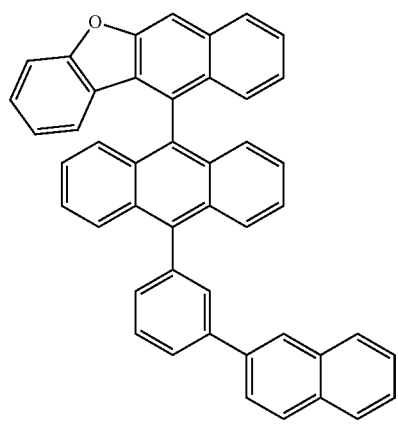
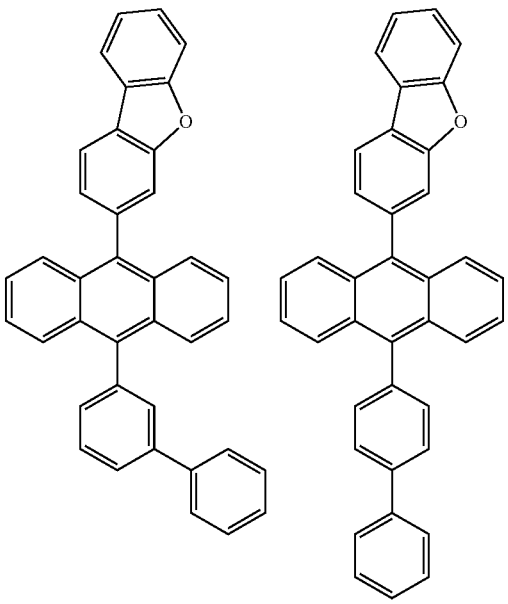
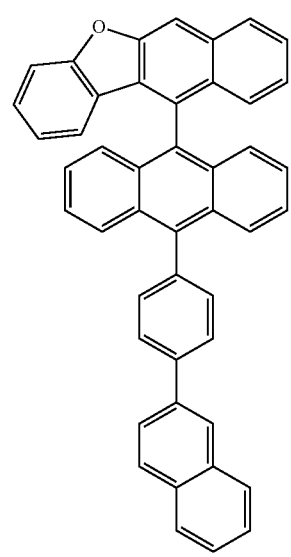
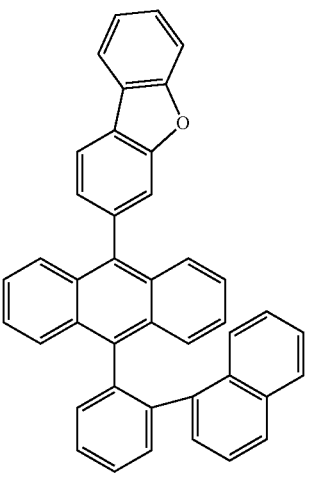
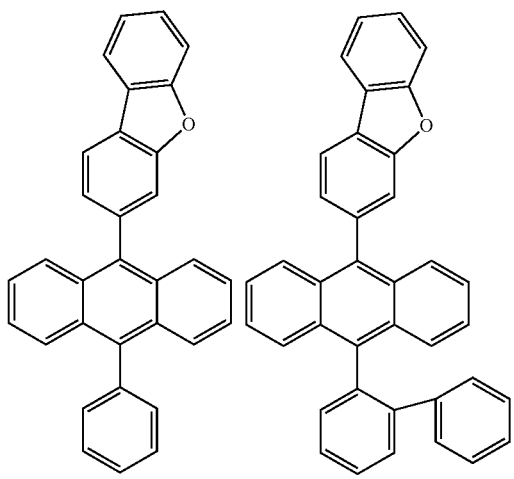
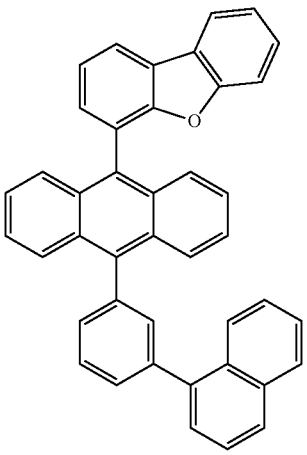

111
-continued
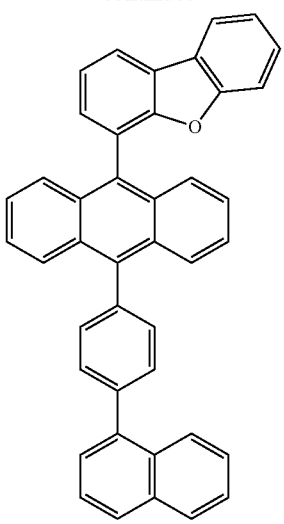
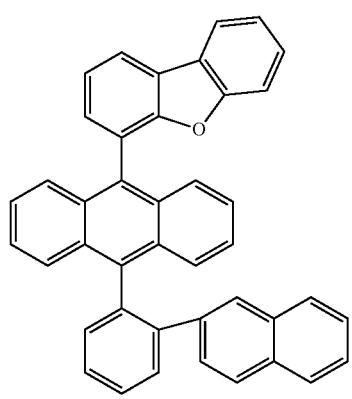
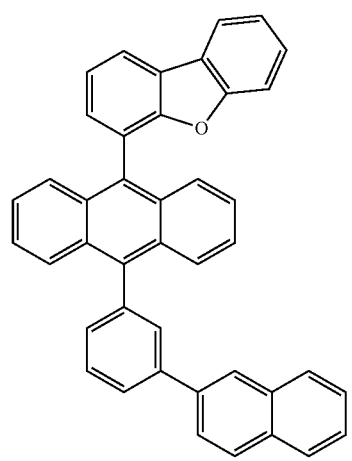
112
-continued
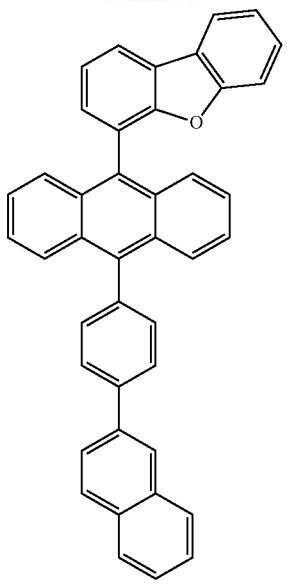
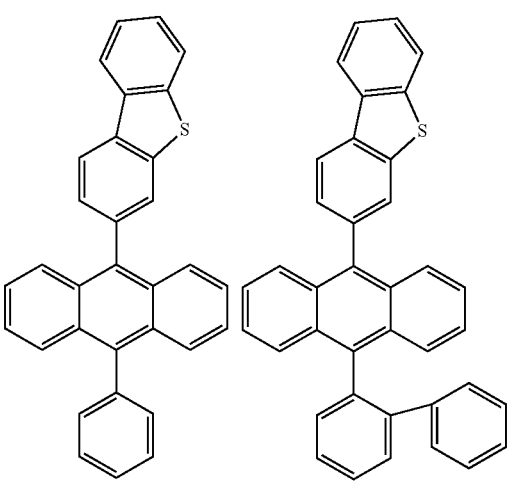

113
-continued
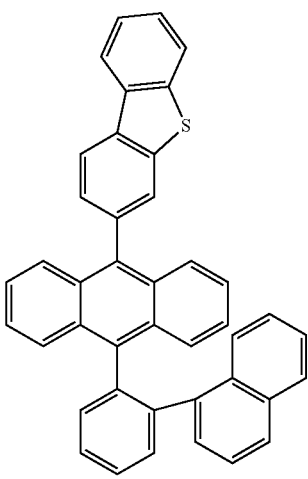
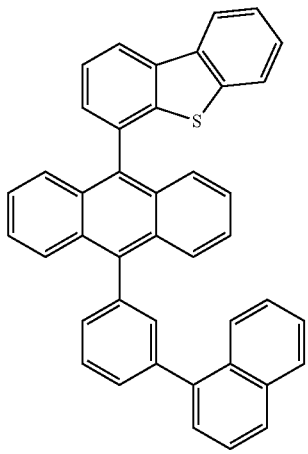
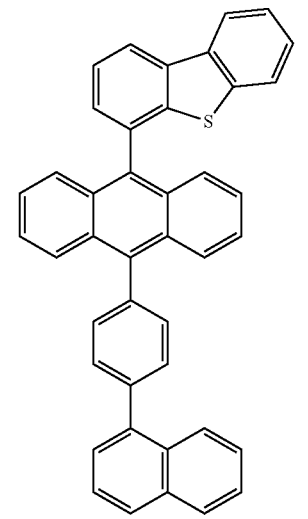
114
-continued
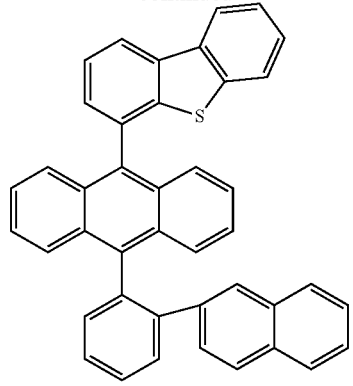
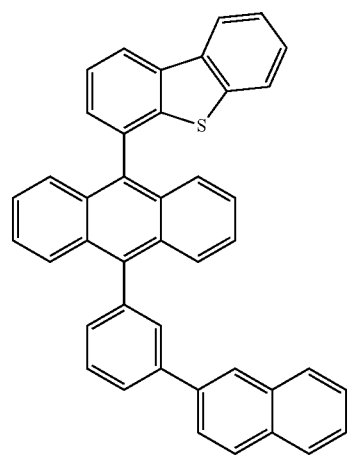
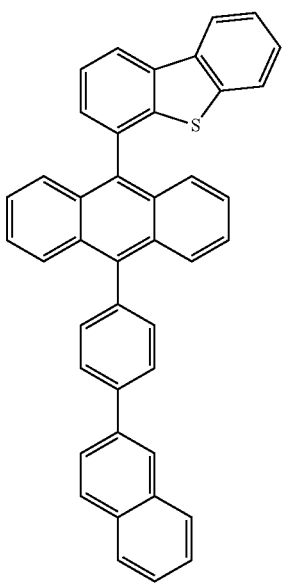

-continued
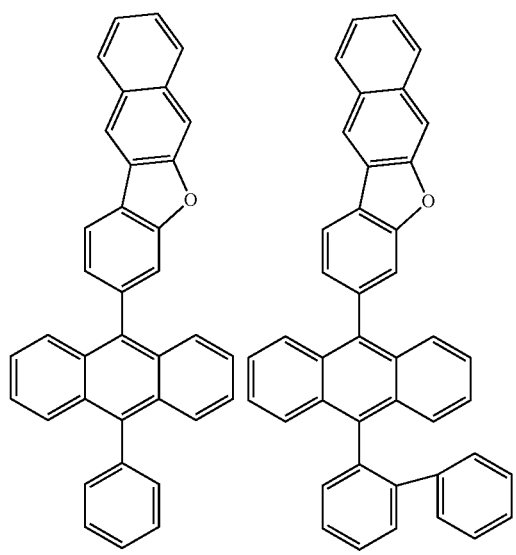
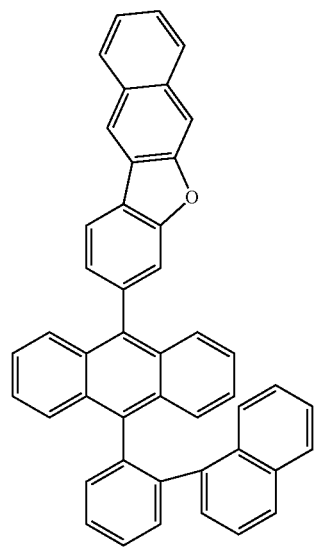
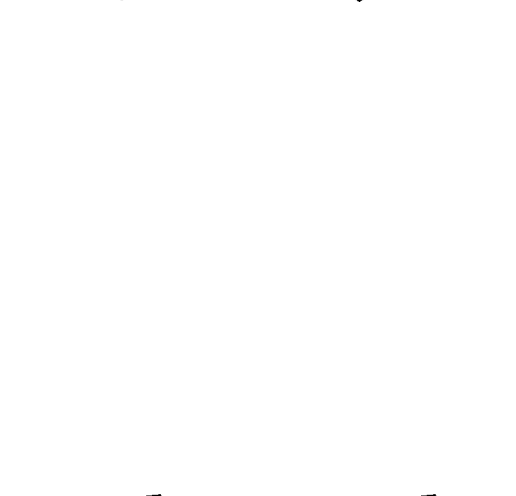
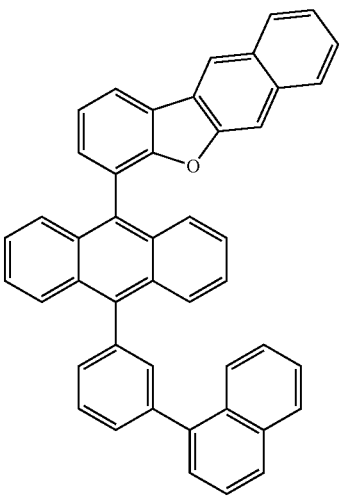
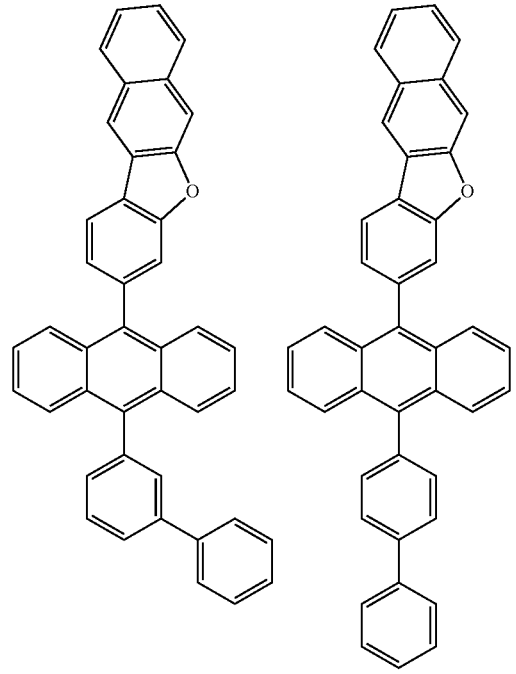
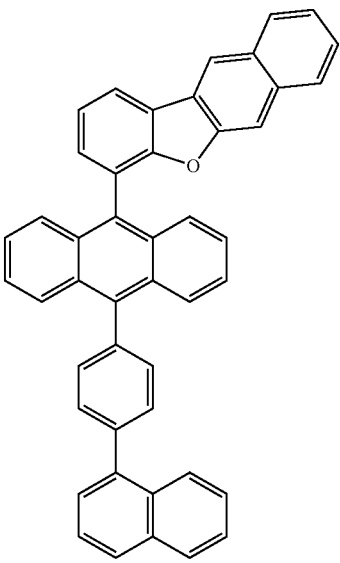

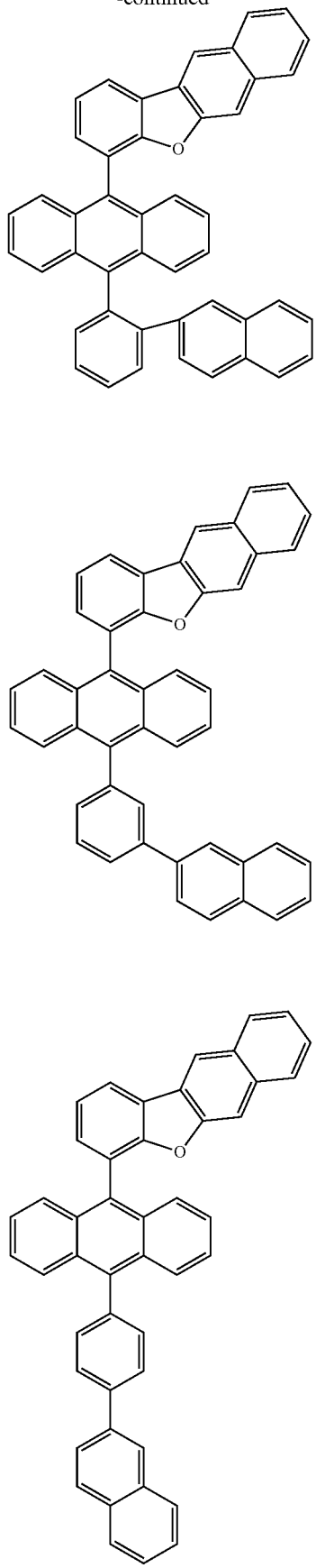
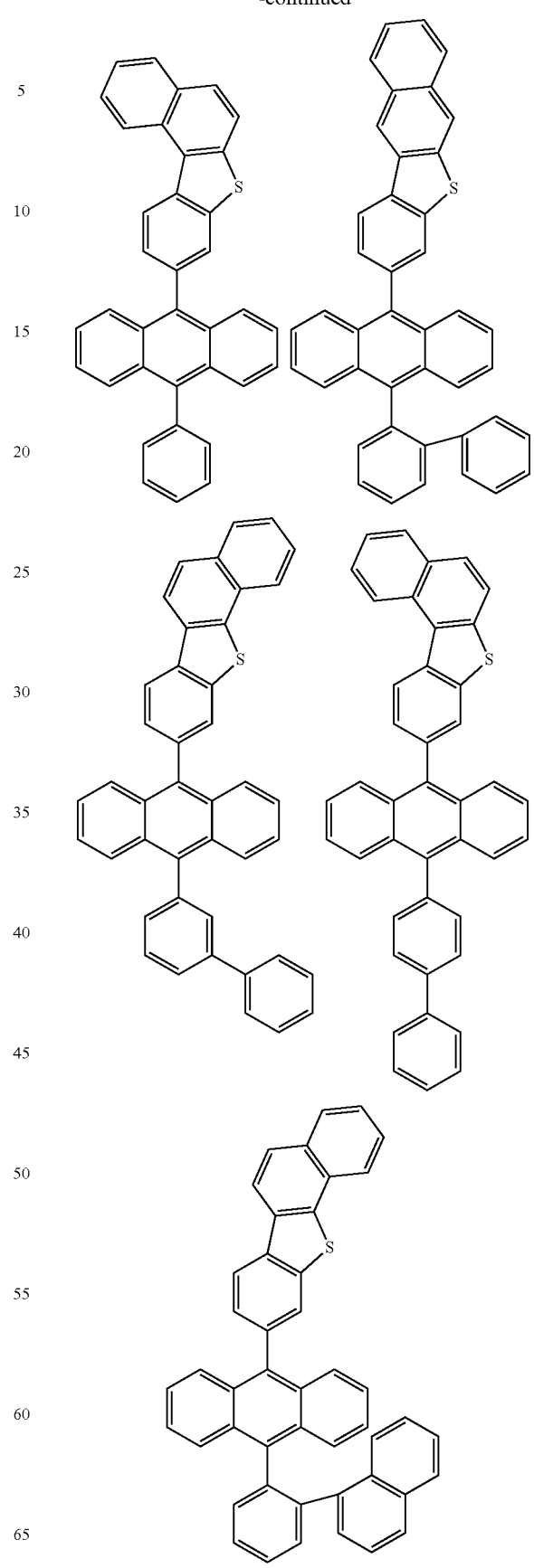

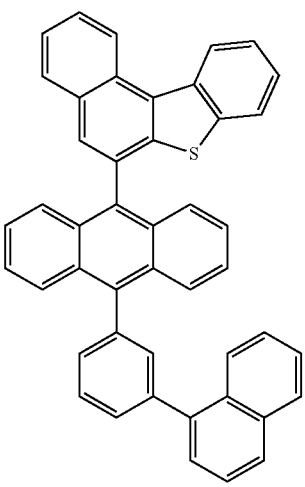
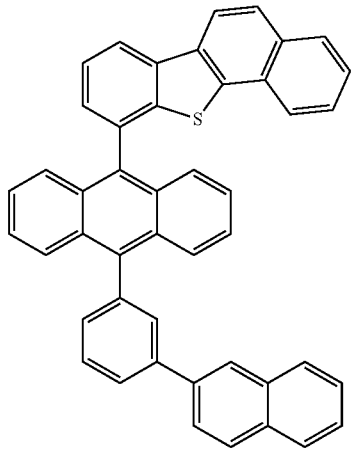
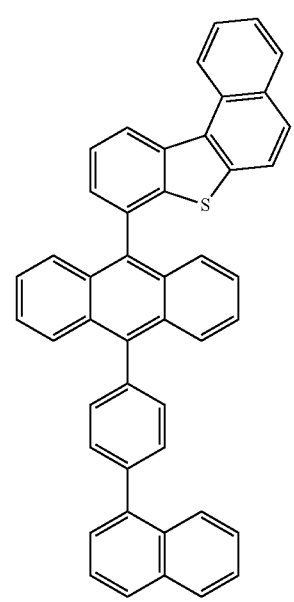
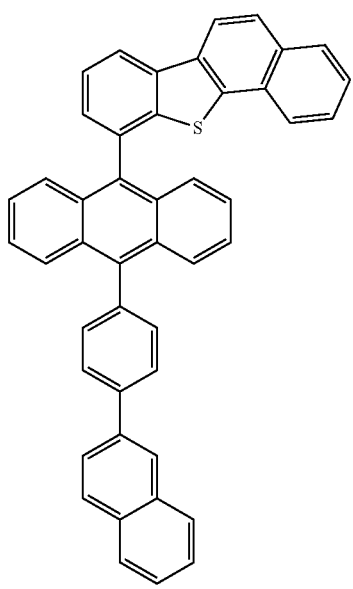
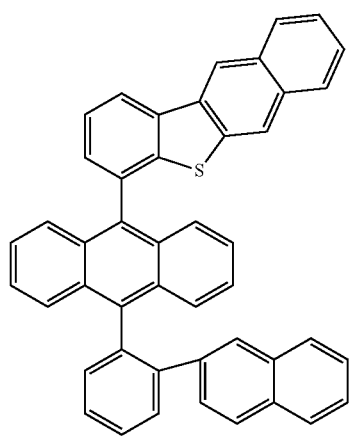
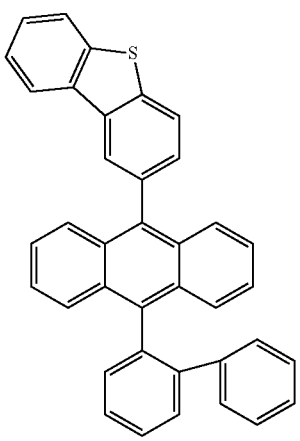

121
-continued
122
-continued
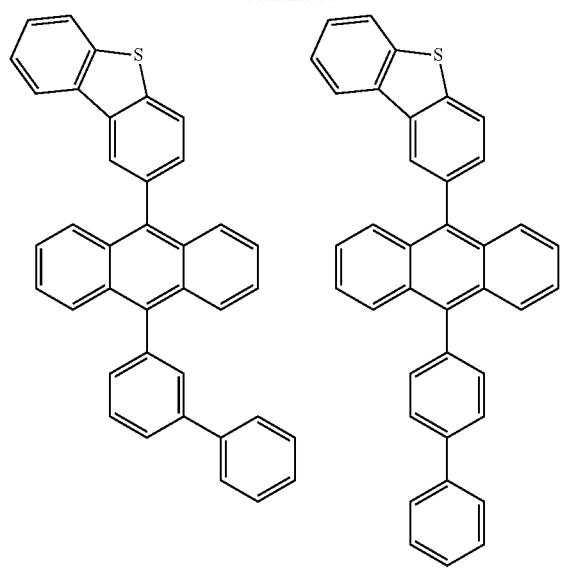
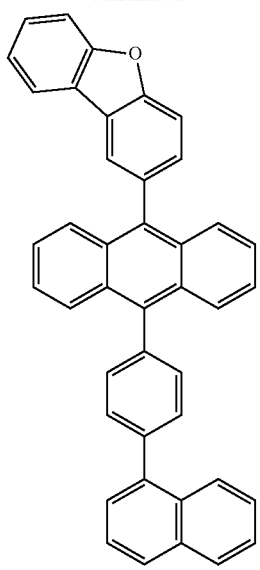

123
-continued
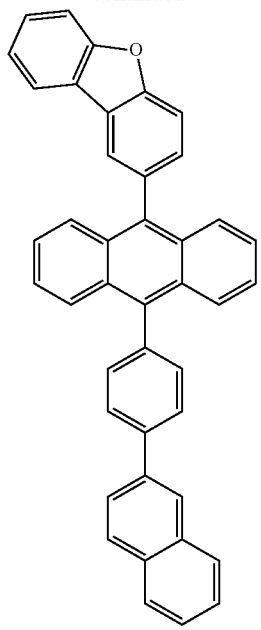
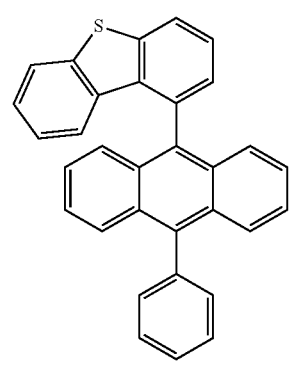
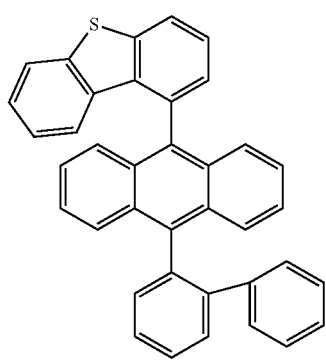
124
-continued
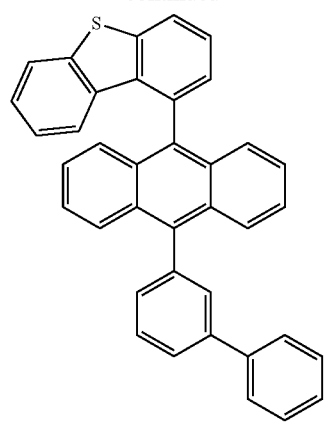
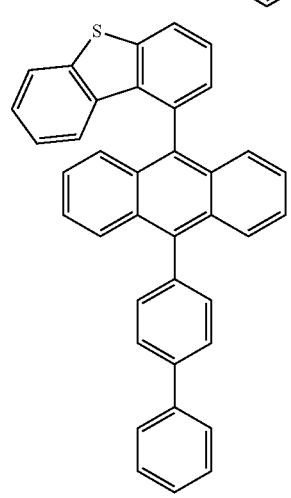
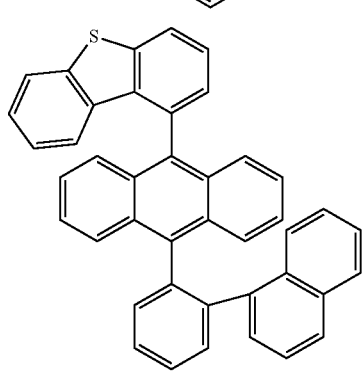
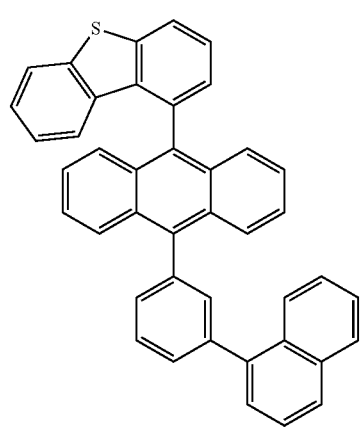

125
-continued
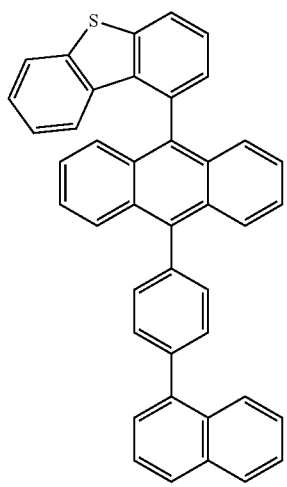
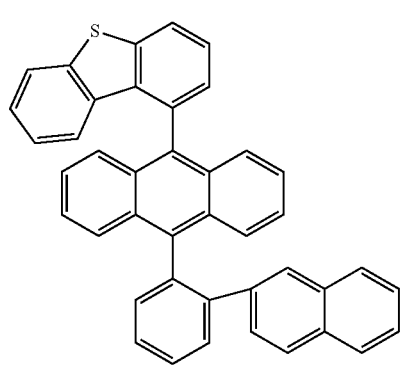
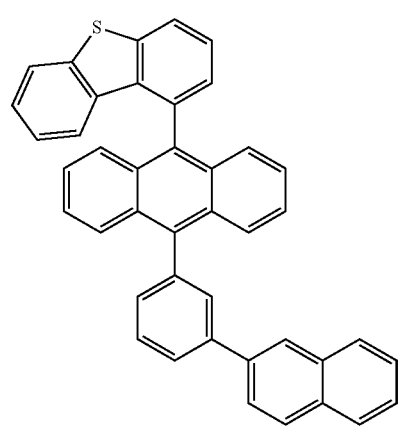
126
-continued
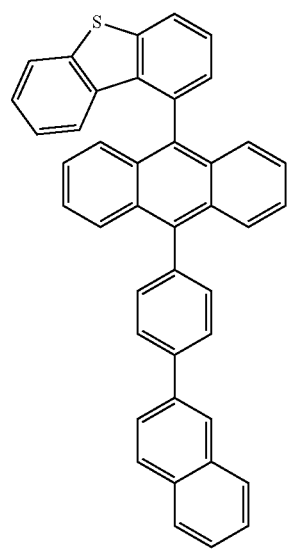
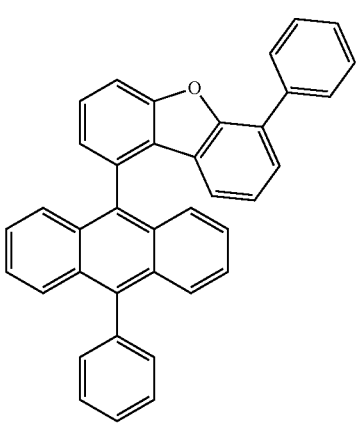
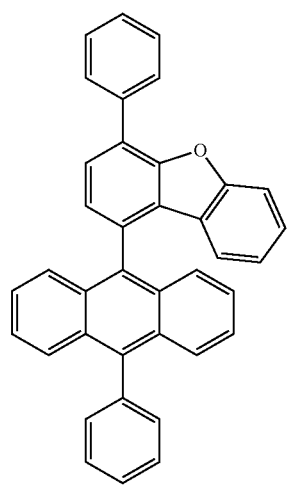

127
-continued
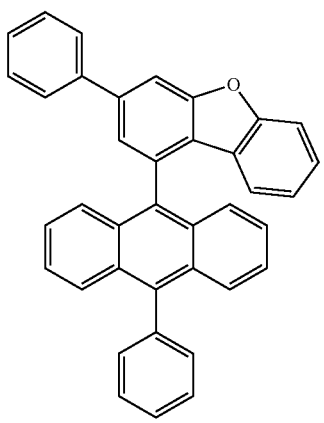
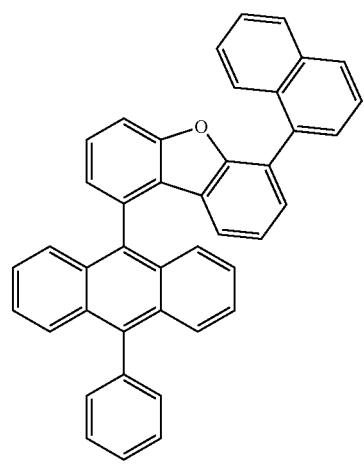
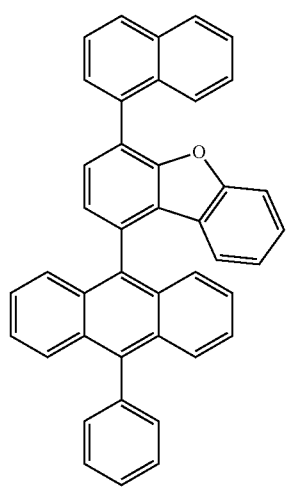
128
-continued
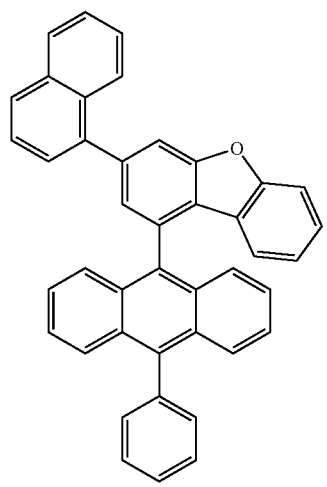
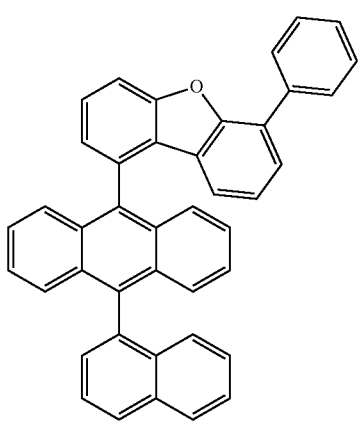
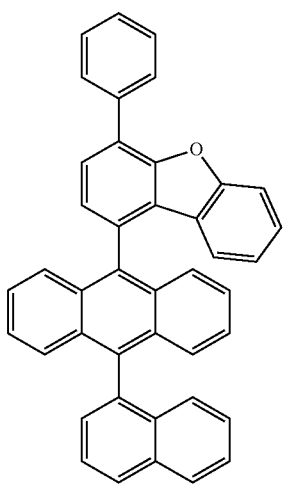

129
-continued
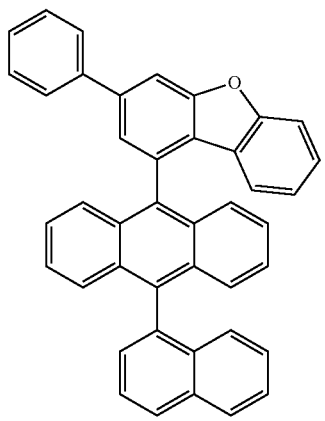
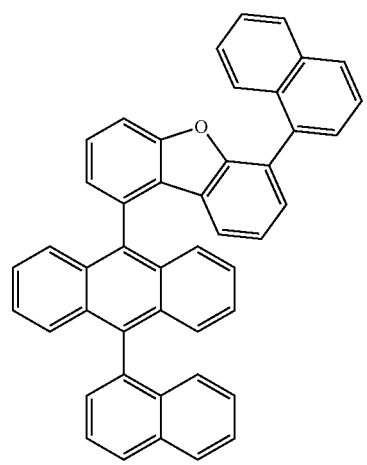
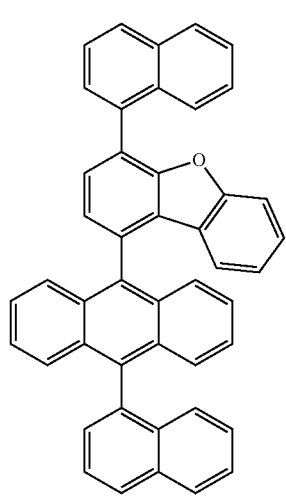
130
-continued
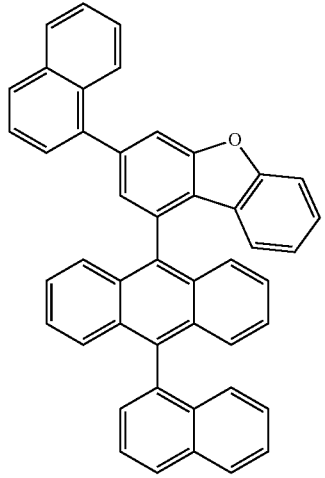
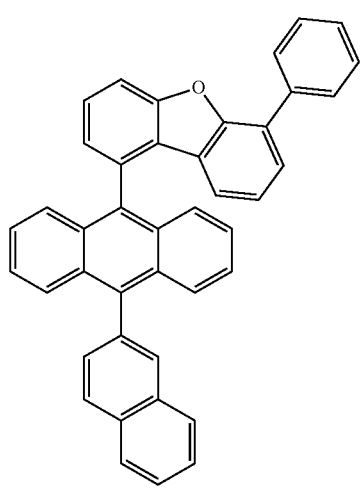
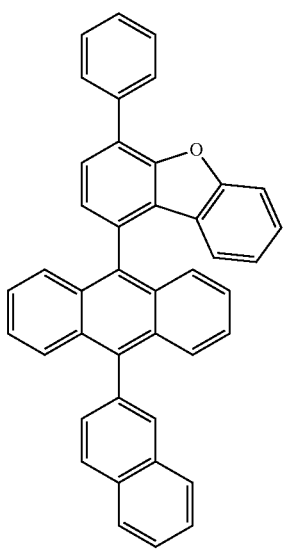

| 131 | 132 |
|---|---|
| -continued | -continued |
| 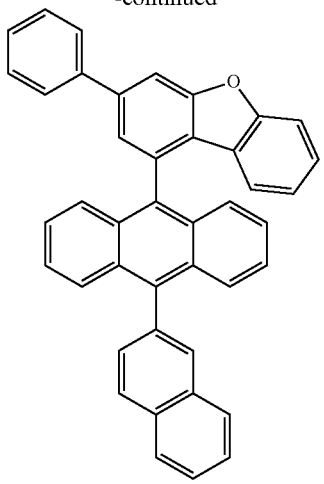 | 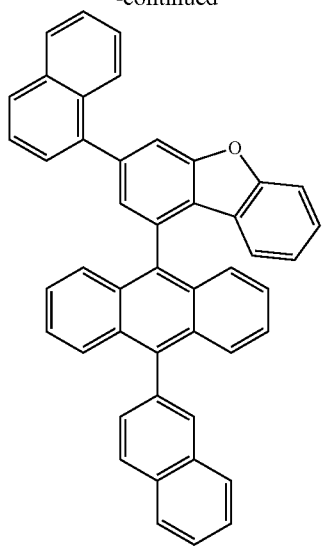 |
| 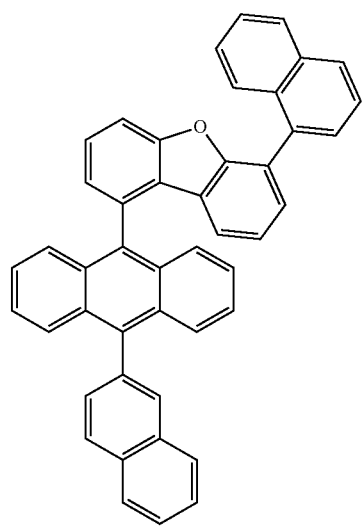 | 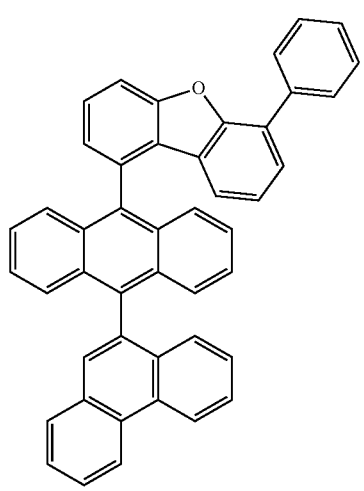 |
| 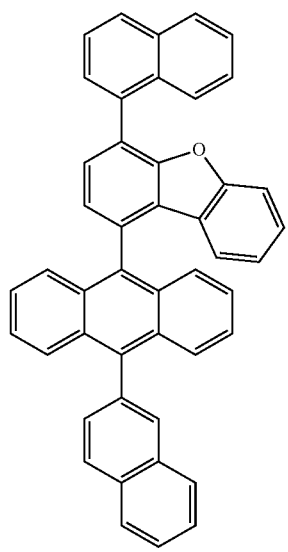 | 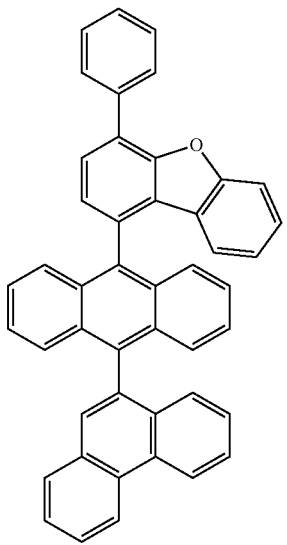 |

133
-continued
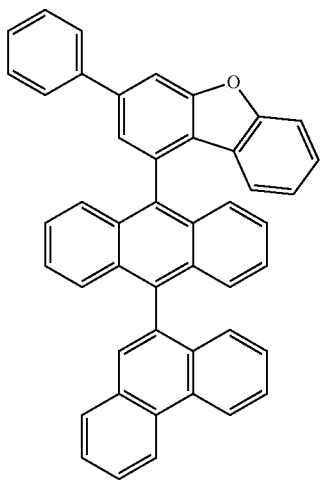
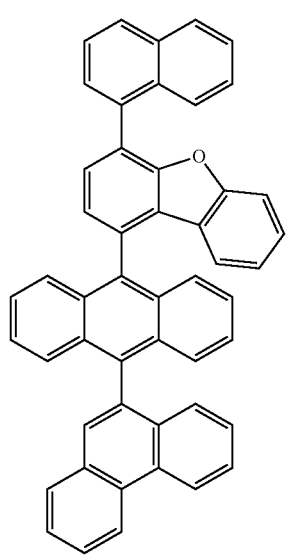
134
-continued
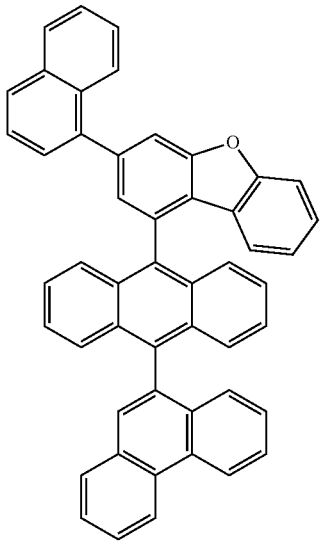
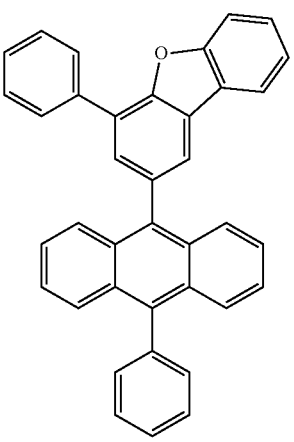

135
-continued
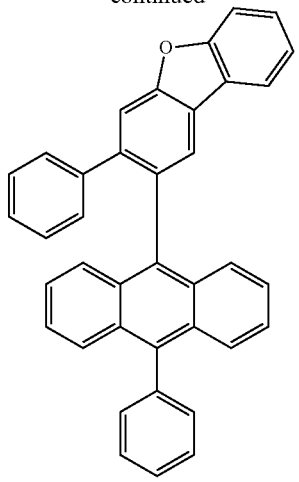
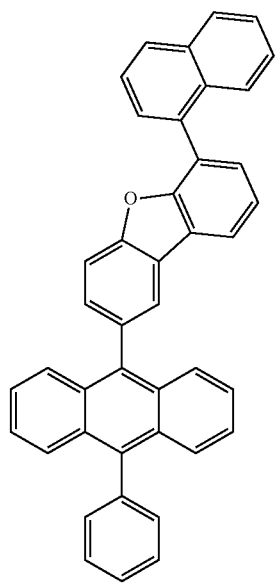
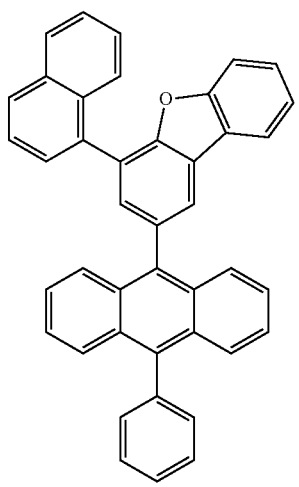
136
-continued
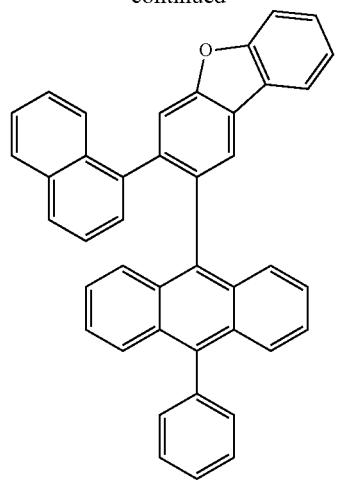
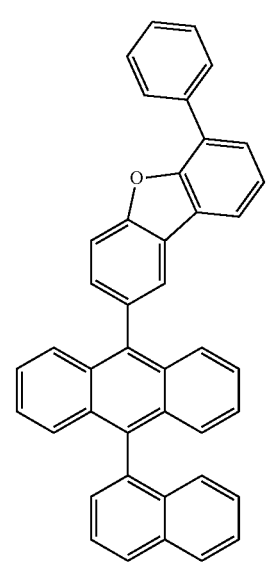
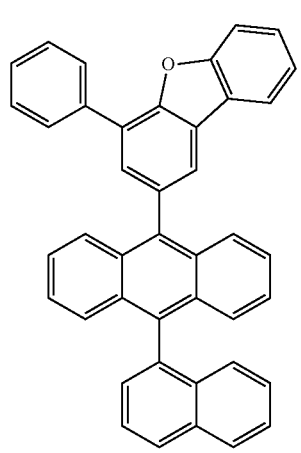

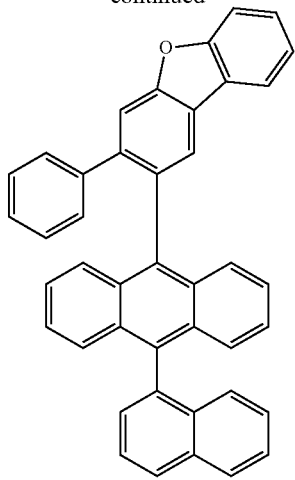
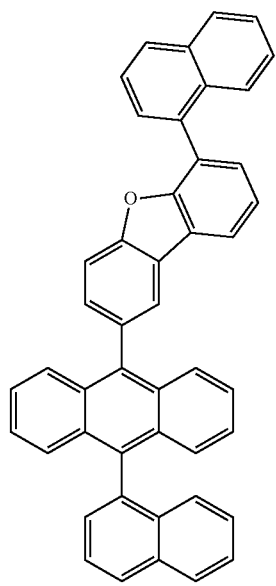
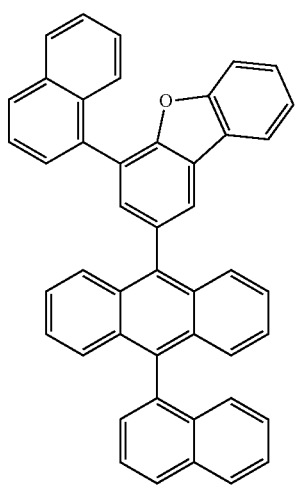
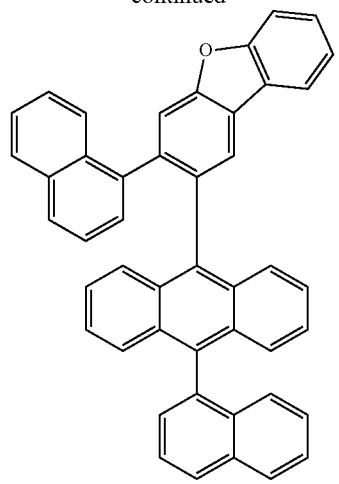
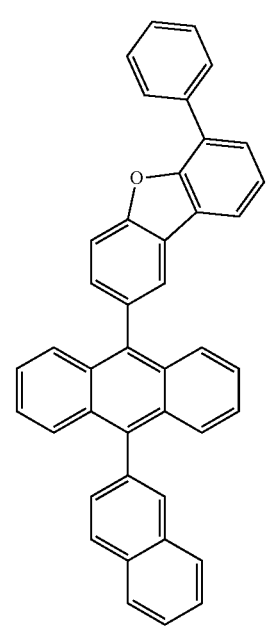
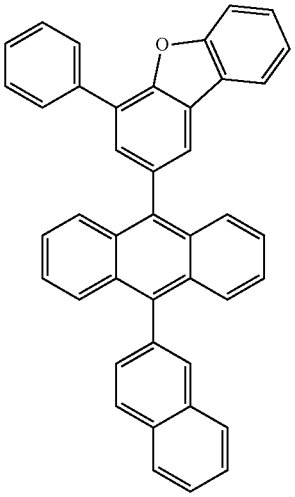

139
-continued
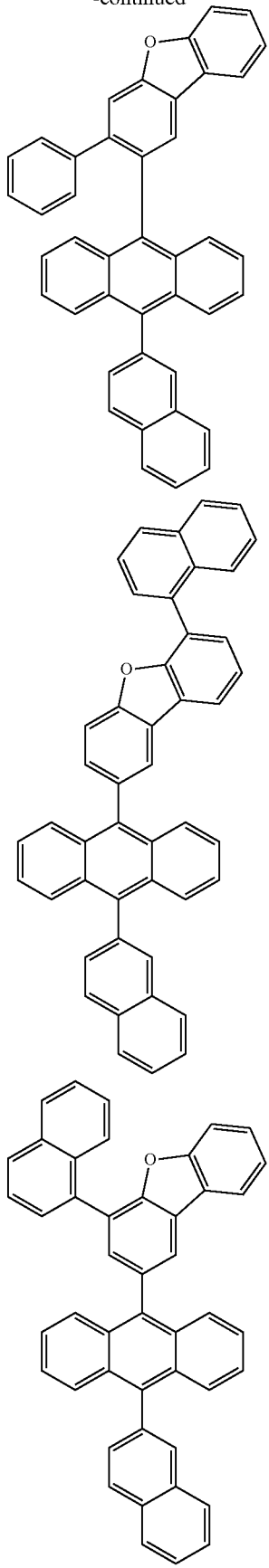
140
-continued
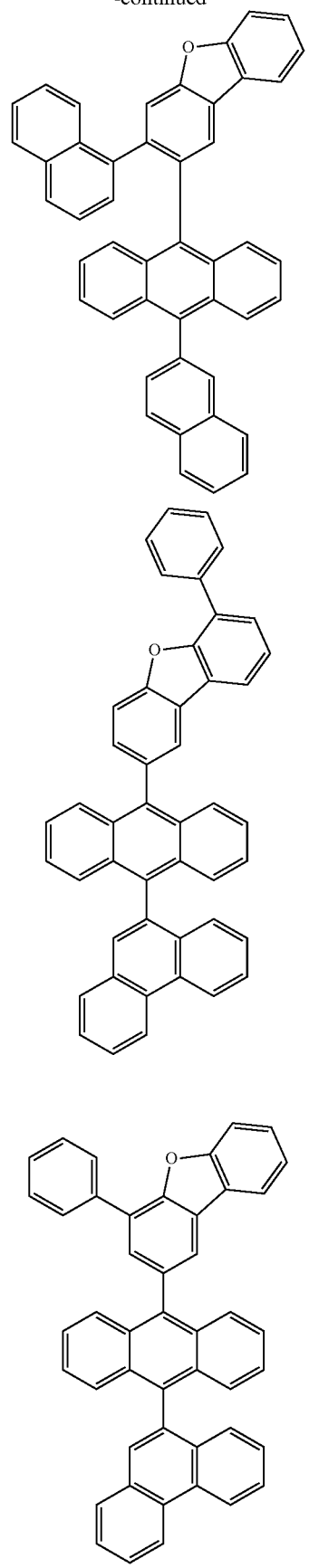

-continued
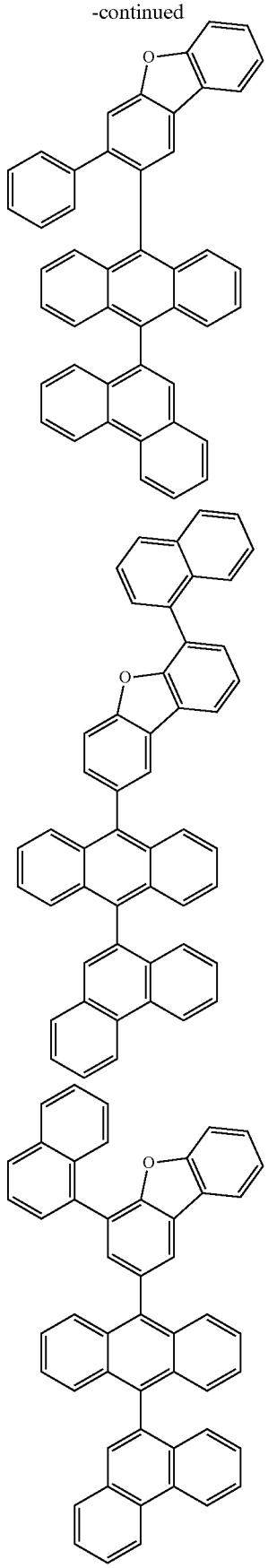
-continued
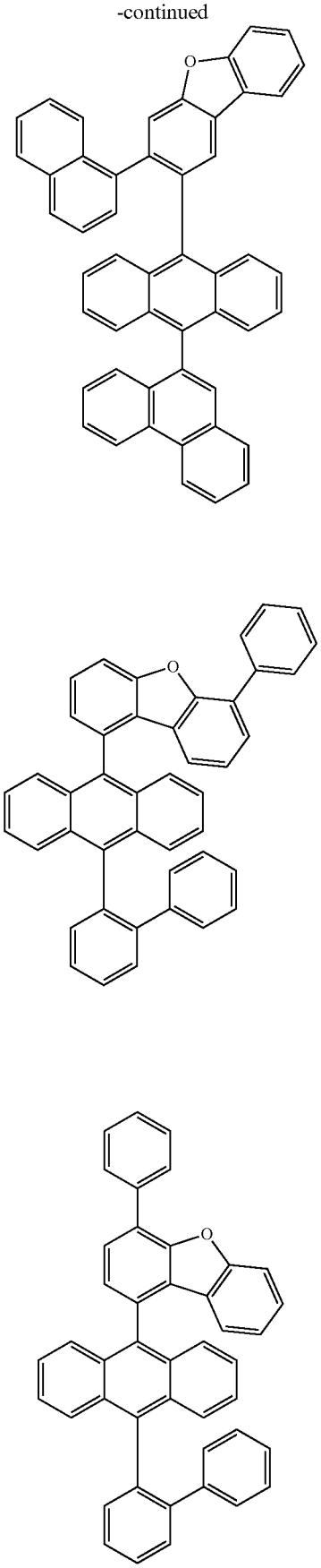

-continued
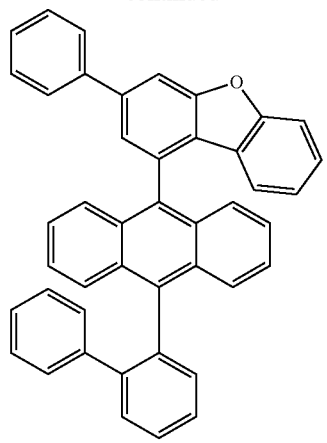
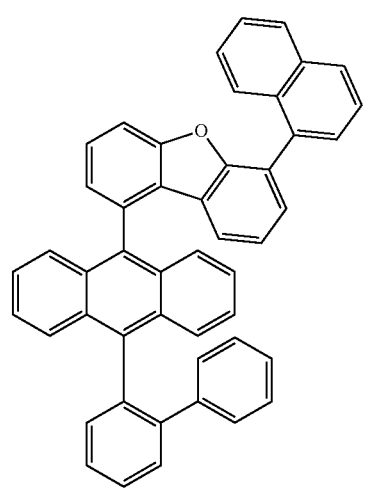
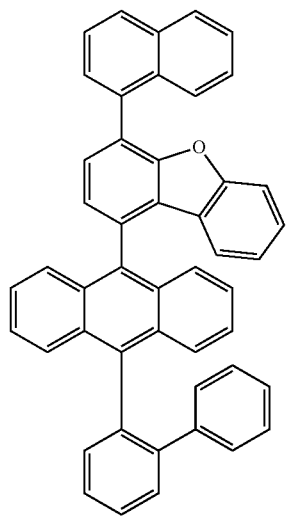
-continued
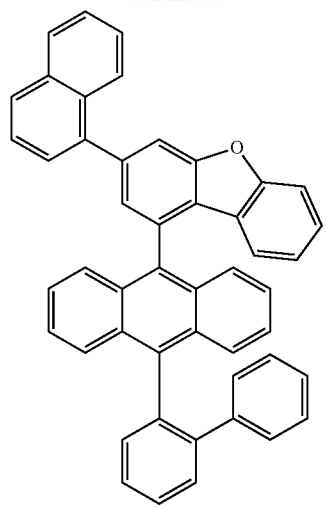
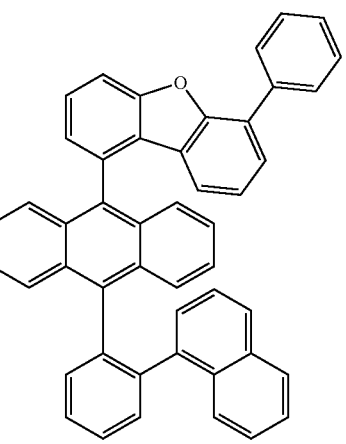
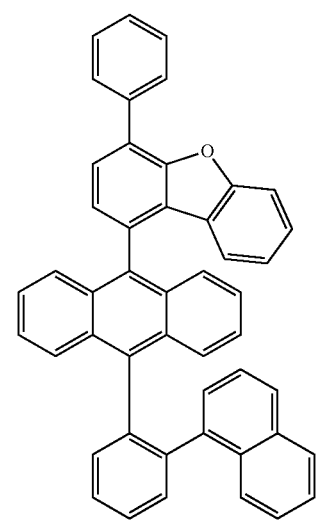

145
146
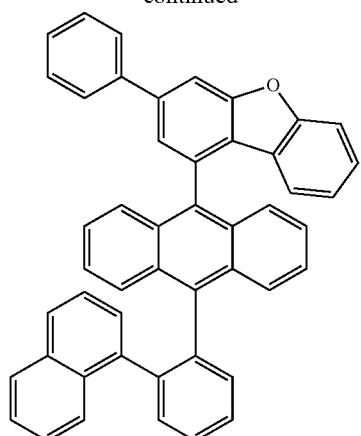
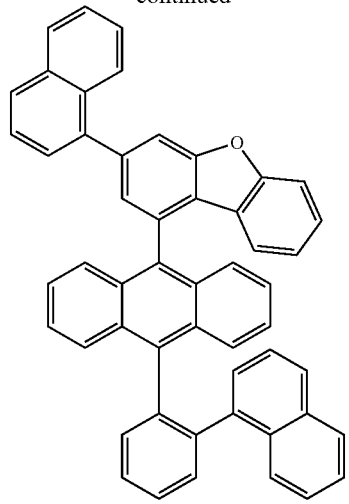
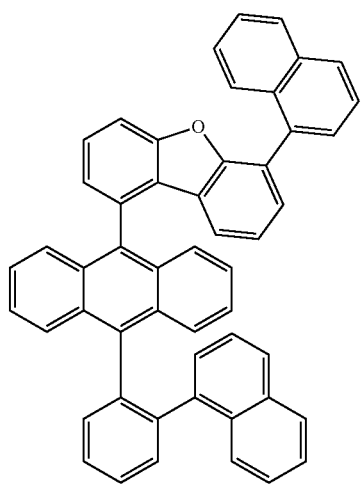
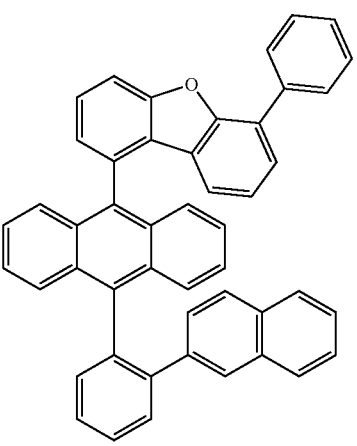
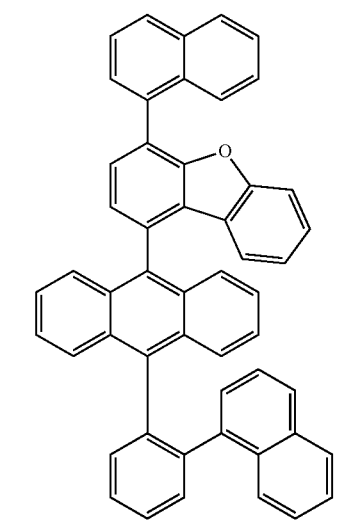
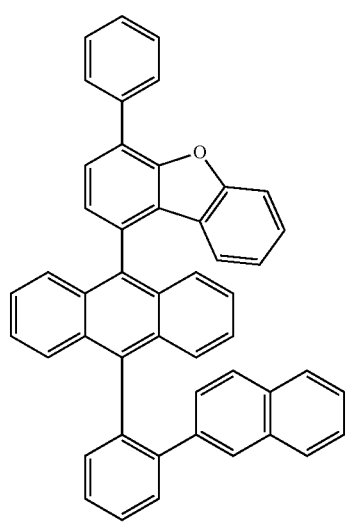

147
-continued
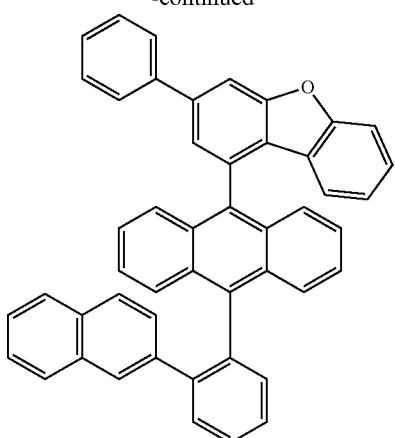
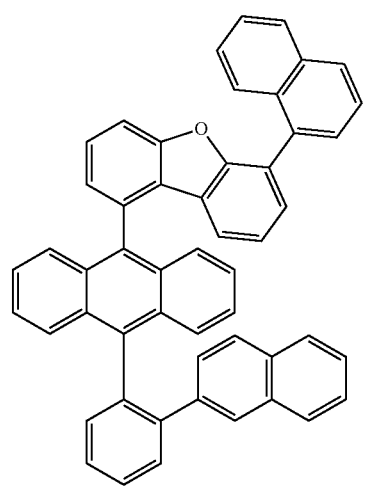
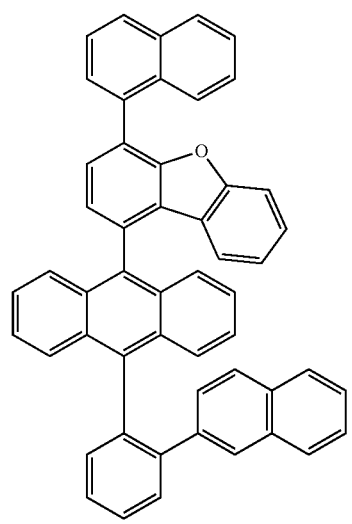
148
-continued
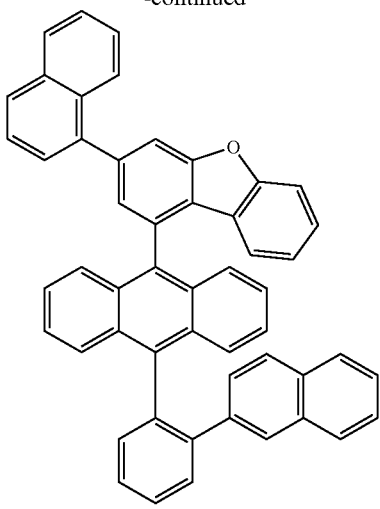
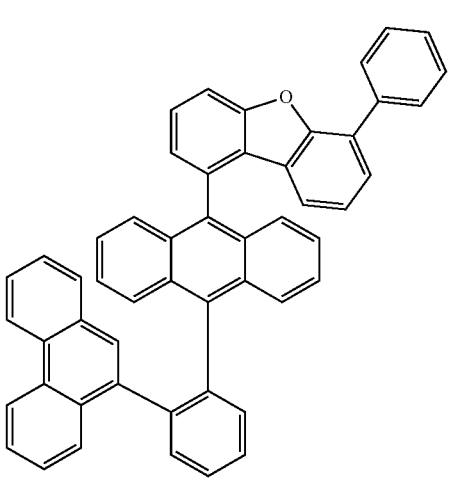
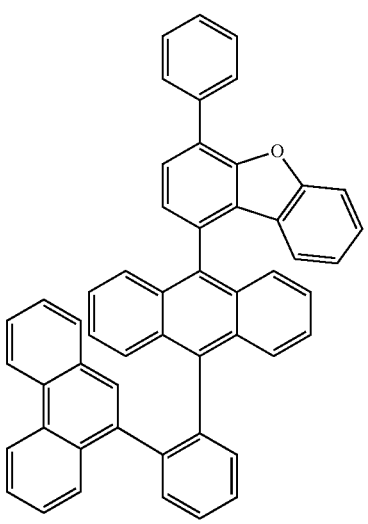

149
-continued
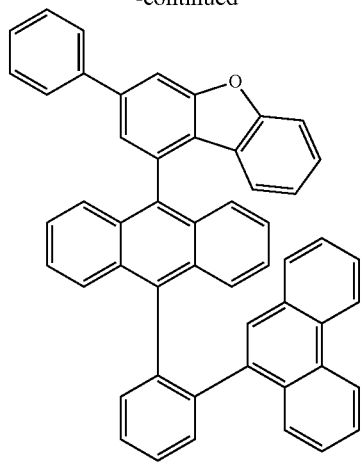
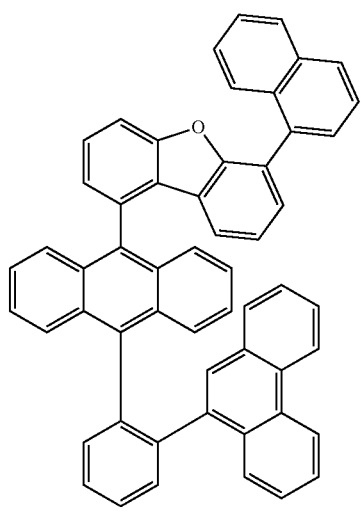
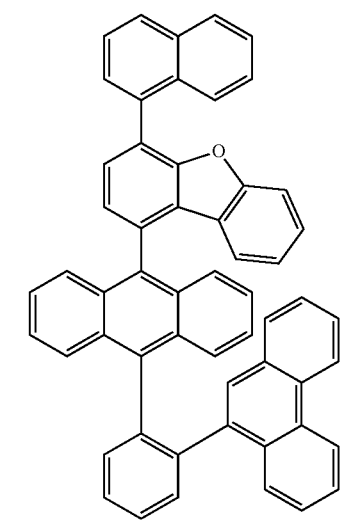
150
-continued
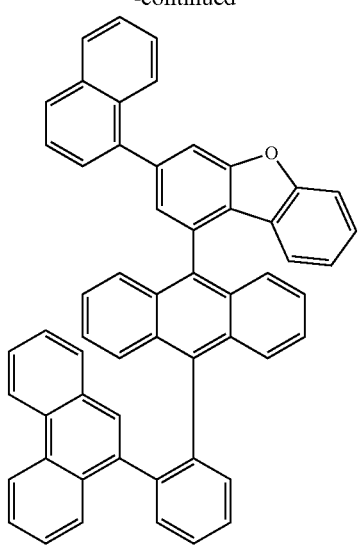
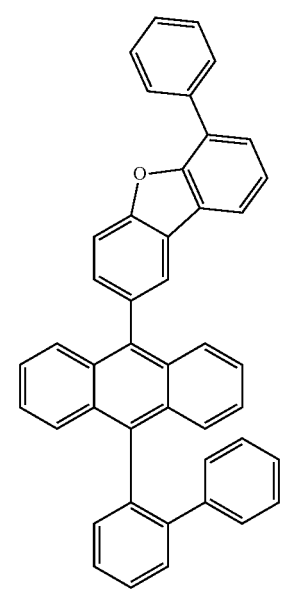
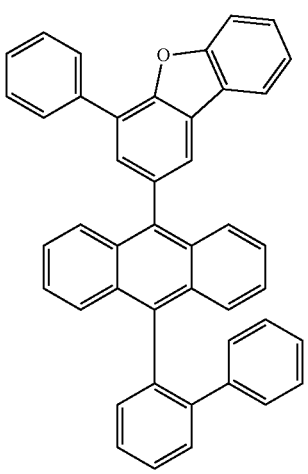

151
-continued
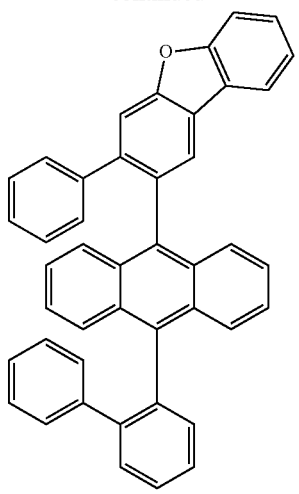
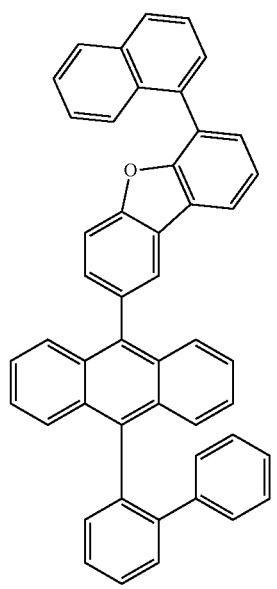
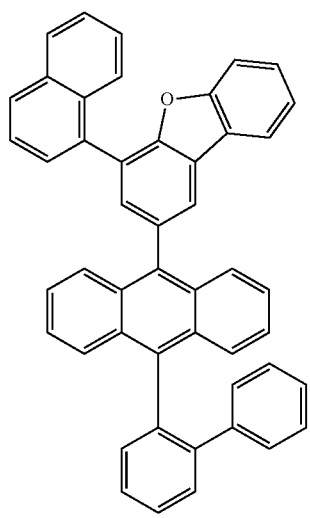
152
-continued
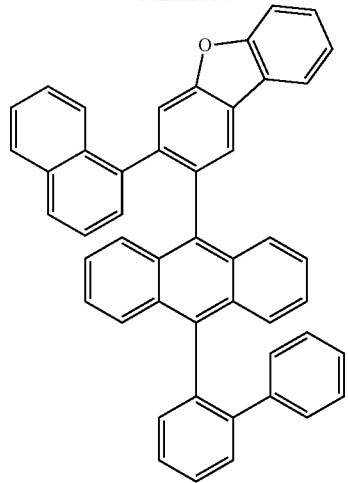
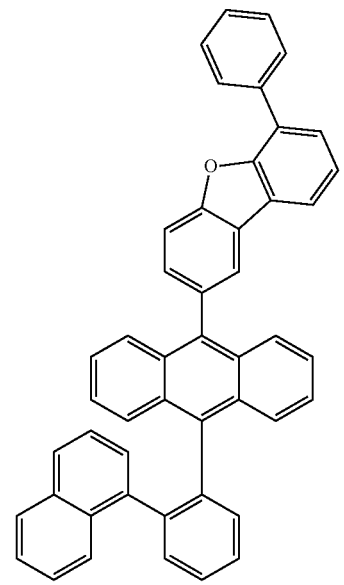
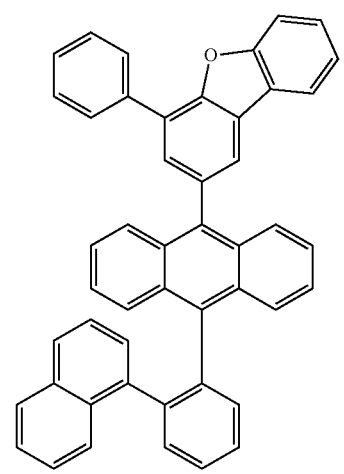

153
-continued
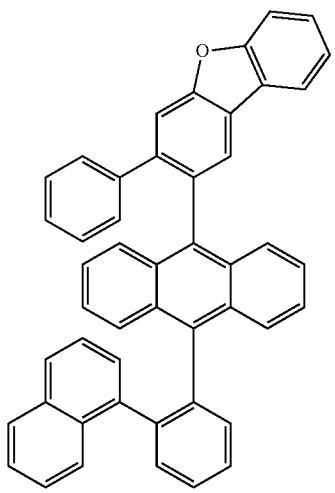
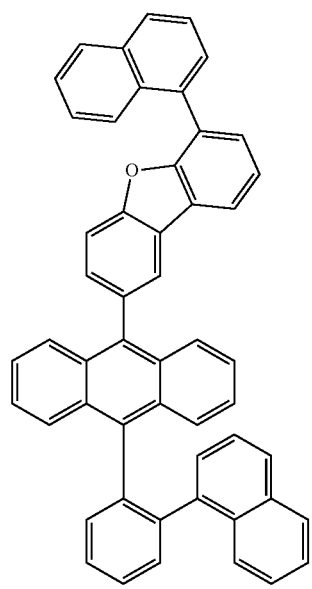
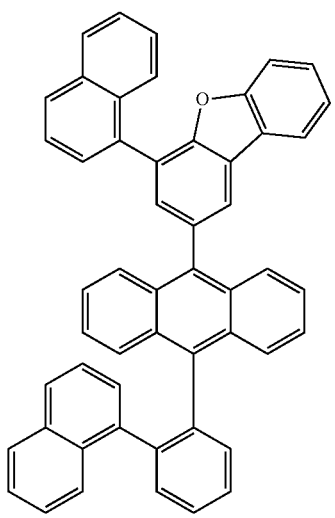
154
-continued
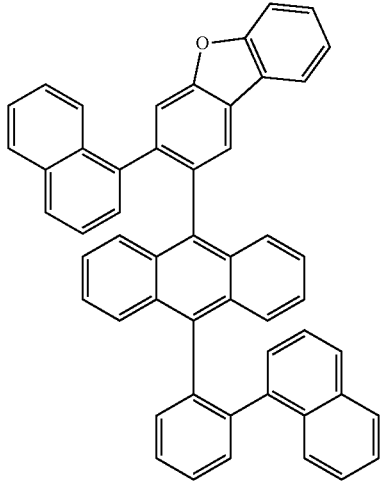
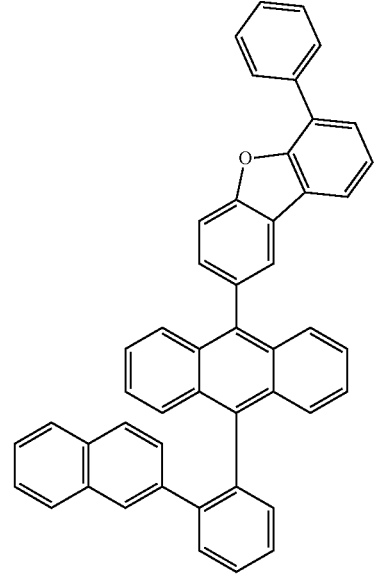
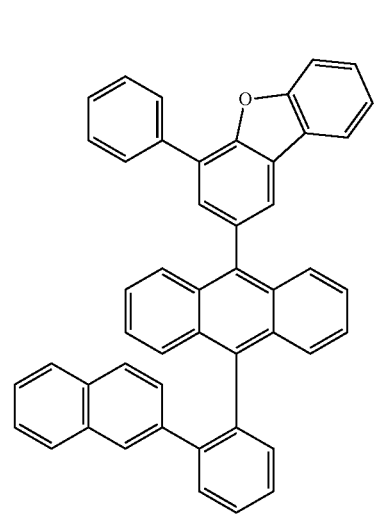

155
-continued
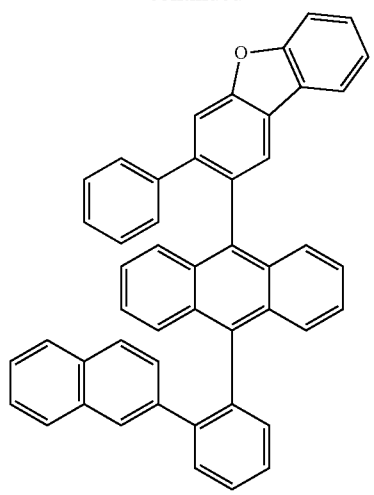
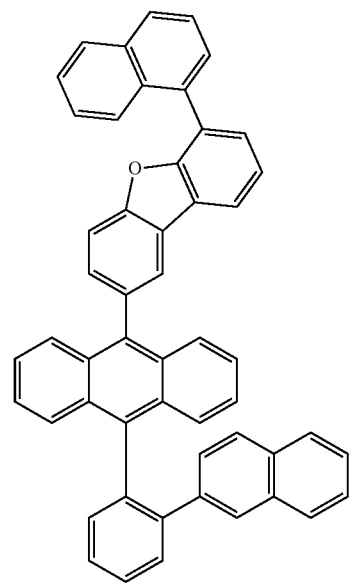
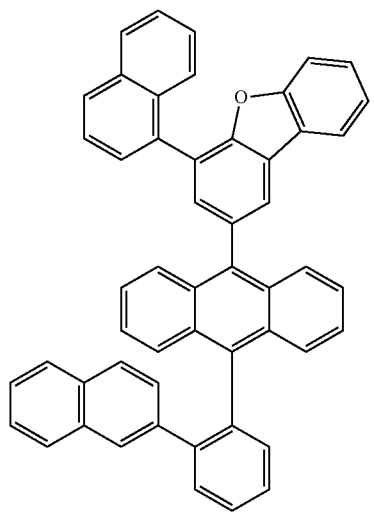
156
-continued
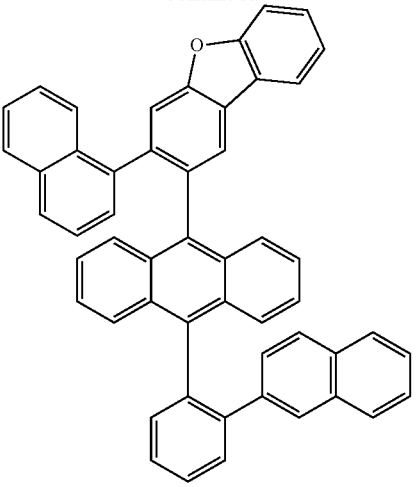
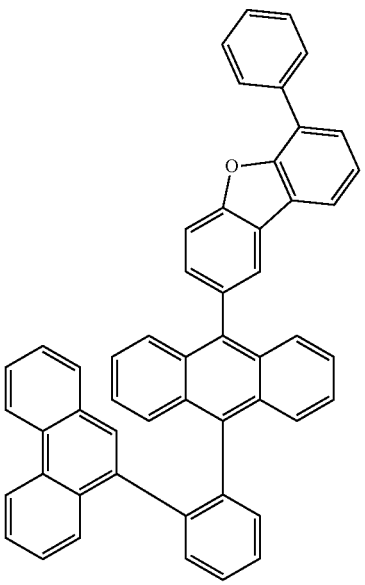
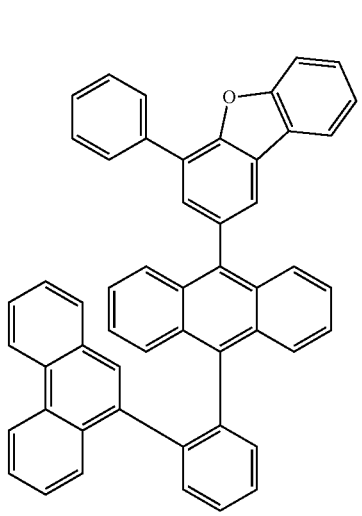

157
-continued
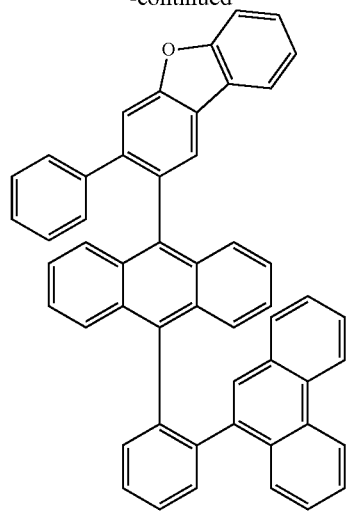
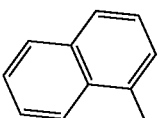
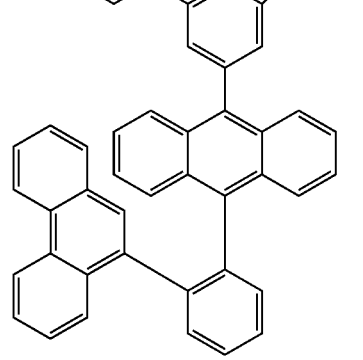
158
-continued
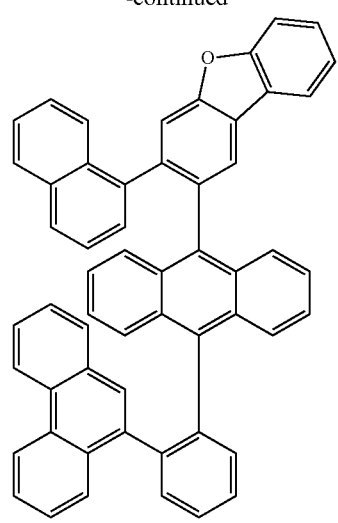
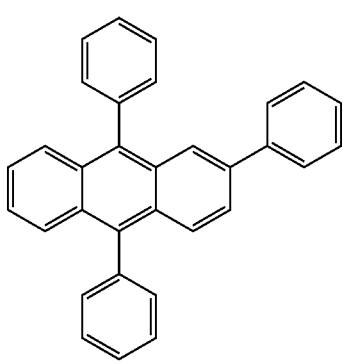
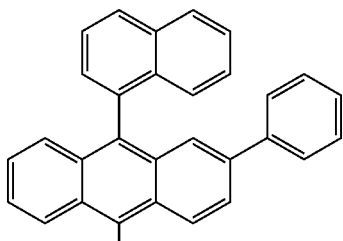
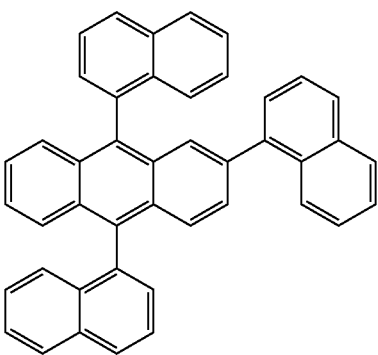

159
-continued
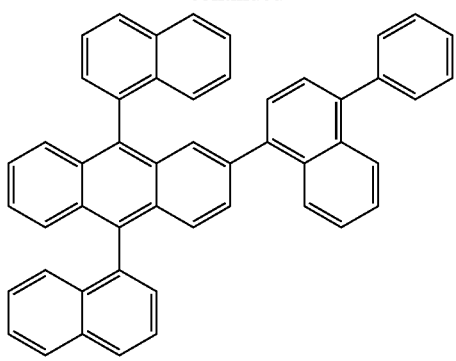
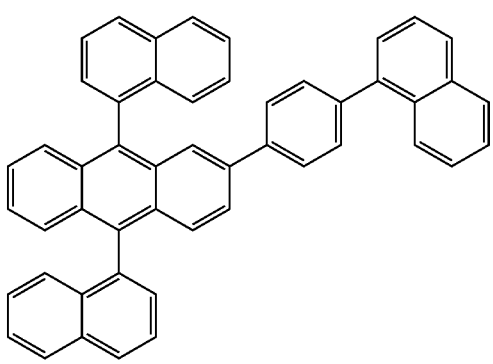
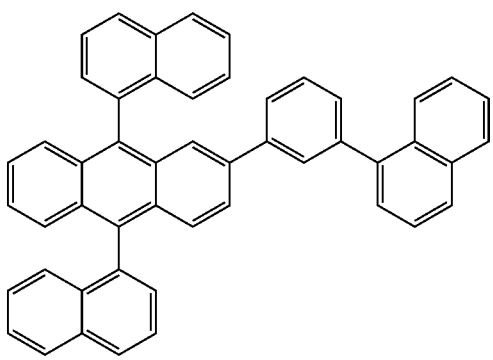
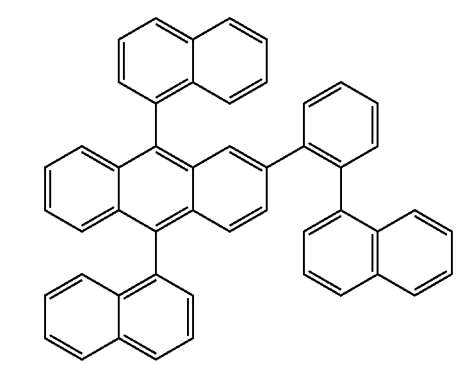
160
-continued
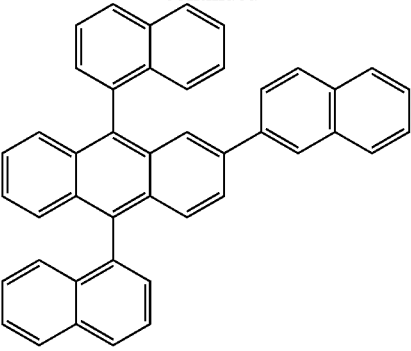
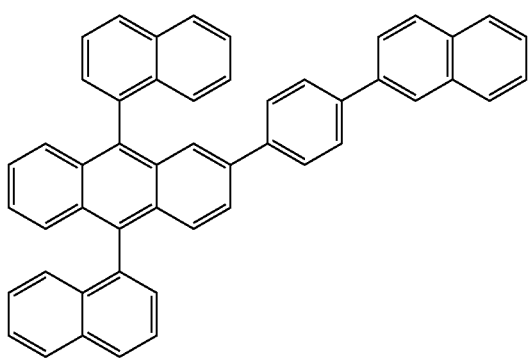
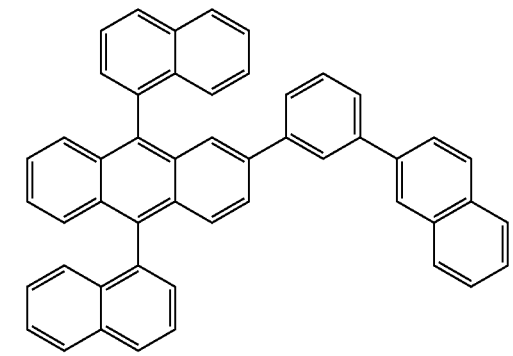
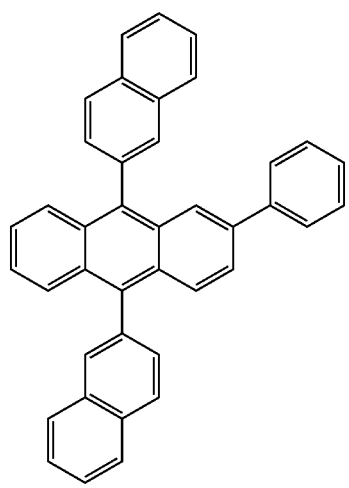

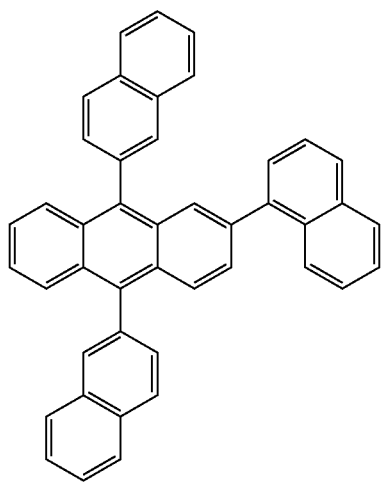
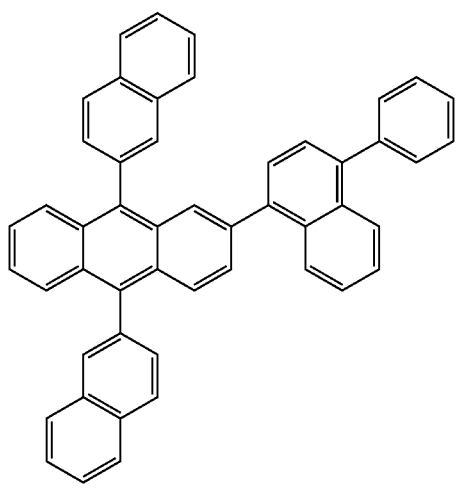
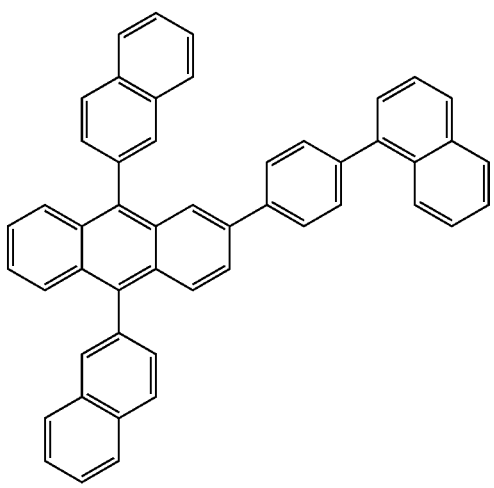
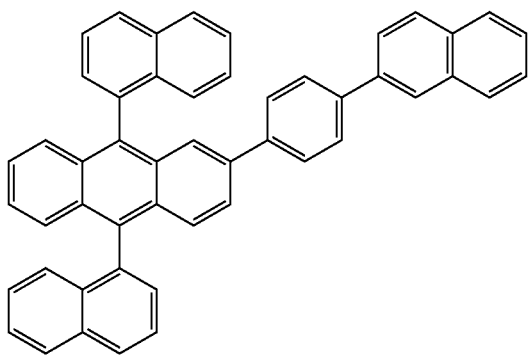
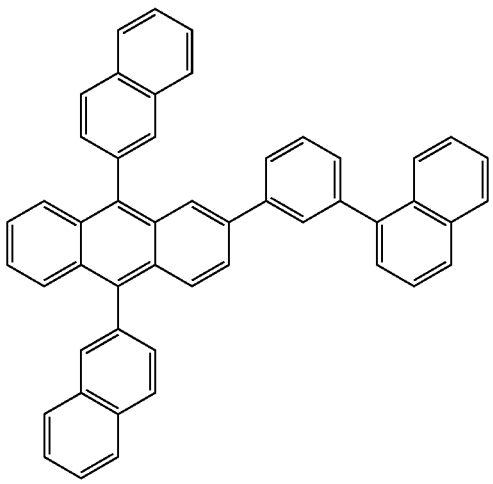
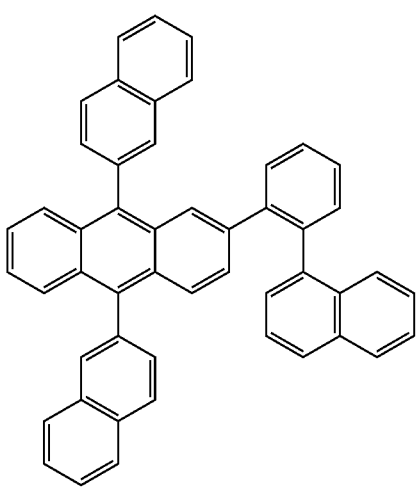

163
-continued
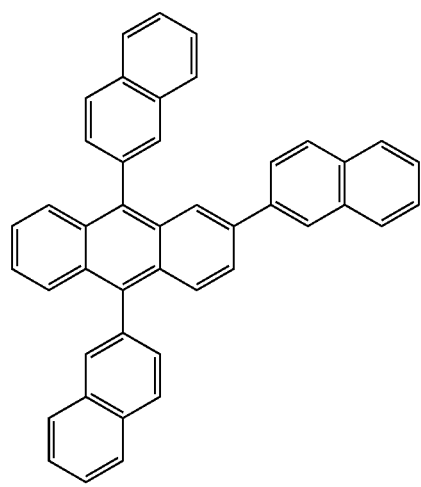
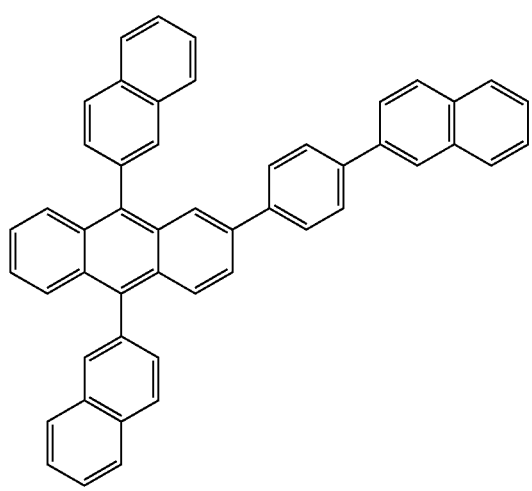
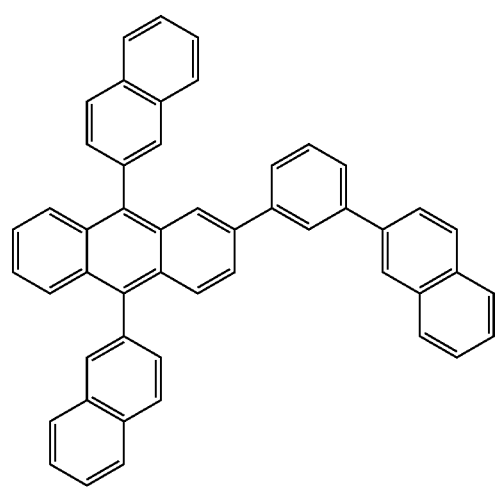
164
-continued
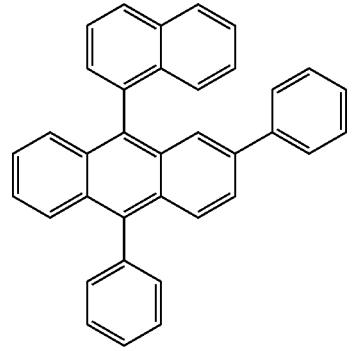
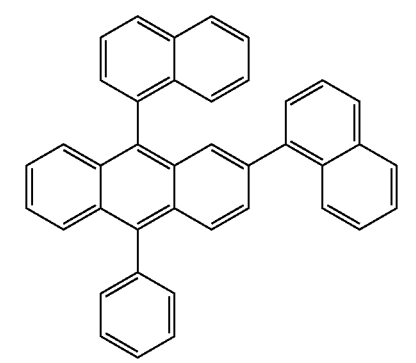
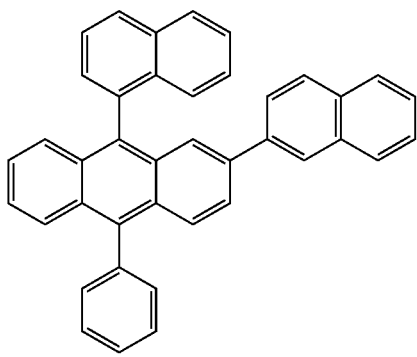
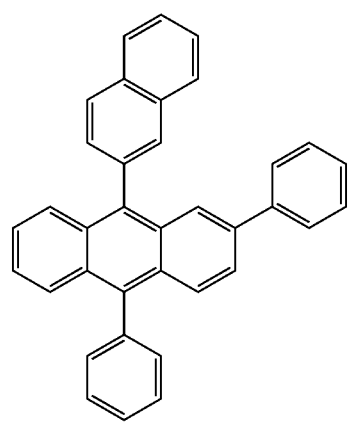

165
-continued
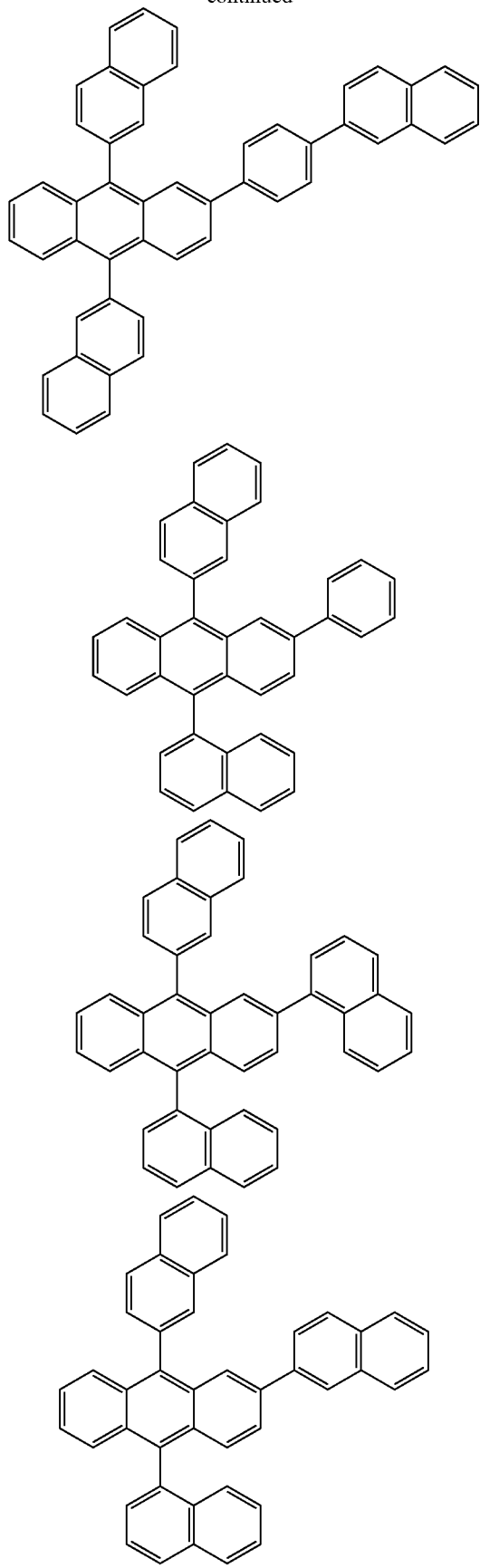
166
-continued
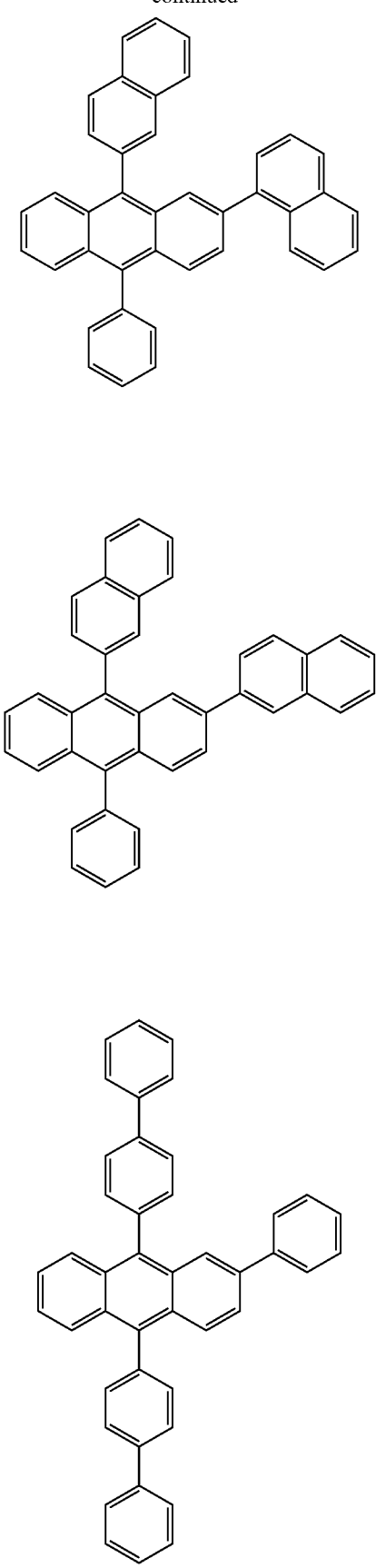

167
-continued
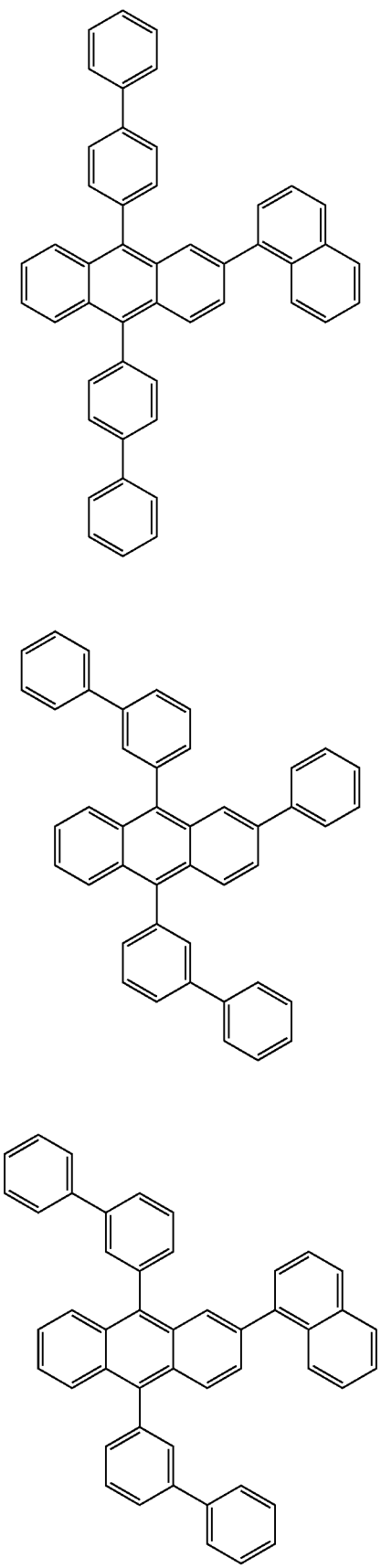
168
-continued
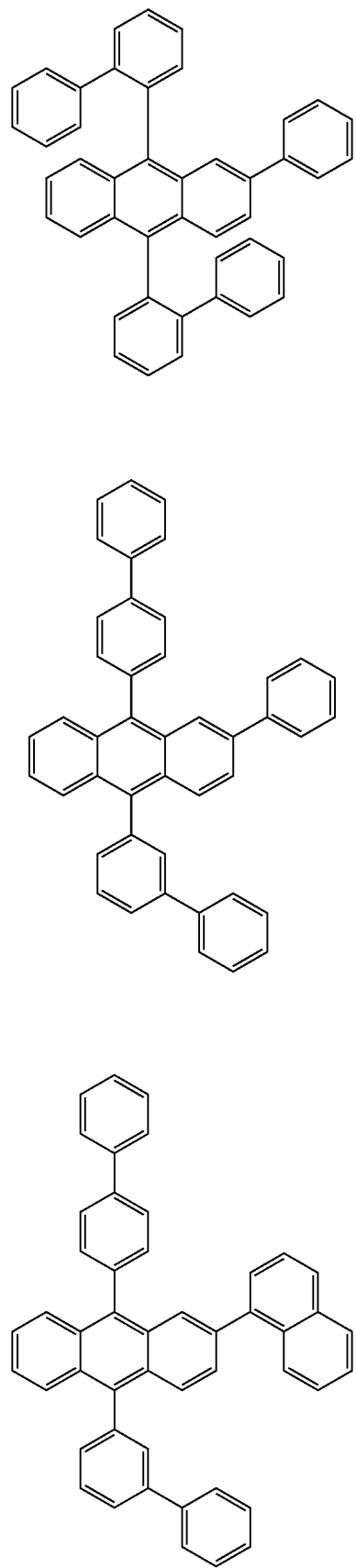

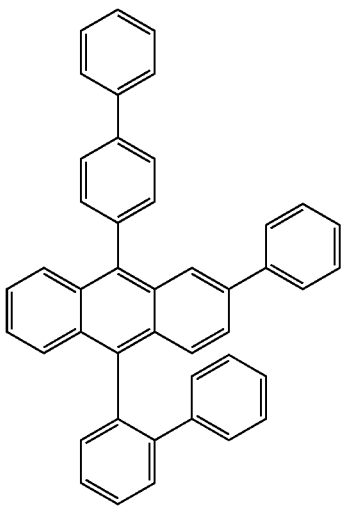
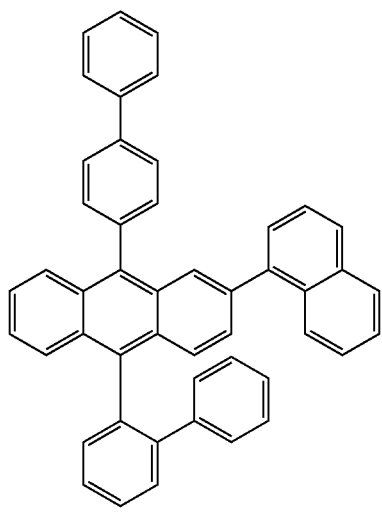
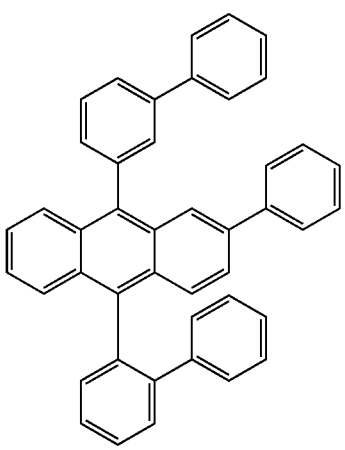
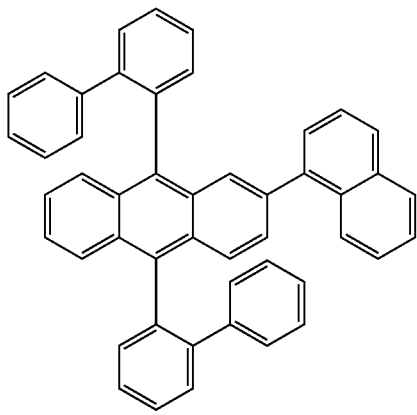
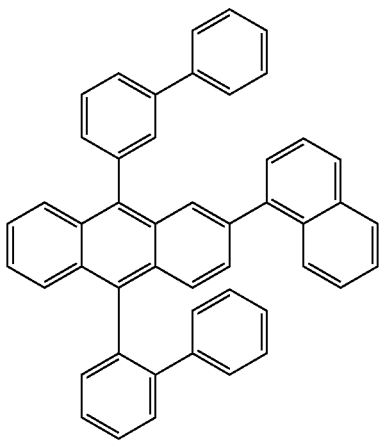
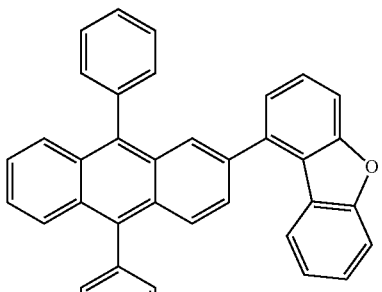
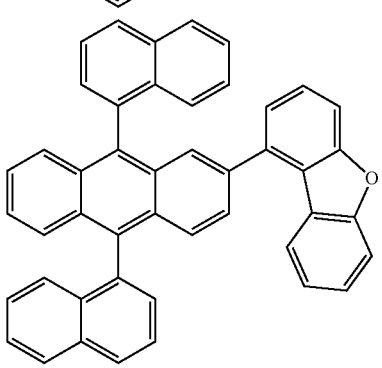

171
-continued
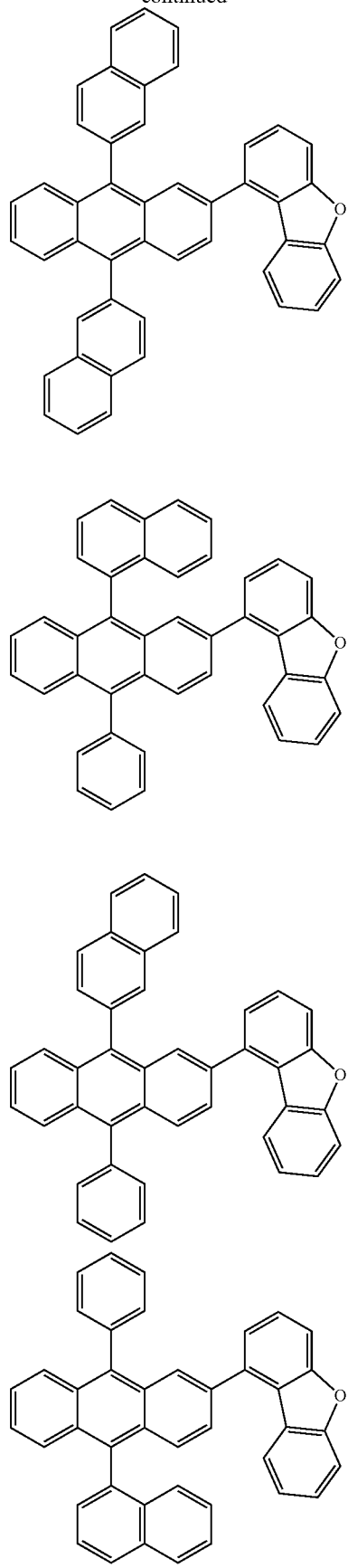
172
-continued
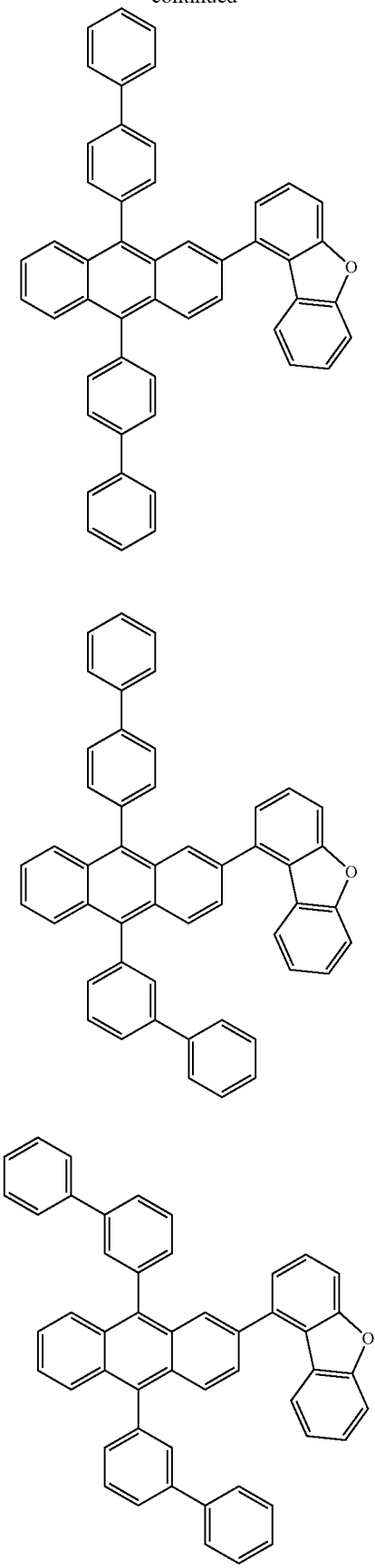

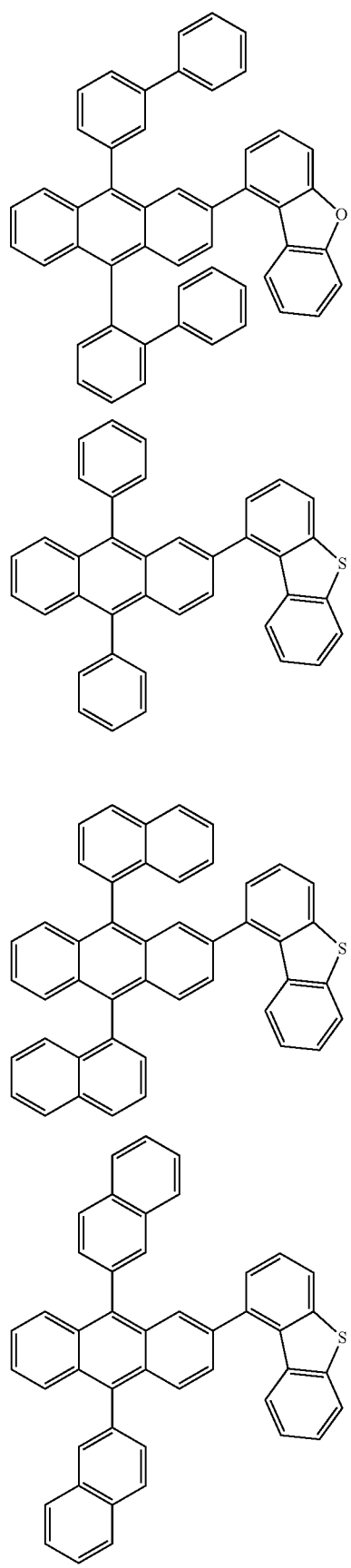
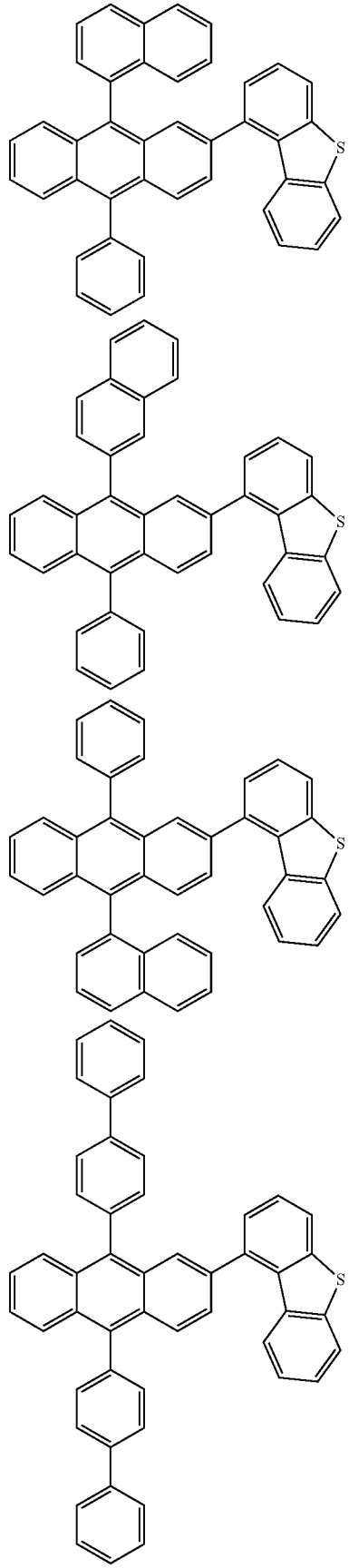

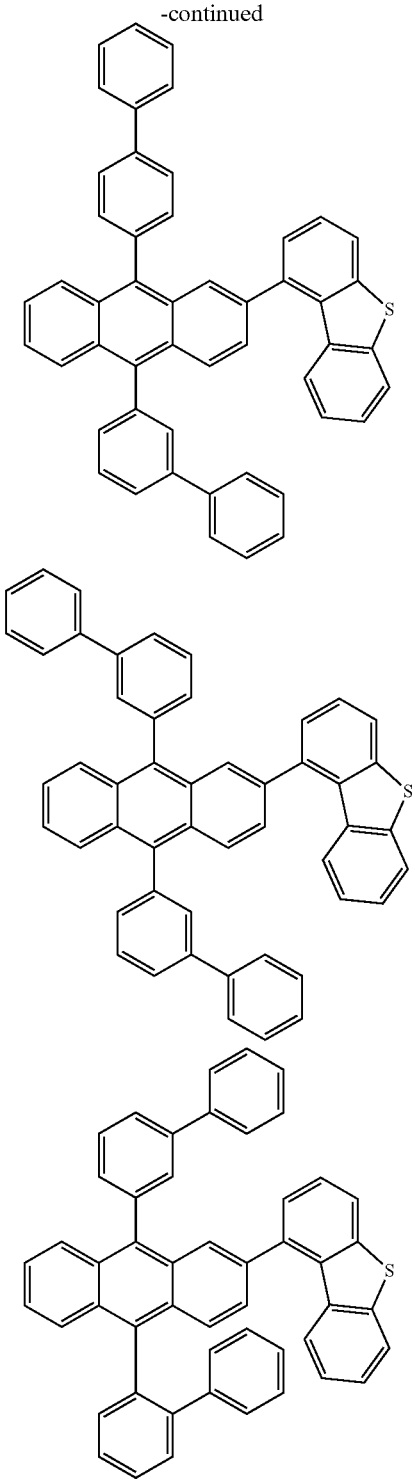

As another example, the organic material layer comprises a light emitting layer, the light emitting layer comprises the compound represented by Chemical Formula 1 described above as a dopant of the light emitting layer, and comprises a fluorescence host or a phosphorescence host, and an iridium (Ir)-based dopant may be used therewith.

According to one embodiment of the present specification, the compound represented by Chemical Formula 1 described above may act as a blue fluorescence dopant in the light emitting layer of the organic light emitting device.

According to another embodiment, the compound represented by Chemical Formula 1 has a maximum emission peak (solution in toluene as solvent) of 420 nm to 480 nm, and according to another example, 450 nm to 465 nm. When the maximum emission peak satisfies the above-mentioned range, efficiency of the blue light emitting device may be enhanced when used as a dopant of the light emitting layer in the organic light emitting device.

A measuring device used for measuring the maximum emission peak is a JASCO FP-8600 fluorescence spectrophotometer. Specifically, the compound to measure is dissolved in a concentration of 1 μM using toluene as a solvent to prepare a sample for fluorescence measurement, and after introducing the sample solution to a quartz cell, fluorescence intensity and maximum emission peak may be measured at room temperature (300 K) using a fluorescence measuring device.

In addition, the compound represented by Chemical Formula 1 has a full width at half maximum of 20 nm to 35 nm, and more preferably 20 nm to 28 nm.

According to another embodiment, the organic material layer comprises a light emitting layer, and the light emitting layer may comprise the compound represented by Chemical Formula 1 described above as a host of the light emitting layer.

As another example, the organic material layer comprises a light emitting layer, and the light emitting layer comprises the compound represented by Chemical Formula 1 described above as a host of the light emitting layer, and may further comprise a dopant.

The light emitting layer comprises a host and a dopant, and the dopant may be included in 1 parts by weight to 50 parts by weight, and more preferably in 1 parts by weight to 5 parts by weight with respect to 100 parts by weight of the host.

In one embodiment of the present specification, the first electrode is an anode, and the second electrode is a cathode.

According to another embodiment, the first electrode is a cathode, and the second electrode is an anode.

The organic light emitting device may have, for example, lamination structures as follows, however, the structure is not limited thereto.

(1) an anode/a hole transfer layer/a light emitting layer/a cathode (2) an anode/a hole injection layer/a hole transfer layer/a light emitting layer/a cathode (3) an anode/a hole transfer layer/a light emitting layer/an electron transfer layer/a cathode (4) an anode/a hole transfer layer/a light emitting layer/an electron transfer layer/an electron injection layer/a cathode (5) an anode/a hole injection layer/a hole transfer layer/a light emitting layer/an electron transfer layer/a cathode (6) an anode/a hole injection layer/a hole transfer layer/a light emitting layer/an electron transfer layer/an electron injection layer/a cathode (7) an anode/a hole transfer layer/an electron blocking layer/a light emitting layer/an electron transfer layer/a cathode (8) an anode/a hole transfer layer/an electron blocking layer/a light emitting layer/an electron transfer layer/an electron injection layer/a cathode (9) an anode/a hole injection layer/a hole transfer layer/an electron blocking layer/a light emitting layer/an electron transfer layer/a cathode

(10) an anode/a hole injection layer/a hole transfer layer/an electron blocking layer/a light emitting layer/an electron transfer layer/an electron injection layer/a cathode
(11) an anode/a hole transfer layer/a light emitting layer/a hole blocking layer/an electron transfer layer/a cathode
(12) an anode/a hole transfer layer/a light emitting layer/a hole blocking layer/an electron transfer layer/an electron injection layer/a cathode
(13) an anode/a hole injection layer/a hole transfer layer/a light emitting layer/an electron transfer layer/a cathode
(14) an anode/a hole injection layer/a hole transfer layer/a light emitting layer/a hole blocking layer/an electron transfer layer/an electron injection layer/a cathode The organic light emitting device of the present specification may have structures as illustrated in FIG. 1 and FIG. 2, however, the structure is not limited thereto.

FIG. 1 illustrates a structure of the organic light emitting device in which an anode (2), a light emitting layer (3) and a cathode (4) are consecutively laminated on a substrate (1). In such a structure, the compound represented by Chemical Formula 1 may be included in the light emitting layer (3).

FIG. 2 illustrates a structure of the organic light emitting device in which an anode (2), a hole injection layer (5), a hole transfer layer (6), a light emitting layer (7), an electron transfer layer (8) and a cathode (4) are consecutively laminated on a substrate (1), and the hole transfer layer (6) and the electron transfer layer (8) are formed in one or two layers. In such a structure, the compound represented by Chemical Formula 1 may be included in one or more of the hole injection layer (5), the hole transfer layer (6), the light emitting layer (7) and the electron transfer layer (8).

For example, the organic light emitting device according to the present specification may be manufactured by forming an anode on a substrate by depositing a metal, a metal oxide having conductivity, or an alloy thereof using a physical vapor deposition (PVD) method such as sputtering or e-beam evaporation, forming an organic material layer comprising a hole injection layer, a hole transfer layer, a light emitting layer, an electron blocking layer, an electron transfer layer and an electron injection layer, and then depositing a material usable as a cathode thereon. In addition to such a method, the organic electronic device may also be manufactured by consecutively depositing a cathode material, an organic material layer and an anode material on a substrate.

The organic material layer may have a multilayer structure comprising a hole injection layer, a hole transfer layer, a layer carrying out electron injection and electron transfer at the same time, an electron blocking layer, a light emitting layer, an electron transfer layer, an electron injection layer, a layer carrying out electron injection and electron transfer at the same time, a hole blocking layer and the like, but is not limited thereto, and may have a single layer structure. In addition, using various polymer materials, the organic material layer may be prepared to a smaller number of layers using a solvent process instead of a deposition method, for example, spin coating, dip coating, doctor blading, screen printing, inkjet printing, a thermal transfer method or the like.

The anode is an electrode injecting holes, and as the anode material, materials having large work function are normally preferred so that hole injection to an organic material layer is smooth. Specific examples of the anode material usable in the present disclosure comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

The cathode is an electrode injecting electrons, and as the cathode material, materials having small work function are normally preferred so that electron injection to an organic material layer is smooth. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer performing a role of smoothly injecting holes from an anode to a light emitting layer, and the hole injection material is a material capable of favorably receiving holes from an anode at a low voltage. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer may perform a role of smoothly transferring holes. As the hole transfer material, materials capable of receiving holes from an anode or a hole injection layer, moving the holes to a light emitting layer, and having high mobility for the holes are suited. Specific examples thereof comprise arylamine-based organic materials, conductive polymers, block copolymers having conjugated parts and non-conjugated parts together, and the like, but are not limited thereto.

As the layer carrying out hole transfer and hole injection at the same time, hole transfer layer materials and/or hole injection layer materials known in the art may be used.

As the layer carrying out electron transfer and electron injection at the same time, electron transfer layer materials and/or electron injection layer materials known in the art may be used.

An electron blocking layer may be provided between the hole transfer layer and the light emitting layer. As the electron blocking layer, materials known in the art may be used.

The light emitting layer may emit red, green or blue, and may be formed with a phosphorescence material or a fluorescence material. The light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxy-quinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

A host material of the light emitting layer may comprise fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, carbazole derivatives, dibenzofuran derivatives, ladder-type furan compounds, pyrimidine derivatives and the like may be included, however, the host material is not limited thereto.

When the light emitting layer emits red light, phosphorescence materials such as bis(1-phenylisoquinoline)acetylacetonate iridium (PIQIr(acac)), bis(1-phenylquinoline) acetylacetonate iridium (PQIr(acac)), tris(1-phenylquinoline)iridium (PQIr) or octaethylporphyrin platinum (PtOEP), or fluorescence materials such as tris(8-hydroxyquinolino)aluminum ($Alq_3$) may be used as the light emitting dopant, however, the light emitting dopant is not limited thereto. When the light emitting layer emits green light, phosphorescence materials such as fac tris(2-phenylpyridine) iridium ($Ir(ppy)_3$), or fluorescence materials such as tris(8-hydroxyquinolino)aluminum ($Alq_3$) may be used as the light emitting dopant, however, the light emitting dopant is not limited thereto. When the light emitting layer emits blue light, phosphorescence materials such as (4,6-$F2ppy)_2Irpic$, or fluorescence materials such as spiro-DPVBi, spiro-6P, distyrylbenzene (DSB), distyrylarylene (DSA), PFO-based polymers or PPV-based polymers may be used as the light emitting dopant, however, the light emitting dopant is not limited thereto.

A hole blocking layer may be provided between the electron transfer layer and the light emitting layer, and materials known in the art may be used.

The electron transfer layer performs a role of smoothly transferring electrons. As the electron transfer material, materials capable of favorably receiving electrons from a cathode, moving the electrons to a light emitting layer, and having high mobility for the electrons are suited. Specific examples thereof comprise Al complexes of 8-hydroxyquinoline; complexes comprising $Alq_3$; organic radical compounds; hydroxyflavon-metal complexes, and the like, but are not limited thereto.

The electron injection layer performs a role of smoothly injecting electrons. As the electron injection material, compounds having an electron transferring ability, having an electron injection effect from a cathode, having an excellent electron injection effect for a light emitting layer or light emitting material, and in addition thereto, having an excellent thin film forming ability are preferred. Specific examples thereof may comprise fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound comprises 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The organic light emitting device according to the present specification may be a top-emission type, a bottom-emission type or a dual-emission type depending on the materials used.

EXAMPLES

Hereinafter, the present specification will be described in detail with reference to examples. However, the examples according to the present specification may be modified to various other forms, and the scope of the present specification is not to be construed as being limited to the examples described below. Examples of the present specification are provided in order to more fully describe the present specification to those having average knowledge in the art.

Synthesis Example 1. Synthesis of Intermediate C-2

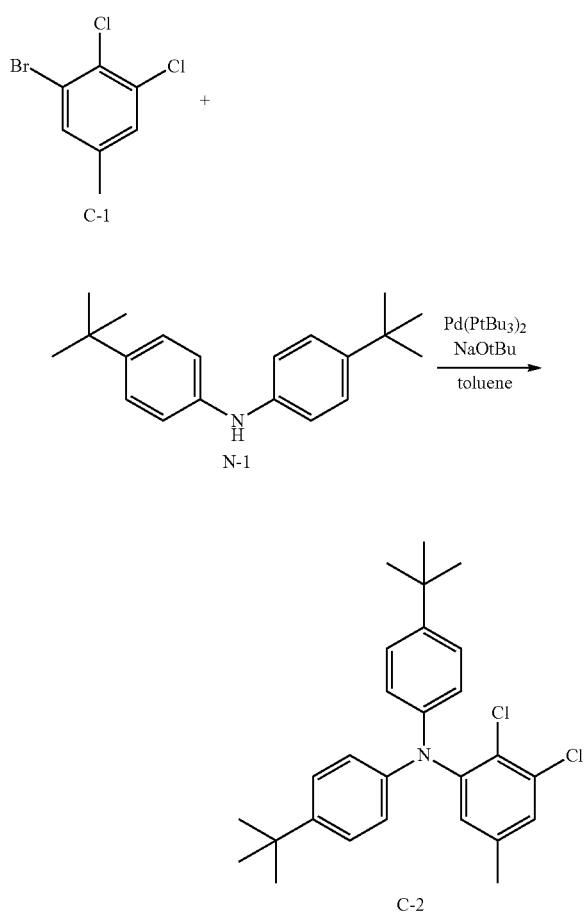

A flask holding starting materials C-1 (20 g) and N-1 (14.6 g), $Pd(PtBu_3)_2$ (0.8 g), NaOtBu (16.0 g) and toluene (400 ml) was heated at 110° C., and the mixture was stirred for 1 hour. The reaction solution was cooled to room temperature, and separated by adding water and toluene thereto, and then the solvent was removed through distillation under vacuum. The result was purified by recrystallization (diethyl ether/hexane/methanol) to obtain Compound C-2 (29 g). When measuring a mass spectrum on the obtained solid, a peak was identified at $[M+H]^+=440$. Herein, tBu is a tert-butyl group.

Synthesis Example 2. Synthesis of Intermediate C-3

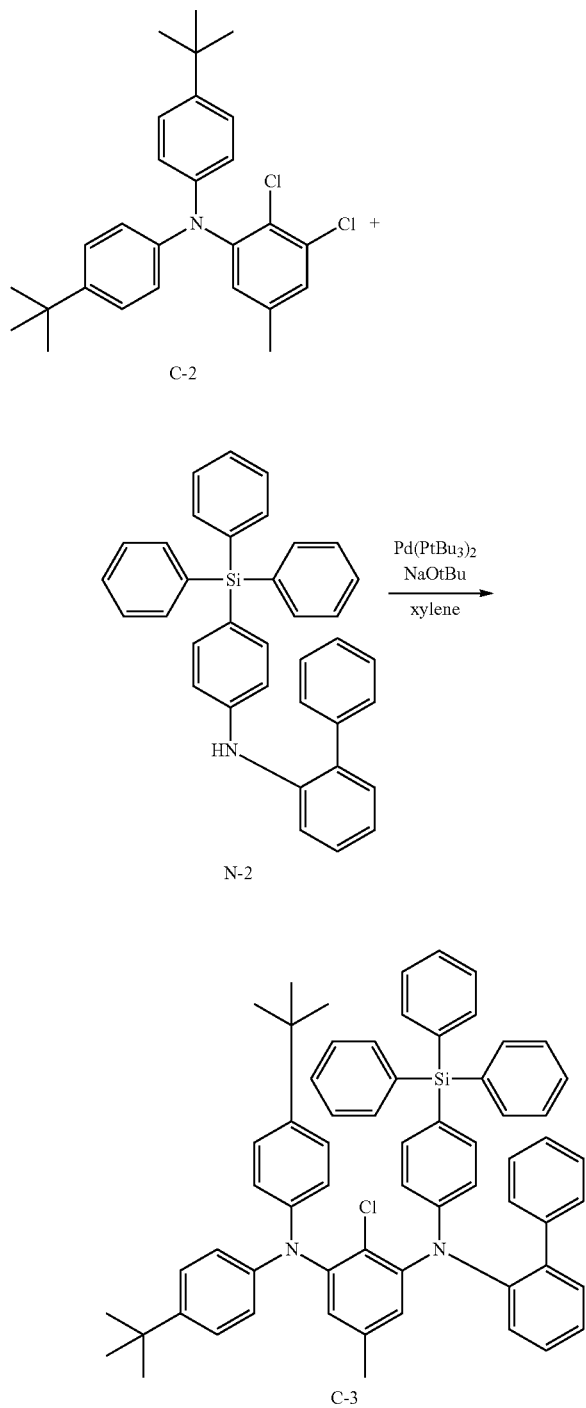

A flask holding starting materials C-2 (10 g) and N-2 (12.6 g), Pd(PtBu₃)₂ (0.17 g), NaOtBu (4.4 g) and xylene (150 ml) was heated at 130° C., and the mixture was stirred for 4 hours. The reaction solution was cooled to room temperature, and separated by adding water and toluene thereto, and then the solvent was removed through distillation under vacuum. The result was purified by recrystallization (hexane/methanol) to obtain Compound C-3 (14 g). When measuring a mass spectrum on the obtained solid, a peak was identified at [M+H]⁺=907.

Synthesis Example 3. Synthesis of Compound A-2

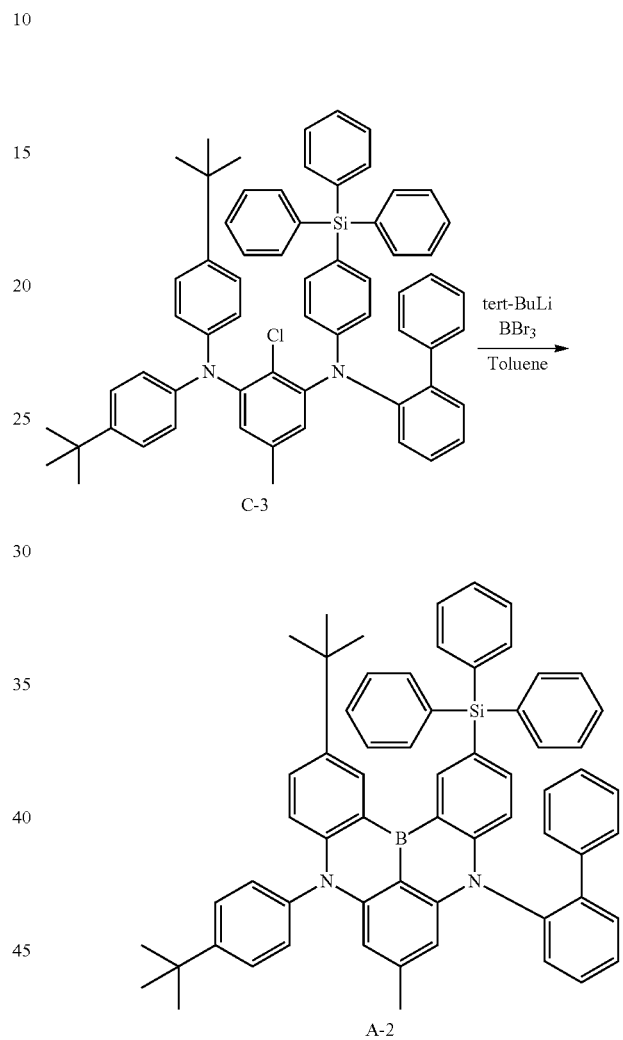

To a flask holding Intermediate C-3 (13.0 g) and toluene (100 ml), a 1.7 M tert-butyllithium pentane solution (16.8 ml) was added at 0° C. under the nitrogen atmosphere. After the dropping was finished, the temperature was raised to 70° C., and the result was stirred for 3 hours. The result was cooled to −40° C., and, after adding boron tribromide (1.66 ml) thereto, stirred for 4 hours while raising the temperature to room temperature. When the reaction was finished, saturated aqueous Na₂S₂O₃ and saturated aqueous NaHCO₃ were added thereto to separate the solution, and the solvent was removed through distillation under vacuum. The result was purified using silica gel column chromatography (developing liquid: hexane/toluene=1/30) to obtain Compound A-2 (2.0 g). When measuring a mass spectrum on the obtained solid, a peak was identified at [M+H]⁺=881.

A graph measuring H-NMR of Compound A-2 is shown in FIG. 3, and a graph measuring Mass is shown in FIG. 4.

Synthesis Example 4. Synthesis of Intermediate C-4

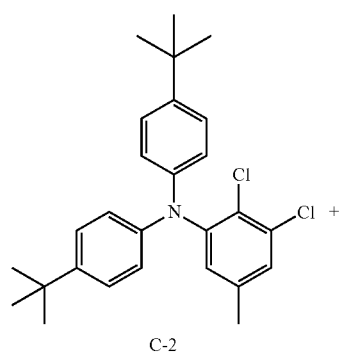

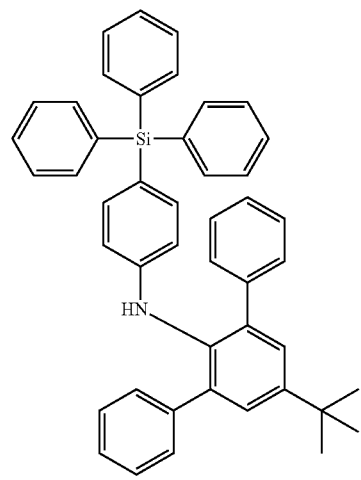

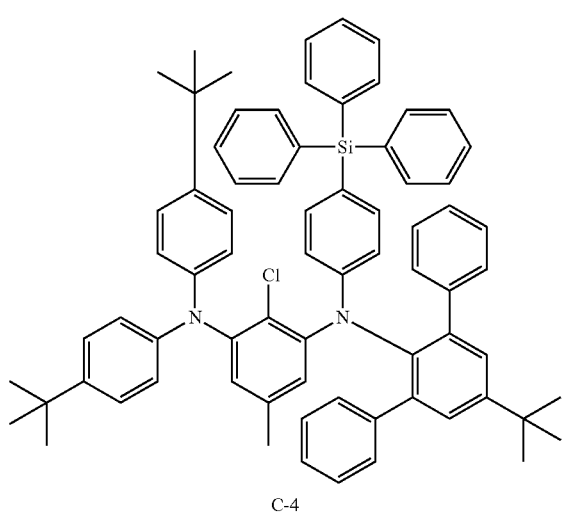

Intermediate C-4 (15.1 g) was synthesized in the same manner as in Synthesis of Intermediate C-3 in Synthesis Example 2 using C-2 (9 g) and N-3 (14.2 g). When measuring a mass spectrum on the obtained solid, a peak was identified at [M+H]⁺=1040.

Synthesis Example 5. Synthesis of Compound A-3

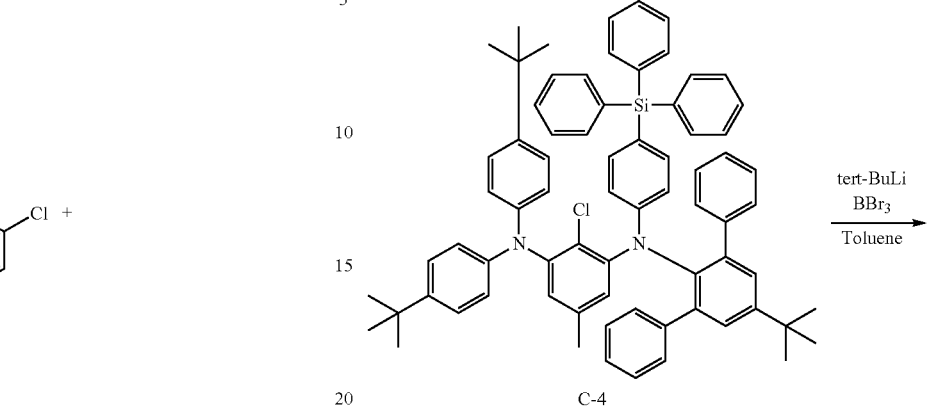

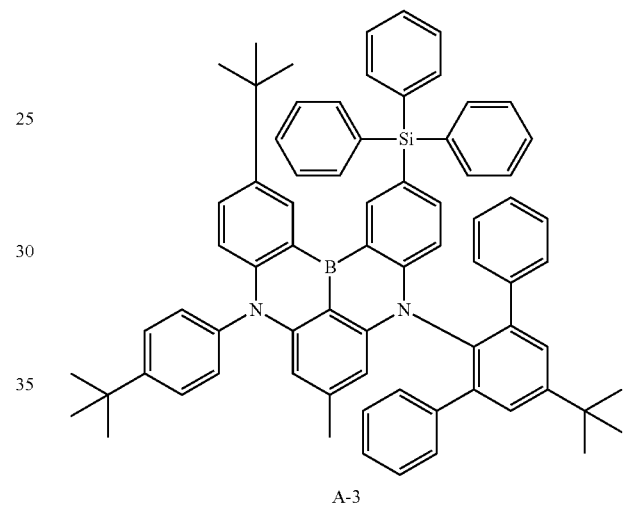

Compound A-3 (1.9 g) was synthesized in the same manner as in Synthesis of Compound A-2 in Synthesis Example 3 using C-4 (13.5 g). When measuring a mass spectrum on the obtained solid, a peak was identified at [M+H]⁺=1014.

Synthesis Example 6. Synthesis of Intermediate C-5

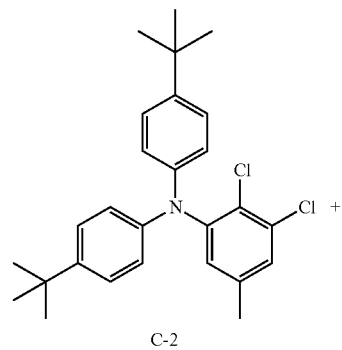

Synthesis Example 7. Synthesis of Compound A-8

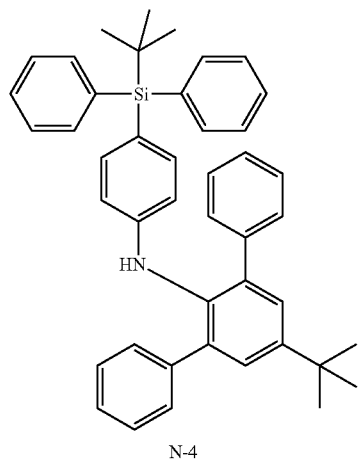

N-4

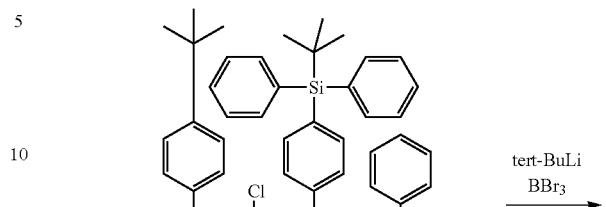

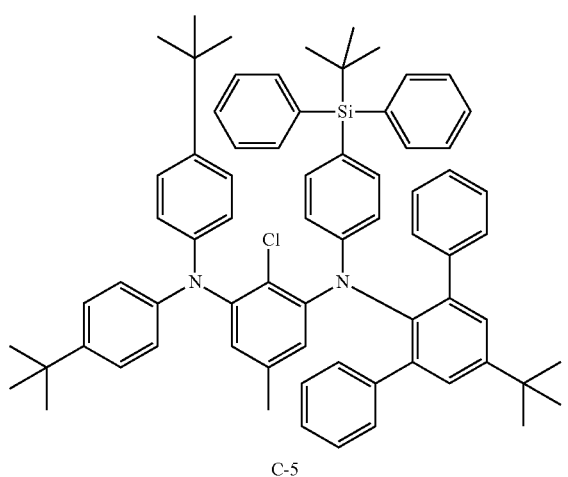

C-5

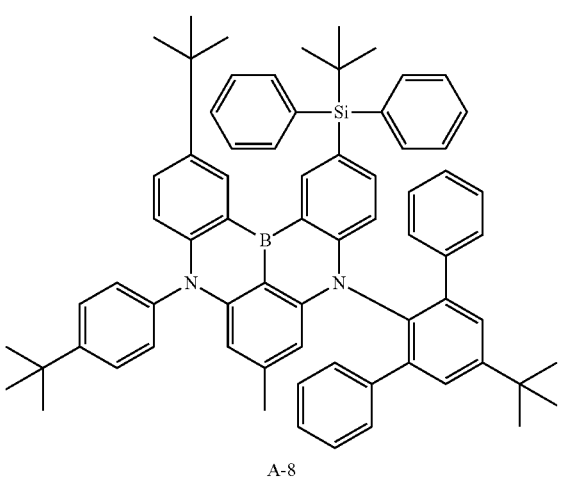

A-8

Intermediate C-5 was synthesized in the same manner as in Synthesis of Intermediate C-3 in Synthesis Example 2 using C-2 (10 g) and N-4 (15.3 g), and 15.2 g was obtained using a column chromatography purification method (eluent: ethyl acetate/hexane). When measuring a mass spectrum on the obtained solid, a peak was identified at $[M+H]^+=1020$.

Compound A-8 (1.6 g) was synthesized in the same manner as in Synthesis of Compound A-2 in Synthesis Example 3 using C-5 (14.3 g). When measuring a mass spectrum on the obtained solid, a peak was identified at $[M+H]^+=994$.

Synthesis Examples 8 to 12. Syntheses of Intermediates C-6 to C-10
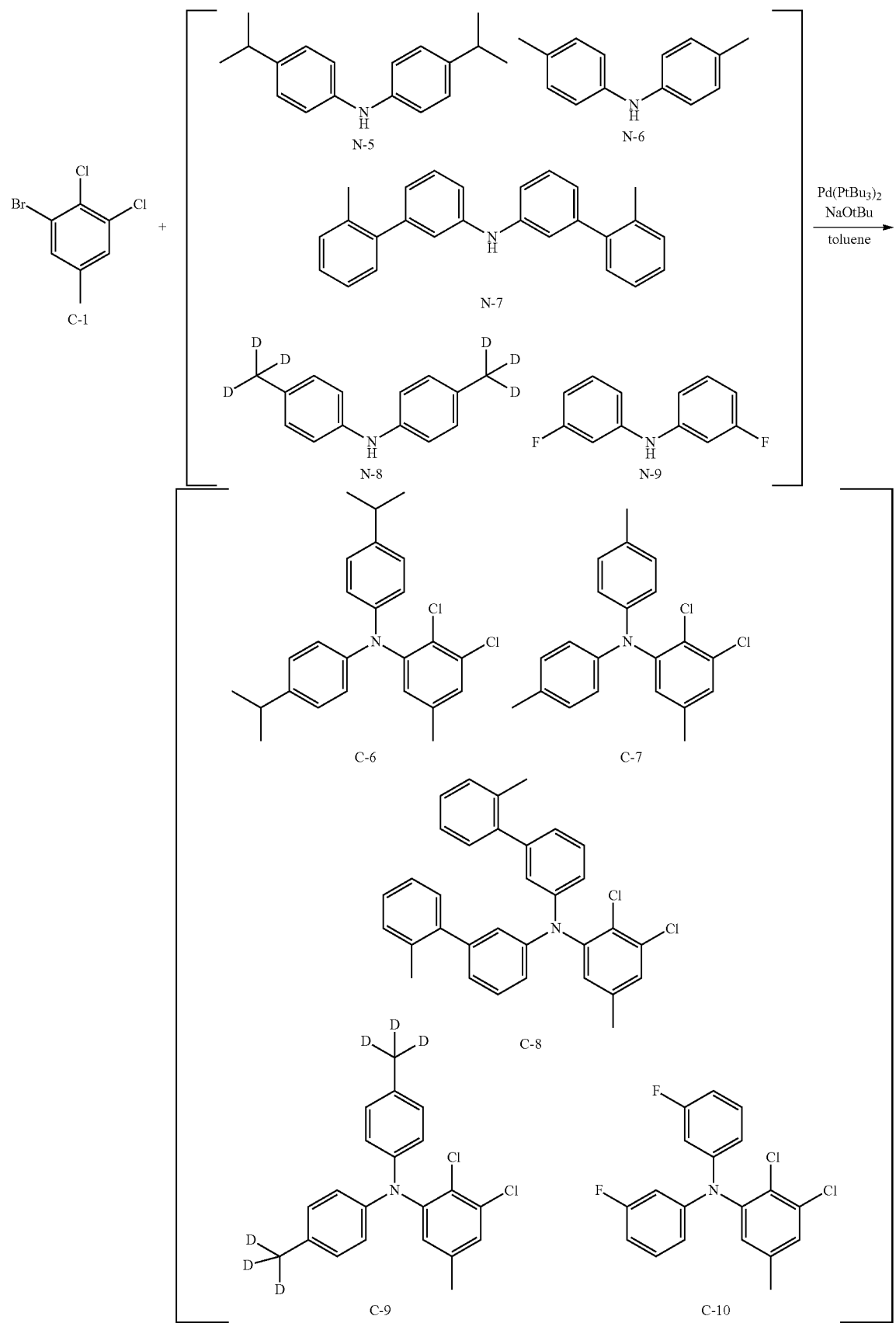

Each of Intermediates C-6 (13.9 g), C-7 (10.9 g), C-8 (16.3 g), C-9 (10.7 g) and C-10 (10.5 g) was synthesized in the same manner as in Synthesis of Intermediate C-2 in Synthesis Example 1 using C-1 (10 g), and each of N-5 (11.1 g), N-6 (8.6 g), N-7 (15.3 g), N-8 (8.9 g) and N-9 (9.0 g). Each of the intermediates was obtained using a column chromatography purification method (eluent: ethyl acetate/hexane).
Synthesis Examples 13 to 15. Syntheses of Intermediates C-11 to C-13
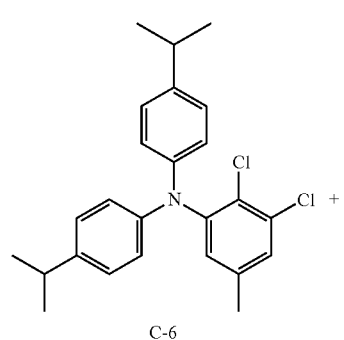
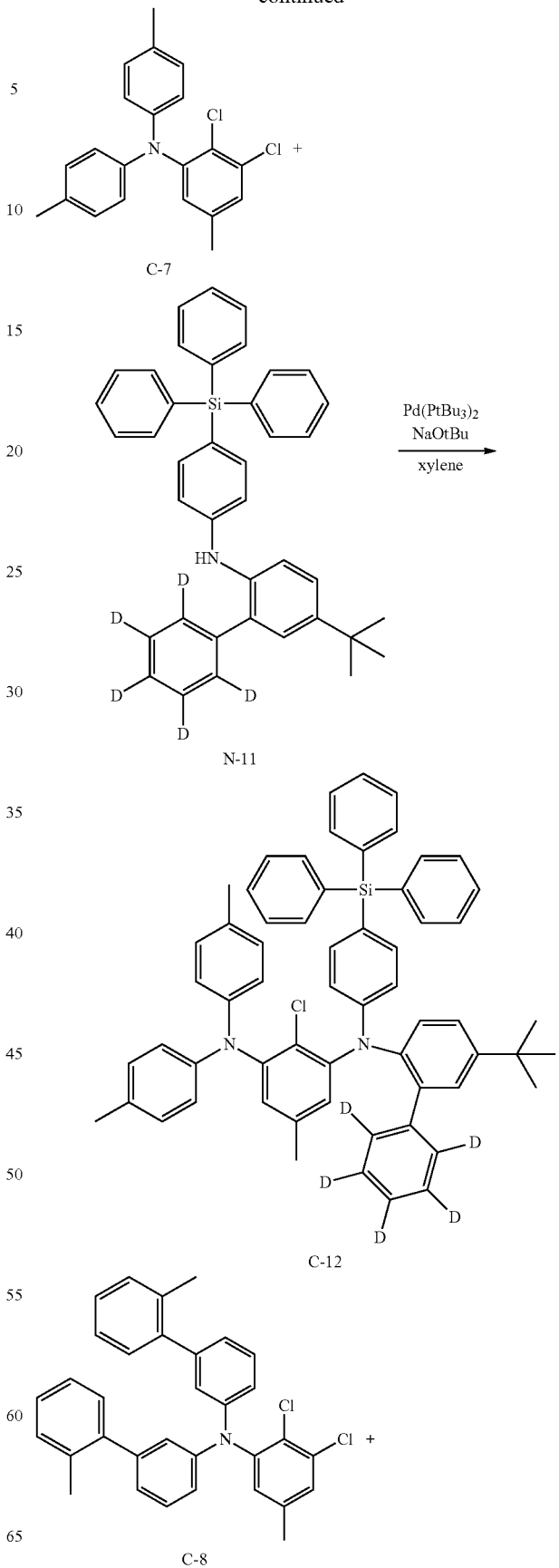

-continued

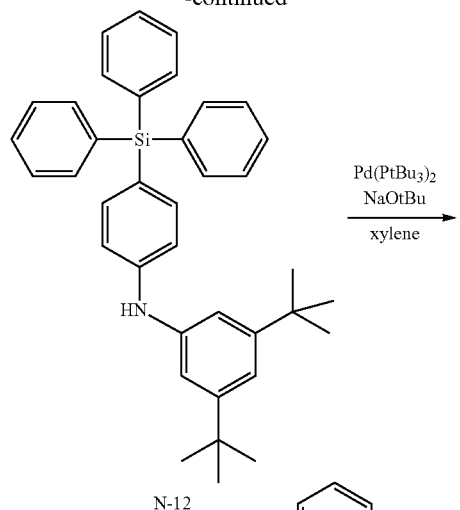

N-12

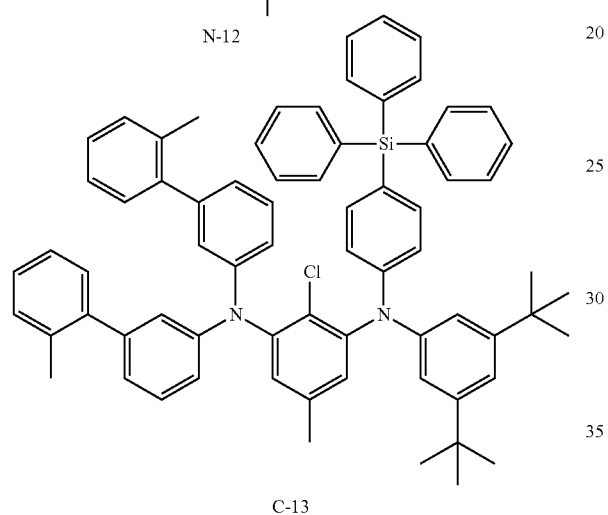

C-13

Each of Intermediates C-11 (16.3 g), C-12 (17.4 g) and C-13 (22.6 g) was synthesized in the same manner as in Synthesis of Intermediate C-3 in Synthesis Example 2 using each of C-6 (13 g) and N-10 (15.1 g), C-7 (10 g) and N-11 (16.6 g), and C-8 (15 g) and N-12 (16.7 g). Each of the intermediates was purified using a column chromatography purification method (eluent: ethyl acetate/hexane), and when measuring a mass spectrum on each of the obtained solids, a peak was identified at $[M+H]^+=831$, $[M+H]^+=884$ and $[M+H]^+=1011$.

Synthesis Example 16. Synthesis of Compound A-4

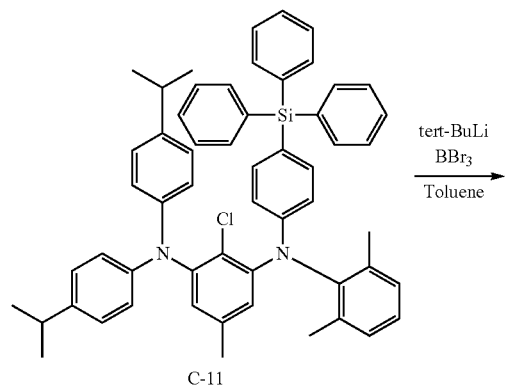

C-11

-continued

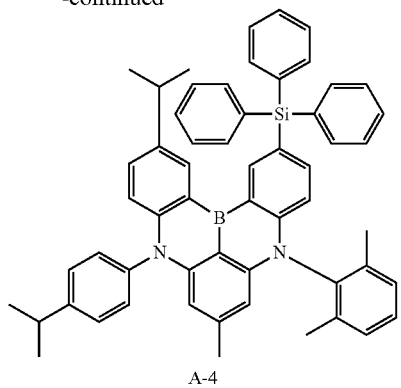

A-4

Compound A-4 (1.7 g) was synthesized in the same manner as in Synthesis of Compound A-2 in Synthesis Example 3 using C-11 (15.5 g). When measuring a mass spectrum on the obtained solid, a peak was identified at $[M+H]^+=805$.

Synthesis Example 17. Synthesis of Compound A-5

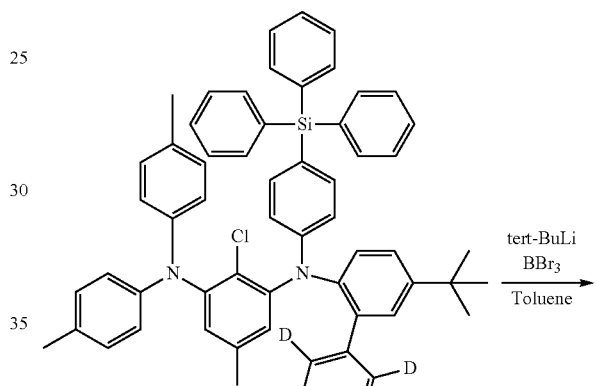

C-12

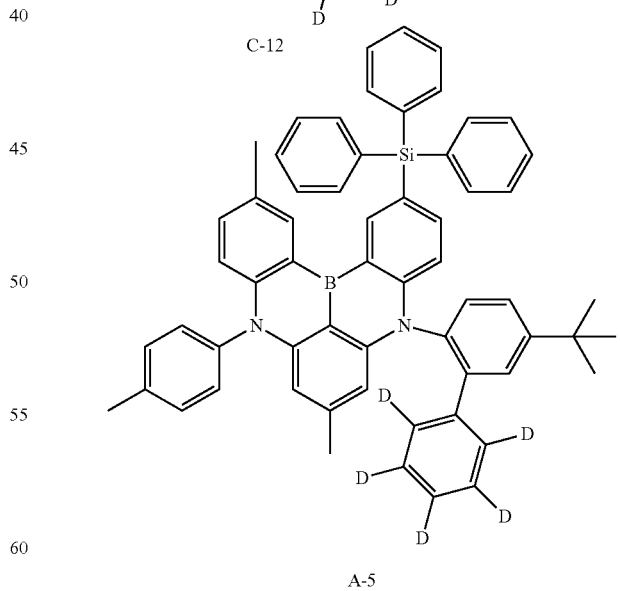

A-5

Compound A-5 (1.9 g) was synthesized in the same manner as in Synthesis of Compound A-2 in Synthesis Example 3 using C-12 (16.3 g). When measuring a mass spectrum on the obtained solid, a peak was identified at $[M+H]^+=858$.

Synthesis Example 18. Synthesis of Compound A-6

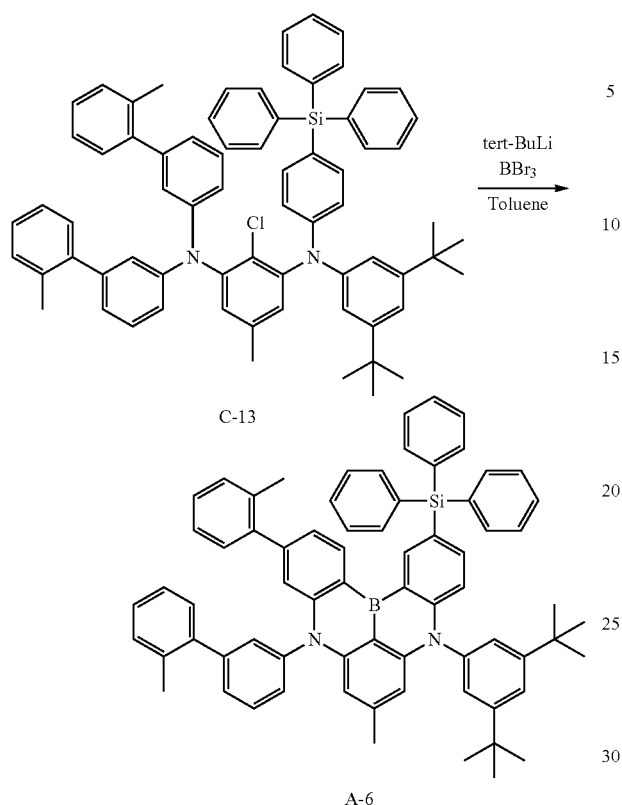

Compound A-6 (1.8 g) was synthesized in the same manner as in Synthesis of Compound A-2 in Synthesis Example 3 using C-13 (20 g). When measuring a mass spectrum on the obtained solid, a peak was identified at [M+H]$^+$=986.

Synthesis Examples 19 and 20. Syntheses of Intermediates C-14 and C-15

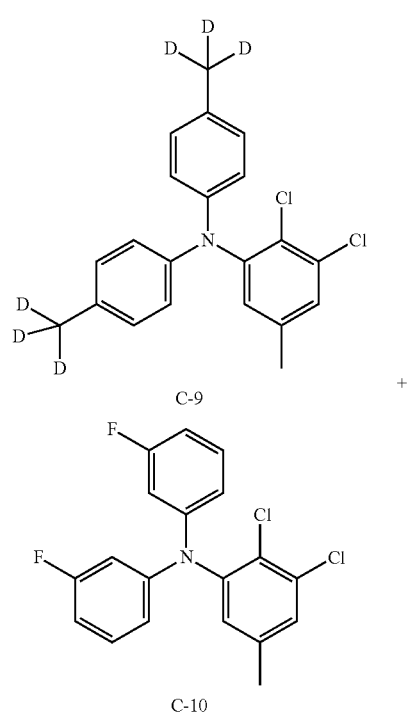

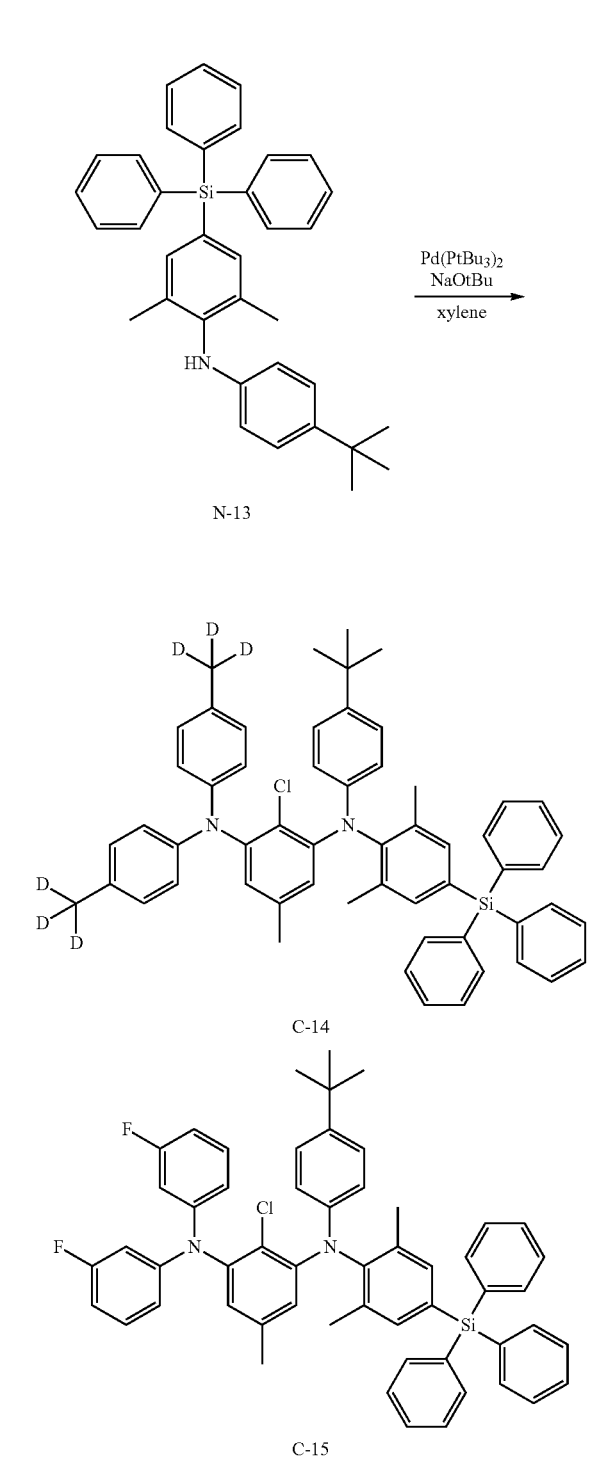

Each of Intermediates C-14 (15.7 g) and C-15 (13.6 g) was synthesized in the same manner as in Synthesis of Intermediate C-3 in Synthesis Example 2 using each of C-9 (10 g) and N-13 (14.8 g), and C-10 (10 g) and N-13 (14 g). Each of the intermediates was purified using a column chromatography purification method (eluent: ethyl acetate/hexane), and when measuring a mass spectrum on each of the obtained solids, a peak was identified at [M+H]$^+$=837 and [M+H]$^+$=858.

Synthesis Example 21. Synthesis of Compound B-1

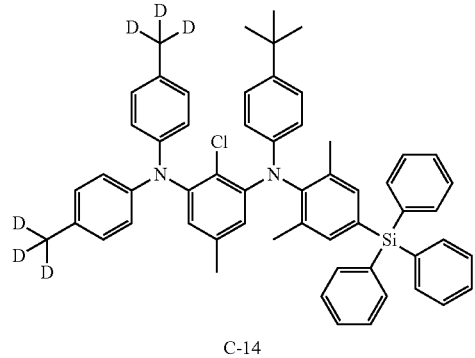

C-14

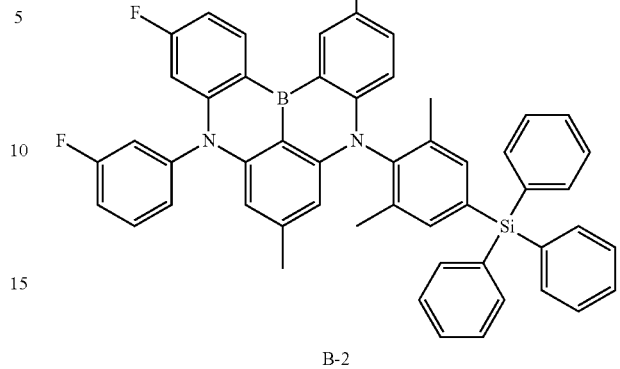

B-2

Compound B-2 (0.9 g) was synthesized the same manner as in Synthesis of Compound A-2 in Synthesis Example 3 using C-15 (13 g). When measuring a mass spectrum on the obtained solid, a peak was identified at [M+H]$^+$=813.

Synthesis Example 23. Synthesis of Intermediate C-18

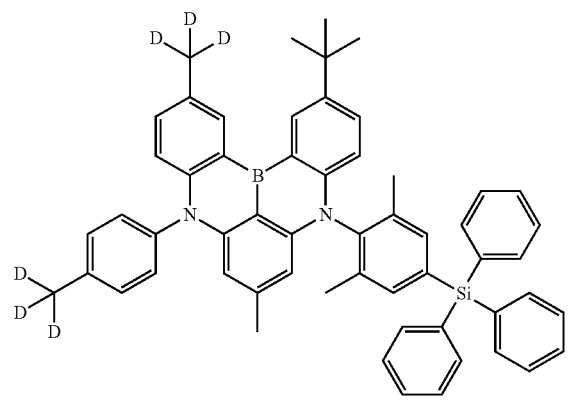

B-1

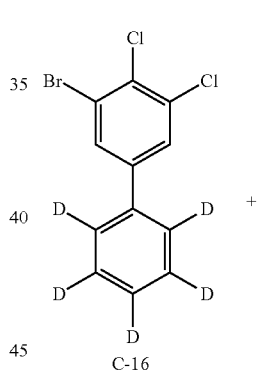

C-16

Compound B-1 (2.0 g) was synthesized in the same manner as in Synthesis of Compound A-2 in Synthesis Example 3 using C-14 (15 g). When measuring a mass spectrum on the obtained solid, a peak was identified at [M+H]$^+$=811.

Synthesis Example 22. Synthesis of Compound B-2

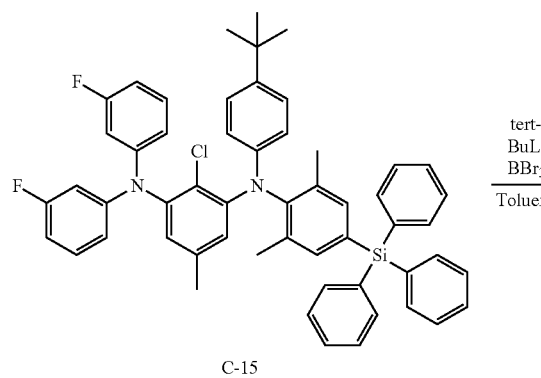

C-15

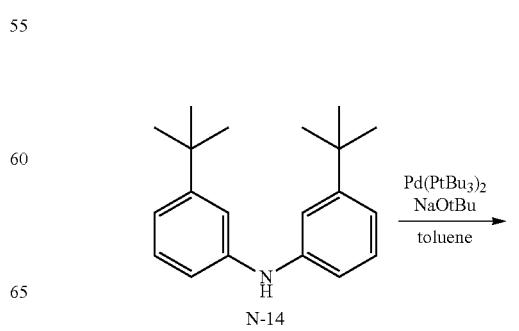

N-14

-continued

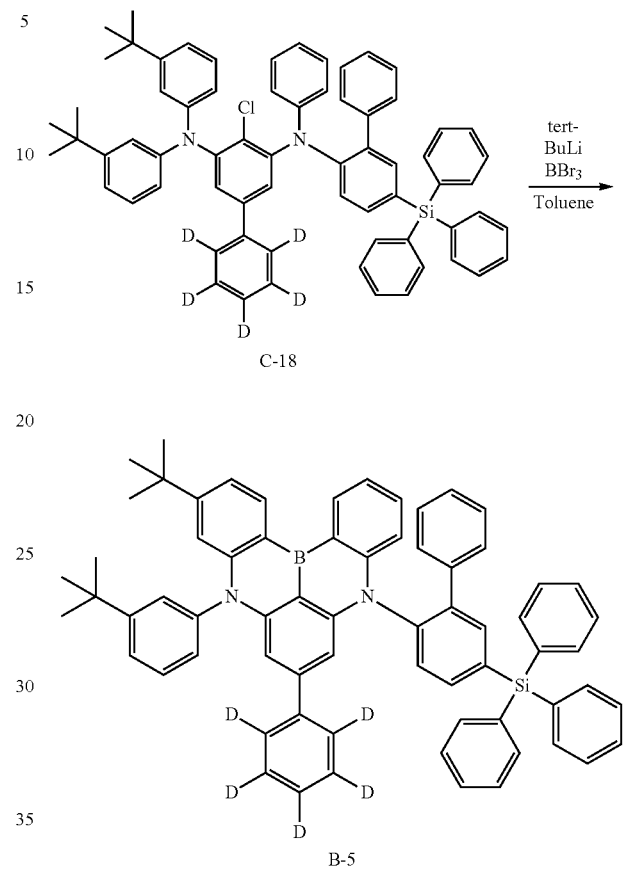

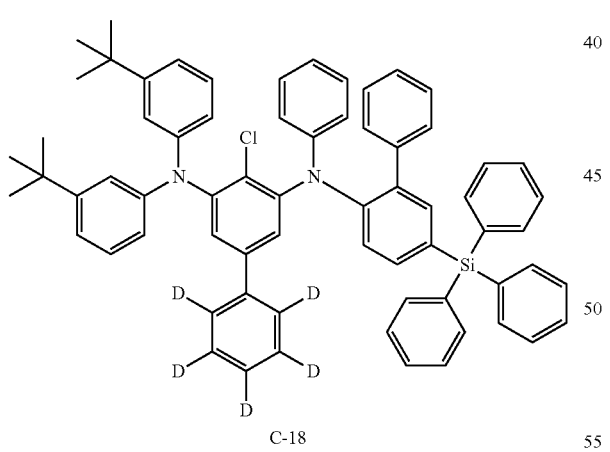

C-17 (12.7 g) was synthesized in the same manner as in Synthesis of Intermediate C-2 in Synthesis Example 1 using C-16 (9.5 g) and N-14 (9.1 g).

Intermediate C-18 (18.2 g) was synthesized in the same manner as in Synthesis of Intermediate C-3 in Synthesis Example 2 using C-17 (12 g) and N-15 (12.5 g). The intermediate was purified using a column chromatography purification method (eluent: ethyl acetate/hexane), and when measuring a mass spectrum on the obtained solid, a peak was identified at $[M+H]^+=974$.

Synthesis Example 24. Synthesis of Compound B-5

Compound B-5 (1.9 g) was synthesized in the same manner as in Synthesis of Compound A-2 in Synthesis Example 3 using C-18 (17 g). When measuring a mass spectrum on the obtained solid, a peak was identified at $[M+H]^+=948$.

Synthesis Example 25 Synthesis of Intermediate C-21

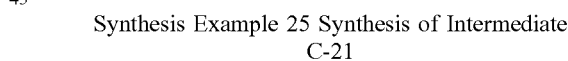

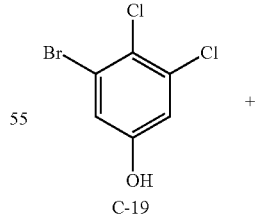

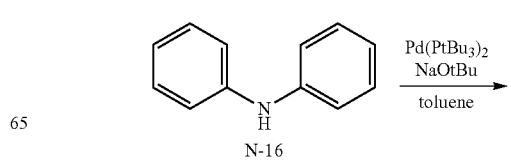

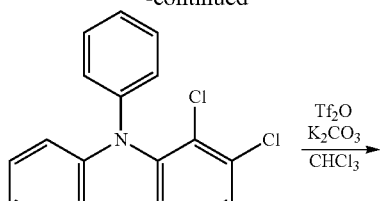

C-20

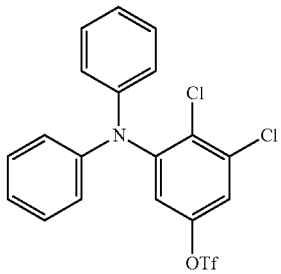

C-21

C-20 was synthesized in the same manner as in Synthesis of Intermediate C-2 in Synthesis Example 1 using C-19 (20 g) and N-16 (14.7 g), and a next reaction was progressed without a purification process.

After dissolving C-20 in chloroform (400 mL, 0.2 M), potassium carbonate (14.8 g) was added thereto at room temperature, and triflic anhydride (15.3 mL) was slowly added dropwise thereto at 0° C. The result was stirred for 2 hours, and after the reaction was finished, aqueous $NaHCO_3$ was introduced thereto, and the organic layer was washed using aqueous NaCl. The separated organic layer was collected, treated with $Na_2SO_4$ (anhydrous), and filtered. The solvent of the filtered solution was removed through vacuum distillation, and Intermediate C-21 (23.2 g) was obtained using a column chromatography (ethyl acetate/hexane) purification method. Herein, Tf is a trifluoromethanesulfonyl group.

Synthesis Example 26. Synthesis of Intermediate C-23

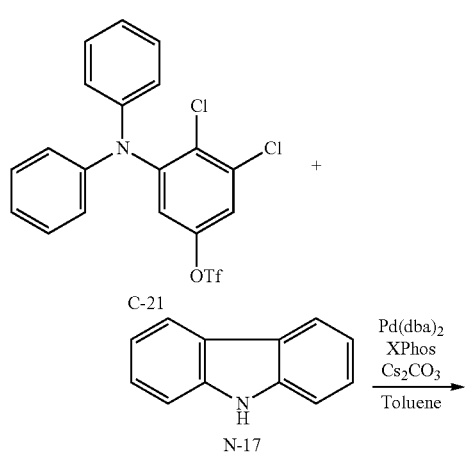

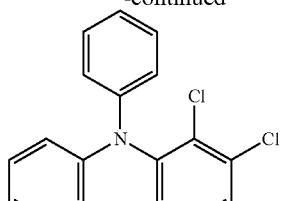

C-22

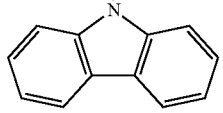

N-10

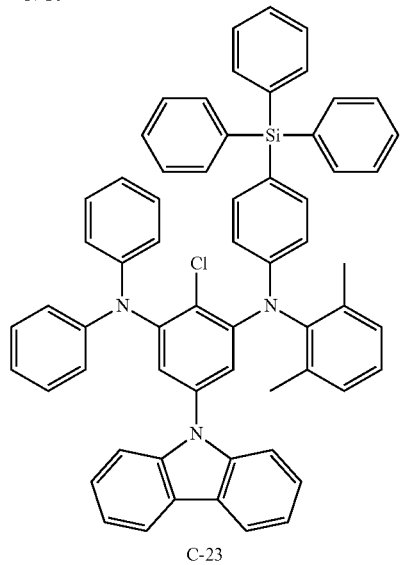

C-23

A flask holding C-21 (12.1 g), N-17 (4.6 g), palladium(0) bis(dibenzylideneacetone) $(Pd(dba)_2)$ (0.15 g), 2-dicyclohexylphosphino-2',4",6"-triisopropylbiphenyl (Xphos) (0.25 g), $Cs_2CO_3$ (25.6 g) and toluene (130 ml) was heated at 110° C., and the mixture was stirred for 12 hours. The reaction solution was cooled to room temperature, and separated by adding saturated aqueous $NH_4Cl$ and toluene thereto, and then the solvent was removed through distillation under vacuum. The result was purified by recrystallization (hexane/diethyl ether) to obtain Intermediate C-22 (11 g). When measuring a mass spectrum on the obtained solid, a peak was identified at $[M+H]^+=479$.

Intermediate C-23 (14.4 g) was synthesized in the same manner as in Synthesis of Intermediate C-3 in Synthesis Example 2 using C-22 (11 g) and N-10 (10.9 g). When measuring a mass spectrum on the obtained solid, a peak was identified at [M+H]$^+$=898.

Synthesis Example 27. Synthesis of Compound A-7

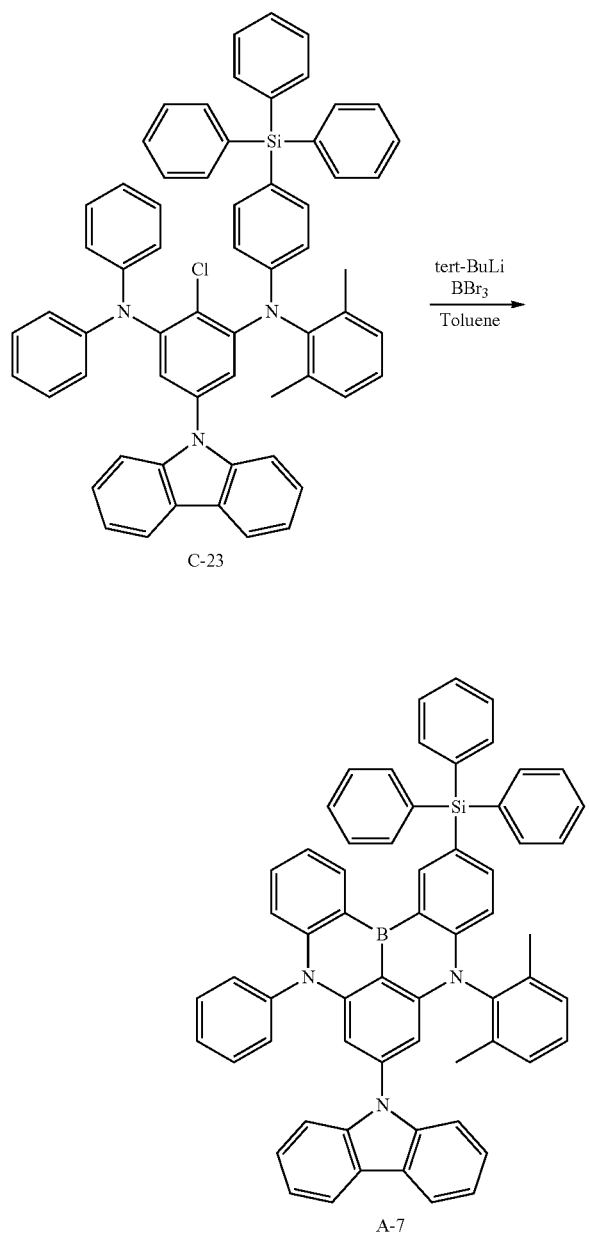

Compound A-7 (2.7 g) was synthesized in the same manner as in Synthesis of Compound A-2 in Synthesis Example 3 using C-23 (13 g). When measuring a mass spectrum on the obtained solid, a peak was identified at [M+H]$^+$=872.

Synthesis Example 28. Synthesis of Intermediate C-25

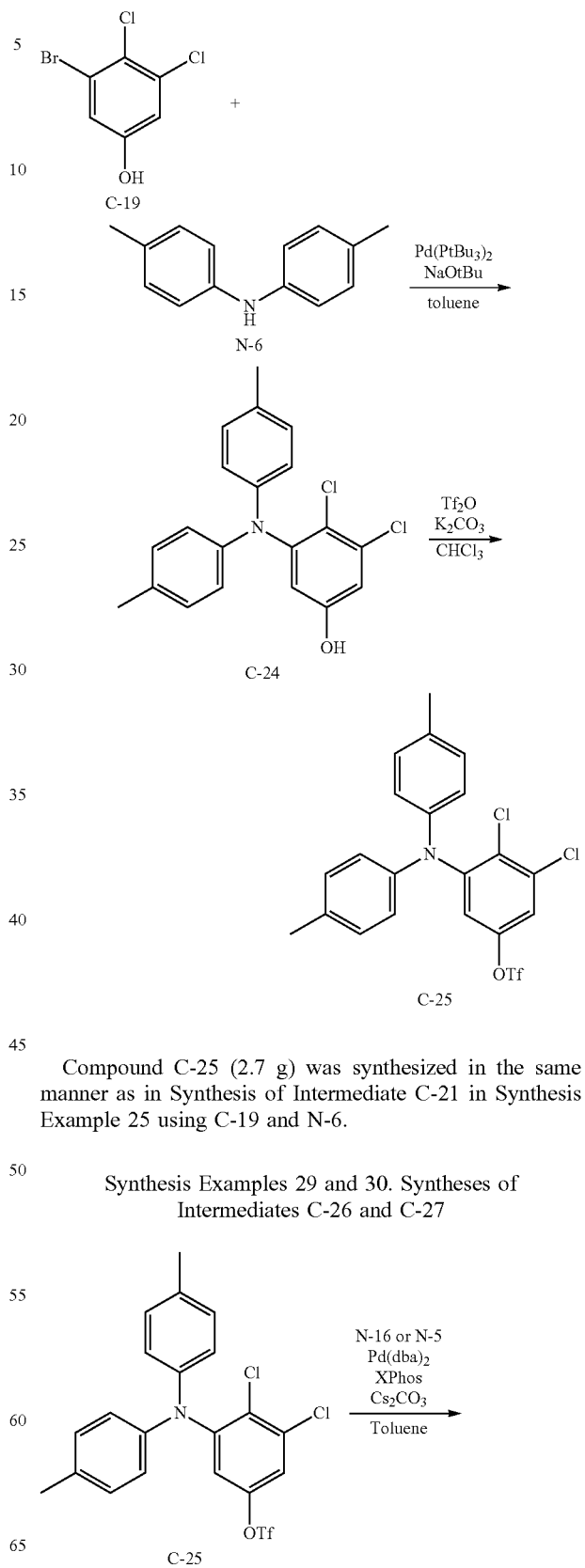

Compound C-25 (2.7 g) was synthesized in the same manner as in Synthesis of Intermediate C-21 in Synthesis Example 25 using C-19 and N-6.

Synthesis Examples 29 and 30. Syntheses of Intermediates C-26 and C-27

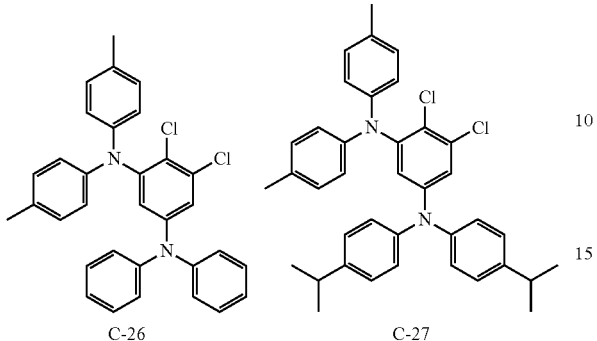

Compounds Intermediate C-26 and Intermediate C-27 (2.7 g) were synthesized in the same manner as in Synthesis of Intermediate C-22 in Synthesis Example 26 using C-25 (13 g). When measuring a mass spectrum on each of the obtained solids, a peak was identified at [M+H]$^+$=509 and 593.

Synthesis Examples 31 and 32. Syntheses of Intermediates C-28 and C-29

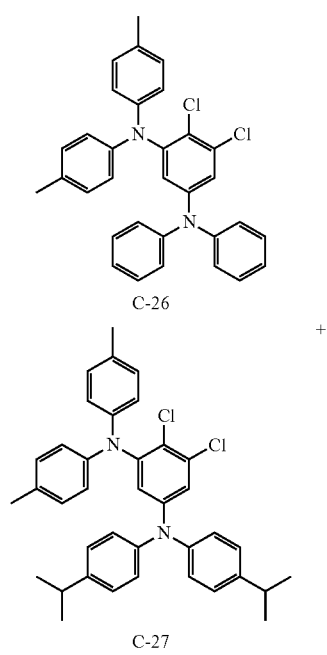

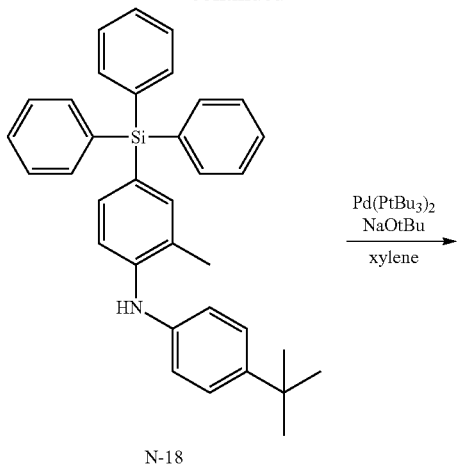

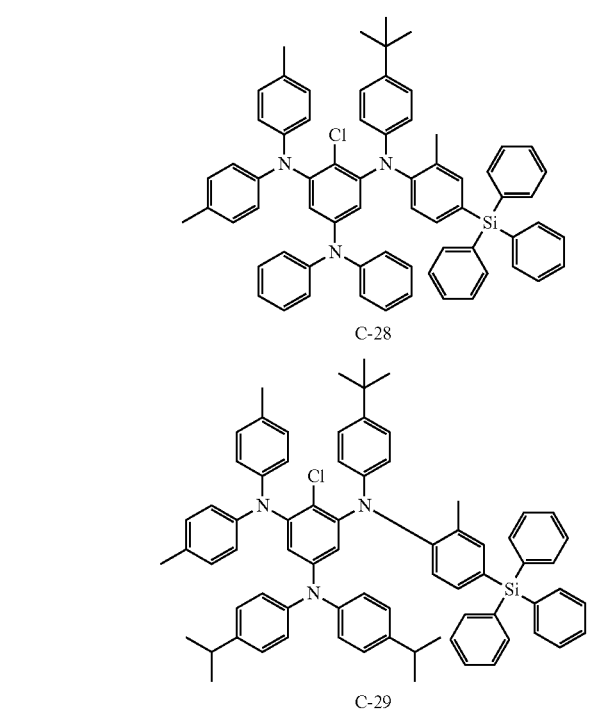

Each of Intermediate C-28 (14.8 g) and Intermediate C-29 (14.3 g) was synthesized in the same manner as in Synthesis of Intermediate C-3 in Synthesis Example 2 using C-26 (11 g) and N-18 (10.3 g), and C-27 (12 g) and N-18 (9.7 g). When measuring a mass spectrum on each of the obtained solids, a peak was identified at [M+H]$^+$=970 and [M+H]$^+$=1055.

Synthesis Example 33. Synthesis of Compound B-3

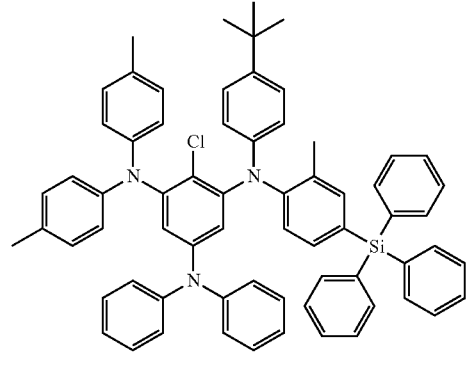
C-28

→ tert-BuLi, BBr₃, Toluene

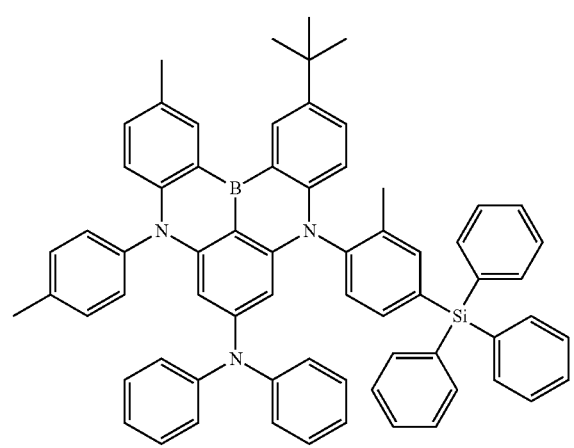
B-3

Compound B-3 (2.1 g) was synthesized the same manner as in Synthesis of Compound A-2 in Synthesis Example 3 using C-28 (13 g). When measuring a mass spectrum on the obtained solid, a peak was identified at [M+H]⁺=944.

Synthesis Example 34. Synthesis of Compound B-4

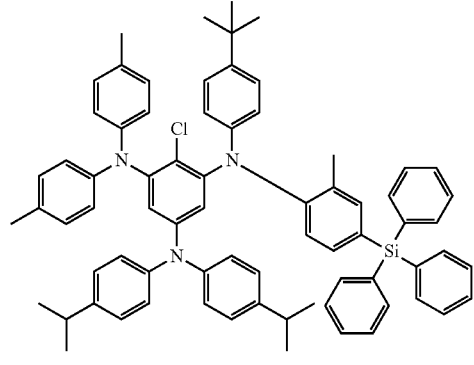
C-29

→ tert-BuLi, BBr₃, Toluene

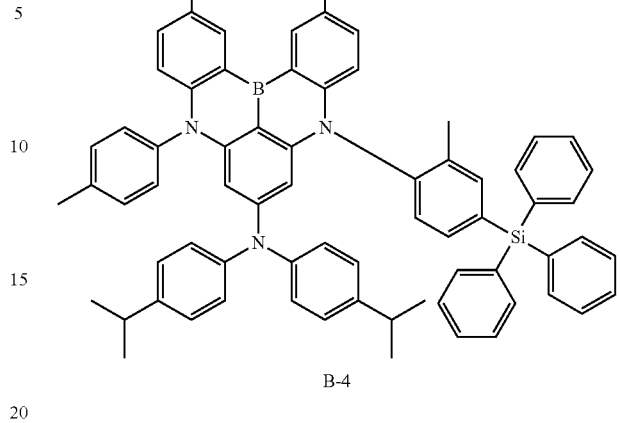
B-4

Compound B-4 (2.8 g) was synthesized in the same manner as in Synthesis of Compound A-2 in Synthesis Example 3 using C-29 (15 g). When measuring a mass spectrum on the obtained solid, a peak was identified at [M+H]⁺=1029.

Synthesis Example 35. Synthesis of Intermediate C-30

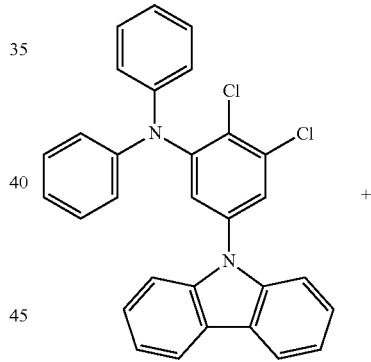
C-22

+

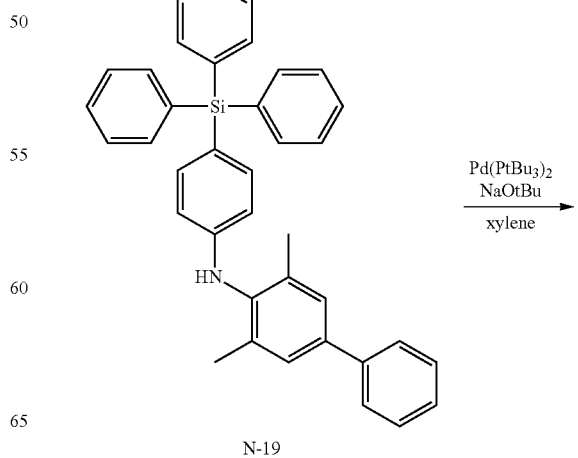
N-19

→ Pd(PtBu₃)₂, NaOtBu, xylene

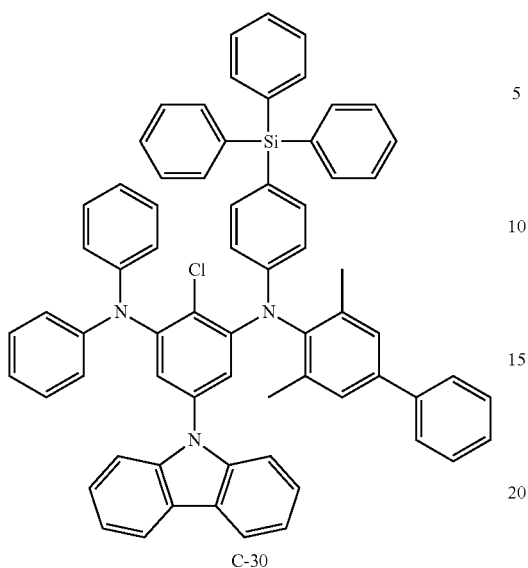

C-30

Intermediate C-30 (15.8 g) was synthesized in the same manner as in Synthesis of Intermediate C-3 in Synthesis Example 2 using C-22 (12.2 g) and N-19 (14.2 g). When measuring a mass spectrum on the obtained solid, a peak was identified at [M+H]$^+$=974.

Synthesis Example 36. Synthesis of Compound A-9

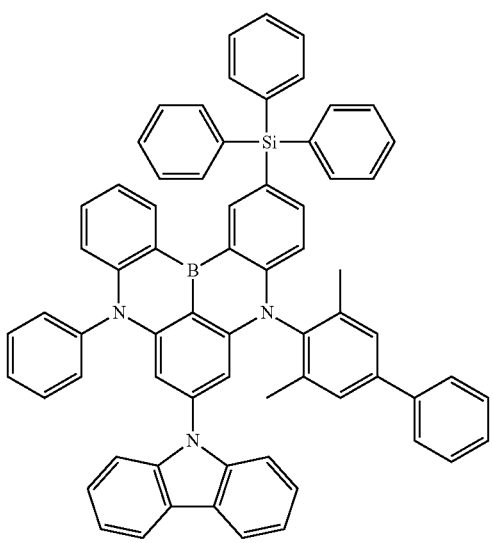

A-9

Compound A-9 (1.9 g) was synthesized in the same manner as in Synthesis of Compound A-2 in Synthesis Example 3 using C-30 (14 g). When measuring a mass spectrum on the obtained solid, a peak was identified at [M+H]$^+$=948.

Experimental Example 1

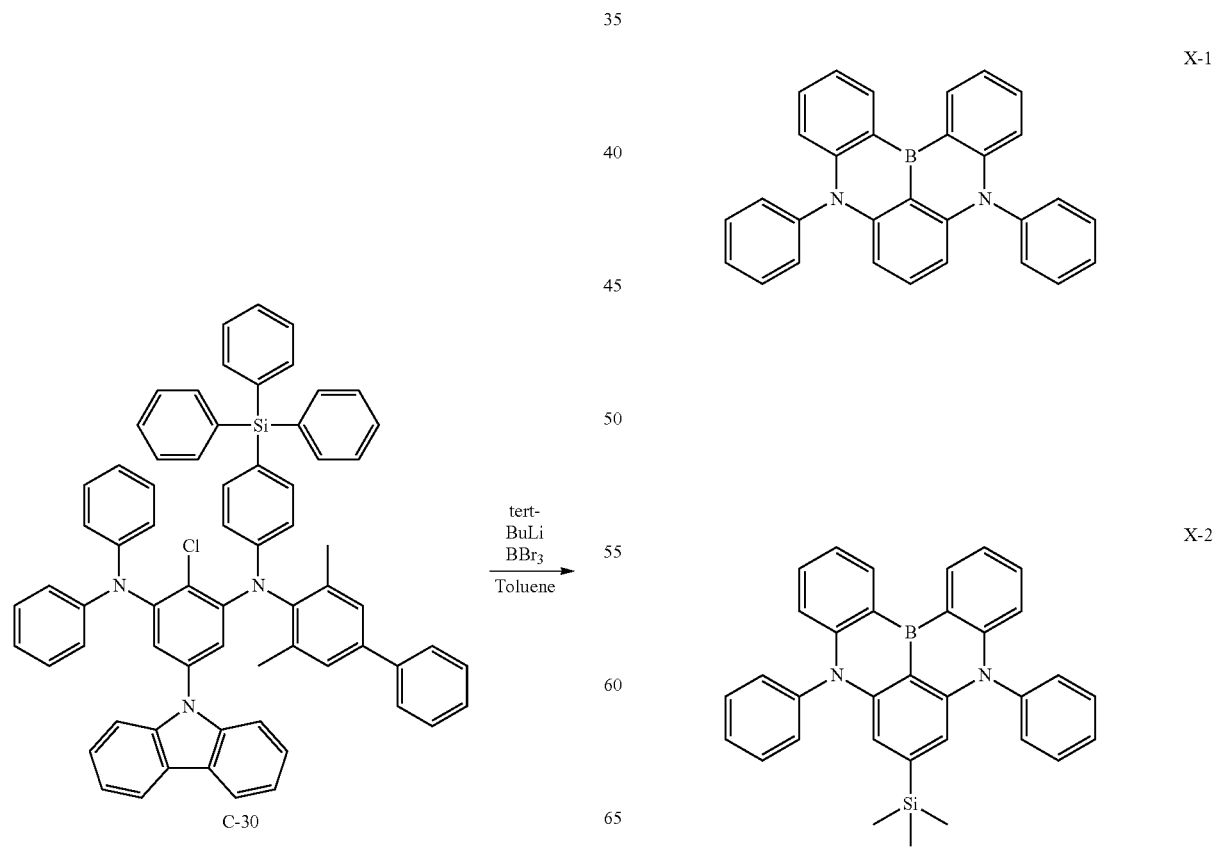

-continued

X-3

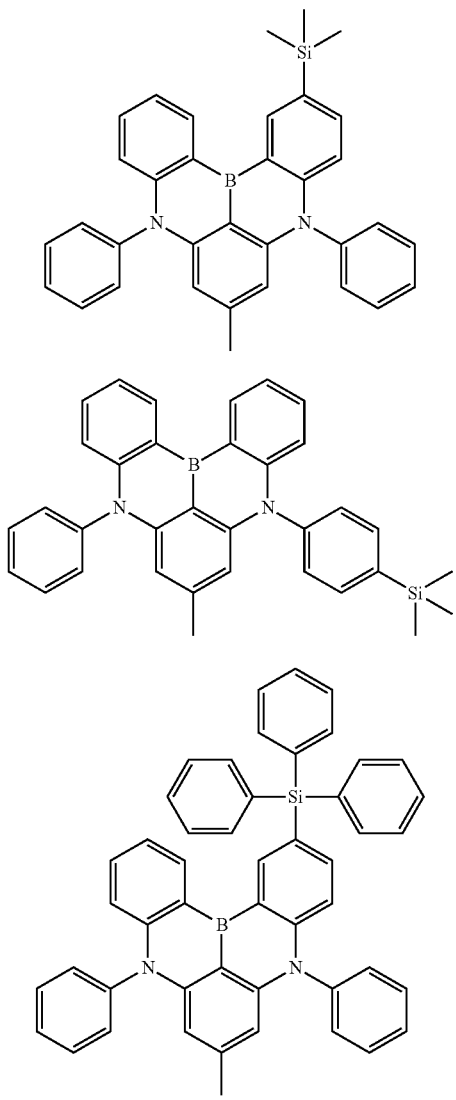

X-4

A-1

-continued

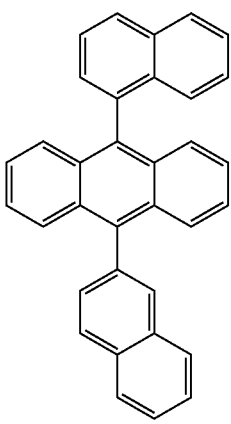

BH-1

A system comprising Compounds X-1 to X-4 and A-1, and BH-1 in a ratio of 5% and 95% was implemented. Specifically, using an OPLS3e force field, an environment of a doped device was chemically calculated through NVT and NPT calculations employing 300 molecules (ratio of Host-1 95%, and BD-X or A or B 5%), a temperature of 300 K and a simulation time of 30 ns.

An average distance between different molecules at this time was obtained through calculation. The results are shown in the following Table 1.

TABLE 1

|  | Comparative Example 1 X-1/BH-1 System | Comparative Example 2 X-2/BH-1 System | Comparative Example 3 X-3/BH-1 System | Comparative Example 4 X-4/BH-1 System | Experimental Example 1-1 A-1/BH-1 System |
| --- | --- | --- | --- | --- | --- |
| Distance between Molecules | 7.1 Å | 12.2 Å | 13.8 Å | 13.9 Å | 14.8 Å |

From Table 1, it can be confirmed that the distance between the host and the dopant increases as the compound is substituted with a silyl group. Particularly, it can be confirmed that, in Comparative Examples 2 to 4, the distance between the molecules further increases when A2 or B2 of Chemical Formula 1 is substituted with a silyl group compared to when A3 of Chemical Formula 1 is substituted. In addition, it was confirmed that the distance between the host and the dopant further increased when the substituted silyl group was an arylsilyl group (Experimental Example 1-1) compared to when it was an alkylsilyl group (Comparative Examples 2 to 4).

From the experimental results of Table 1, although Chemical Formula 1 of the present disclosure differs from the above Experimental Example 1-1 by the presence/absence of R4, it was seen the organic light emitting device using the compound of Chemical Formula 1 which includes an arylsilyl group introduced to A2 or B2 as a dopant has smaller host triplet energy and dexter energy transfer compared to the organic light emitting device using the compound not having a silyl group bonded thereto, the compound having a different bonding position of silyl group, and the compound having an alkylsilyl group bonded thereto, and therefore, an increase in the device efficiency may be predicted.

Experimental Example 2. Device Example

Example 2

A glass substrate on which indium tin oxide (ITO) coated as a thin film to a thickness of 1,300 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum deposition apparatus.

On the transparent ITO electrode prepared as above, a hole injection layer was formed by thermal vacuum depositing the following Compound HAT to a thickness of 50 Å. The following Compound HT-A was vacuum deposited to 1000 Å as a first hole transfer layer thereon, and subsequently, the following Compound HT-B was deposited to 100 Å as a second hole transfer layer. BH-1, a host, and Compound A-2, a dopant, were vacuum deposited in a weight ratio of 98:2 to form a light emitting layer having a thickness of 200 Å.

Then, the following Compound ET-A was vacuum deposited to 50 Å as a first electron transfer layer, and subsequently, the following Compound ET-B and the following Compound Liq in a ratio of 1:1 were deposited to 300 Å as a second electron transfer layer carrying out electron injection and electron transfer at the same time, and a cathode was formed thereon by consecutively depositing magnesium and silver (mass ratio 10:1) to a thickness of 500 Å simultaneously, and as a result, an organic light emitting device was manufactured.

In the above-mentioned process, the deposition rates of the organic materials were maintained at 0.4 Å/sec to 1.0 Å/sec, the deposition rate of the silver and the magnesium was maintained at 2 Å/sec, and the degree of vacuum during the deposition was maintained at $5 \times 10^{-8}$ torr to $1 \times 10^{-7}$ torr to manufacture the organic light emitting device.

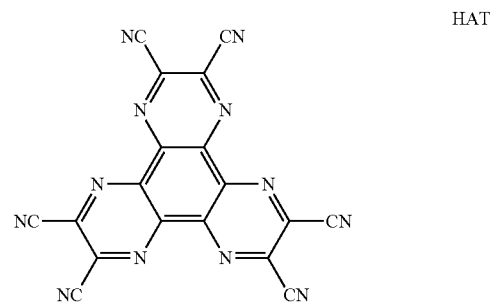

HAT

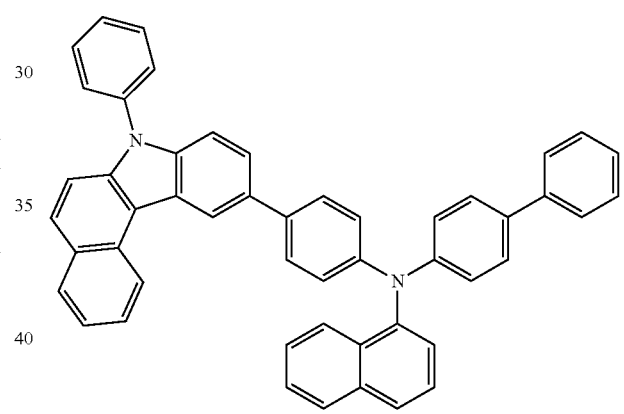

HT-A

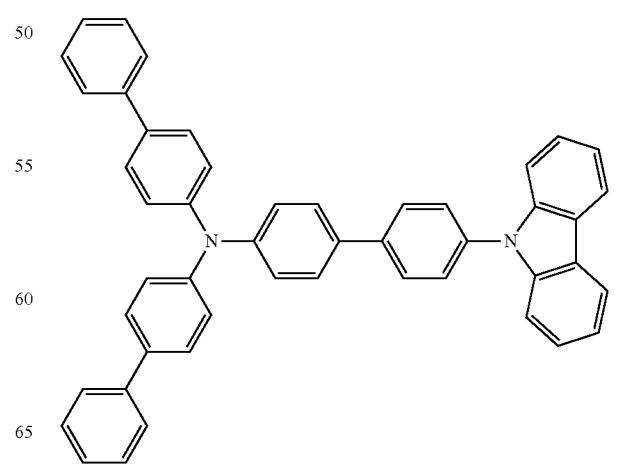

HT-B

ET-A
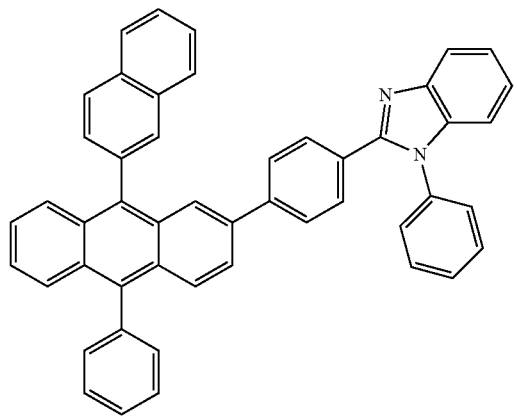
A-2
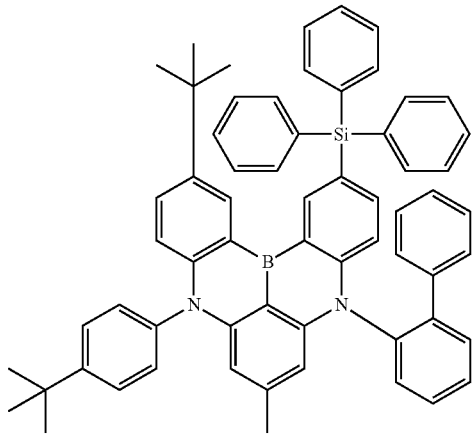
ET-B
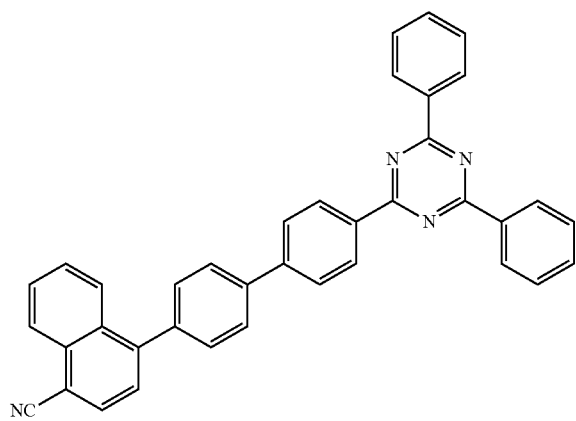
Comparative Examples 5 to 8
Organic light emitting devices were manufactured in the same manner as in Example 2 except that host and dopant compounds described in the following Table 2 were used as the light emitting layer material.
X-5
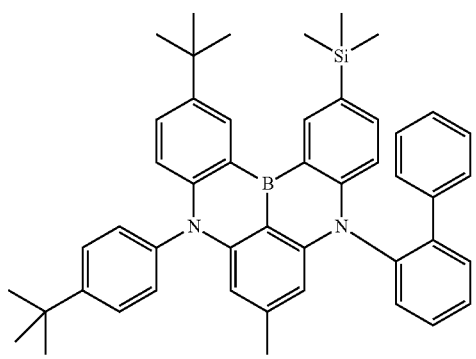
Liq
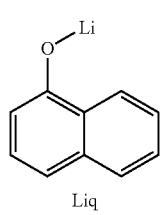
BH-1
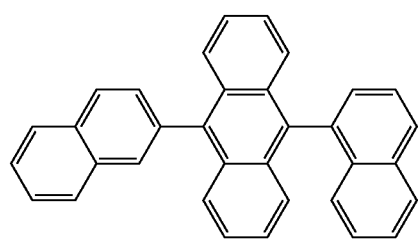
X-6
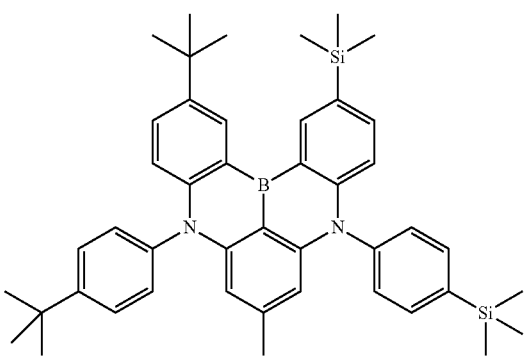

X-7

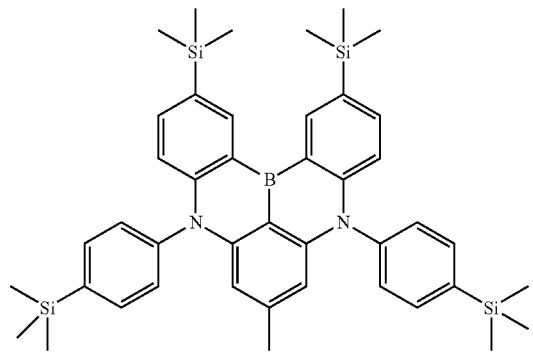

For the organic light emitting devices manufactured in Example 2 and Comparative Examples 5 to 8, driving voltage and light emission efficiency (cd/A) were measured at current density of 10 mA/cm$^2$, and the results are shown in the following Table 2. As the lifetime, time taken to become 97% (T97) with respect to initial luminance was measured at 20 mA/cm$^2$.

TABLE 2

| | | 10 mA/cm$^2$ | | |
| --- | --- | --- | --- | --- |
| | Dopant (Light Emitting Layer) | Driving Voltage (V) | Light Emission Efficiency (Cd/A) | 20 mA/cm$^2$ Lifetime, T97 (Time) |
| Example 2 | A-2 | 4.3 | 6.66 | 112 |
| Comparative Example 5 | X-5 | 4.2 | 6.05 | 98 |
| Comparative Example 6 | X-6 | 4.3 | 6.11 | 106 |
| Comparative Example 7 | X-7 | 4.3 | 5.87 | 108 |
| Comparative Example 8 | X-1 | 4.3 | 5.32 | 71 |

From the results of Comparative Examples 5 to 8 and Example 2, it was identified that light emission efficiency and lifetime was improved as a silyl group was introduced, however, there was no correlation with an increase in the number of silyl substituents. Accordingly, device efficiency and lifetime increase when there is just one silyl group, and improvements in the efficiency and the lifetime are greater when the introduced silyl group is an arylsilyl group compared to when it is an alkylsilyl group.

Examples 3 to 14

Organic light emitting devices were manufactured in the same manner as in Example 2 except that host and dopant compounds described in the following Table 3 were used as the light emitting layer material.

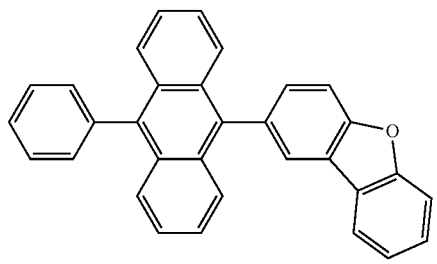

BH-2

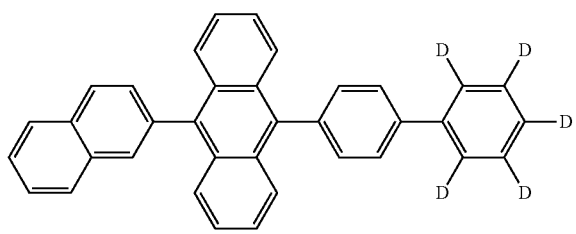

BH-3

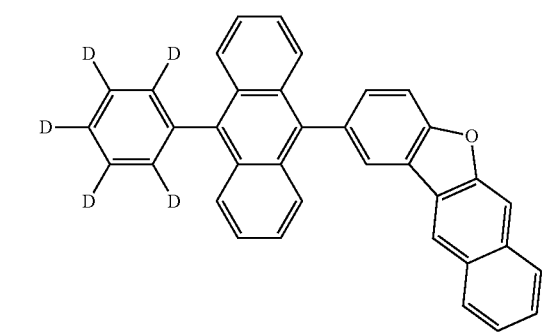

BH-4

Comparative Examples 9 to 11

Organic light emitting devices were manufactured in the same manner as in Example 2 except that host and dopant compounds described in the following Table 3 were used as the light emitting layer material.

Example 15

An organic light emitting device was manufactured in the same manner as in Example 2 except that host and dopant compounds described in the following Table 3 were used as the light emitting layer material. Specifically, as the host, BH-1 and BH-4 were used in a weight ratio of 1:1 instead of BH-1.

Example 16

An organic light emitting device was manufactured in the same manner as in Example 2 except that host and dopant compounds described in the following Table 3 were used as the light emitting layer material. Specifically, as the host, BH-2 and BH-3 were used in a weight ratio of 1:1 instead of BH-1.

Example 17

An organic light emitting device was manufactured in the same manner as in Example 2 except that host and dopant compounds described in the following Table 3 were used as the light emitting layer material. Specifically, as the host, BH-3 and BH-4 were used in a weight ratio of 1:1 instead of BH-1.

For the organic light emitting devices manufactured in Examples 3 to 17 and Comparative Examples 9 to 11, driving voltage and light emission efficiency (cd/A) were measured at current density of 10 mA/cm$^2$, and the results are shown in the following Table 3. As the lifetime, a ratio of time taken to become 97% with respect to initial luminance was measured at 20 mA/cm$^2$.

TABLE 3

| | Host (Light Emitting Layer) | Dopant (Light Emitting Layer) | 10 mA/cm$^2$ | | 20 mA/cm$^2$ Lifetime, T97 (Ratio) |
| | | | Driving Voltage (V) | Light Emission Efficiency (Cd/A) | |
|---|---|---|---|---|---|
| Example 3 | BH-1 | A-5 | 4.3 | 6.8 | 1.30 |
| Example 4 | BH-1 | A-6 | 4.3 | 6.9 | 1.12 |
| Example 5 | BH-1 | A-8 | 4.4 | 7.1 | 1.21 |
| Example 6 | BH-1 | B-1 | 4.2 | 7.3 | 1.16 |
| Example 7 | BH-1 | B-3 | 4.4 | 7.0 | 1.12 |
| Example 8 | BH-2 | A-2 | 4.1 | 6.5 | 1.21 |
| Example 9 | BH-2 | A-6 | 4.1 | 6.7 | 1.11 |
| Example 10 | BH-2 | A-9 | 3.9 | 6.4 | 1.10 |
| Example 11 | BH-2 | B-1 | 4.1 | 7.1 | 1.12 |
| Example 12 | BH-3 | A-8 | 4.3 | 7.1 | 1.37 |
| Example 13 | BH-4 | A-5 | 4.2 | 6.8 | 1.34 |
| Example 14 | BH-4 | B-3 | 4.2 | 6.9 | 2.00 |
| Comparative Example 9 | BH-2 | X-5 | 4.1 | 6.0 | 1.00 |
| Comparative Example 10 | BH-3 | X-5 | 4.3 | 6.2 | 1.05 |
| Comparative Example 11 | BH-1 | A-1 | 4.2 | 6.3 | 1.06 |
| Example 15 | BH-1 + BH-4 | A-2 | 4.1 | 6.7 | 1.19 |
| Example 16 | BH-2 + BH-3 | A-8 | 4.2 | 7.0 | 1.34 |
| Example 17 | BH-3 + BH-4 | B-1 | 4.1 | 7.0 | 1.24 |

From the results of Table 2 and Table 3, it was confirmed that the device using the compound corresponding to Chemical Formula 1 of the present disclosure exhibited superior efficiency and lifetime properties.

Experimental Example 3

Example 18

An actual maximum emission wavelength of Compound A-2 was measured, and a measuring device used for the measurement was a JASCO FP-8600 fluorescence spectrophotometer.

The maximum emission wavelength was obtained as follows. A compound to measure was dissolved in a concentration of 1 M (micro-molarity) using toluene as a solvent to prepare a sample for measurement. The sample solution was introduced to a quartz cell and degassed using nitrogen gas (N2) to remove oxygen in the solution, and a fluorescence spectrum was measured at room temperature (300 K) using the measuring device. Herein, a wavelength value (nm) of the maximum emission peak was obtained, and a spread width (FWHM, full width at half maximum, nm) of the graph at half height in the maximum emission peak was obtained and is shown in the following Table 4. The measured graph is shown in FIG. 5.

TABLE 4

| Compound | Maximum Emission Wavelength (nm) | Full Width at Half Maximum (nm) |
|---|---|---|
| A-2 | 456 | 24.5 |

The invention claimed is:
1. A compound of Chemical Formula 1:

[Chemical Formula 1]

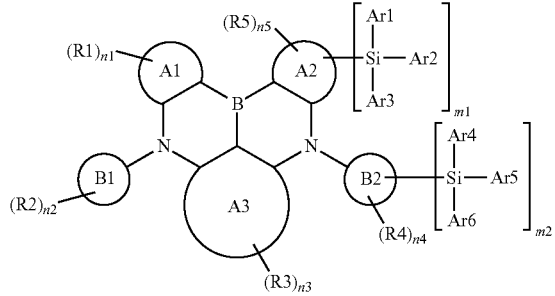

wherein, in Chemical Formula 1:
A1, A2, A3, B1 and B2 are the same as or different from each other, and are each independently a hydrocarbon ring;
Ar1, Ar2, Ar4 and Ar5 are the same as or different from each other, and are each independently a substituted or unsubstituted aryl group;
Ar3 and Ar6 are the same as or different from each other, and are each independently a substituted or unsubstituted alkyl group or a substituted or unsubstituted aryl group;
R1 and R3 are the same as or different from each other, and are each independently deuterium, a halogen group, a cyano group, a substituted or unsubstituted alkyl group, a substituted or unsubstituted alkenyl group, a substituted or unsubstituted alkynyl group, a substituted or unsubstituted alkoxy group, a substituted or unsubstituted cycloalkyl group, a substituted or unsubstituted amine group, a substituted or unsubstituted aryl group, a substituted or unsubstituted aryloxy group, or a substituted or unsubstituted heterocyclic group;

R2 and R5 are the same as or different from each other, and are each independently hydrogen, deuterium, a halogen group, a cyano group, a substituted or unsubstituted alkyl group, a substituted or unsubstituted alkenyl group, a substituted or unsubstituted alkynyl group, a substituted or unsubstituted alkoxy group, a substituted or unsubstituted cycloalkyl group, a substituted or unsubstituted amine group, a substituted or unsubstituted aryl group, a substituted or unsubstituted aryloxy group, or a substituted or unsubstituted heterocyclic group;

R4 is deuterium, a halogen group, a cyano group, a substituted or unsubstituted alkyl group, a substituted or unsubstituted alkenyl group, a substituted or unsubstituted alkynyl group, a substituted or unsubstituted alkoxy group, a substituted or unsubstituted cycloalkyl group, a substituted or unsubstituted amine group, a substituted or unsubstituted aryl group, a substituted or unsubstituted aryloxy group, or a substituted or unsubstituted heterocyclic group;

n1 to n3 and n5 are each an integer of 0 to 10, n4 is an integer of 1 to 10, and when any of n1 to n5 is 2 or greater, the two or more substituents in the parentheses are the same as or different from each other;

n1+n3 is 1 or greater; and m1 and m2 are each 0 or 1, and m1+m2 is 1.

2. The compound of claim 1, wherein A1, A2, A3, B1 and B2 are the same as or different from each other, and are each independently an aromatic hydrocarbon ring having 6 to 30 carbon atoms.

3. The compound of claim 1, wherein R4 is deuterium, a halogen group, a substituted or unsubstituted linear or branched alkyl group having 1 to 20 carbon atoms, a substituted or unsubstituted aryl group having 6 to 30 carbon atoms, or a substituted or unsubstituted heterocyclic group having 2 to 30 carbon atoms and comprising one or more heteroatoms selected from the group consisting of O, S, N and Si.

4. The compound of claim 1, wherein the compound of Chemical Formula 1 is represented by the following Chemical Formula 2 or 3:

[Chemical Formula 2]

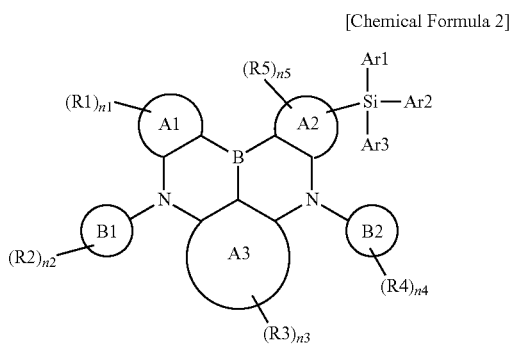

[Chemical Formula 3]

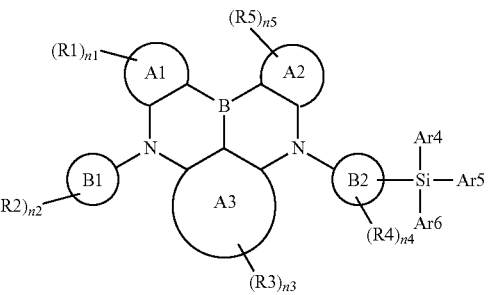

wherein, in Chemical Formulae 2 and 3,

A1, A2, A3, B1, B2, R1 to R5, n1 to n5 and Ar1 to Ar6 are the same as defined in Chemical Formula 1.

5. The compound of claim 1, wherein the compound of Chemical Formula 1 is represented by—the following Chemical Formula 4:

[Chemical Formula 4]

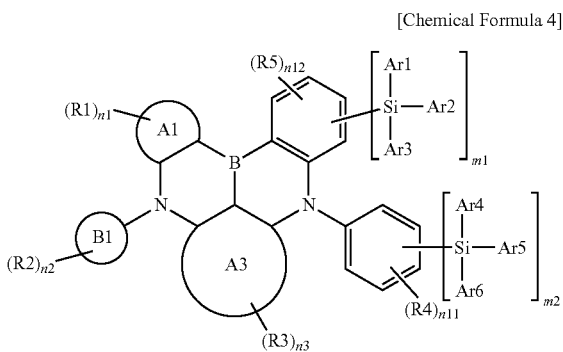

wherein, in Chemical Formula 4,

A1, A3, B1, R1 to R5, n1 to n3, Ar1 to Ar6, m1 and m2 are the same as defined in Chemical Formula 1, and n11 is an integer of 1 to 5, n12 is an integer of 0 to 4, and when n11 and n12 are 2 or greater, the two or more substituents in the parentheses are the same as or different from each other.

6. The compound of claim 1, wherein the compound of Chemical Formula 1 is represented by the following Chemical Formula 5:

[Chemical Formula 5]

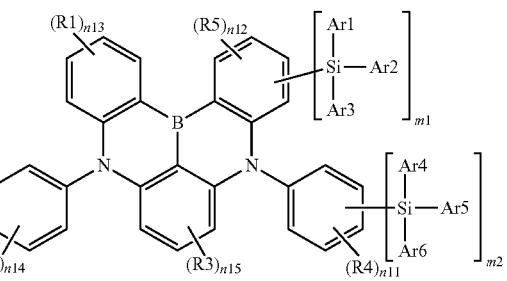

wherein, in Chemical Formula 5,

R1 to R5, Ar1 to Ar6, m1 and m2 are the same as defined in Chemical Formula 1, and n11 is an integer of 1 to 5, n14 is an integer of 0 to 5, n12 and n13 are each an integer of 0 to 4, and n15 is an integer of 0 to 3, and when any of n11 to n15 are 2 or greater, the two or more substituents in the parentheses are the same as or different from each other, and n13+n15 is 1 or greater.

7. The compound of claim 1, wherein the compound of Chemical Formula 1 is represented by the following Chemical Formula 6 or 7:

[Chemical Formula 6]

[Chemical Formula 7]

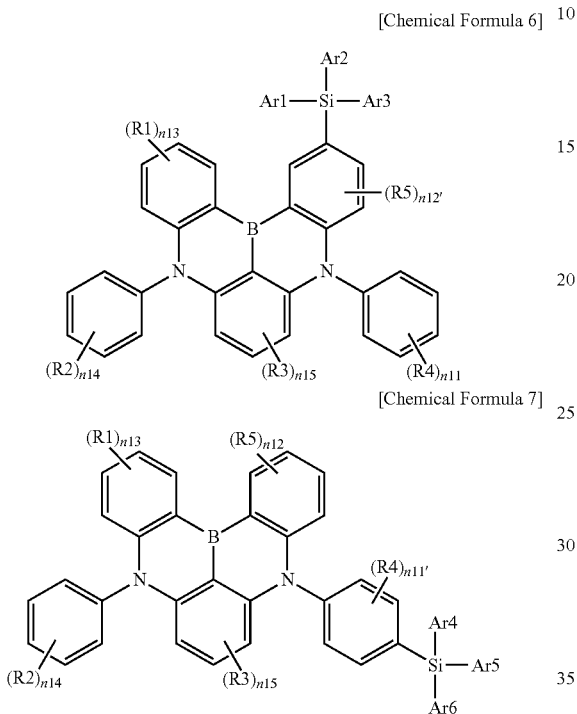

wherein, in Chemical Formulae 6 and 7,
R1 to R5 and Ar1 to Ar6 are the same as defined in Chemical Formula 1, and
n11 is an integer of 1 to 5, n14 is an integer of 0 to 5, n12 and n13 are each an integer of 0 to 4, n15 and n12' are each an integer of 0 to 3, n11' is an integer of 1 to 4, and when any of n11 to n15, n11' or n12' are 2 or greater, the two or more substituents in the parentheses are the same as or different from each other, and n13+n15 is 1 or greater.

8. The compound of claim 1, wherein the compound of Chemical Formula 1 is any one compound selected from among the following compounds:

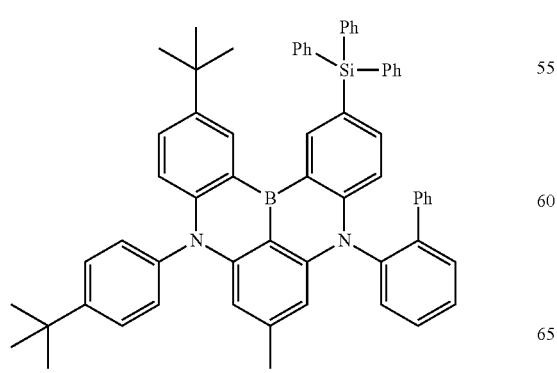

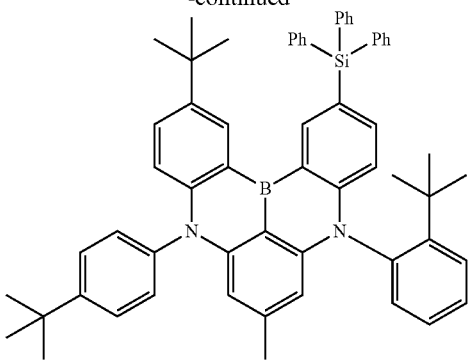

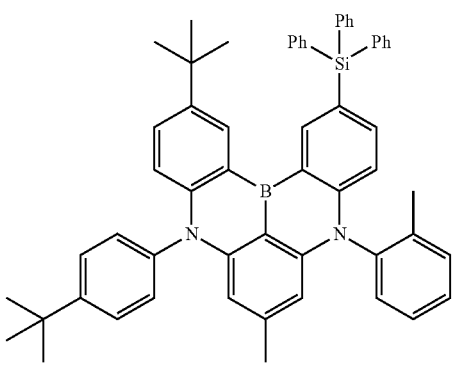

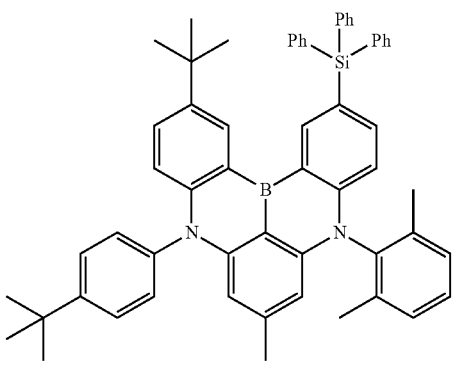

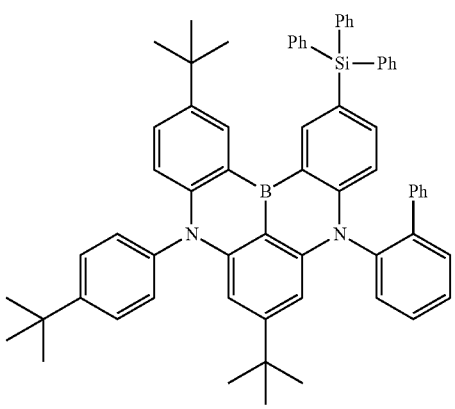

223
-continued
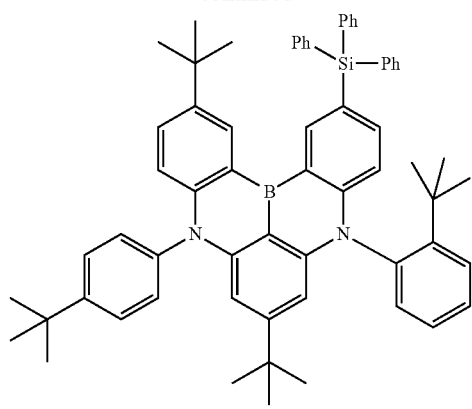
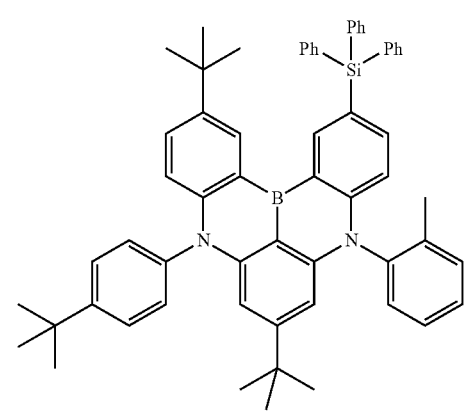
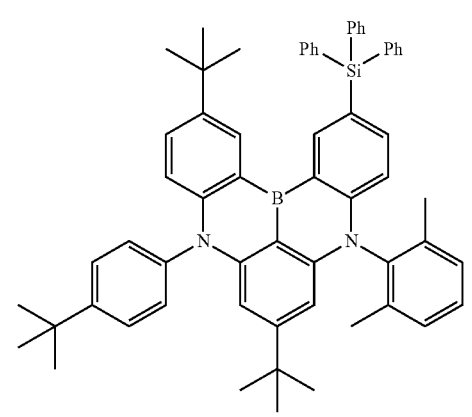
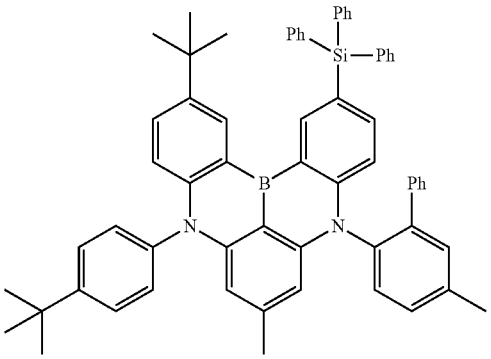
224
-continued
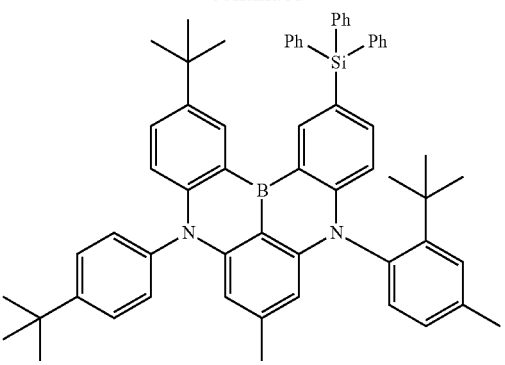
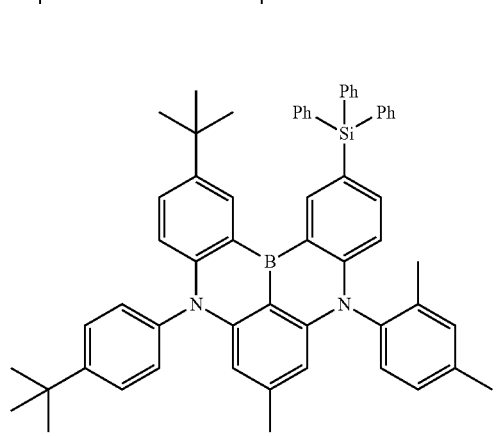
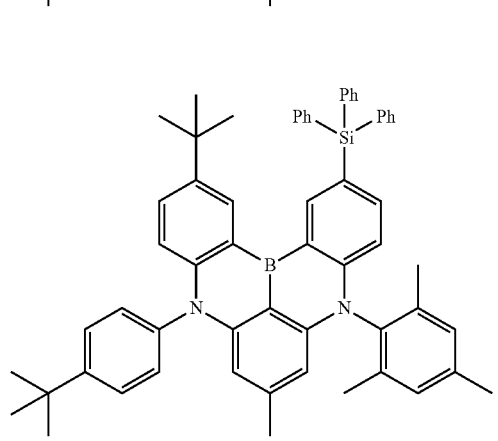
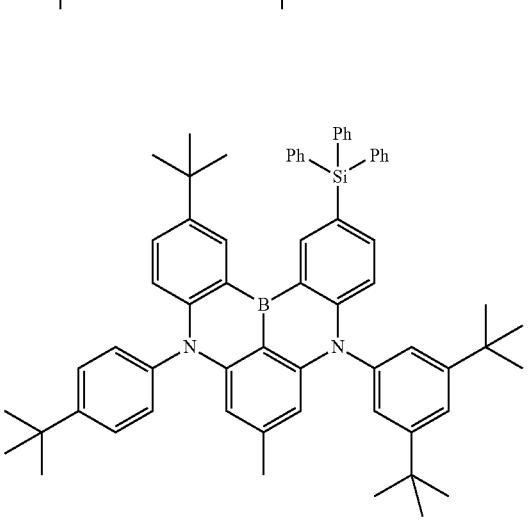

225
-continued
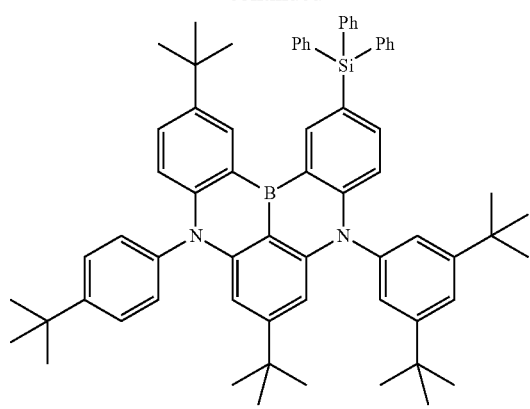
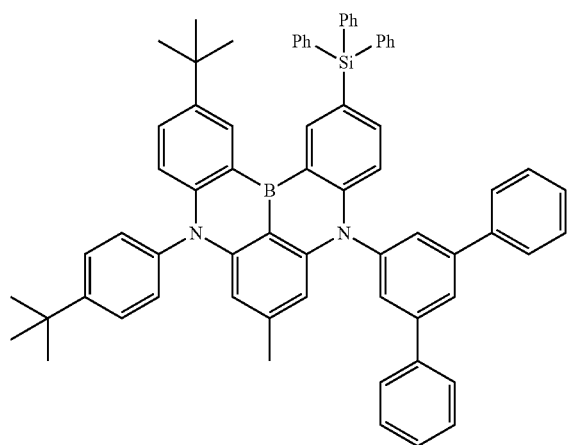
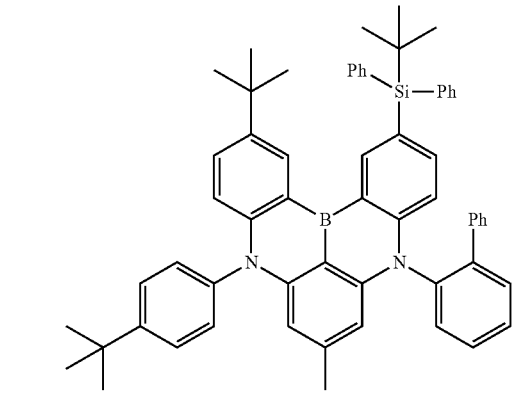
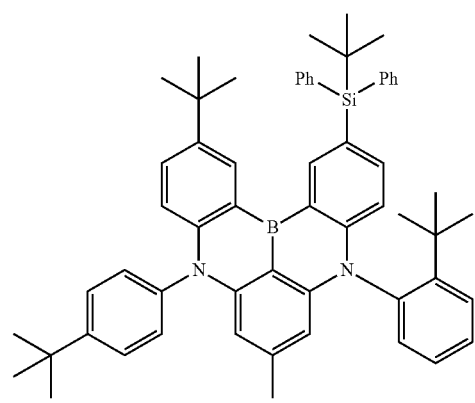
226
-continued
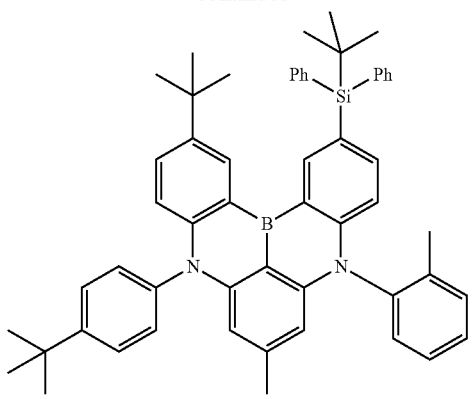
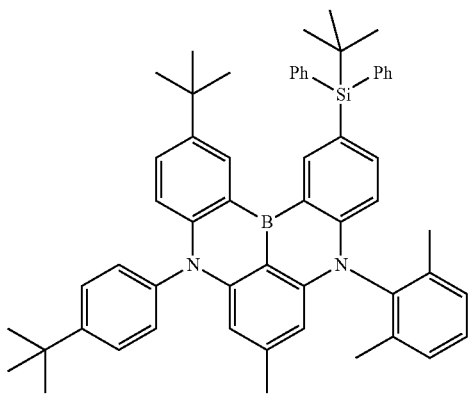
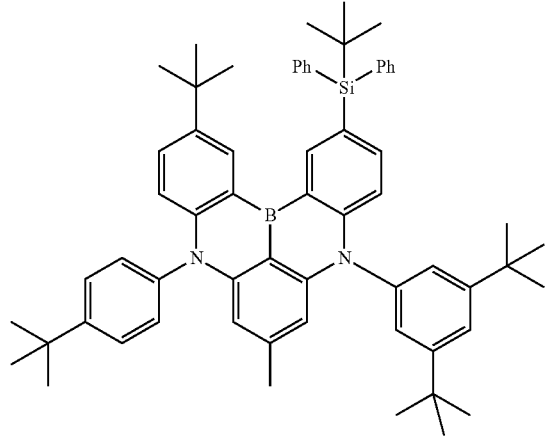
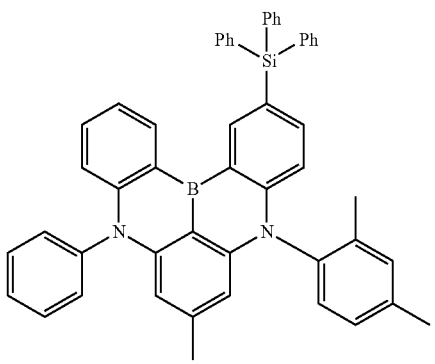

227
-continued
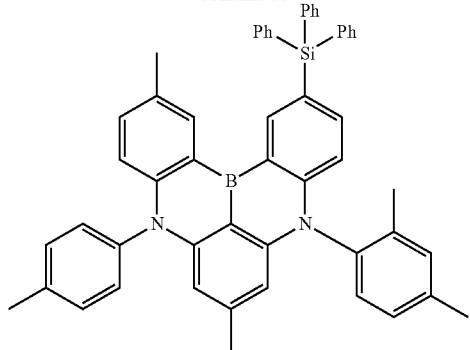
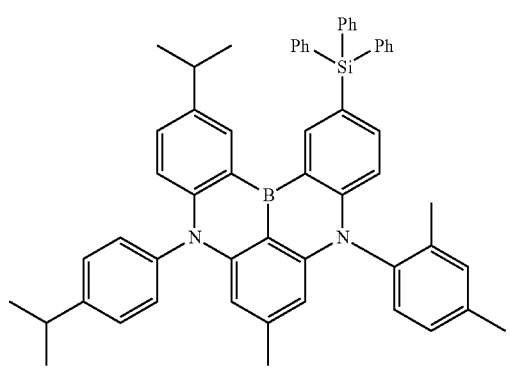
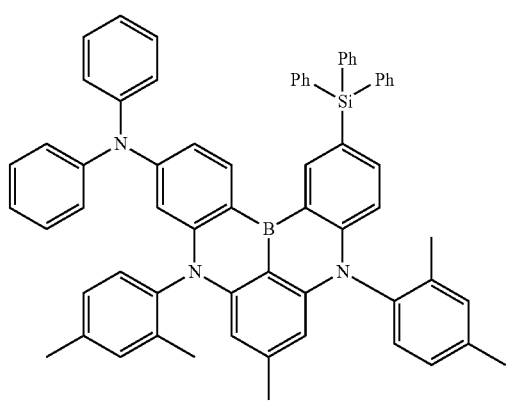
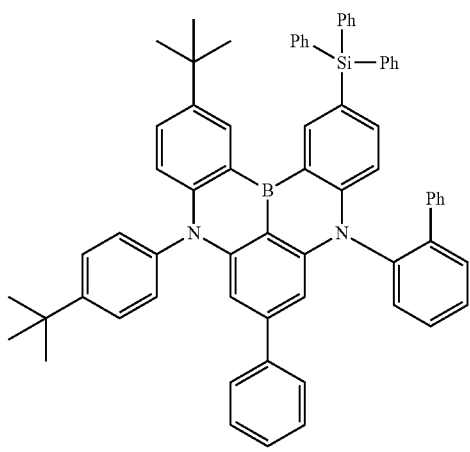
228
-continued
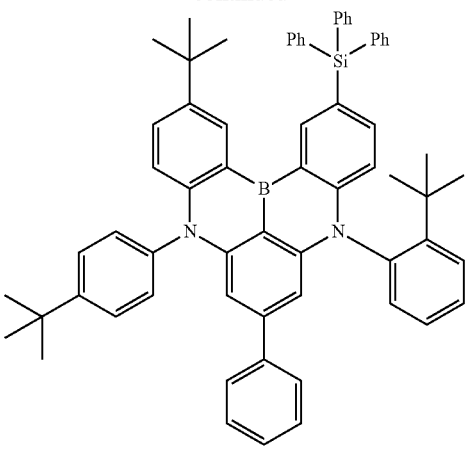
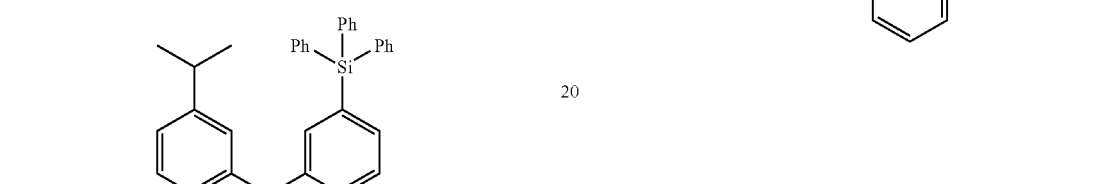
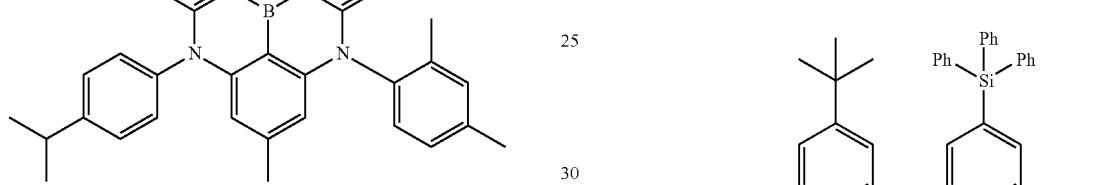

229
-continued
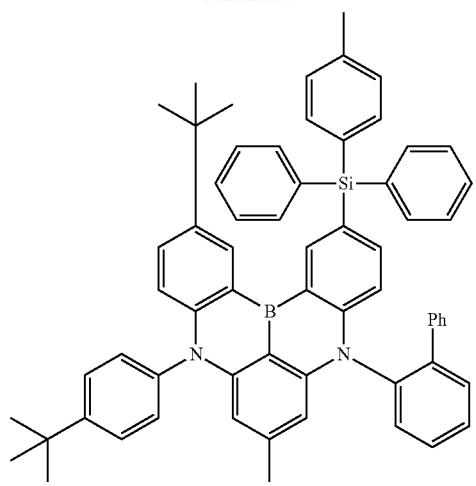
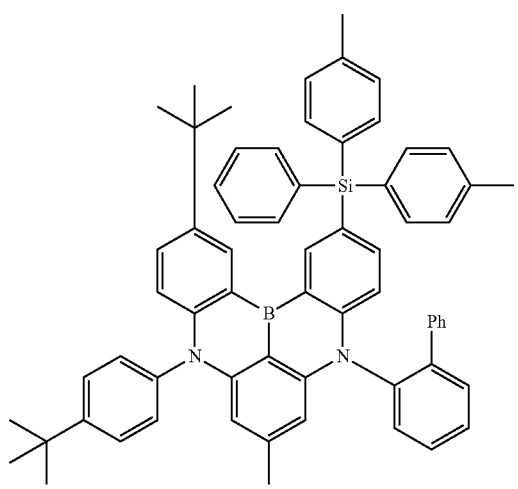
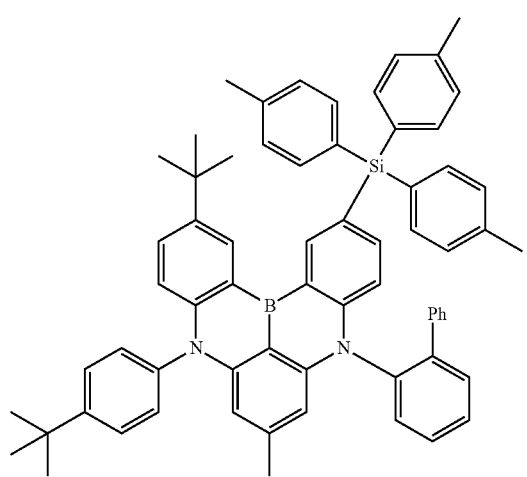
230
-continued
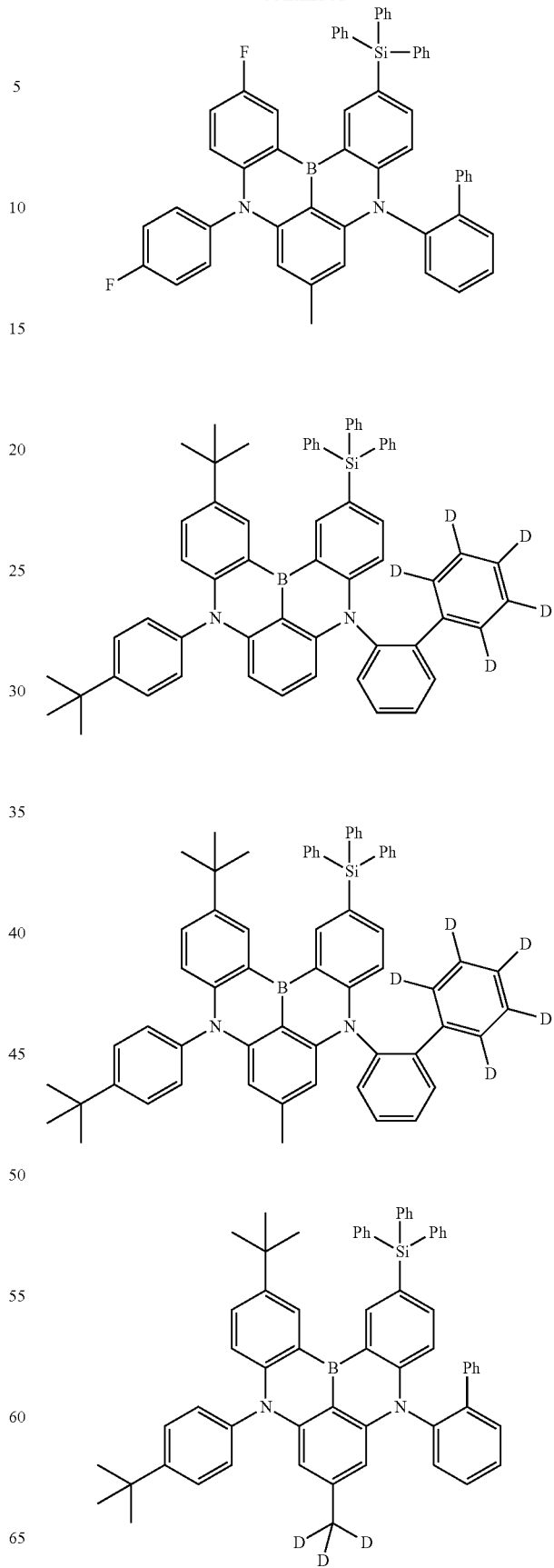

231
-continued
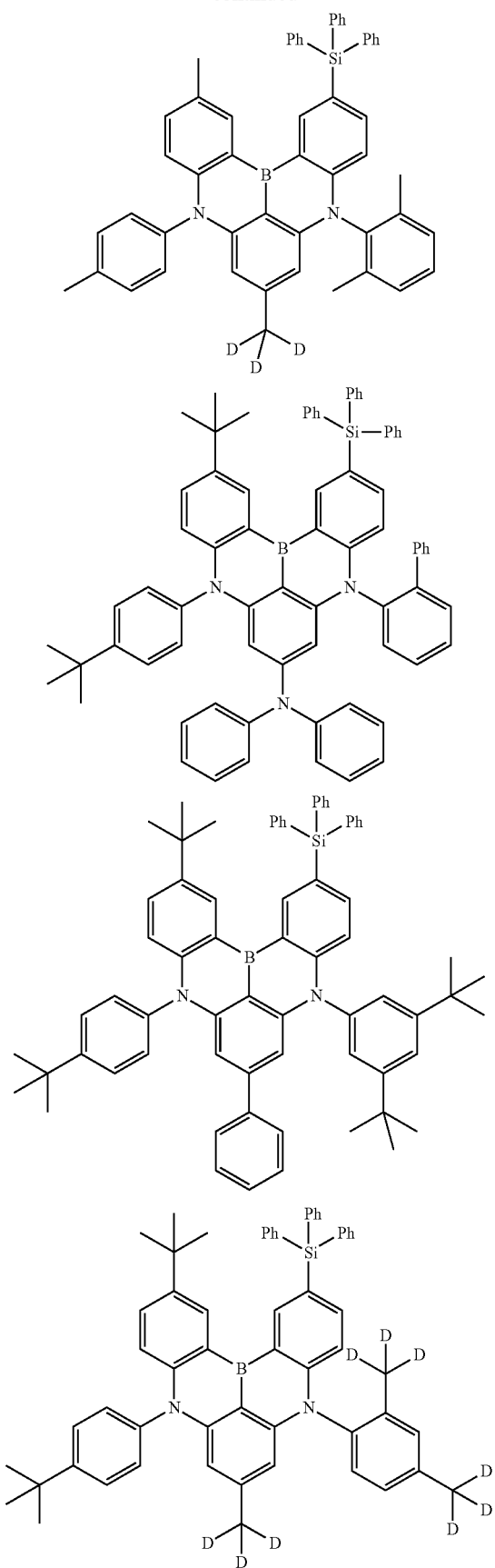
232
-continued
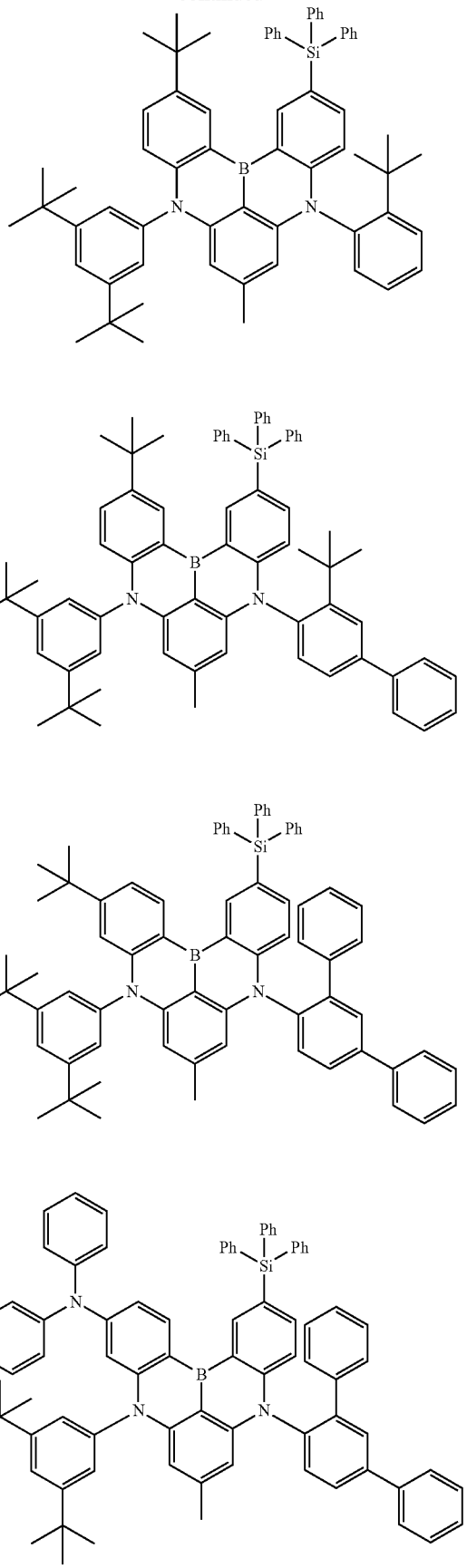

233
-continued
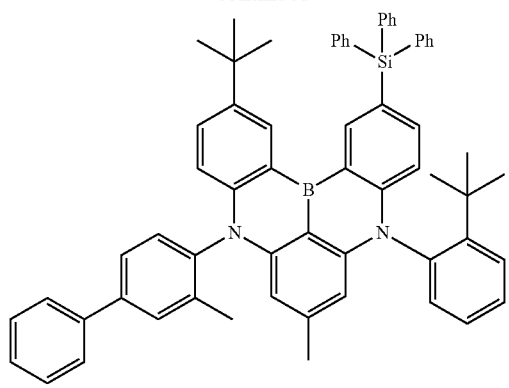
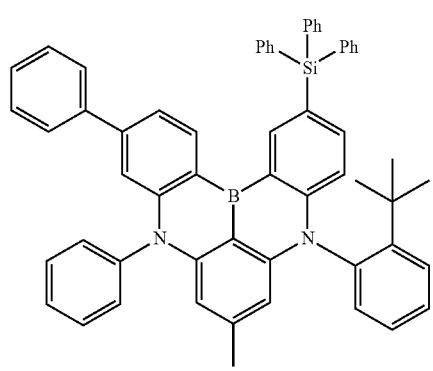
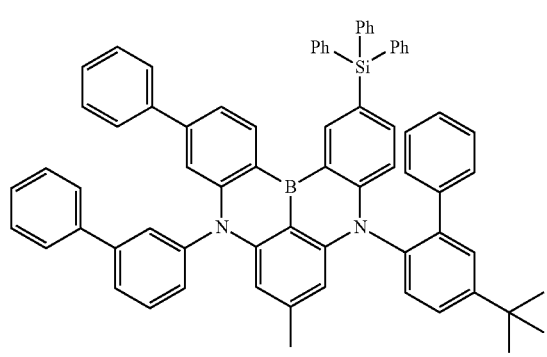
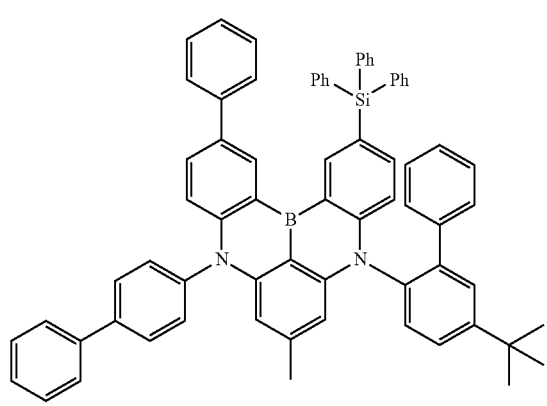
234
-continued
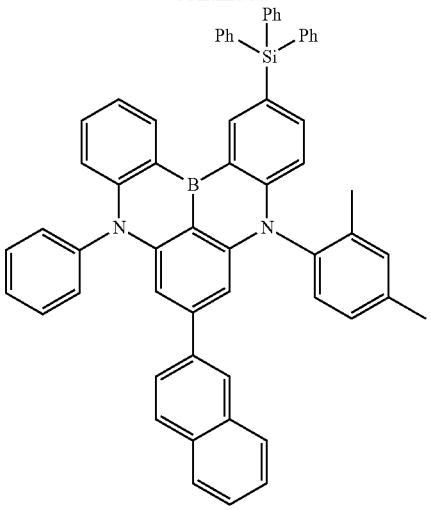
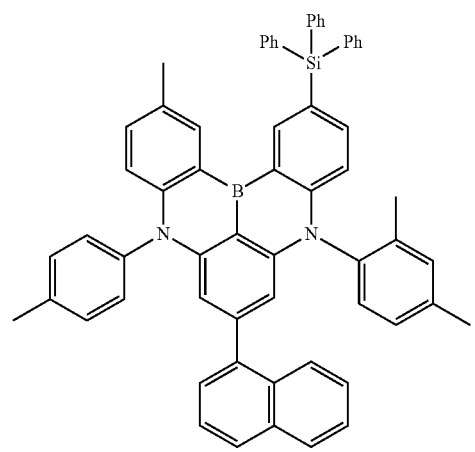
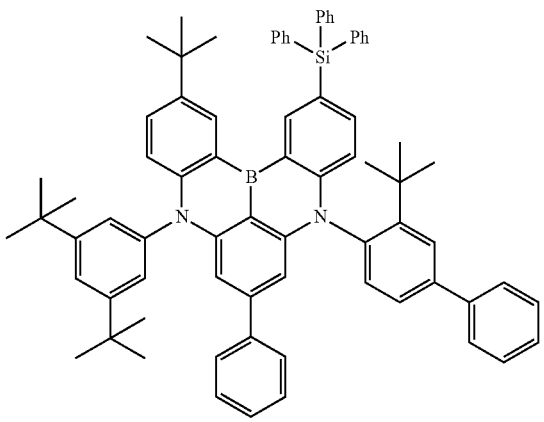

235
-continued
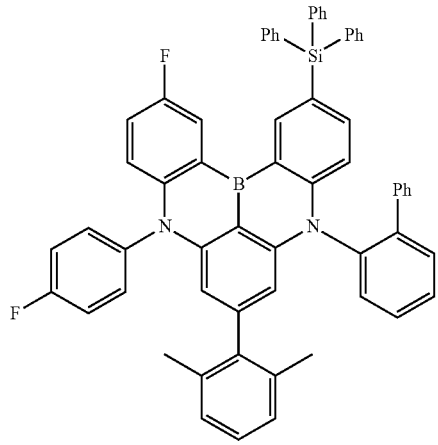
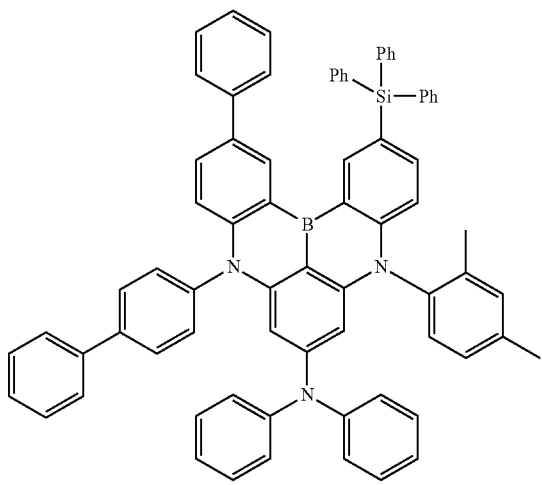
236
-continued
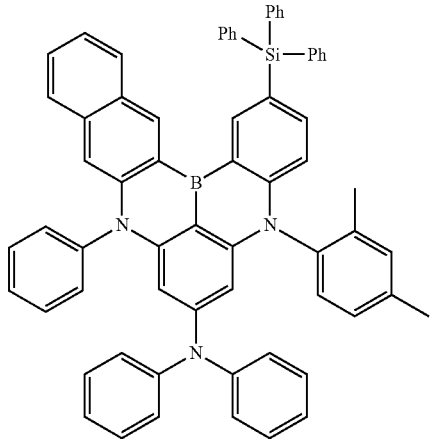
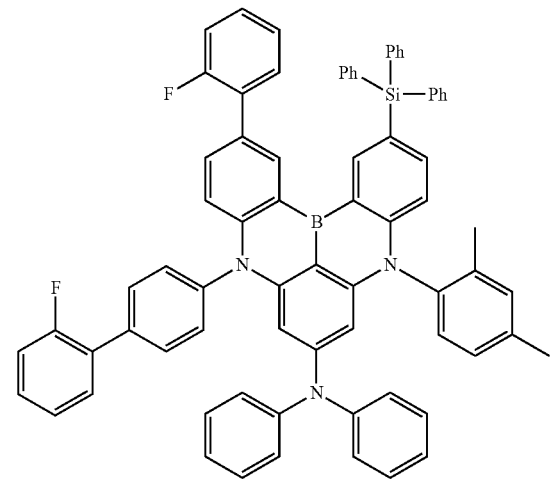
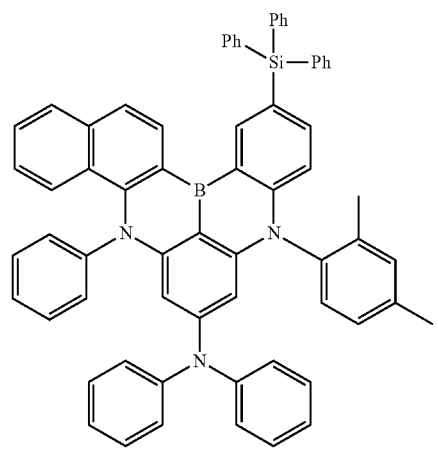
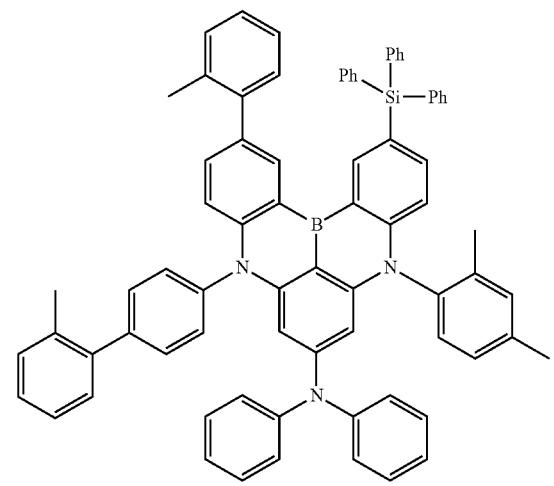

237
-continued
238
-continued
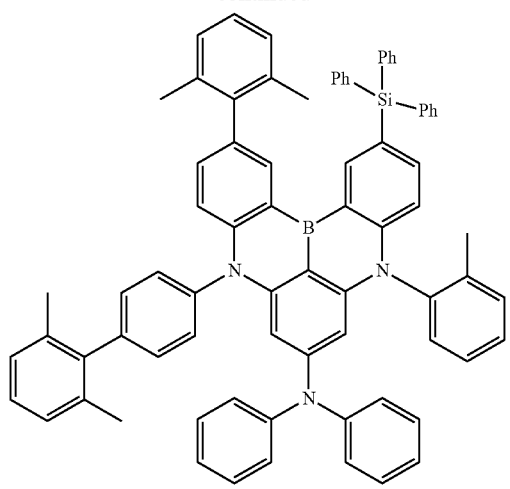
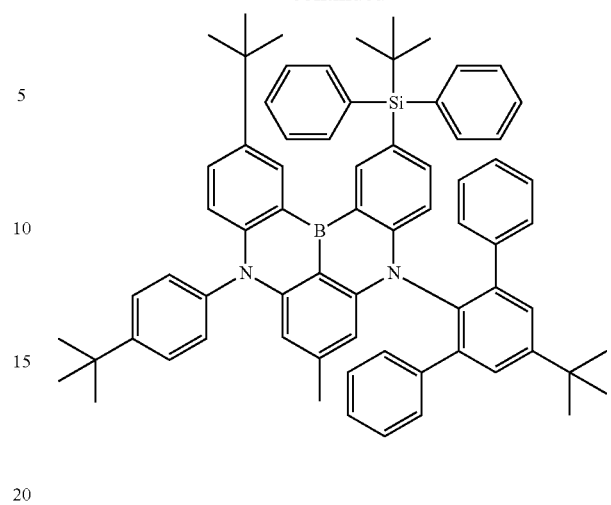
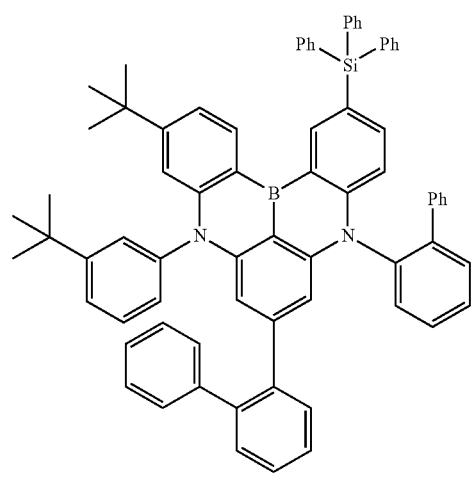
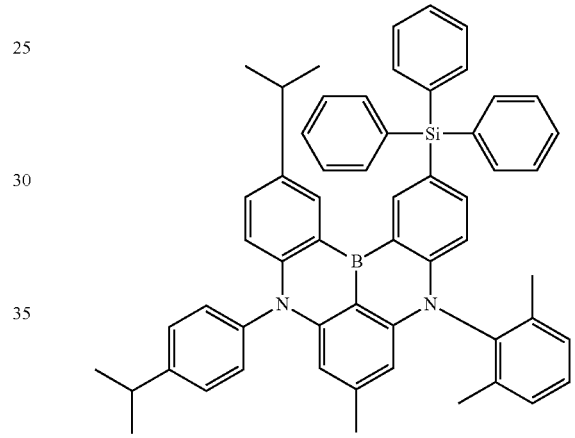
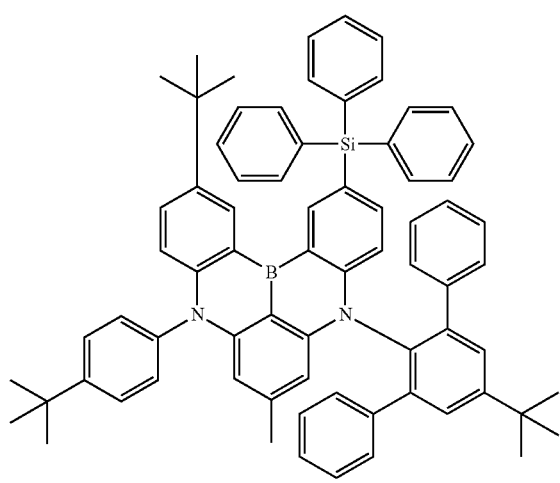
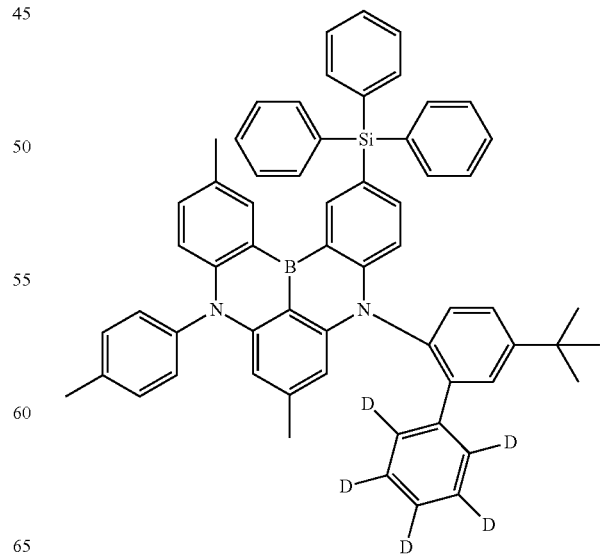

239
-continued
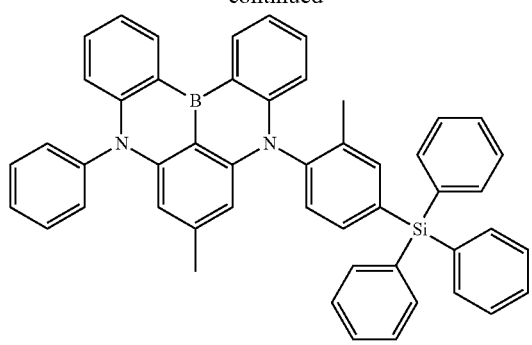
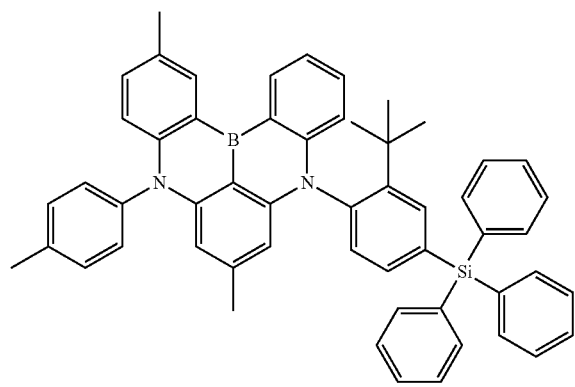
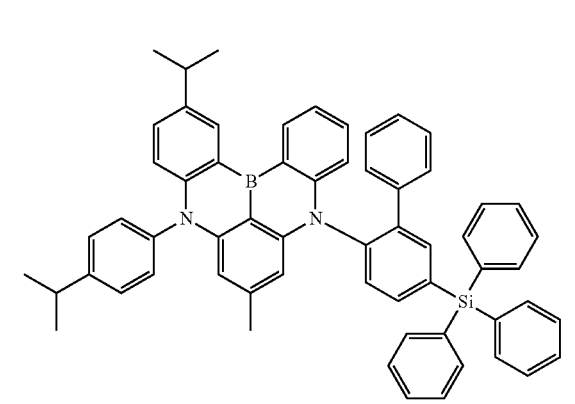
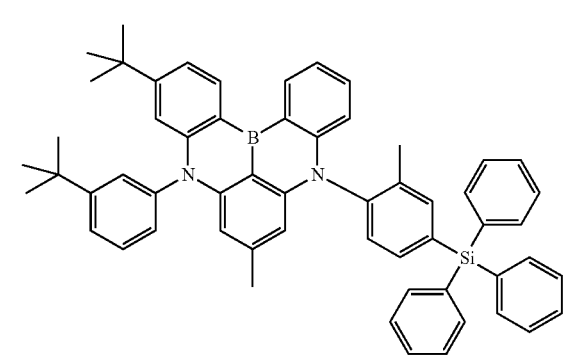
240
-continued
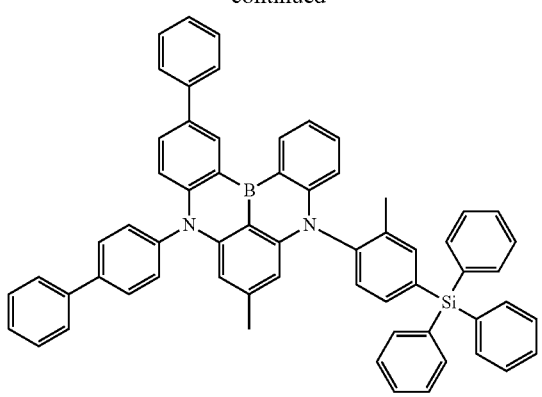
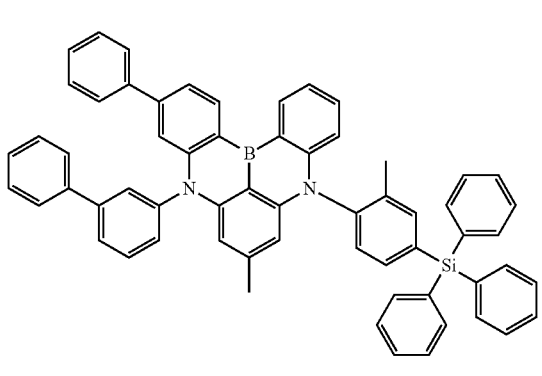
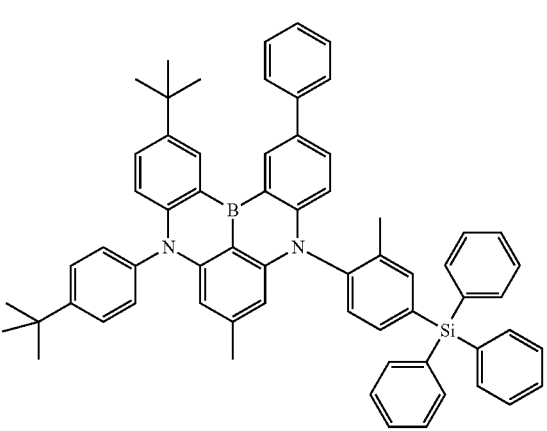
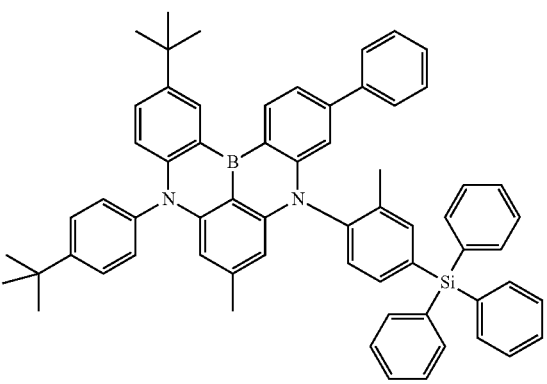

-continued
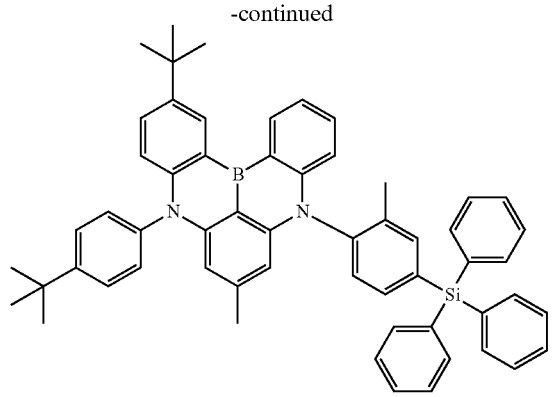
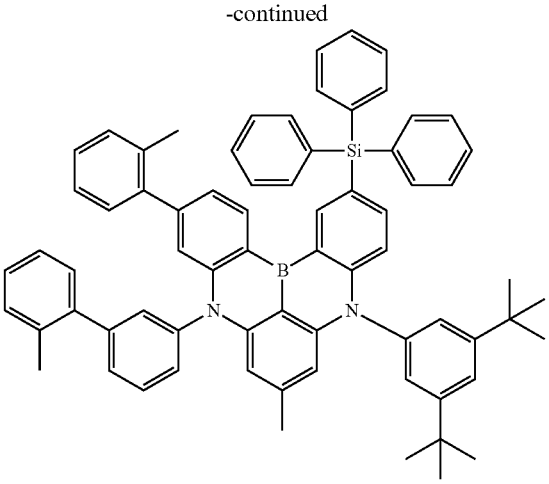
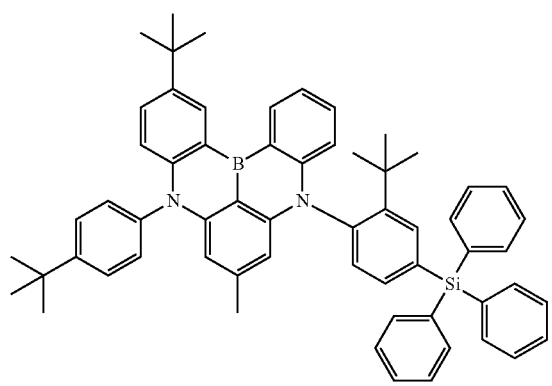
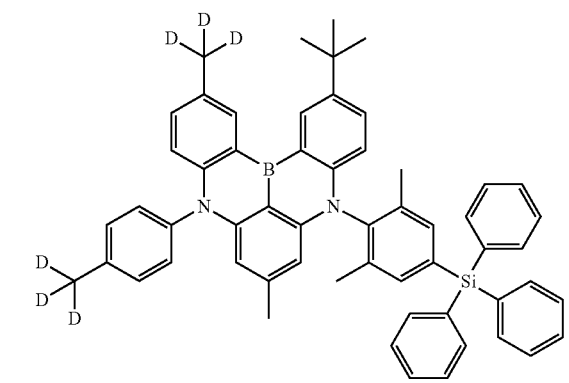
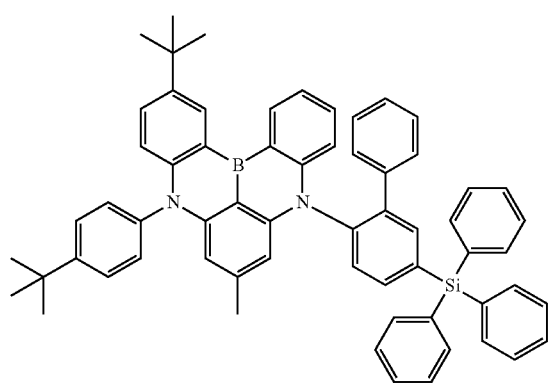
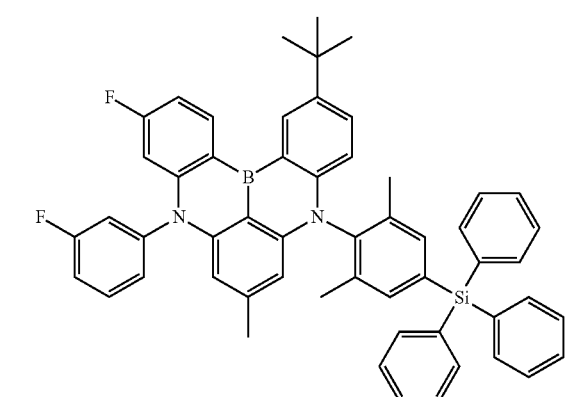
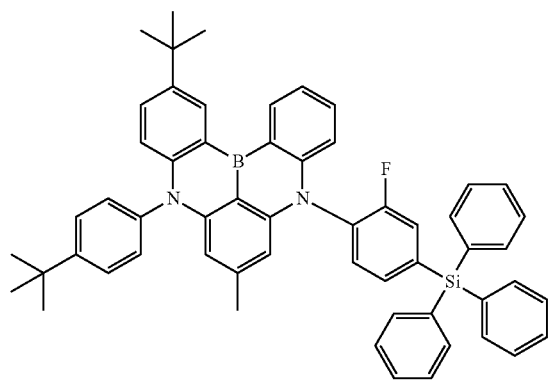
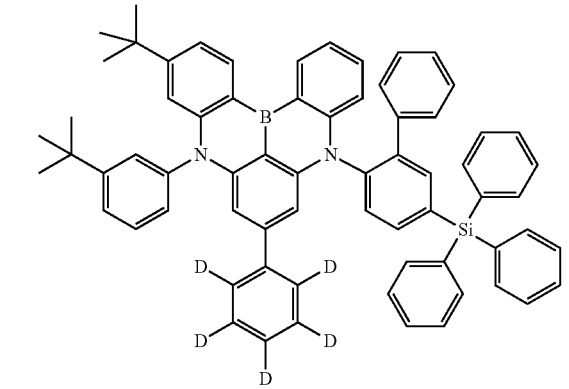

243
-continued
244
-continued
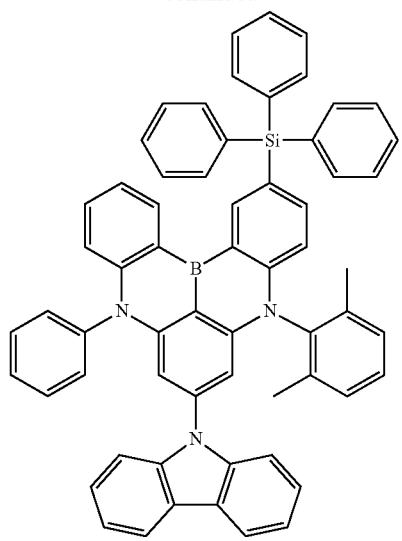
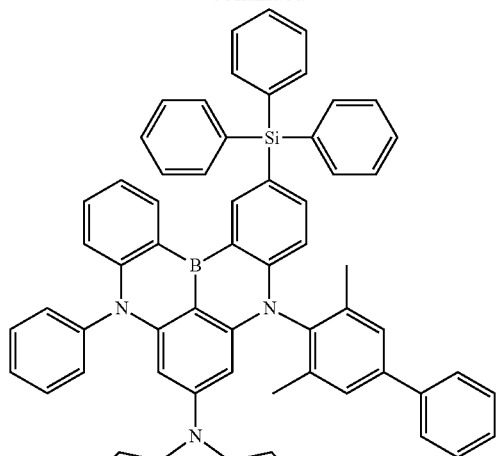
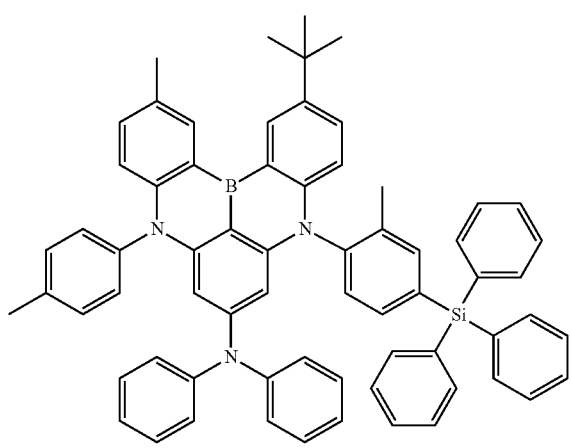
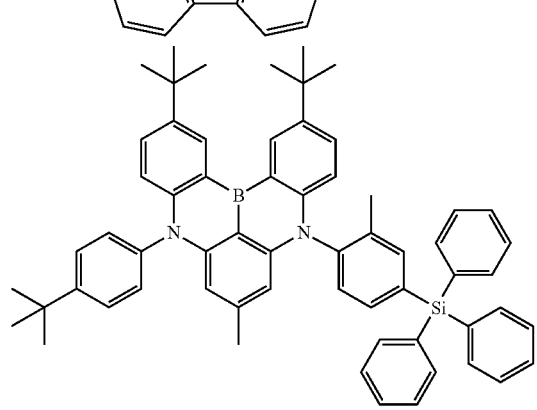
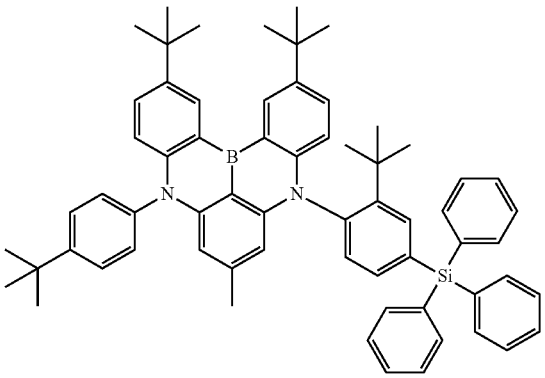
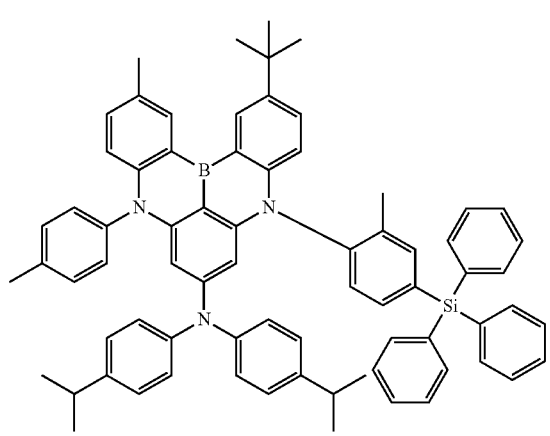
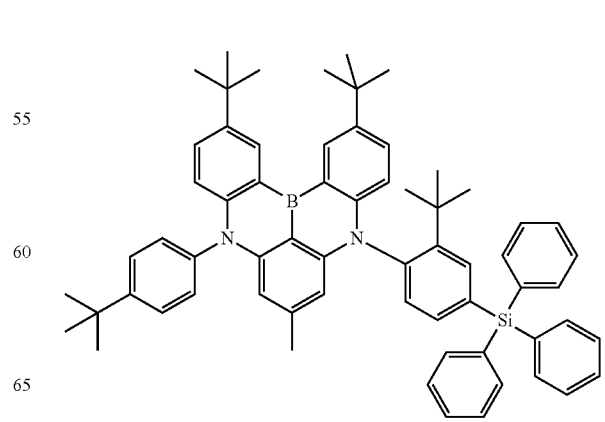

245
-continued
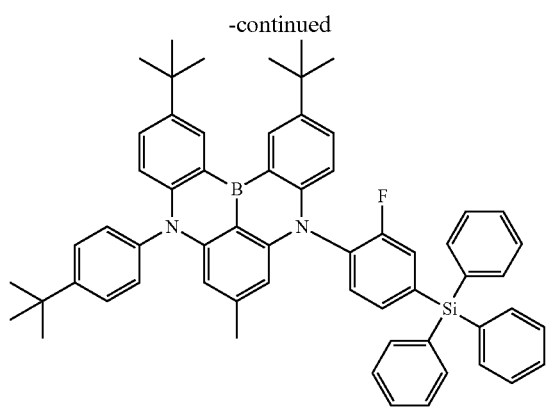
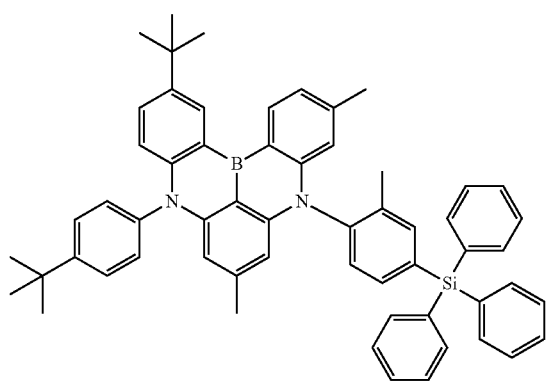
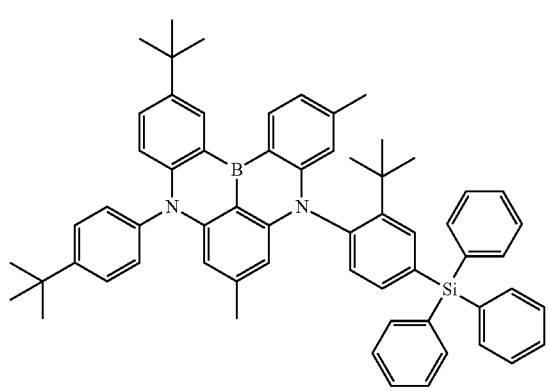
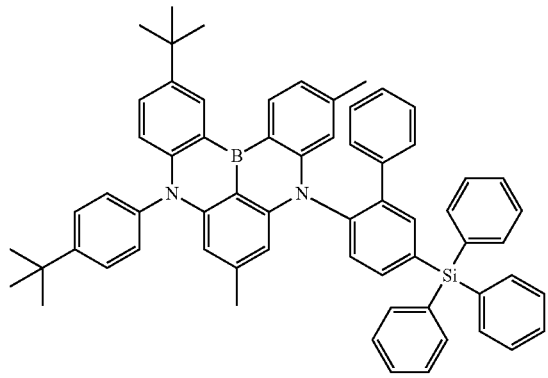
246
-continued
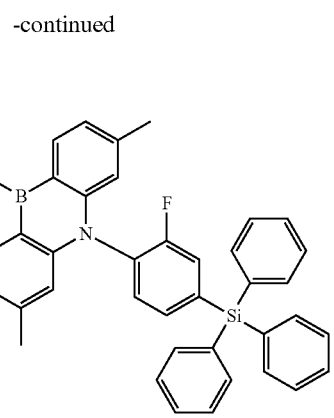
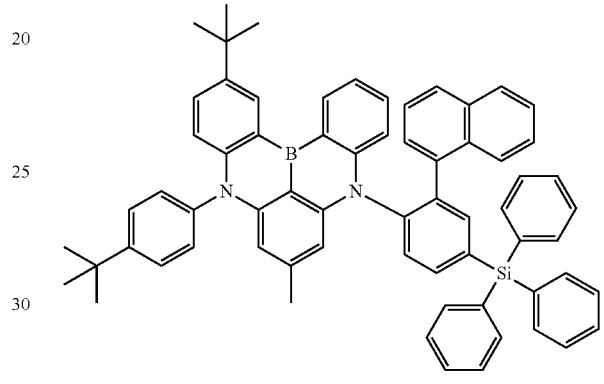
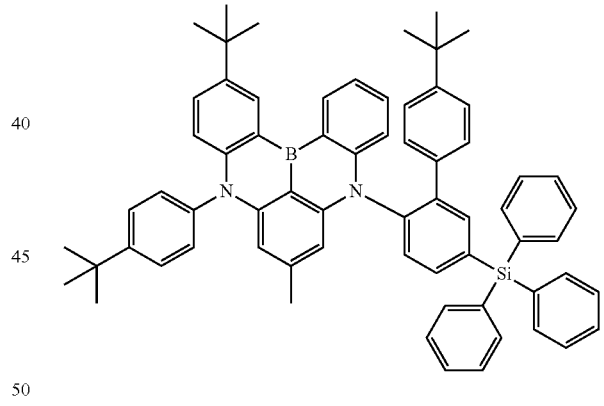
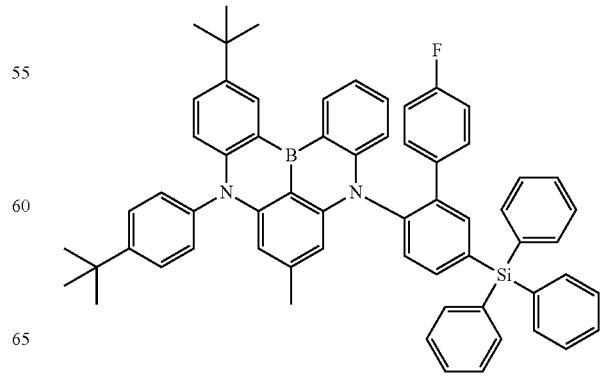

247
-continued
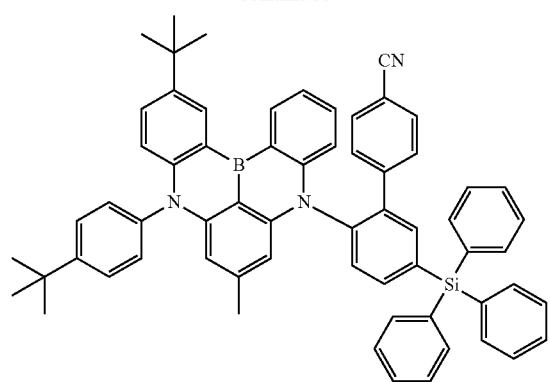
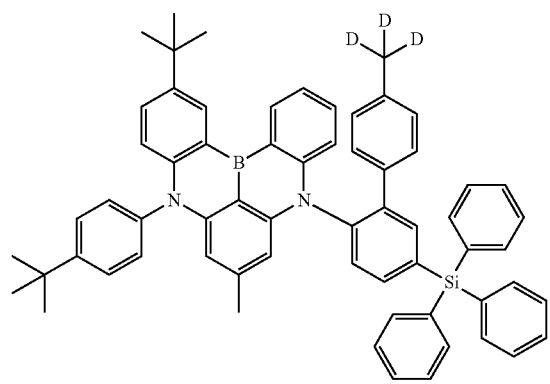
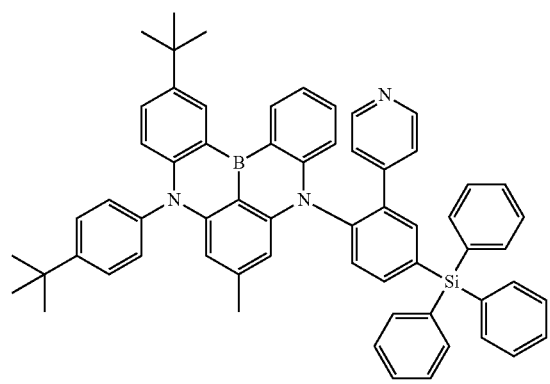
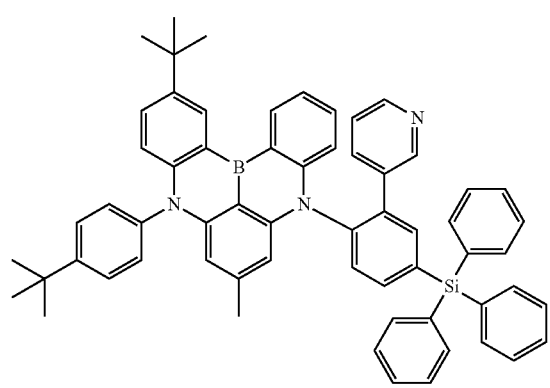
248
-continued
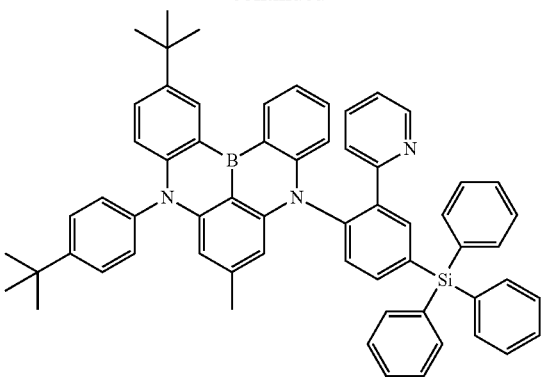
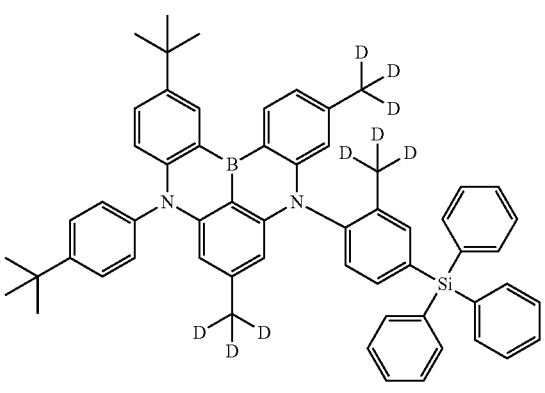
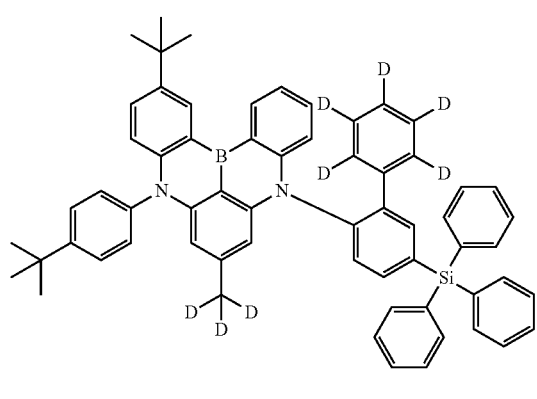
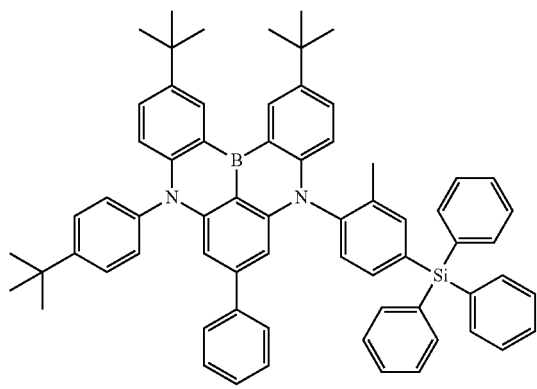

-continued

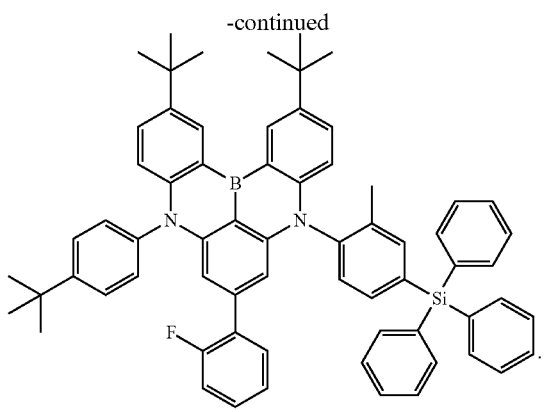

9. The compound of claim 1, which is a fluorescence dopant for a thermally activated delayed fluorescence device.

10. An organic light emitting device comprising:
a first electrode;
a second electrode; and
one or more organic material layers provided between the first electrode and the second electrode,
wherein one or more layers of the organic material layers comprise the compound of claim 1.

11. The organic light emitting device of claim 10, wherein the organic material layer comprises a hole injection layer or a hole transfer layer, and the hole injection layer or the hole transfer layer comprises the compound.

12. The organic light emitting device of claim 10, wherein the organic material layer comprises an electron transfer layer or an electron injection layer, and the electron transfer layer or the electron injection layer comprises the compound.

13. The organic light emitting device of claim 10, wherein the organic material layer comprises a light emitting layer, and the light emitting layer comprises the compound.

14. The organic light emitting device of claim 13, wherein the light emitting layer comprises the compound as a dopant.

15. The organic light emitting device of claim 13, wherein the light emitting layer comprises the compound as a thermally activated delayed fluorescence dopant.

16. The organic light emitting device of claim 10, wherein the organic material layer comprises one or more of a hole transfer layer, a hole injection layer, an electron blocking layer, a layer carrying out hole transfer and hole injection at the same time, a light emitting layer, an electron transfer layer, an electron injection layer, a hole blocking layer, and a layer carrying out electron transfer and electron injection at the same time.

* * * * *